(12) United States Patent
Lui et al.

(10) Patent No.: US 10,074,810 B2
(45) Date of Patent: Sep. 11, 2018

(54) ORGANIC OPTOELECTRIC DEVICE AND DISPLAY DEVICE

(71) Applicant: SAMSUNG SDI CO., LTD., Yongin-si, Gyeonggi-do (KR)

(72) Inventors: Jin-Hyun Lui, Suwon-si (KR);
Jae-Han Park, Suwon-si (KR);
Young-Kyoung Jo, Suwon-si (KR);
Chang-Woo Kim, Suwon-si (KR);
Soo-Hyun Min, Suwon-si (KR);
Eun-Sun Yu, Suwon-si (KR); Han-Ill Lee, Suwon-si (KR); Sung-Hyun Jung, Suwon-si (KR); Ho-Kuk Jung, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 282 days.

(21) Appl. No.: 14/864,942

(22) Filed: Sep. 25, 2015

(65) Prior Publication Data

US 2016/0126471 A1    May 5, 2016

(30) Foreign Application Priority Data

Oct. 31, 2014  (KR) .................. 10-2014-0150599

(51) Int. Cl.
*H01L 51/00*    (2006.01)
*H01L 51/50*    (2006.01)
(Continued)

(52) U.S. Cl.
CPC ...... *H01L 51/0067* (2013.01); *H01L 51/0054* (2013.01); *H01L 51/0059* (2013.01);
(Continued)

(58) Field of Classification Search
CPC ............. H01L 51/0054; H01L 51/0059; H01L 51/0061; H01L 51/0067; H01L 51/0072;
(Continued)

(56) References Cited

U.S. PATENT DOCUMENTS

2010/0301312 A1* 12/2010 Jinde ................... H01L 51/0059
257/40
2011/0260138 A1* 10/2011 Xia ....................... C07D 405/14
257/40

(Continued)

FOREIGN PATENT DOCUMENTS

CN    102144015 A    8/2011
CN    102459507 A    5/2012
(Continued)

OTHER PUBLICATIONS

Machine translation of JP 2012-216819A (publication date: Nov. 2012).*

(Continued)

*Primary Examiner* — Dawn Garrett
(74) *Attorney, Agent, or Firm* — Lee & Morse, P.C.

(57) ABSTRACT

An organic optoelectric device including an anode and a cathode facing each other, an emission layer between the anode and the cathode, a hole transport layer between the anode and the emission layer, a hole transport auxiliary layer between the hole transport layer and the emission layer, an electron transport layer between the cathode and the emission layer, and an electron transport auxiliary layer between the electron transport layer and the emission layer, wherein the electron transport auxiliary layer includes a first compound represented by the following Chemical Formula 1, and the hole transport auxiliary layer includes a second compound represented by the following Chemical Formula 2:

(Continued)

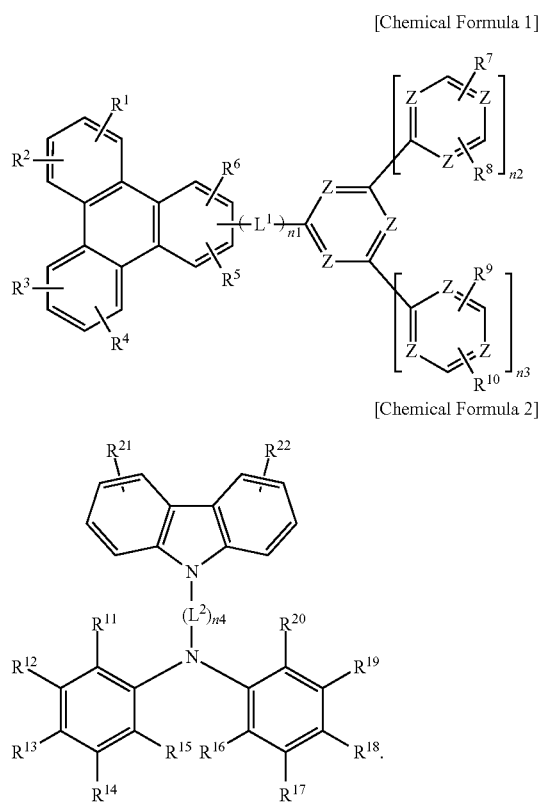

[Chemical Formula 1]

[Chemical Formula 2]

15 Claims, 1 Drawing Sheet

(51) Int. Cl.
*H01L 51/44* (2006.01)
*H01L 51/05* (2006.01)

(52) U.S. Cl.
CPC ...... *H01L 51/0061* (2013.01); *H01L 51/0072* (2013.01); *H01L 51/0558* (2013.01); *H01L 51/44* (2013.01); *H01L 51/508* (2013.01); *H01L 51/5012* (2013.01); *H01L 51/5064* (2013.01); *H01L 51/5096* (2013.01); *Y02E 10/549* (2013.01)

(58) Field of Classification Search
CPC . H01L 51/0558; H01L 51/44; H01L 51/5012; H01L 51/5064; H01L 51/508; H01L 51/5096; Y02E 10/549
See application file for complete search history.

(56) References Cited

U.S. PATENT DOCUMENTS

| | | | |
|---|---|---|---|
| 2012/0091438 A1* | 4/2012 | Yabunouchi | C09K 11/06 257/40 |
| 2012/0211736 A1* | 8/2012 | Kim | C09K 11/06 257/40 |
| 2012/0223295 A1* | 9/2012 | Inoue | C09K 11/06 257/40 |
| 2012/0326141 A1* | 12/2012 | Pflumm | C09K 11/06 257/40 |
| 2013/0056720 A1* | 3/2013 | Kim | C07D 401/14 257/40 |
| 2013/0256644 A1 | 10/2013 | Kim et al. | |
| 2014/0034940 A1* | 2/2014 | Yu | C09B 57/00 257/40 |
| 2014/0197386 A1* | 7/2014 | Kim | H01L 51/0067 257/40 |
| 2014/0209874 A1 | 7/2014 | Chun et al. | |
| 2014/0217392 A1 | 8/2014 | Hong et al. | |
| 2015/0102301 A1* | 4/2015 | Cho | H01L 51/0054 257/40 |
| 2015/0340618 A1* | 11/2015 | Lee | C09B 57/00 257/40 |

FOREIGN PATENT DOCUMENTS

| | | |
|---|---|---|
| CN | 102532105 A | 7/2012 |
| CN | 103827257 A | 5/2014 |
| JP | 2012-059904 A | 3/2012 |
| JP | 2012-216819 A * | 11/2012 |
| JP | 2013-035752 A * | 2/2013 |
| KR | 10-2011-0041729 A | 4/2011 |
| KR | 10-2013-0098226 A | 9/2013 |
| KR | 10-2013-0098228 A | 9/2013 |
| KR | 10-2014-0020935 A | 2/2014 |
| TW | 201311650 A1 | 3/2013 |
| WO | WO 2011/149240 A2 | 12/2011 |
| WO | WO 2014/030872 A2 | 2/2014 |

OTHER PUBLICATIONS

Extended European Search Report dated Mar. 23, 2016 in Corresponding European Patent Application No. 15188541.5.
Taiwanese Search Report dated Mar. 30, 2016 in Corresponding Taiwanese Patent Application No. 104132909.
Office Action dated Feb. 3, 2017 of the corresponding Chinese Patent Application No. 201510673136.3.

\* cited by examiner

[FIG. 1]
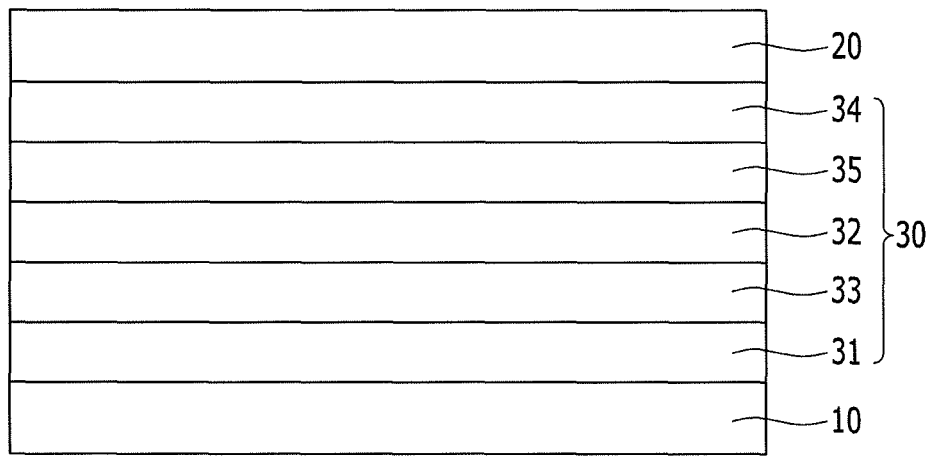
[FIG. 2]
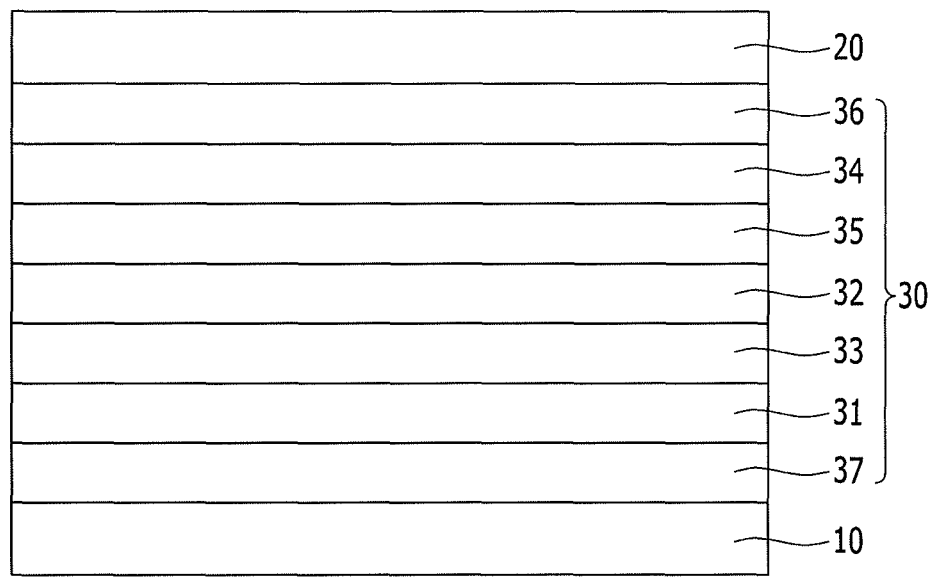

ORGANIC OPTOELECTRIC DEVICE AND DISPLAY DEVICE

CROSS-REFERENCE TO RELATED APPLICATION

This application claims priority to and the benefit of Korean Patent Application No. 10-2014-0150599 filed in the Korean Intellectual Property Office on Oct. 31, 2014, the entire contents of which are incorporated herein by reference.

BACKGROUND OF THE INVENTION

1. Field of the Invention

An organic optoelectric device and a display device are disclosed.

2. Description of the Related Art

An organic optoelectric device is a device that converts electrical energy into photoenergy, and vice versa.

An organic optoelectric device may be classified as follows in accordance with its driving principles. One is an optoelectric device where excitons are generated by photoenergy, separated into electrons and holes, and are transferred to different electrodes to generate electrical energy, and the other is a light emitting device where a voltage or a current is supplied to an electrode to generate photoenergy from electrical energy.

Examples of the organic optoelectric device may be an organic photoelectric device, an organic light emitting diode, an organic solar cell, and an organic photo conductor drum.

Of these, an organic light emitting diode (OLED) has recently drawn attention due to an increase in demand for flat panel displays. Such an organic light emitting diode converts electrical energy into light by applying current to an organic light emitting material. It has a structure in which an organic layer is interposed between an anode and a cathode.

A blue organic light emitting diode having a long life-span is considered to be one of the critical factors for realizing a long life-span full color display. Accordingly, development of a long life-span blue organic light emitting diode is being actively researched. In order to solve this problem, a long life-span blue organic light emitting diode is provided in this invention.

SUMMARY OF THE INVENTION

One embodiment provides an organic optoelectric device being capable of realizing having high efficiency. Another embodiment provides a display device including the organic optoelectric device.

According to one embodiment, an organic optoelectric device includes an anode and a cathode facing each other, an emission layer between the anode and the cathode, a hole transport layer between the anode and the emission layer, a hole transport auxiliary layer between the hole transport layer and the emission layer, an electron transport layer between the cathode and the emission layer, and an electron transport auxiliary layer between the electron transport layer and the emission layer, wherein the electron transport auxiliary layer includes at least one of a first compound represented by Chemical Formula 1, the hole transport auxiliary layer includes at least one of a second compound represented by Chemical Formula 2.

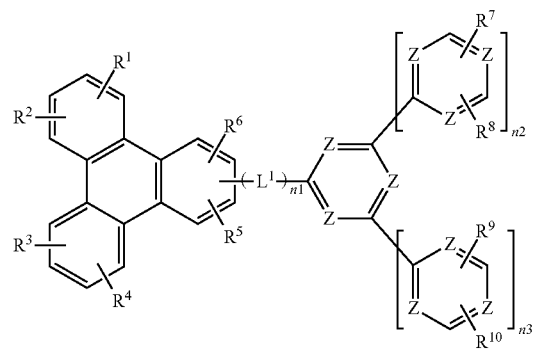

[Chemical Formula 1]

In Chemical Formula 1,
Z is each independently N or $CR^a$,
at least one of Z is N,
$R^1$ to $R^{10}$ and $R^a$ are each independently hydrogen, deuterium, a substituted or unsubstituted C1 to C10 alkyl group, a substituted or unsubstituted C6 to C12 aryl group, or a combination thereof,
$L^1$ is a substituted or unsubstituted phenylene group, a substituted or unsubstituted biphenylene group or a substituted or unsubstituted terphenylene group,
n1 to n3 are each independently 0 or 1, and $n1+n2+n3 \geq 1$,

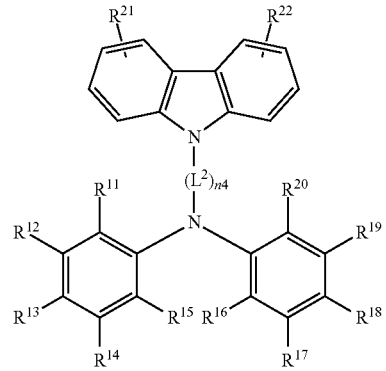

[Chemical Formula 2]

wherein, in Chemical Formula 2,
$L^2$ is a substituted or unsubstituted C6 to C30 arylene group, or a substituted or unsubstituted C2 to C30 heteroarylene group,
n4 is an integer of 1 to 5,
$R^{11}$ to $R^{22}$ are independently, hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof, and
$R^{11}$ to $R^{20}$ are independently present or are fused with each other to form a ring,
wherein "substituted" of Chemical Formulae 1 and 2 refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

According to another embodiment, a display device including the organic optoelectric device is provided.

An organic optoelectric device having high efficiency may be realized.

BRIEF DESCRIPTION OF THE DRAWINGS

FIGS. 1 and 2 are cross-sectional views showing organic optoelectric devices according to one embodiment.

DETAILED DESCRIPTION

Hereinafter, embodiments of the present invention are described in detail. However, these embodiments are exemplary, the present invention is not limited thereto and the present invention is defined by the scope of claims.

In the present specification, when a definition is not otherwise provided, the term "substituted" refers to one substituted with a substituent selected from deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group such as a trifluoromethyl group, or a cyano group, instead of at least one hydrogen of a substituent or a compound.

In addition, two adjacent substituents of the substituted halogen, hydroxy group, amino group, substituted or unsubstituted C1 to C20 amine group, nitro group, substituted or unsubstituted C3 to C40 silyl group, C1 to C30 alkyl group, C1 to C10 alkylsilyl group, C3 to C30 cycloalkyl group, C2 to C30 heterocycloalkyl group, C6 to C30 aryl group, C2 to C30 heteroaryl group, C1 to C20 alkoxy group, fluoro group, C1 to C10 trifluoroalkyl group such as trifluoromethyl group and the like, or cyano group may be fused with each other to form a ring. For example, the substituted C6 to C30 aryl group may be fused with another adjacent substituted C6 to C30 aryl group to form a substituted or unsubstituted fluorene ring.

In the present specification, when specific definition is not otherwise provided, the term "hetero" refers to one including 1 to 3 hetero atoms selected from N, O, S, P, and Si, and remaining carbons in one compound or substituent.

In the present specification, when a definition is not otherwise provided, "alkyl group" refers to an aliphatic hydrocarbon group. The alkyl group may be "a saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group may have 1 to 4 carbon atoms in an alkyl chain which may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, the term "aryl group" refers to a substituent including all element of the cycle having p-orbitals which form conjugation, and may be monocyclic, polycyclic or fused ring polycyclic (i.e., rings sharing adjacent pairs of carbon atoms) functional group.

In the present specification, the term "heteroaryl group" refers to aryl group including 1 to 3 heteroatoms selected from N, O, S, P, and Si, and remaining carbons. When the heteroaryl group is a fused ring, each ring may include 1 to 3 hetero atoms.

More specifically, the substituted or unsubstituted C6 to C30 aryl group and/or the substituted or unsubstituted C2 to C30 heteroaryl group may be a substituted or unsubstituted phenyl group, a substituted or unsubstituted naphthyl group, a substituted or unsubstituted anthracenyl group, a substituted or unsubstituted phenanthrylene group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted carbazolyl group, a substituted or unsubstituted dibenzofuranyl group, a substituted or unsubstituted dibenzothiophenyl group, combinations thereof, or fused rings of the combinations thereof, but are not limited thereto.

In the specification, hole characteristics refer to characteristics capable of donating an electron when an electric field is applied and that a hole formed in the anode is easily injected into the emission layer and transported in the emission layer due to conductive characteristics according to highest occupied molecular orbital (HOMO) level.

In addition, electron characteristics refer to characteristics capable of accepting an electron when an electric field is applied and that an electron formed in the cathode is easily injected into the emission layer and transported in the emission layer due to conductive characteristics according to lowest unoccupied molecular orbital (LUMO) level.

Hereinafter, an organic optoelectric device according to one embodiment is described.

The organic optoelectric device may be any device to convert electrical energy into photoenergy and vice versa without particular limitation, and may be, for example an organic photoelectric device, an organic light emitting diode, an organic solar cell, and an organic photo-conductor drum.

Herein, an organic light emitting diode as one example of an organic optoelectric device is described, but the present invention can be applied to other organic optoelectric devices in the same way.

In the drawings, the thickness of layers, films, panels, regions, etc., are exaggerated for clarity. Like reference numerals designate like elements throughout the specification. It will be understood that when an element such as a layer, a film, a region, or a substrate is referred to as being "on" another element, it can be directly on the other element or intervening elements may also be present. In contrast, when an element is referred to as being "directly on" another element, there are no intervening elements present.

FIG. 1 is a schematic cross-sectional view showing organic optoelectric devices according to one embodiment.

Referring to FIG. 1, an organic optoelectric device according to one embodiment includes an anode 10 and a cathode 20 facing each other and an organic layer 30 between the anode 10 and the cathode 20.

The anode 10 may be made of a conductor having a large work function to help hole injection, and may be for example metal, metal oxide and/or a conductive polymer. The anode 10 may be, for example a metal such as nickel, platinum, vanadium, chromium, copper, zinc, and gold or an alloy thereof; metal oxide such as zinc oxide, indium oxide, indium tin oxide (ITO), indium zinc oxide (IZO), and the like; a combination of metal and metal oxide such as ZnO and Al or SnO$_2$ and Sb; a conductive polymer such as poly(3-methylthiophene), poly(3,4-(ethylene-1,2-dioxy)thiophene) (PEDT), polypyrrole, and polyaniline, but is not limited thereto.

The cathode 20 may be made of a conductor having a small work function to help electron injection, and may be for example metal, metal oxide and/or a conductive polymer. The cathode 20 may be for example a metal or an alloy thereof such as magnesium, calcium, sodium, potassium, titanium, indium, yttrium, lithium, gadolinium, aluminum silver, tin, lead, cesium, barium, and the like; a multi-layer structure material such as LiF/Al, LiO$_2$/Al, LiF/Ca, LiF/Al and BaF$_2$/Ca, but is not limited thereto.

The organic layer 30 includes a hole transport layer 31, an emission layer 32 and a hole transport auxiliary layer 33 between the hole transport layer 31 and the emission layer 32.

In addition, it includes an electron transport layer 34 and an electron transport auxiliary layer 35 between the electron transport layer 34 and the emission layer 32.

Referring to FIG. 2, the organic layer 30 may further include a hole injection layer 37 between the hole transport layer 31 and the anode 10, and an electron injection layer 36 between the electron transport layer 34 and the cathode 20.

The hole injection layer 37 between the hole transport layer 31 and the anode 10 the improves the interface characteristics between an organic material used as the hole transport layer 31 and ITO used as the anode 10. The hole injection layer 37 is coated on the uneven ITO to smoothen the surface of the uneven ITO. For example, the hole injection layer 37 may be selected from materials having a median value between work functions of the ITO and HOMO of the hole transport layer 31 to adjust a difference between the work functions of the ITO and the HOMO of the hole transport layer 31 and particularly, materials having appropriate conductivity. The materials forming the hole injection layer 37 of the present invention may be N4,N4'-diphenyl-N4,N4'-bis(9-phenyl-9H-carbazol-3-yl)biphenyl-4,4'-diamine, but is not limited thereto. A conventional material of the hole injection layer 37 may be also used together, for example, copper phthlalocyanine (CuPc), aromatic amines such as N,N'-dinaphthyl-N,N'-phenyl-(1,1'-biphenyl)-4,4'-diamine (NPD), 4,4',4''-tris[methylphenyl(phenyl)amino]triphenyl amine (m-MTDATA), 4,4',4''-tris[1-naphthyl(phenyl)amino]triphenyl amine (1-TNATA), 4,4',4''-tris[2-naphthyl(phenyl)amino]triphenyl amine (2-TNATA), 1,3,5-tris[N-(4-diphenylaminophenyl)phenylamino]benzene (p-DPA-TDAB), a compound such 4,4'-bis[N-[4-{N,N-bis(3-methylphenyl)amino}phenyl]-N-phenylamino]biphenyl (DNTPD), hexaazatriphenylenehexacarbonitrile (HAT-CN), and the like, a conductive polymer such as a polythiophene derivative of poly(3,4-ethylenedioxythiophene)-poly(styrenesulfonate) (PEDOT). The hole injection layer 37 may be coated with a thickness, for example of 10 to 300 Å on ITO as an anode.

The electron injection layer 36 is disposed on the electron transport layer and thus, facilitates injection of electrons from a cathode and ultimately improves power efficiency and may, for example, include LiF, Liq, NaCl, CsF, Li$_2$O, BaO and the like, which are conventionally used in a related art.

The hole transport layer 31 facilitates hole transport from the anode 10 to the emission layer 32 and may be, for example, formed of an amine compound but is not limited thereto.

The amine compound may include, for example at least one aryl group and/or heteroaryl group. The amine compound may be, for example represented by Chemical Formula a or Chemical Formula b, but is not limited thereto.

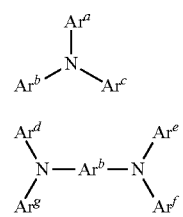

[Chemical Formula a]

[Chemical Formula b]

In Chemical Formulae a or b, $Ar^a$ to $Ar^g$ are each independently hydrogen, deuterium, a substituted or unsubstituted C1 to C20 alkyl group, a substituted or unsubstituted C6 to C30 aryl group, a substituted or unsubstituted C2 to C30 heteroaryl group, or a combination thereof, at least one of $Ar^a$ to $Ar^c$ and at least one of $Ar^d$ to $Ar^g$ are a substituted or unsubstituted C6 to C30 aryl group, a substituted or unsubstituted C2 to C30 heteroaryl group, or a combination thereof, and $Ar^h$ is a single bond, a substituted or unsubstituted C1 to C20 alkylene group, a substituted or unsubstituted C6 to C30 arylene group, a substituted or unsubstituted C2 to C30 heteroarylene group or a combination thereof.

The electron transport layer 34 easily transports electrons from the cathode 20 to the emission layer 32 and may be formed of an organic compound containing an electron-accepting functional group (an electron-withdrawing group), a metal compound well accepting electrons, or a mixture thereof. For example, the electron transport layer material may include aluminum trihydroxyquinoline (Alq$_3$), a 1,3,4-oxadiazole derivative of 2-(4-biphenylyl)-5-phenyl-1,3,4-oxadiazole (PBD), a quinoxaline derivative of 1,3,4- tris[(3-phenyl-6-trifluoromethyl)quinoxaline-2-yl]benzene (TPQ), a triazole derivative and a triazine derivative of 8-(4-(4-(naphthalen-2-yl)-6-(naphthalen-3-yl)-1,3,5-triazin-2-yl)phenyl)quinoline), and the like, but is not limited thereto.

In addition, the electron transport layer may include an organometallic compound represented by Chemical Formula c singularly or as a mixture with the electron transport layer material.

$$Y_m\text{-}M\text{-}(OA)_n$$ [Chemical Formula c]

In Chemical Formula c,

Y includes a moiety where one selected from C, N, O and S directly bonds with M to form a single bond and a moiety where one selected from C, N, O and S forms a coordination bond with M, and is a chelated ligand with the single bond by a coordination bond, the M is an alkali metal, an alkali earth metal, aluminum (Al), or a boron (B) atom, and the OA is a monovalent ligand being capable of forming a single bond or a coordination bonding with the M, the O is oxygen, A is selected from a substituted or unsubstituted C1 to C30 alkyl group, a substituted or unsubstituted C5 to C50 aryl group, a substituted or unsubstituted C2 to C30 alkenyl group, a substituted or unsubstituted C2 to C20 alkynyl group, a substituted or unsubstituted C3 to C30 cycloalkyl group, a substituted or unsubstituted C5 to C30 cycloalkenyl group, and a substituted or unsubstituted C2 to C50 heteroaryl group having heterogeneous atom of O, N or S, when the M is a metal selected from an alkali metal, m=1 and n=0, when the M is a metal selected from an alkali earth metal, m=1 and n=1, or m=2, and n=0, when the M is boron or aluminum, m is one of 1 to 3, and n is one of 0 to 2, satisfying m+n=3; and the 'substituted' of the 'substituted or unsubstituted' refers to that at least one hydrogen is replaced by one or more substituent selected from deuterium, a cyano group, a halogen, a hydroxy group, a nitro group, an alkyl group, an alkoxy group, an alkylamino group, an arylamino group, a heteroarylamino group, an alkylsilyl group, an arylsilyl group, an aryloxy group, an aryl group, a heteroaryl group, germanium, phosphorus, and boron.

In the present invention, each Y is the same or different, and are independently one selected from Chemical Formula c1 to Chemical Formula c39, but is not limited thereto.

[Chemical Formula c1]

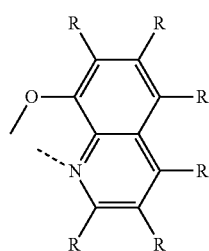

[Chemical Formula c2]

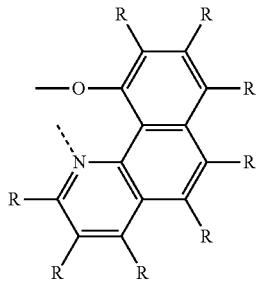

[Chemical Formula c3]

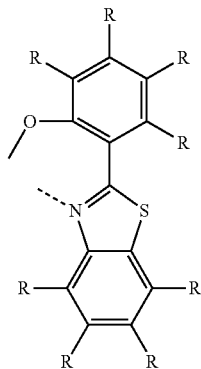

[Chemical Formula c4]

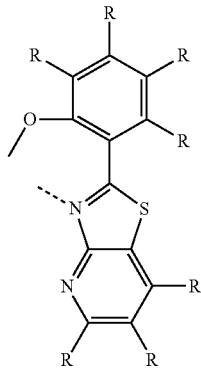

[Chemical Formula c5]

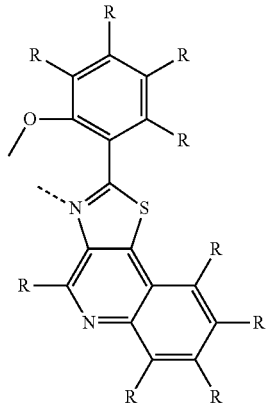

[Chemical Formula c6]
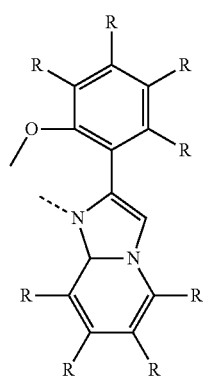
[Chemical Formula c7]
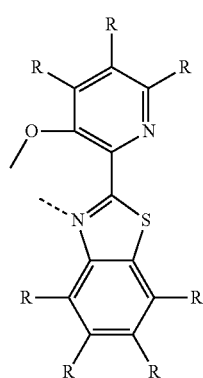
[Chemical Formula c8]
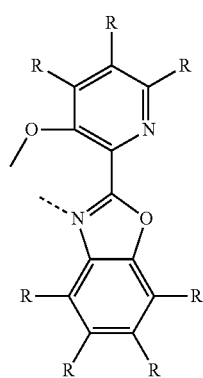
[Chemical Formula c9]
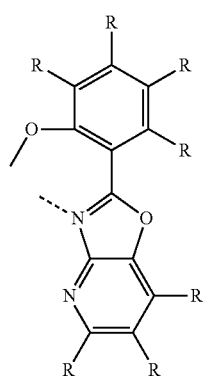
[Chemical Formula c10]
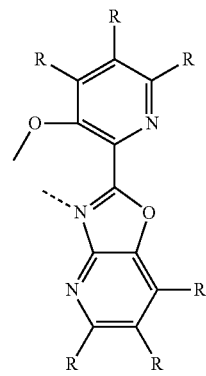
[Chemical Formula c11]
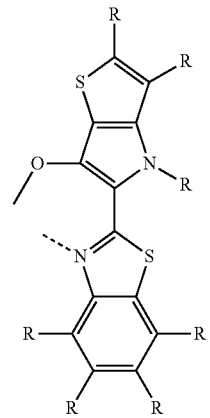
[Chemical Formula c12]
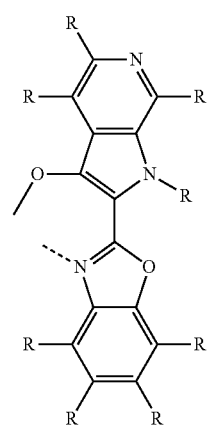
[Chemical Formula c13]
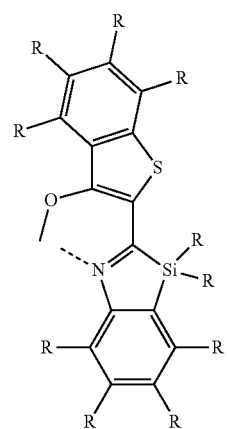

[Chemical Formula c14]
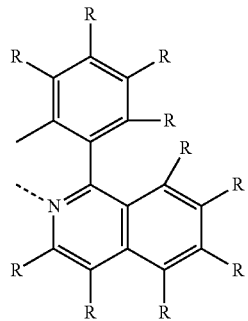
[Chemical Formula c15]
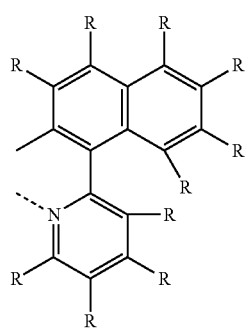
[Chemical Formula c16]
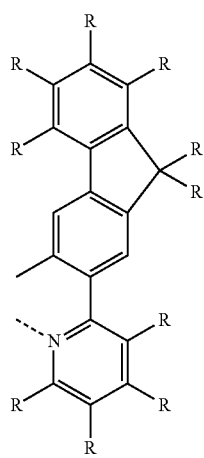
[Chemical Formula c17]
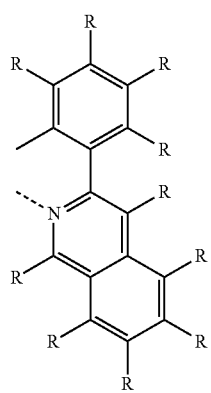
[Chemical Formula c18]
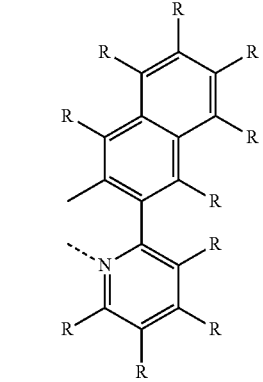
[Chemical Formula c19]
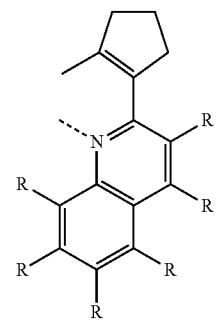
[Chemical Formula c20]
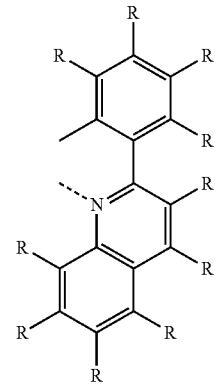
[Chemical Formula c21]
[Chemical Formula c22]
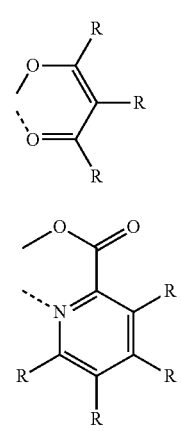

[Chemical Formula c23]
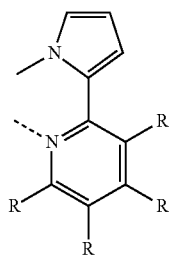
[Chemical Formula c24]
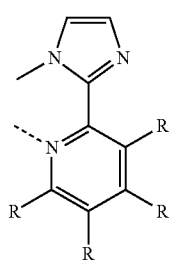
[Chemical Formula c25]
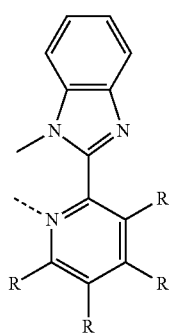
[Chemical Formula c26]
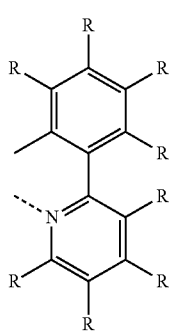
[Chemical Formula c27]
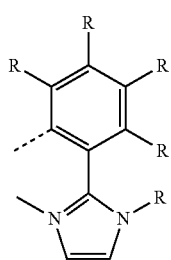
[Chemical Formula c28]
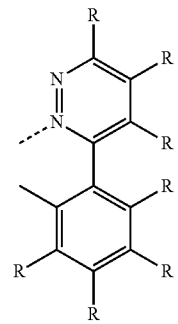
[Chemical Formula c29]
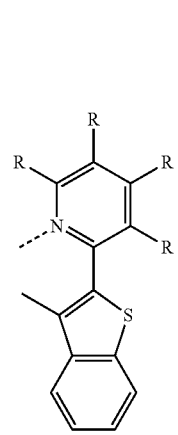
[Chemical Formula c30]
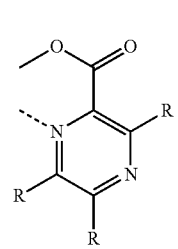
[Chemical Formula c31]
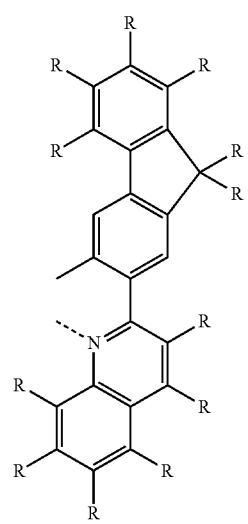

[Chemical Formula c32]

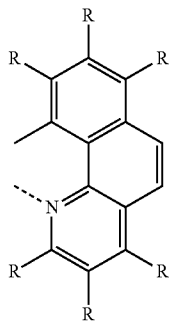

[Chemical Formula c33]

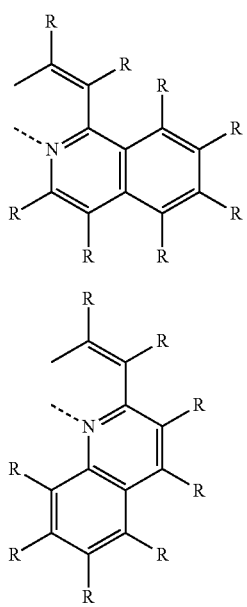

[Chemical Formula c34]

[Chemical Formula c35]

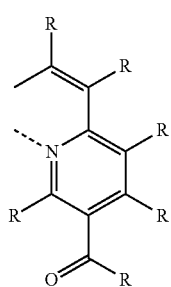

[Chemical Formula c36]

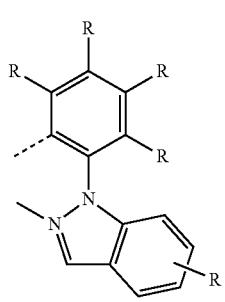

[Chemical Formula c37]

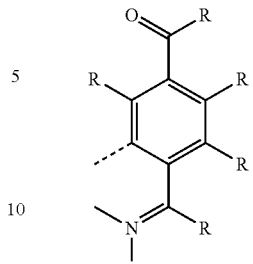

[Chemical Formula c38]

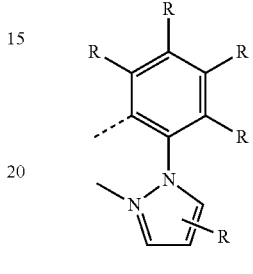

[Chemical Formula c39]

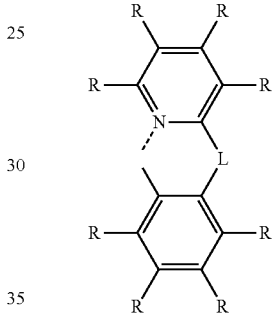

In Chemical Formulae c1 to c39,

R is the same or different and is each independently selected from hydrogen, deuterium, a halogen, a cyano group, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C1 to C30 alkylamino group, a substituted or unsubstituted C1 to C30 alkylsilyl group, a substituted or unsubstituted C6 to C30 arylamino group and a substituted or unsubstituted C6 to C30 arylsilyl group, or is linked to an adjacent substituted with alkylene or alkenylene to form a spirocycle or a fused ring.

The emission layer 32 is an organic layer emitting light and includes a host and a dopant when a doping system is adopted. Herein, the host mainly promotes a recombination of electrons and holes and holds excitons in an emission layer, while the dopant efficiently emits light from the excitons obtained from the recombination.

The emission layer may include known hosts and dopants.

The hosts may include, for example, Alq3, CBP (4,4'-N,N'-dicarbazole-biphenyl), PVK (poly(n-vinylcarbazole)), 9,10-di(naphthalene-2-yl)anthracene (ADN), TCTA, TPBI (1,3,5-tris(N-phenylbenzimidazole-2-yl)benzene), TBADN (3-tert-butyl-9,10-di(naphth-2-yl) anthracene), mCP, OXD-7, BH113 that is commercially available from SFC, and the like, but are not limited thereto.

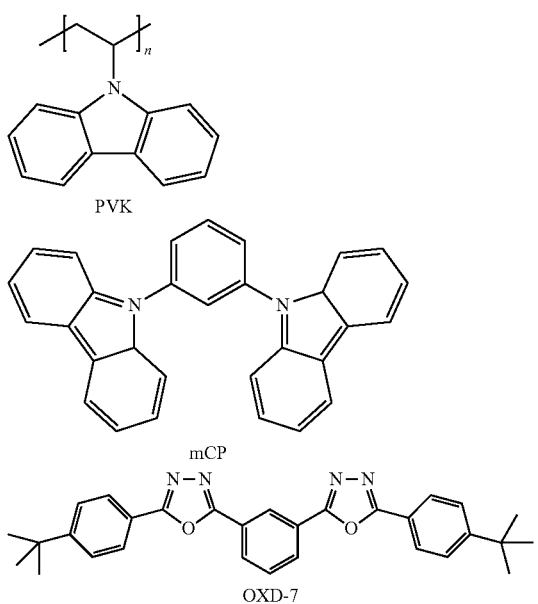

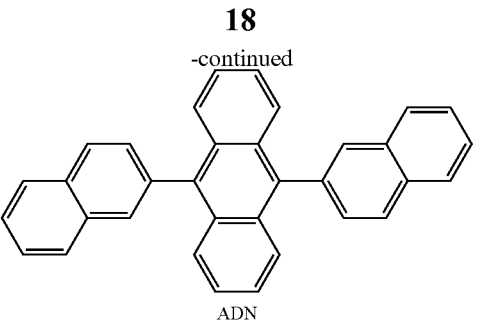

The dopant may be at least one of a fluorescent dopant and phosphorescent dopant. The phosphorescent dopant may be an organic metal complex including, Ir, Pt, Os, Re, Ti, Zr, Hf, or a combination of two or more, but is not limited thereto.

Examples of known blue dopants may be $F_2$Irpic, $(F_2ppy)_2$Ir(tmd), Ir(dfppz)$_3$, ter-fluorene, 4,4'-bis(4-diphenylaminostyryl) biphenyl (DPAVBi), 2,5,8,11-tetra-tert-butyl perylene (TBPe), DPVBi, pyrene derivative (KR0525408, LG Electronics Inc.), BD01, BD370 that is commercially available from SFC, but are not limited thereto.

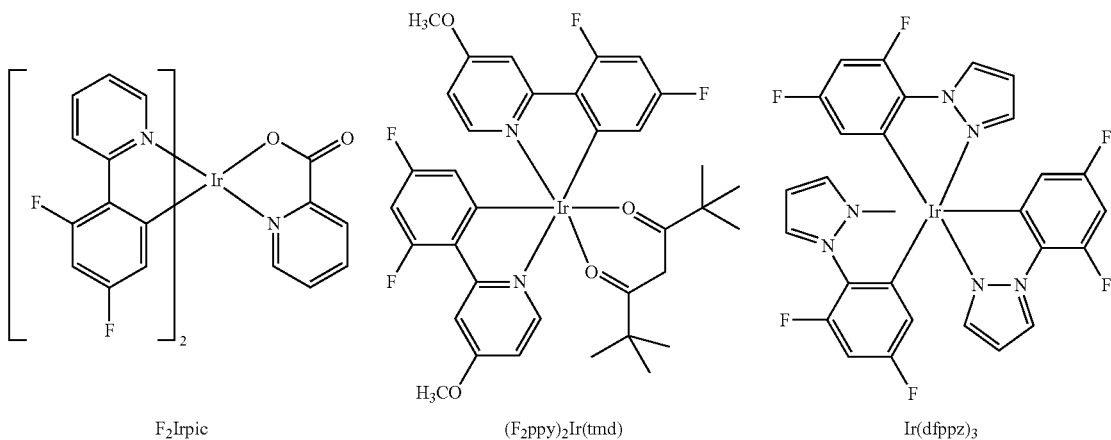

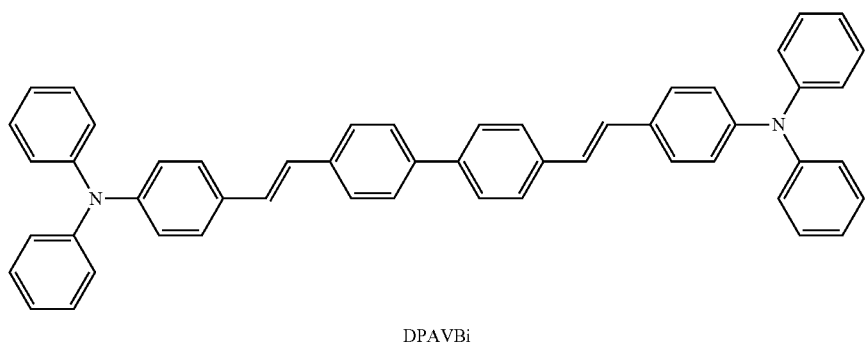

-continued
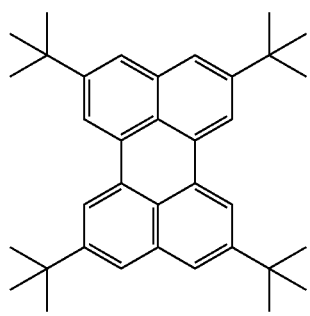
TBPe
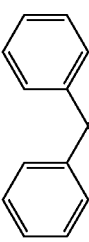
DPVBi
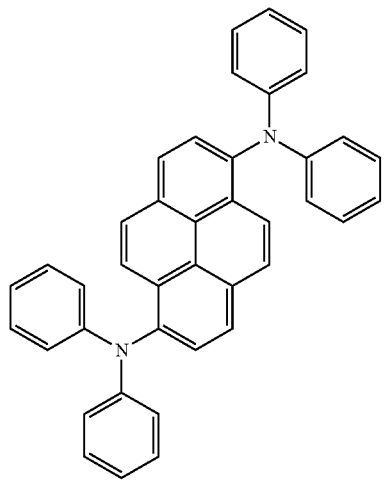
BD01
Examples of known red dopants may include PtOEP, Ir(piq)$_3$, BtpIr, and the like, but are not limited thereto.
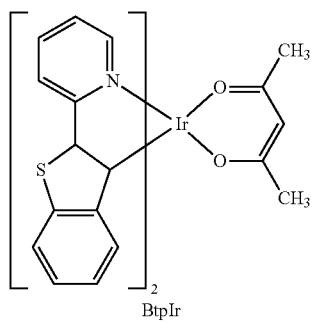
BtpIr
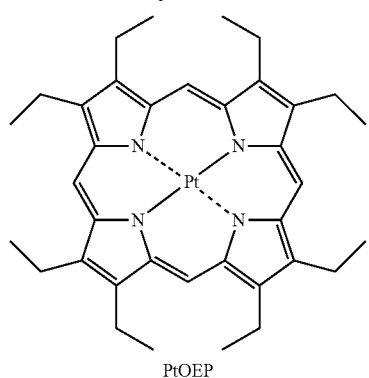
PtOEP
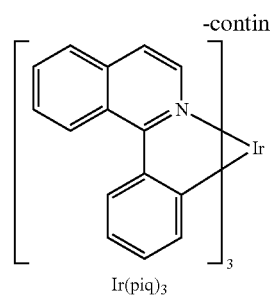
Ir(piq)$_3$
Examples of known green dopant may be Ir(ppy)$_3$ (ppy=phenylpyridine), Ir(ppy)$_2$(acac), Ir(mpyp)$_3$, and the like, but is not limited thereto.
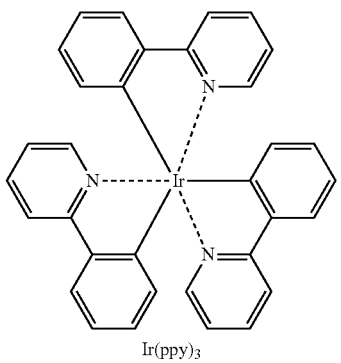
Ir(ppy)$_3$

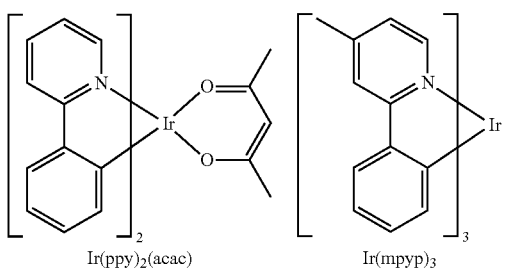

Ir(ppy)₂(acac)    Ir(mpyp)₃

When the emission layer includes hosts and dopants, an amount of the dopants may be generally about 0.01 to about 15 wt % based on 100 wt % of the emission layer 100 wt %, without limitation.

The emission layer may have a thickness of about 200 Å to about 700 Å.

The electron transport auxiliary layer 35 may include a first compound having relatively strong electron characteristics singularly, or as a mixture with the first compound.

The first compound may be represented by Chemical Formula 1.

[Chemical Formula 1]

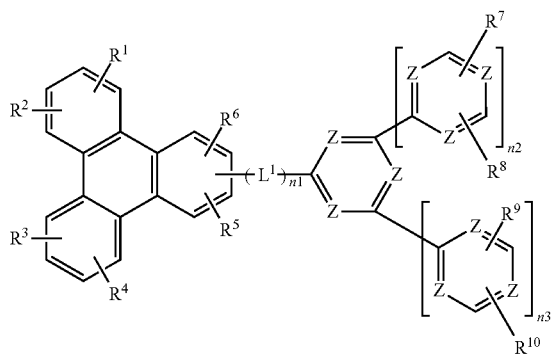

In Chemical Formula 1,

Z is each independently N or $CR^a$, at least one of Z is N, $R^1$ to $R^{10}$ and $R^a$ are each independently hydrogen, deuterium, a substituted or unsubstituted C1 to C10 alkyl group, a substituted or unsubstituted C6 to C12 aryl group, or a combination thereof, $L^1$ is a substituted or unsubstituted phenylene group, a substituted or unsubstituted biphenylene group or a substituted or unsubstituted terphenylene group, n1 to n3 are each independently 0 or 1, and n1+n2+n3≥1.

The first compound may be, for example represented by the following Chemical Formula 1-I or Chemical Formula 1-II according to a bonding position of a triphenylene group.

[Chemical Formula 1-I]

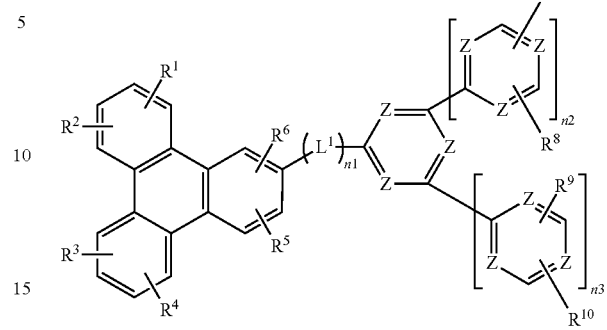

[Chemical Formula 1-II]

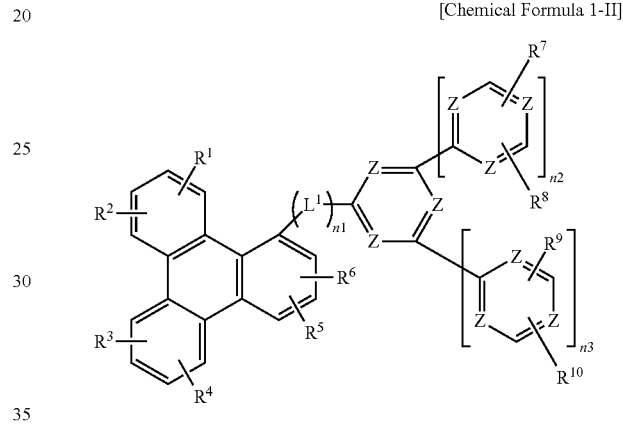

In Chemical Formulae 1-I or 1-II, Z, $R^1$ to $R^{10}$, $L^1$ and n1 to n3 are the same as described above.

The first compound includes a triphenylene group and a heteroaryl group including at least one nitrogen atom. The first compound may includes a ring containing at least one nitrogen atom and thus, has a structure easily receiving electrons when an electric field is applied thereto and accordingly, may increase the injection amount of electrons and decrease a driving voltage when used to manufacture an organic optoelectric device.

The first compound represented by Chemical Formula 1 has at least one of kink structure in the center of an arylene group and/or a heteroarylene group.

The kink structure indicates a structure that an arylene group and/or a heteroarylene group are not linked straight at the linking point. For example, as for phenylene, ortho-phenylene (o-phenylene) and meta phenylene (m-phenylene) have the kink structure in which their linking point are not straight, while para phenylene (p-phenylene) has no kink structure.

In Chemical Formula 1, the kink structure may be formed in the center of a linking group (L) and/or an arylene group/heteroarylene group.

For example, when n1 of Chemical Formula 1 is 0, that is to say, it has a structure without a linking group ($L^1$), a kink structure may be formed in the center of an arylene group/heteroarylene group, and may be for example a compound represented by Chemical Formula 1a or 1b.

[Chemical Formula 1a]

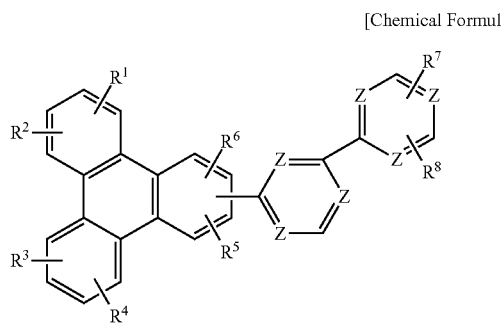

[Chemical Formula 1b]

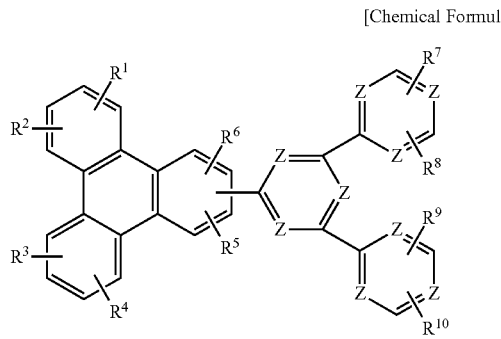

In Chemical Formulae 1a or 1b, Z, $R^1$ to $R^{10}$ are the same as described above.

For example, when n1 of Chemical Formula 1 is 1, a kink structure may be formed in the center of a linking group ($L^1$), and for example $L^1$ may be a substituted or unsubstituted phenylene group having a kink structure, a substituted or unsubstituted biphenylene group having a kink structure, or a substituted or unsubstituted terphenylene group having a kink structure.

The $L^1$ may be, for example selected from substituted or unsubstituted groups listed in Group 1.

[Group 1]

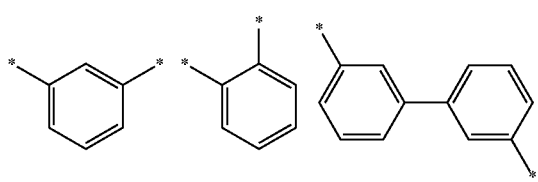

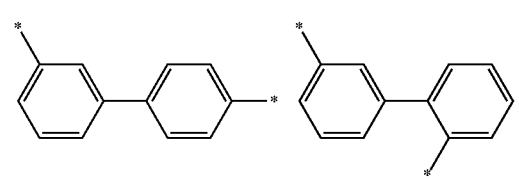

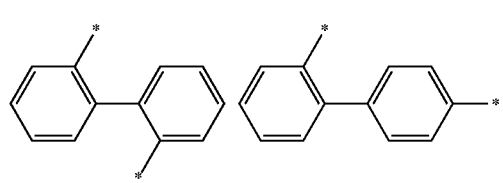

-continued

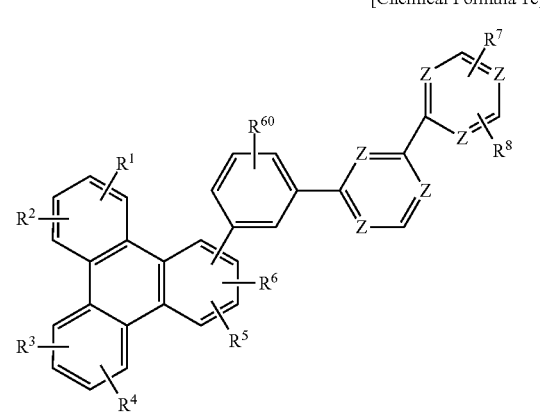

In Group 1,
* is a linking point,
wherein "substituted" refers to that at least one hydrogen is replaced by deuterium, a halogen, a C1 to C20 alkyl group, a C3 to C20 cycloalkyl group, C1 to C20 alkoxy group, a C3 to C20 cycloalkoxy group, a C1 to C20 alkylthio group, a C6 to C30 aralkyl group, a C6 to C30 aryl group, a C6 to C30 aryloxy group, a C6 to C30 arylthio group, a C2 to C30 heteroaryl group, C2 to C30 amino group, a C3 to C30 silyl group, a cyano group, a nitro group, a hydroxyl group, or a carboxyl group.

The first compound may have at least two kink structures, for example two to four kink structures.

The first compound has the above kink structures and thus, may appropriately localize charges and effectively control flow of a conjugation system and resultantly, improve efficiency of an organic optoelectric device manufactured by using the compound.

The first compound may be for example represented by one of the following Chemical Formulae 1c to 1t.

[Chemical Formula 1c]

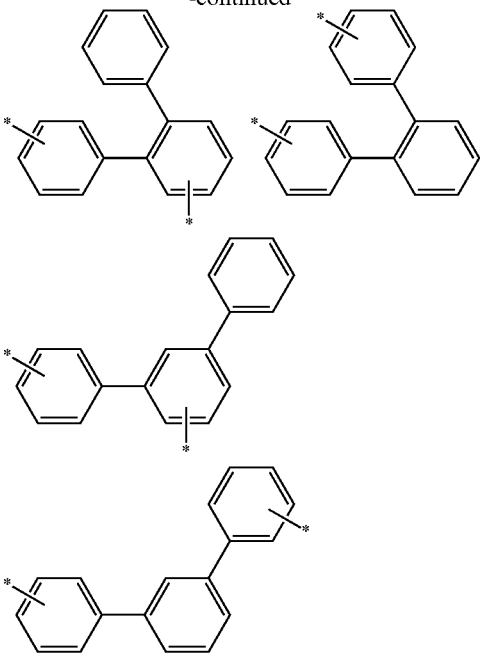

[Chemical Formula 1d]
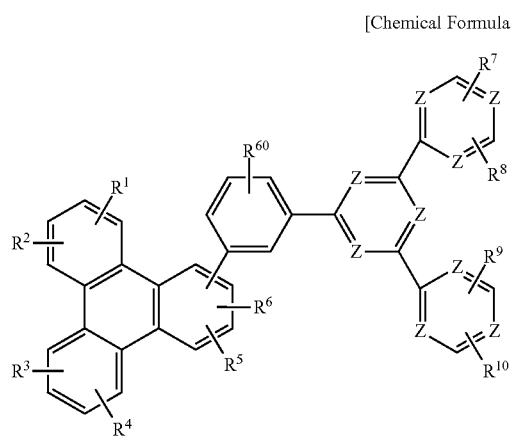
[Chemical Formula 1e]
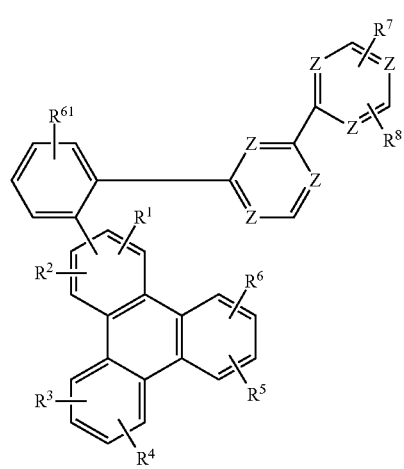
[Chemical Formula 1f]
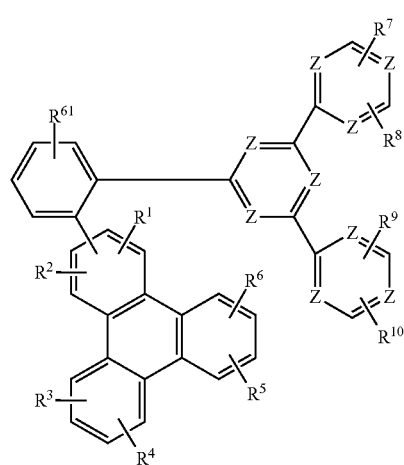
[Chemical Formula 1g]
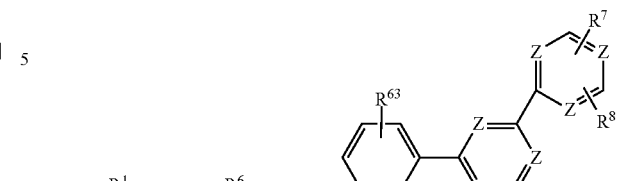
[Chemical Formula 1h]
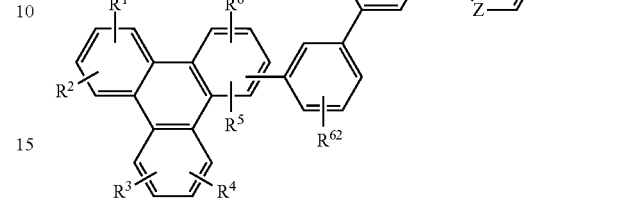
[Chemical Formula 1i]
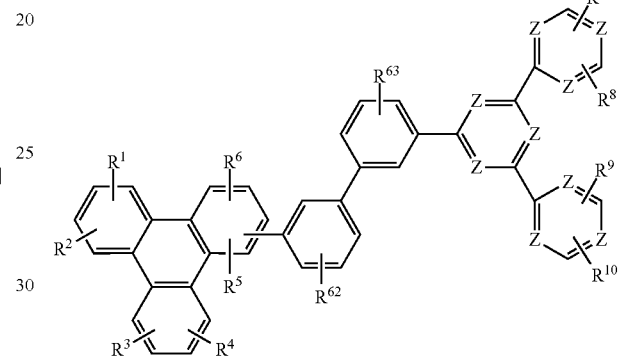
[Chemical Formula 1j]
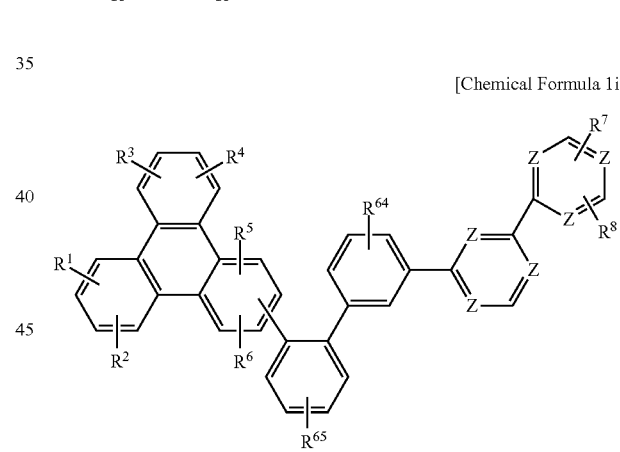

[Chemical Formula 1k]
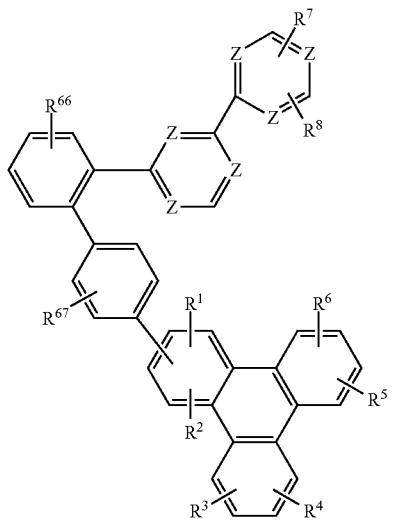
[Chemical Formula 1l]
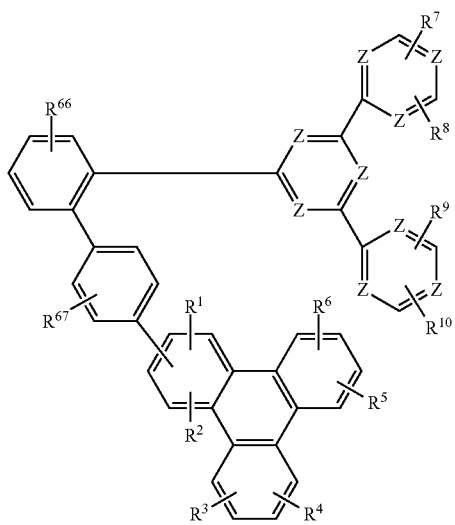
[Chemical Formula 1m]
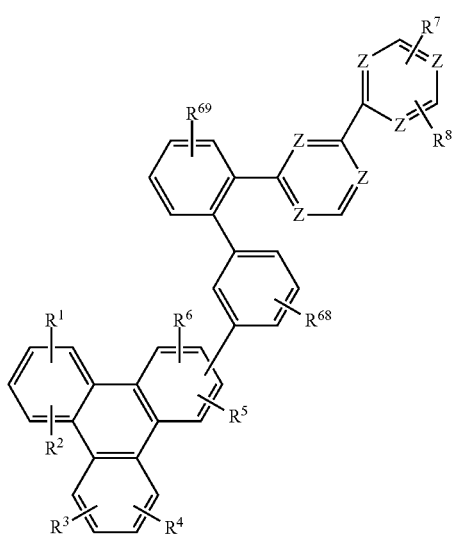
[Chemical Formula 1n]
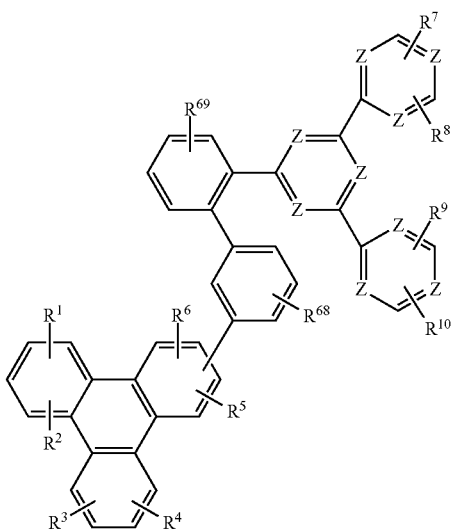
[Chemical Formula 1o]
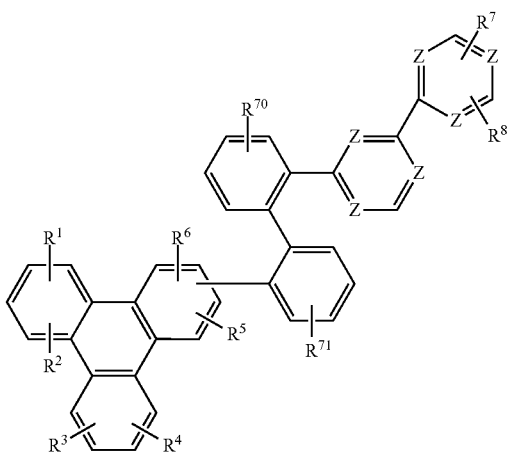
[Chemical Formula 1p]
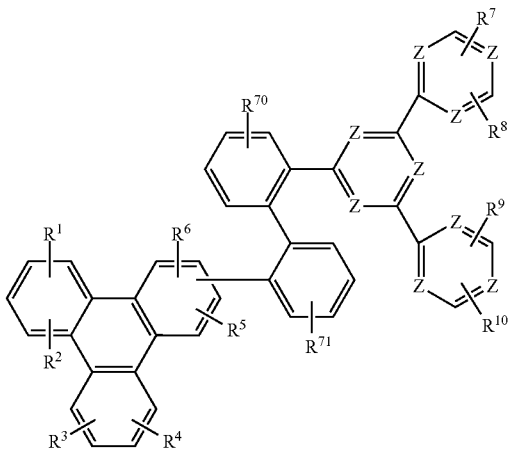

[Chemical Formula 1q]

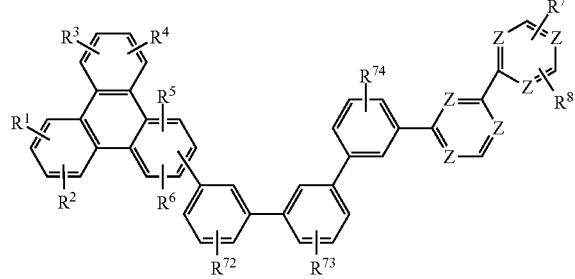

[Chemical Formula 1r]

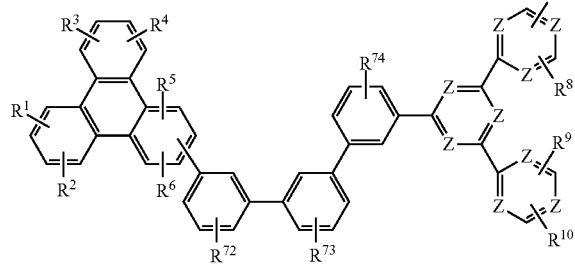

[Chemical Formula 1s]

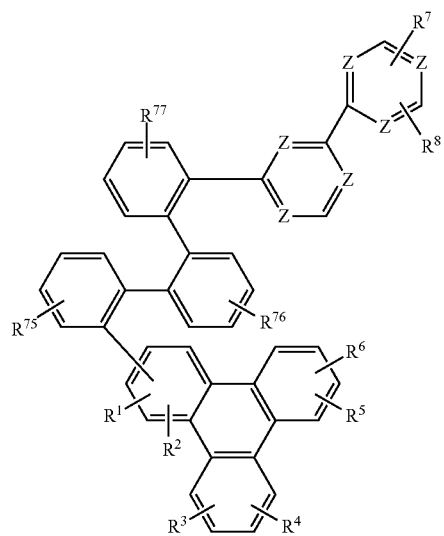

[Chemical Formula 1t]

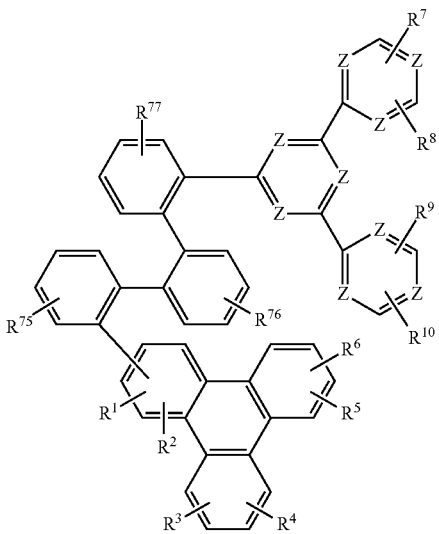

In Chemical Formulae 1c to 1t,

Z and $R^1$ to $R^{10}$ are the same as described above, $R^{60}$ to $R^{77}$ are independently hydrogen, deuterium, a substituted or unsubstituted C1 to C10 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heteroaryl group, a substituted or unsubstituted amine group, a substituted or unsubstituted C6 to C30 arylamine group, a substituted or unsubstituted C6 to C30 heteroarylamine group, a substituted or unsubstituted C1 to C30 alkoxy group, a halogen, a halogen-containing group, a cyano group, a hydroxyl group, an amino group, a nitro group, a carboxyl group, a ferrocenyl group or a combination thereof.

The first compound may be, for example compounds listed in Group 2, but is not limited thereto.

[Group 2]

A-1

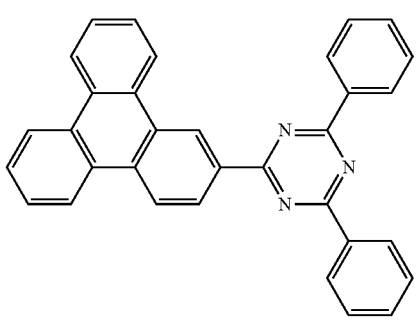

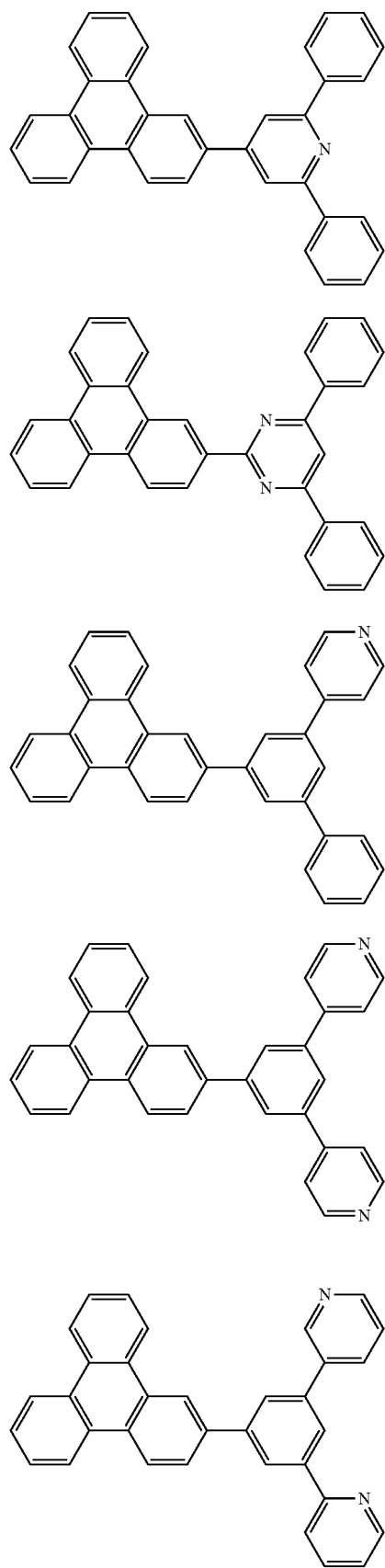
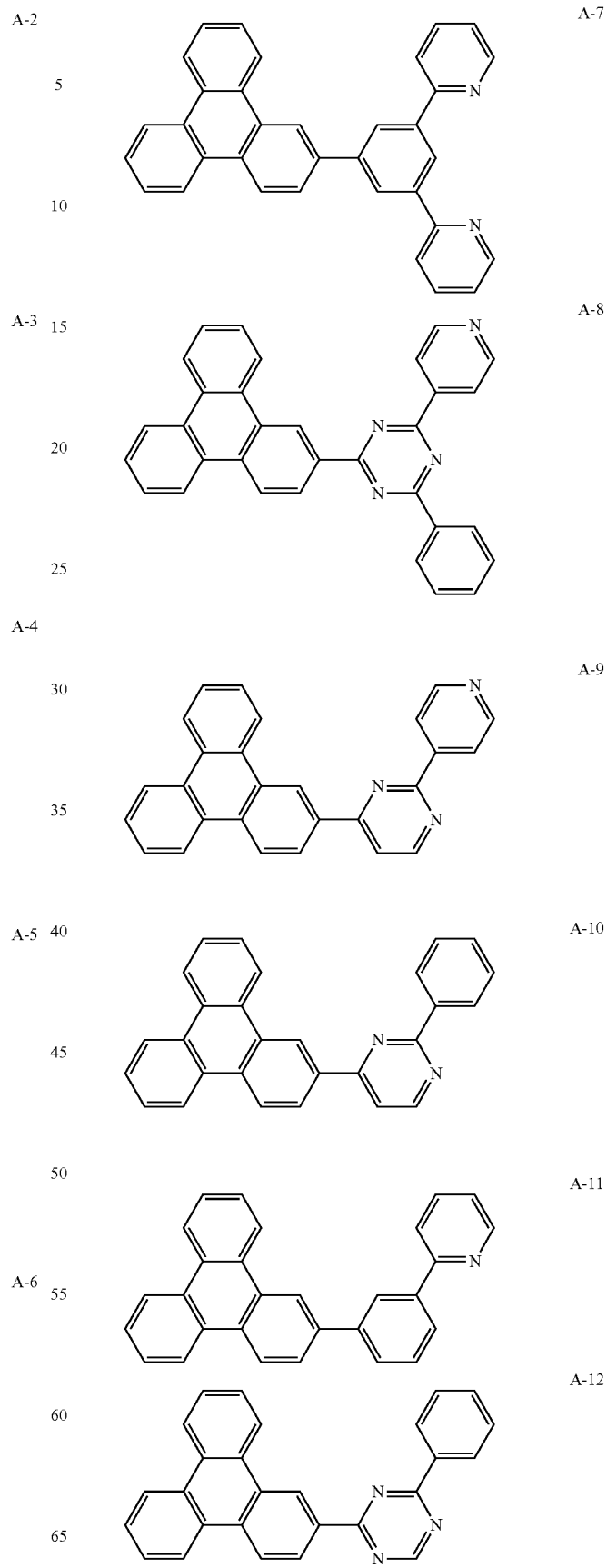

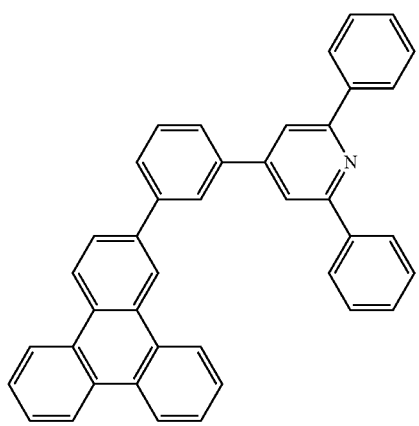
A-13
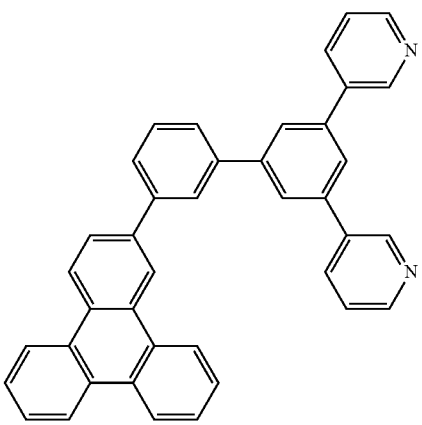
A-17
A-14
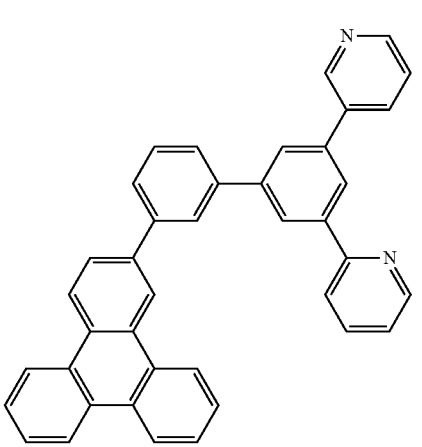
A-18
A-15
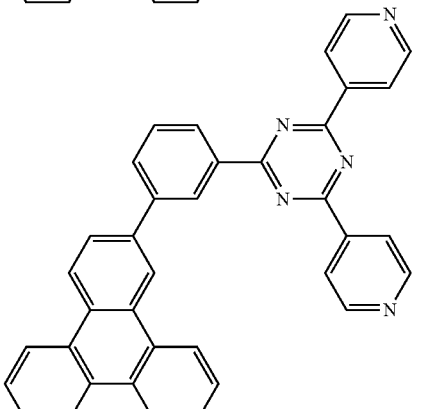
A-19
A-16
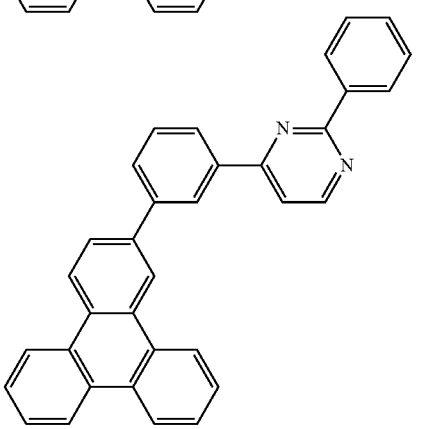
A-20

A-21 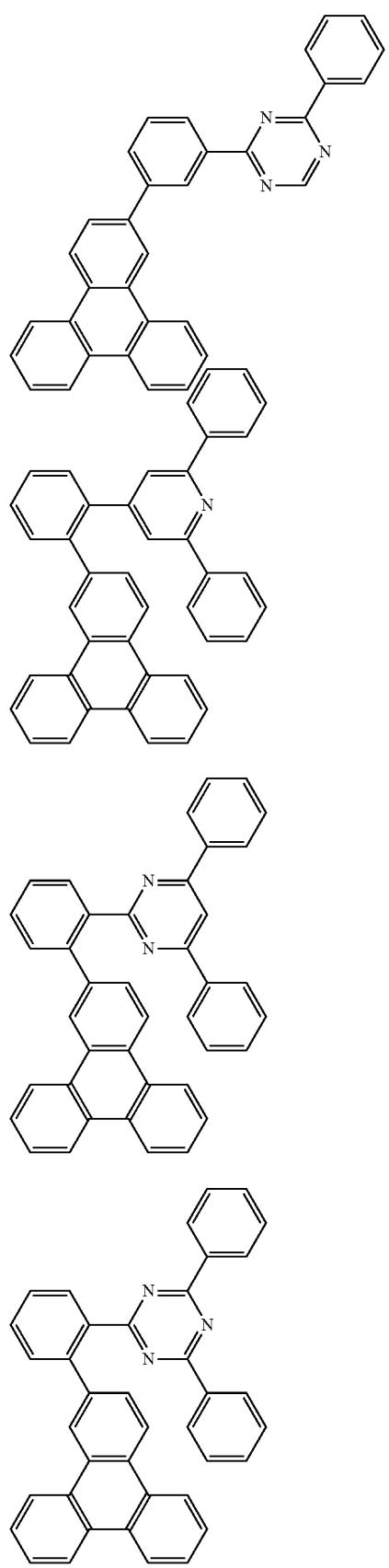
A-22
A-23
A-24
A-25 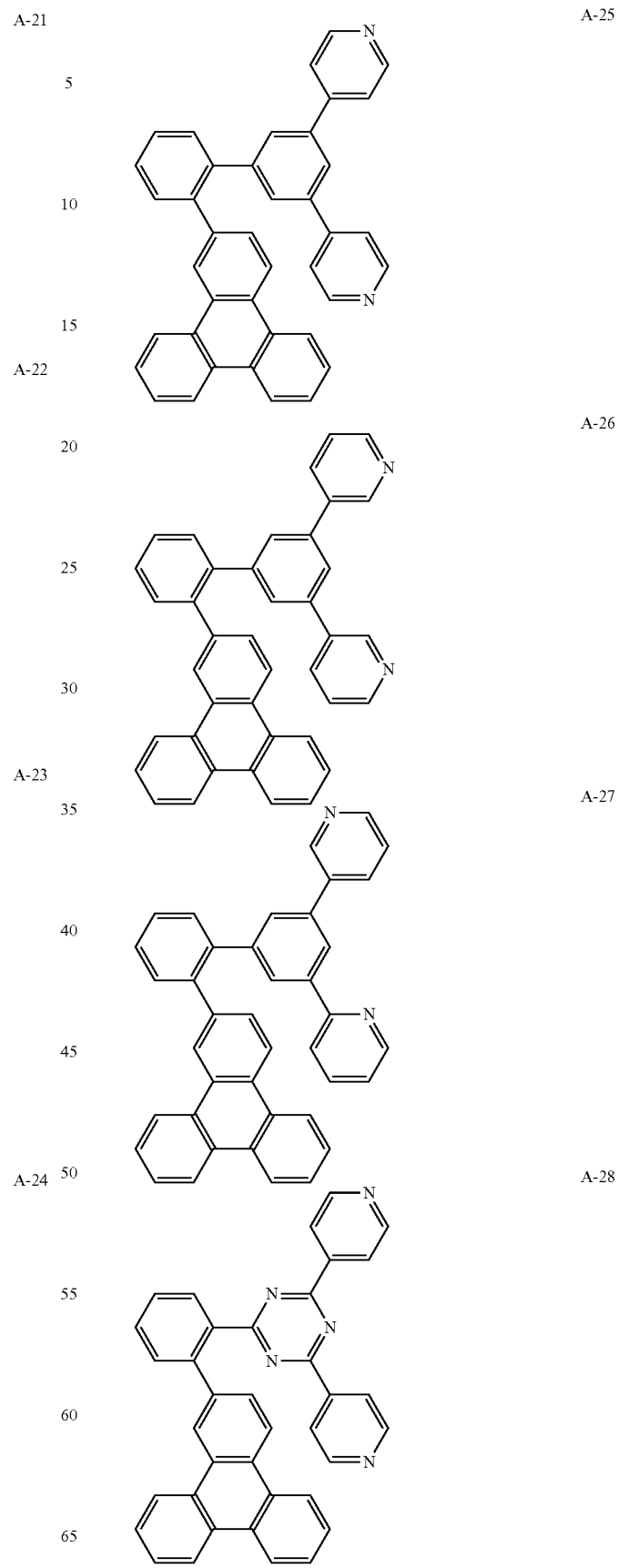
A-26
A-27
A-28

A-29
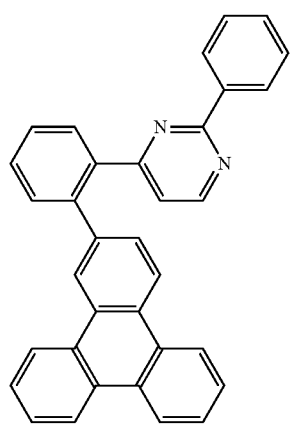
A-30
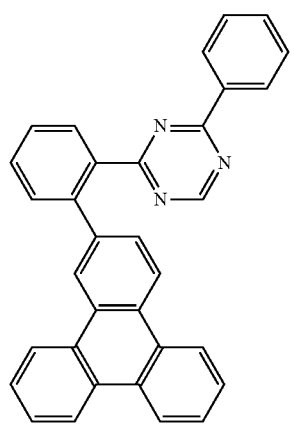
A-31
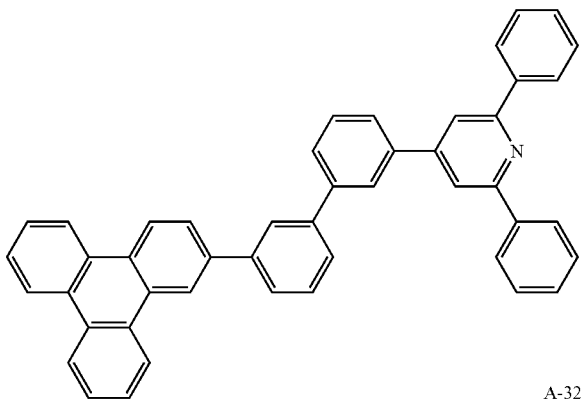
A-32
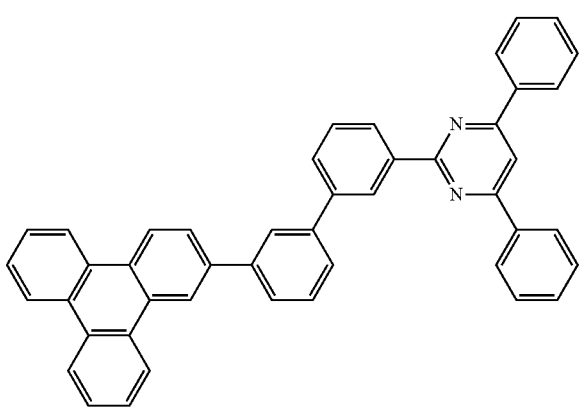
A-33
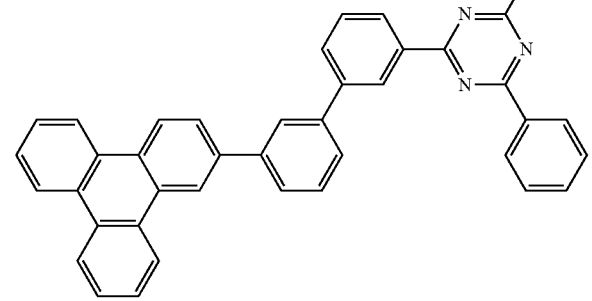
A-34
A-35
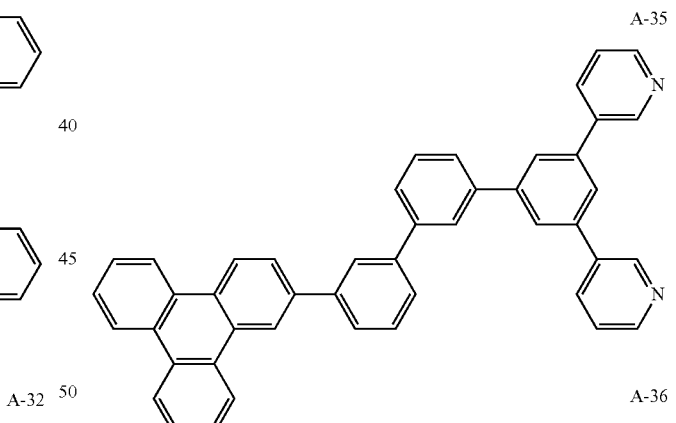
A-36

A-37
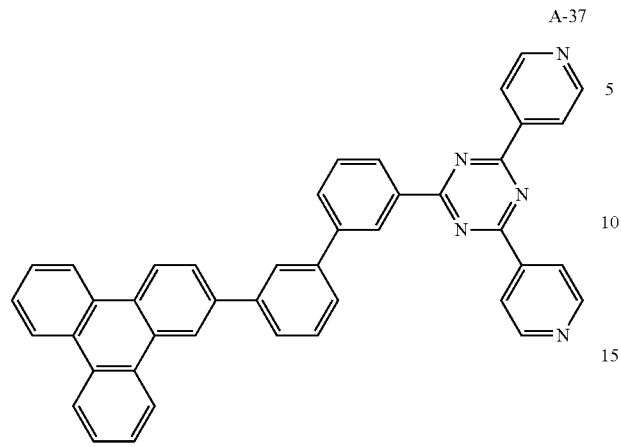
A-41
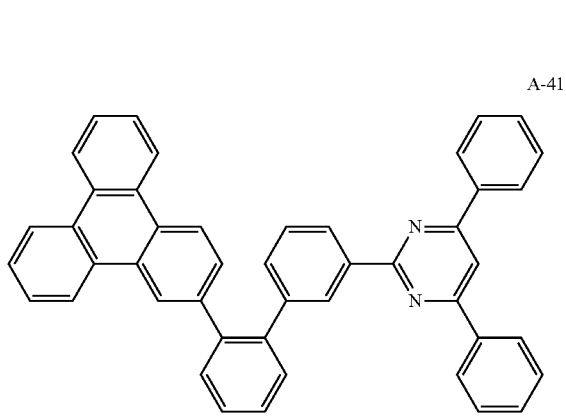
A-38
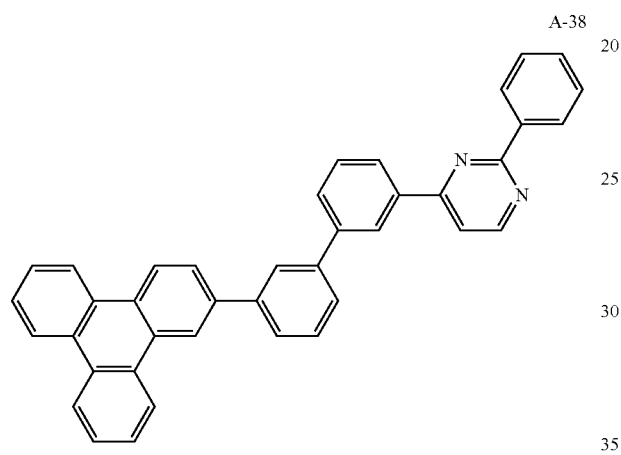
A-42
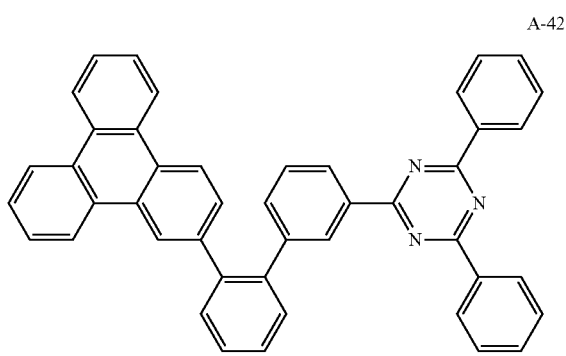
A-39
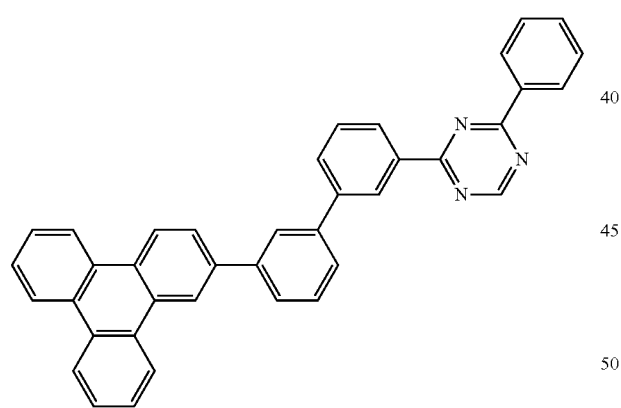
A-43
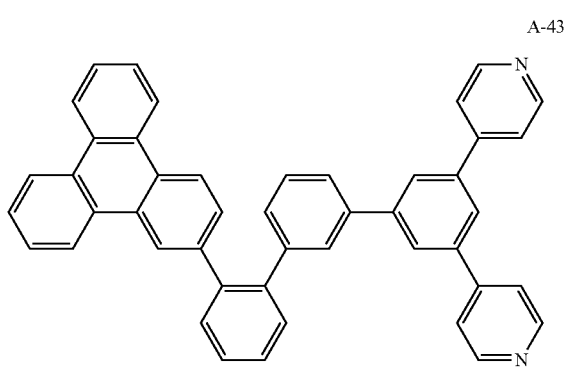
A-40
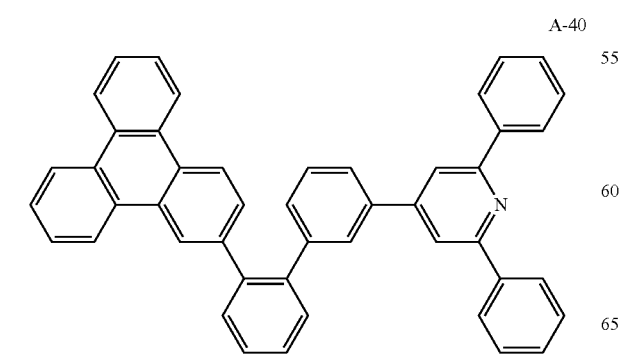
A-44
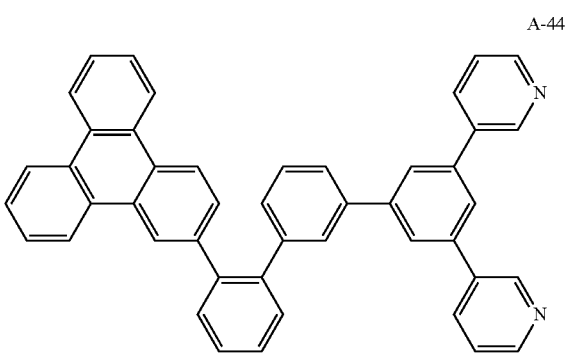

-continued
A-45
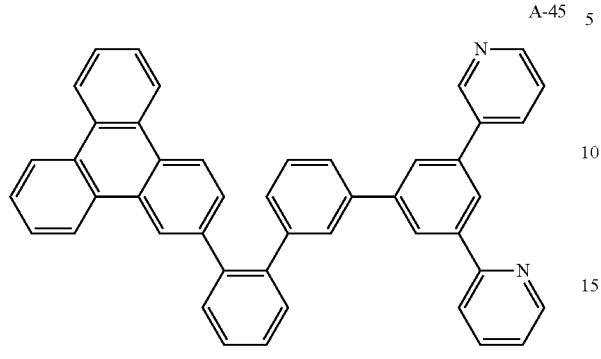
A-46
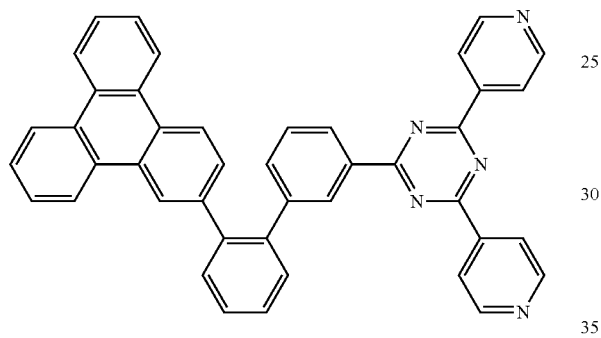
A-47
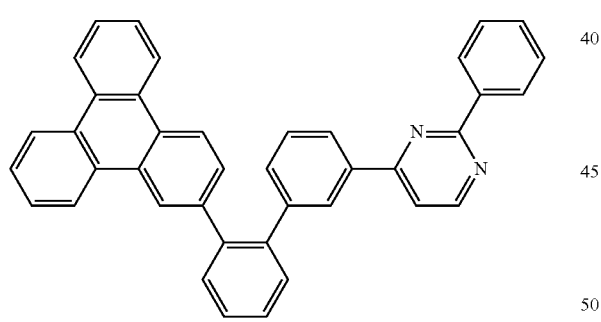
A-48
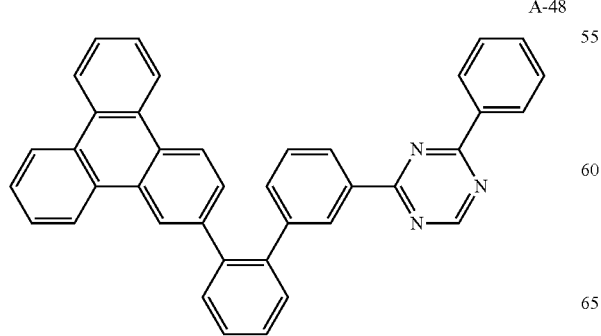
-continued
A-49
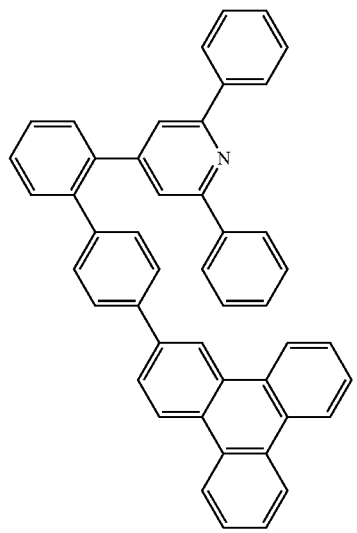
A-50
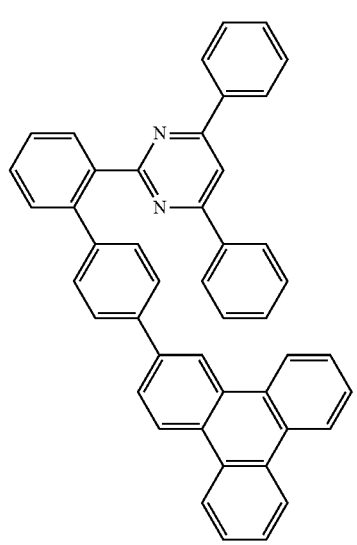
A-51
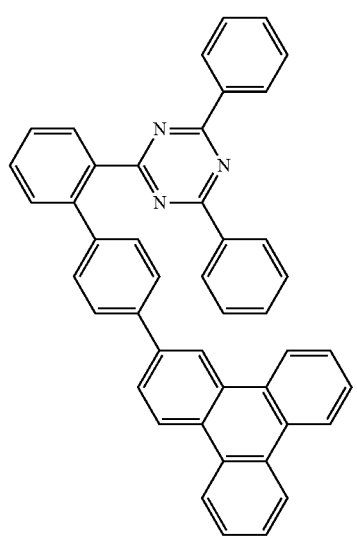

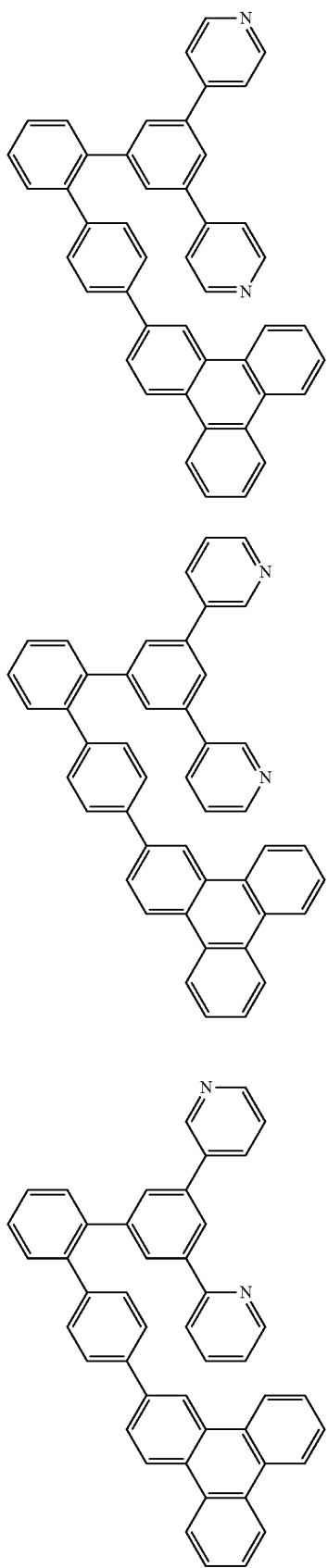
A-52
A-53
A-54
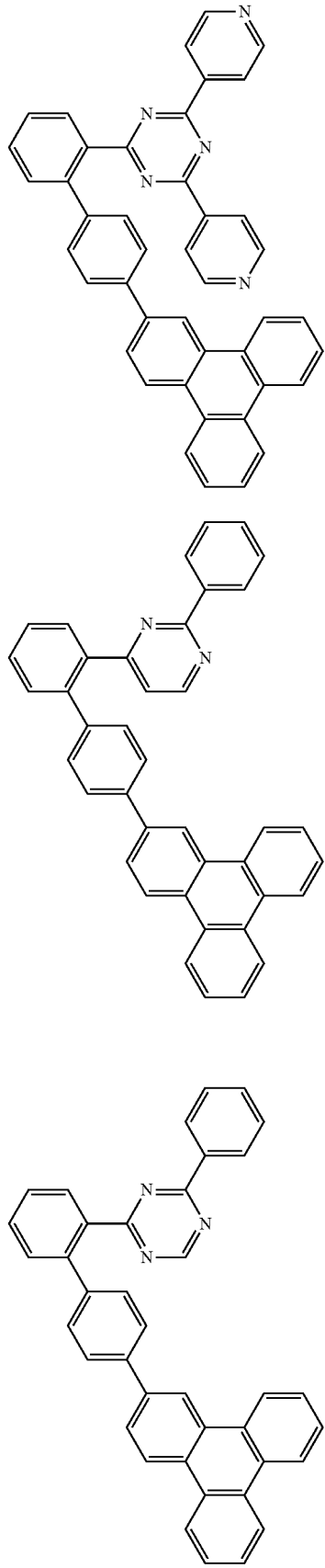
A-55
A-56
A-57

A-58
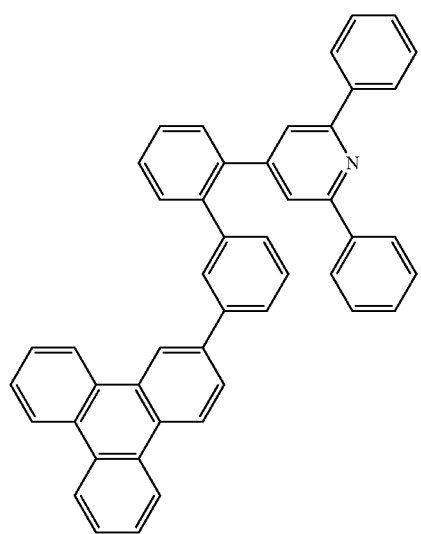
A-59
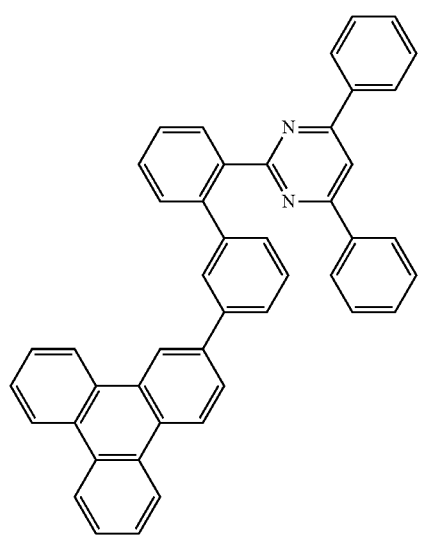
A-60
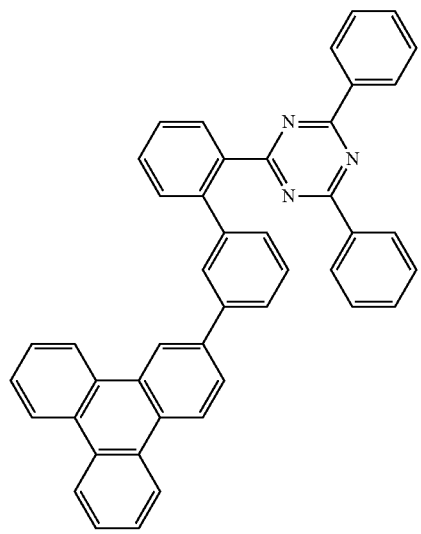
A-61
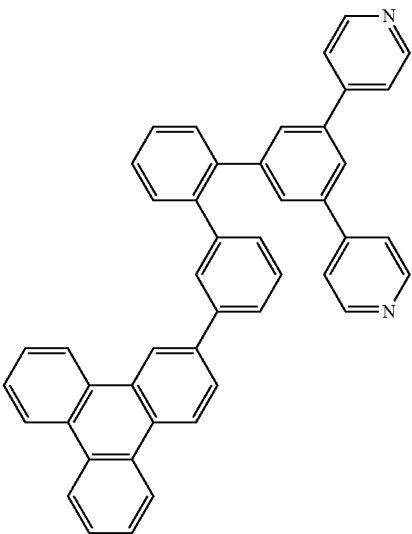
A-62
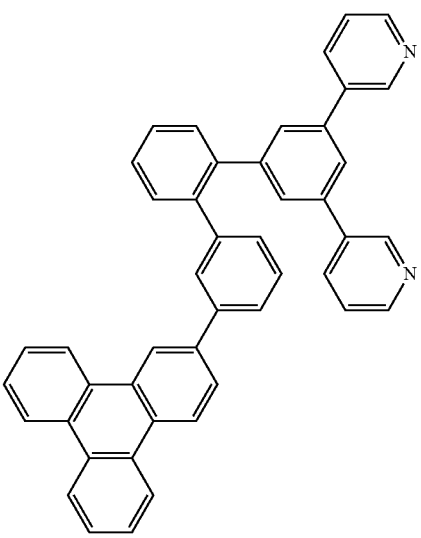
A-63
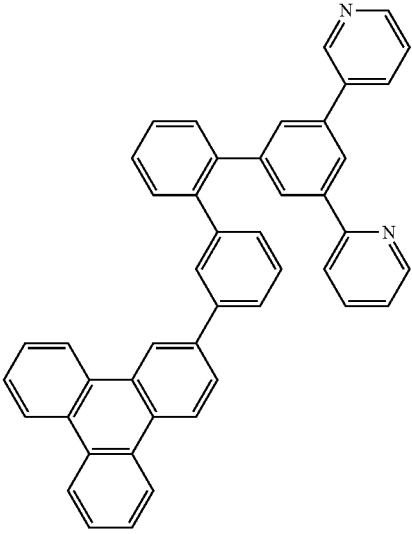

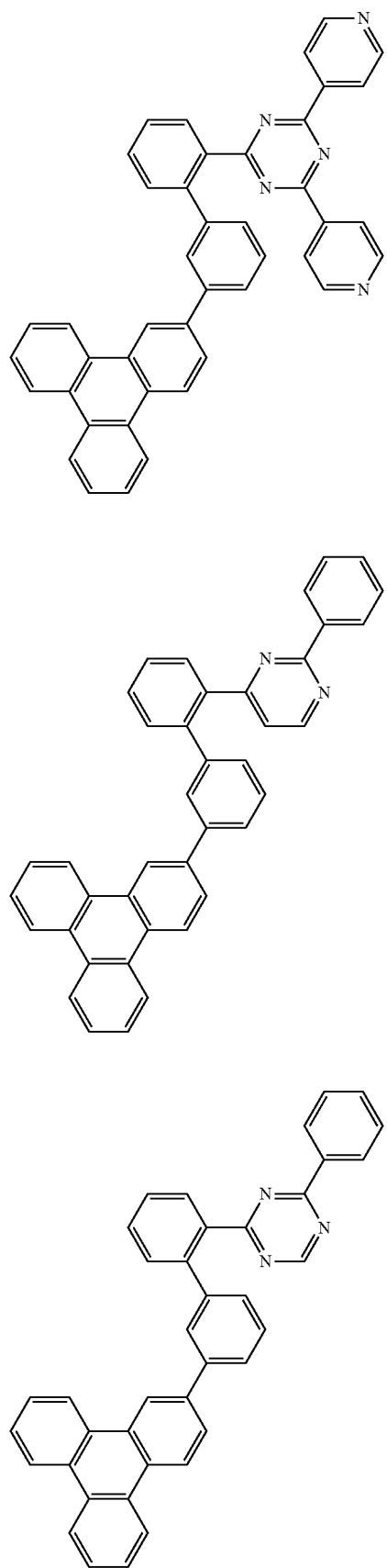
A-64
A-65
A-66
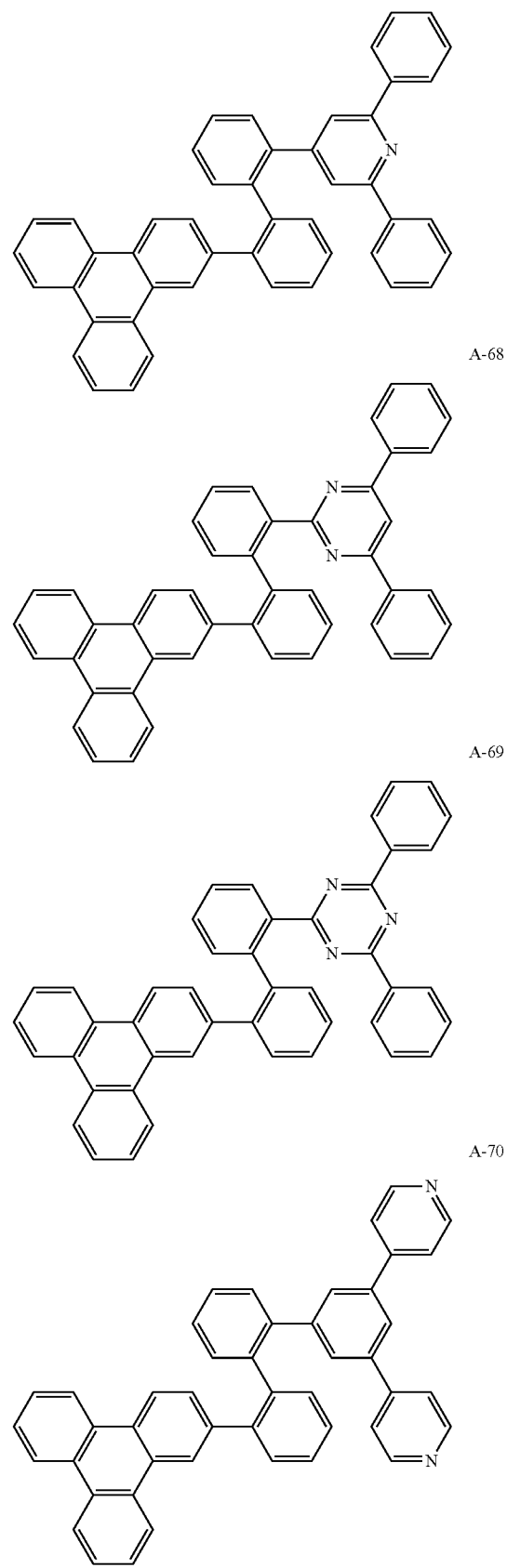
A-67
A-68
A-69
A-70

A-71
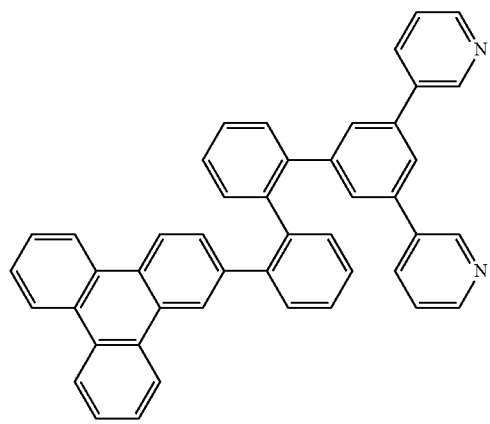
A-72
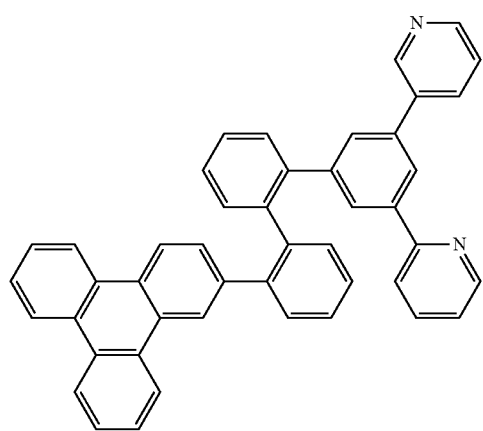
A-73
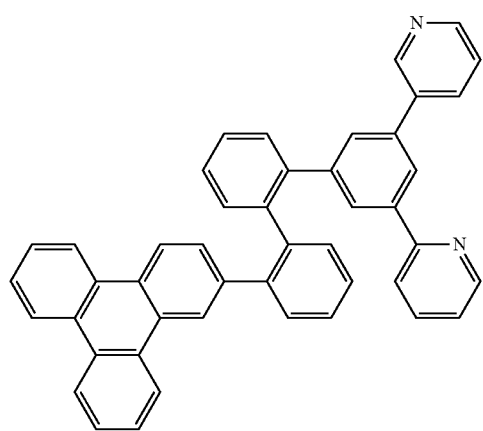
A-74
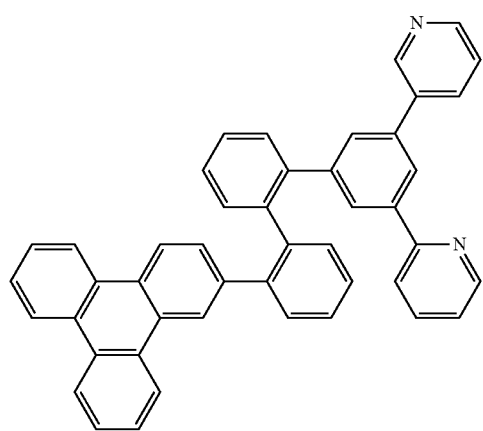
A-75
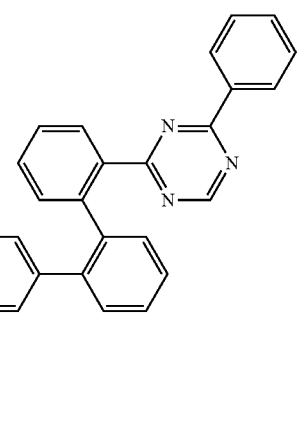
A-76
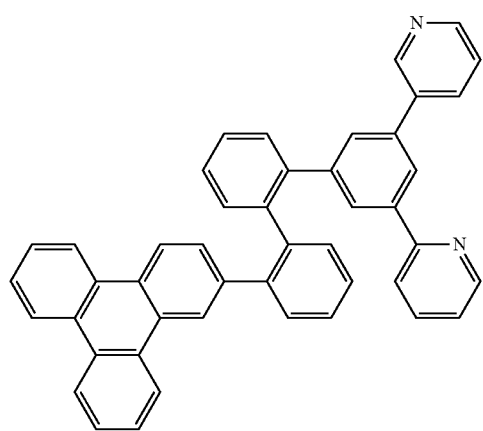
A-77
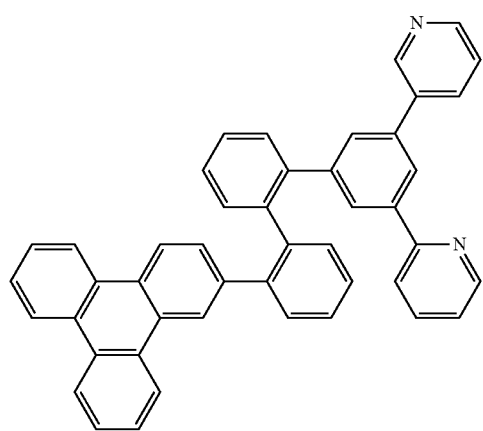
A-78
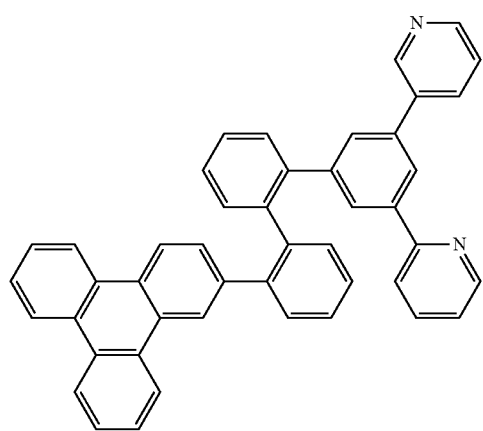
A-79
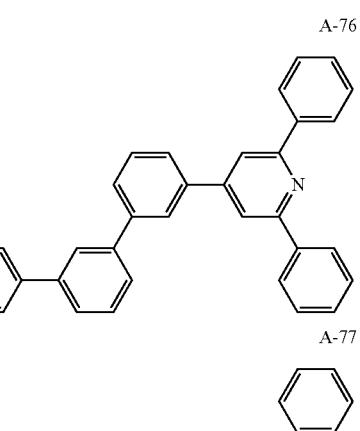

A-80
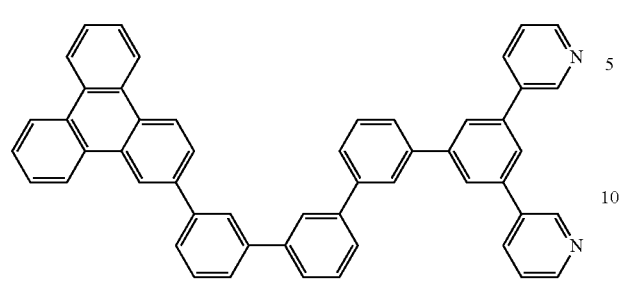
A-81
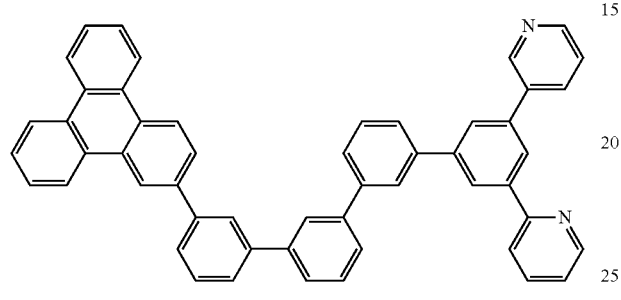
A-82
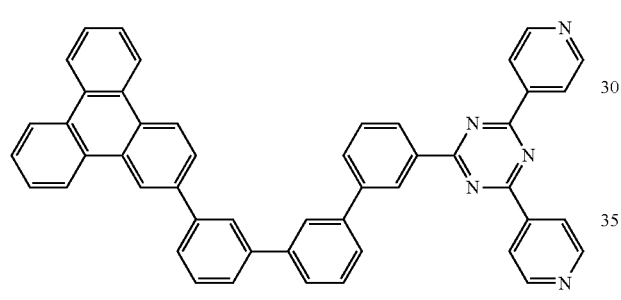
A-83
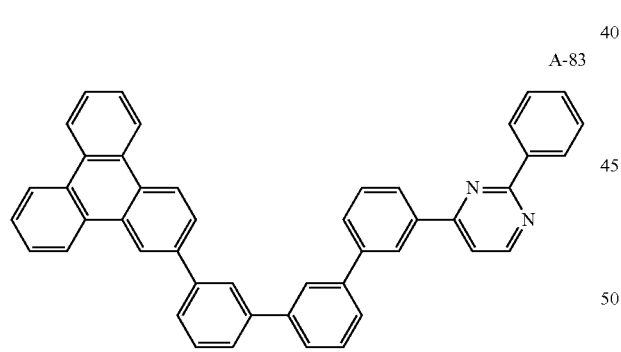
A-84
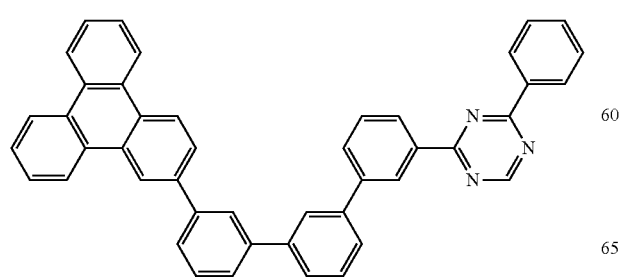
A-85
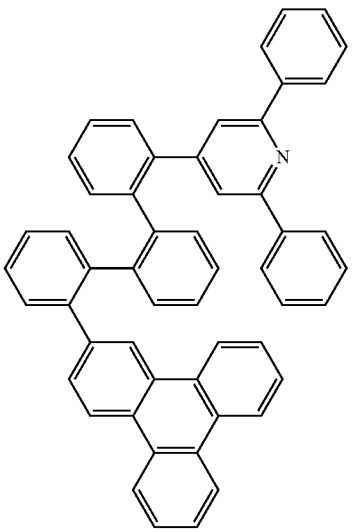
A-86
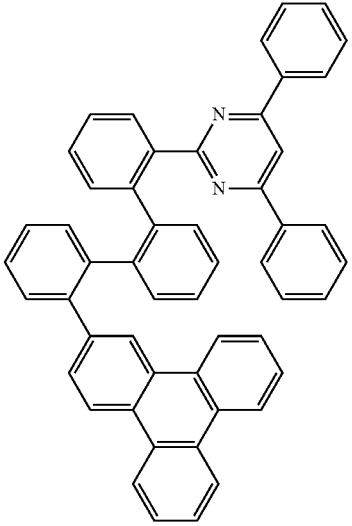
A-87
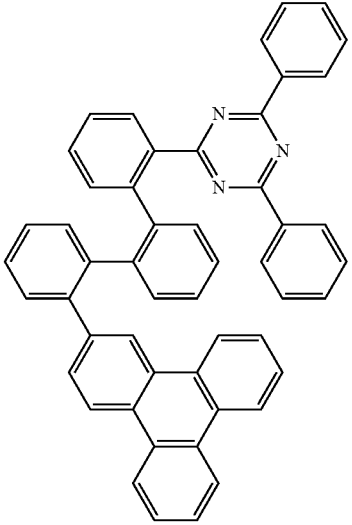

A-88
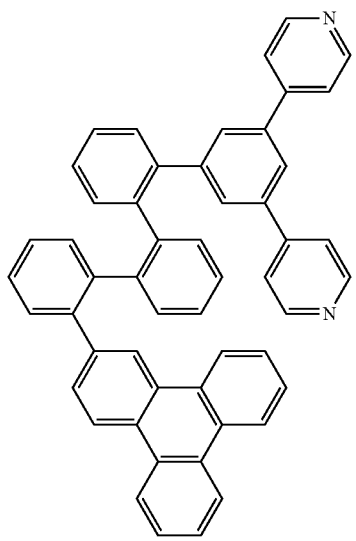
A-89
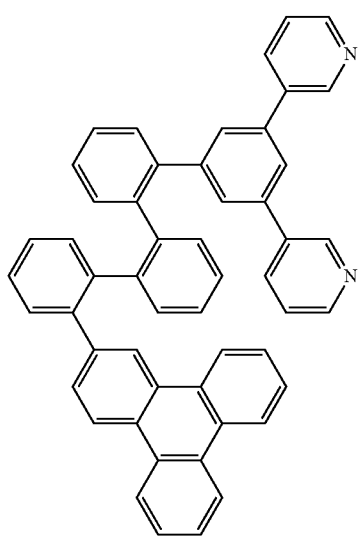
A-90
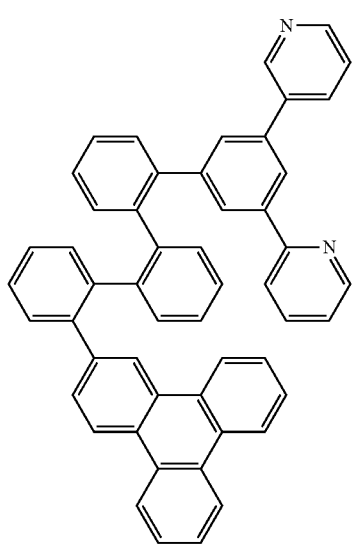
A-91
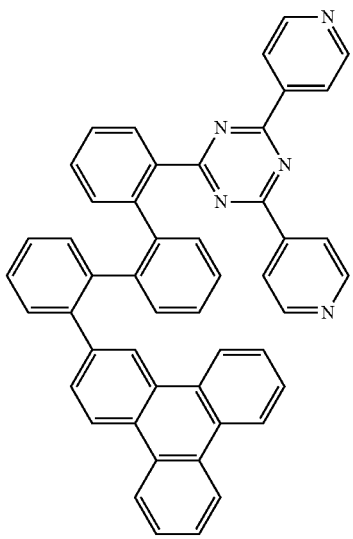
A-92
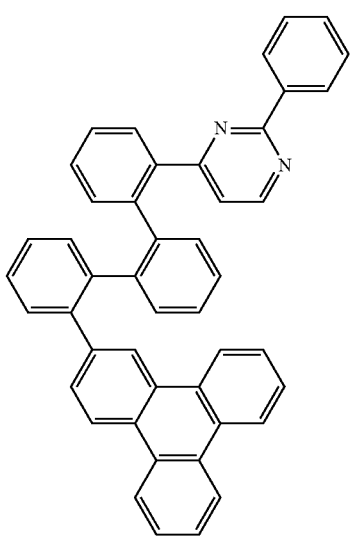
A-93
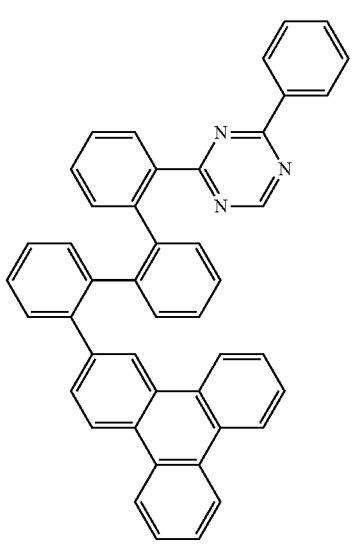

A-94
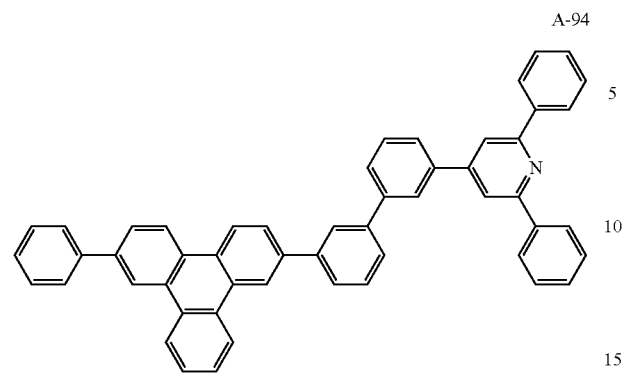
A-95
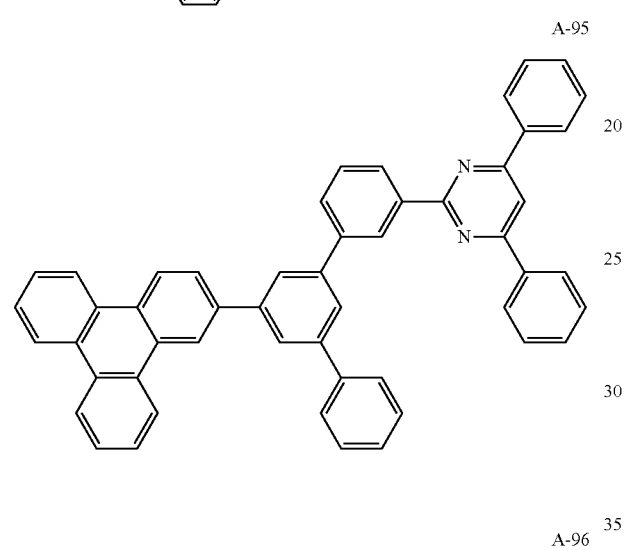
A-96
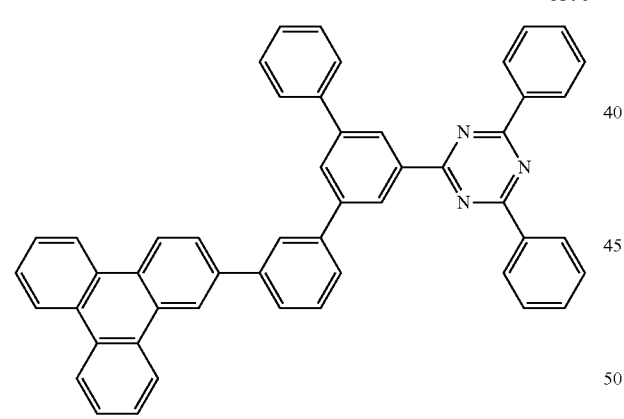
A-97
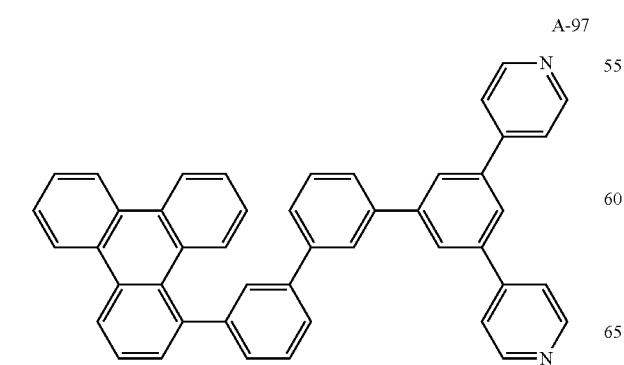
A-98
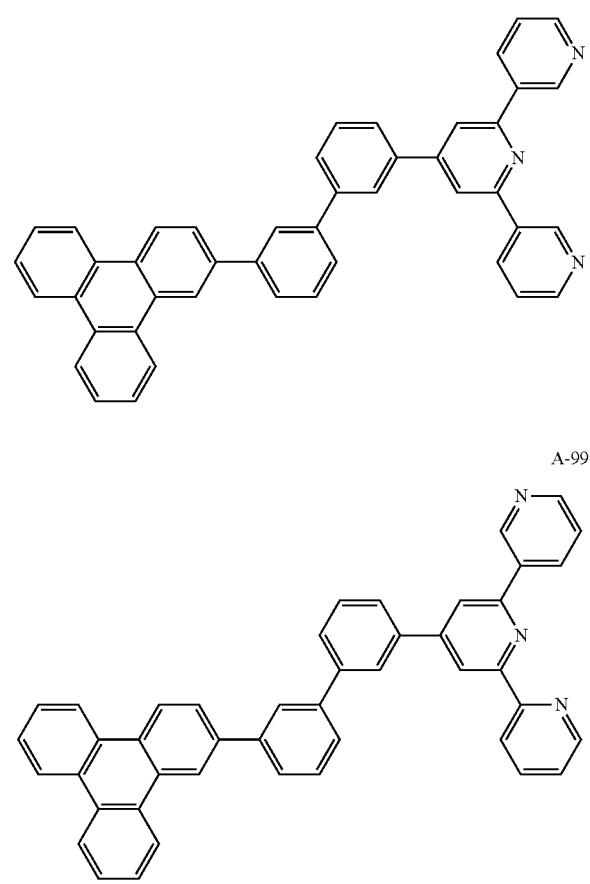
A-99
A-100
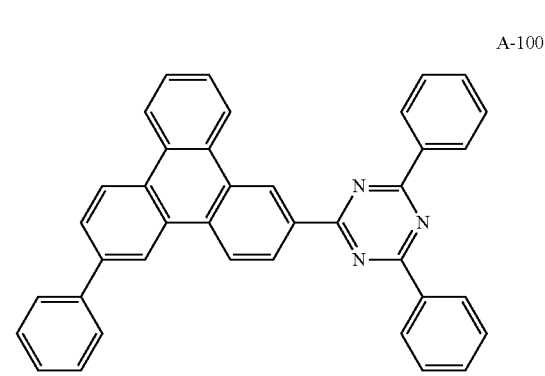
A-101
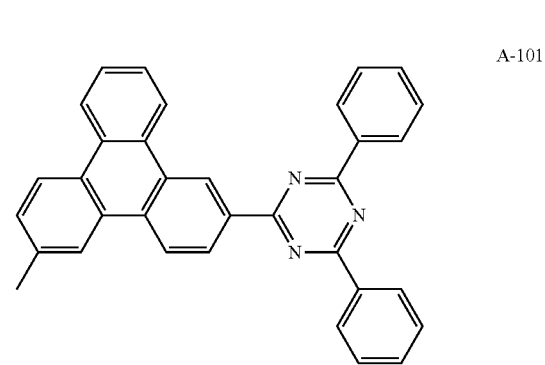

A-102
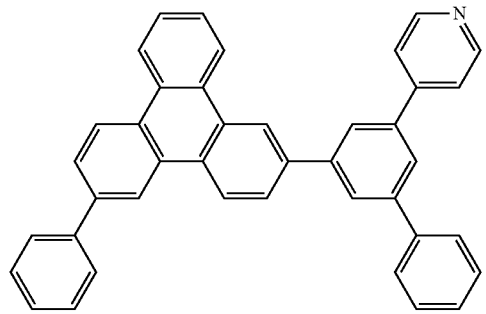
A-106
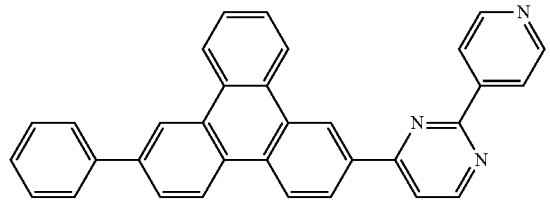
A-103
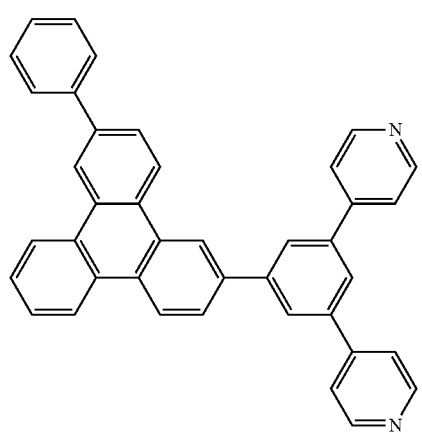
A-107
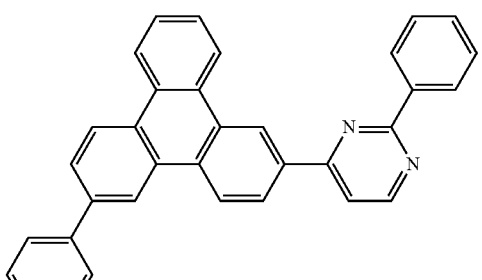
A-104
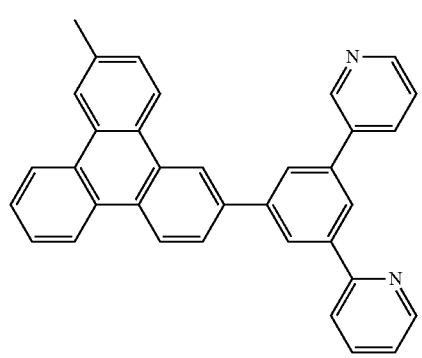
A-108
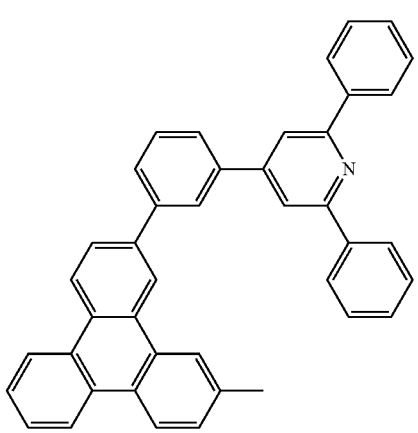
A-105
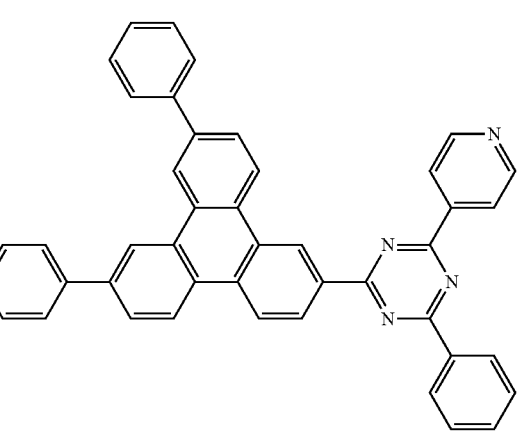
A-109
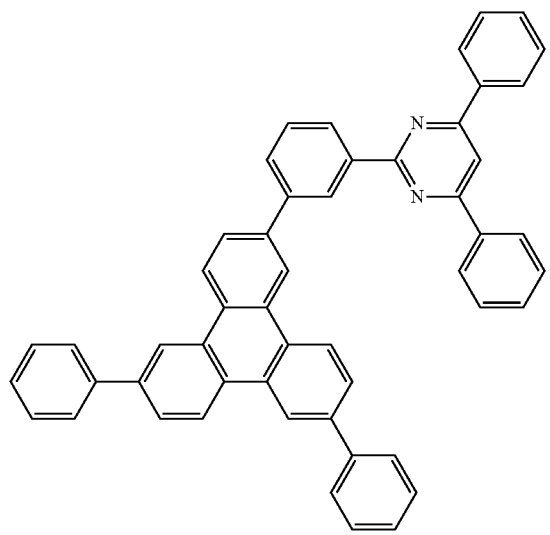

A-110

A-111

A-112

A-113

A-114

A-115

-continued
A-116
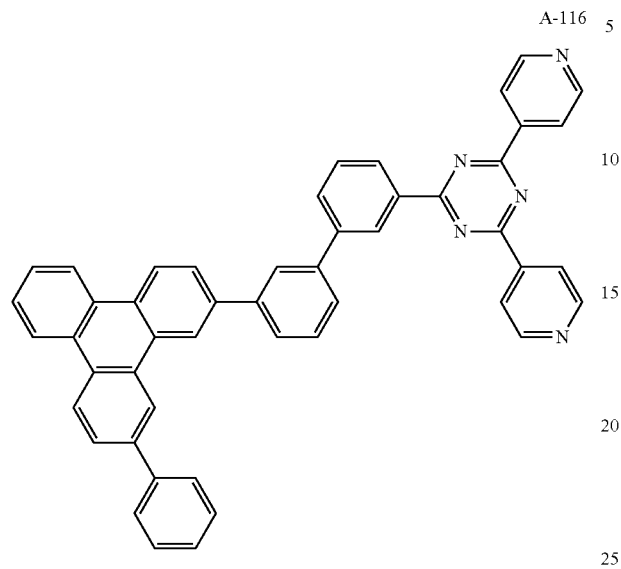
A-117
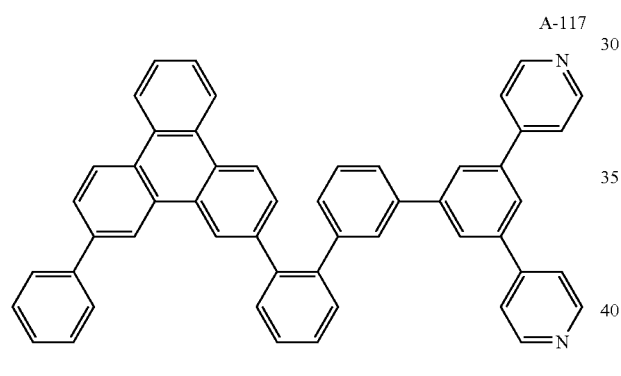
A-118
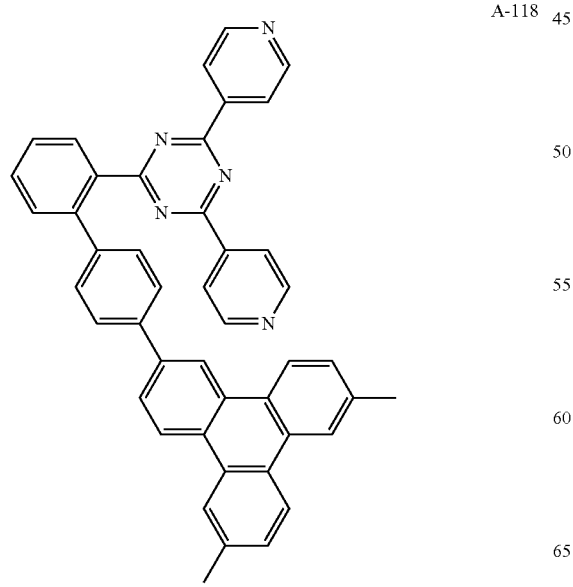
-continued
A-119
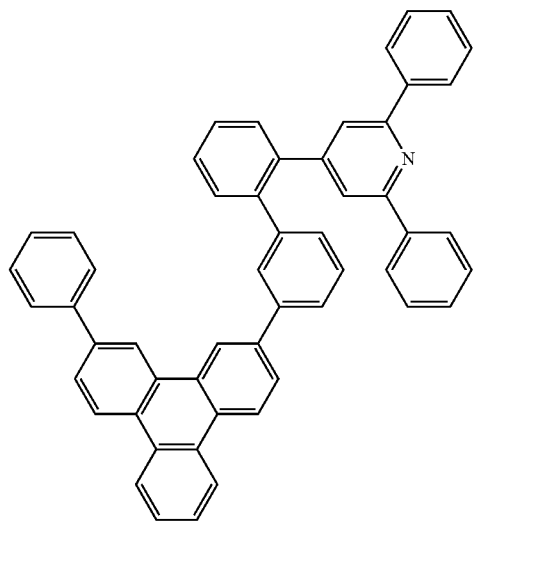
A-120
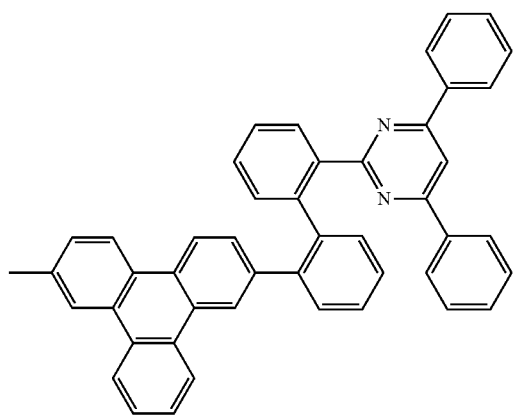
A-121
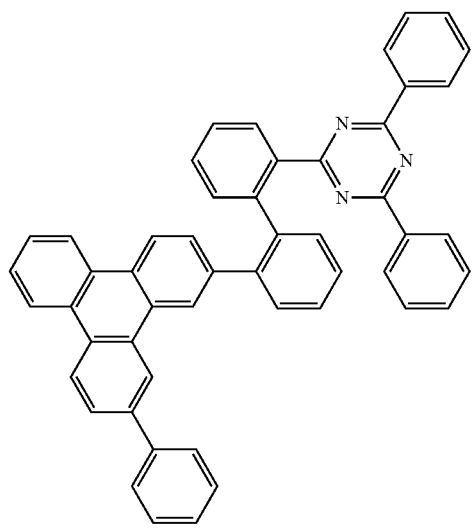

-continued

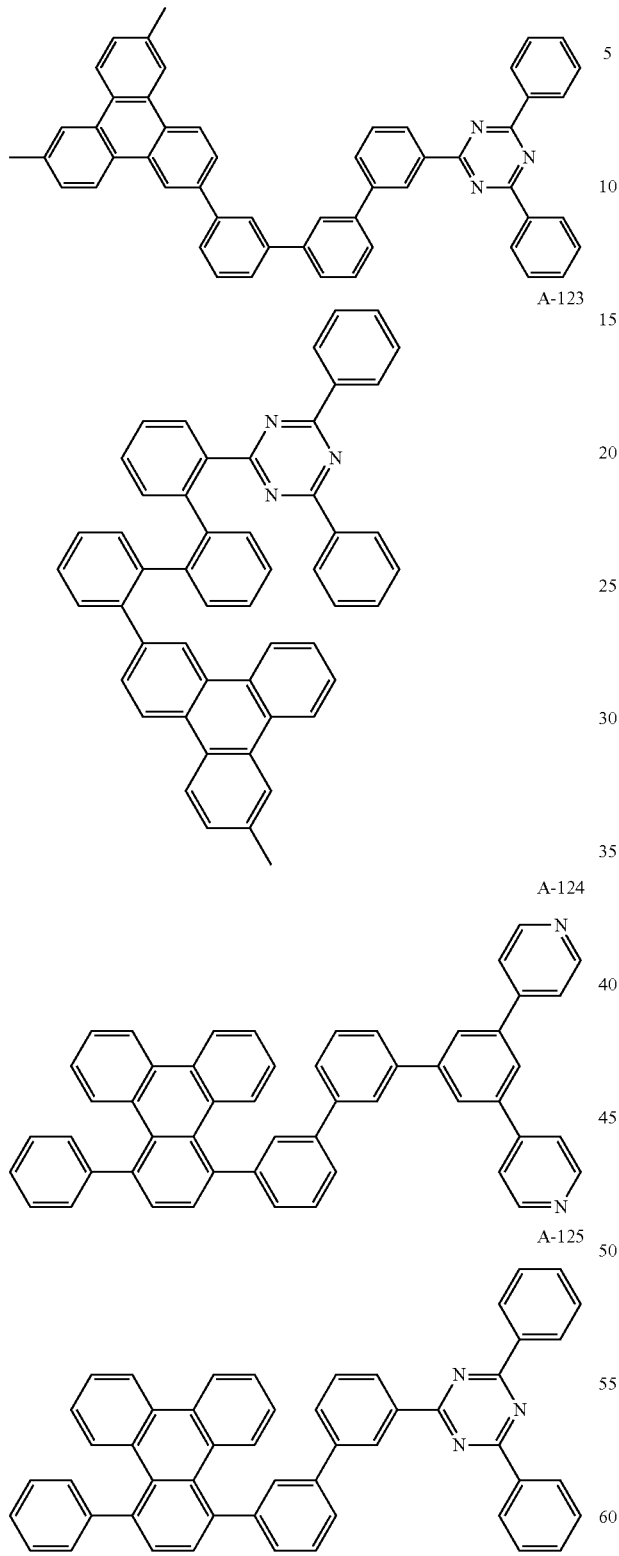

The electron transport auxiliary layer may include at least one kind of the first compound, or may include a third compound having relatively strong hole characteristics with the first compound.

The third compound may be, for example represented by the following Chemical Formula 3.

[Chemical Formula 3]

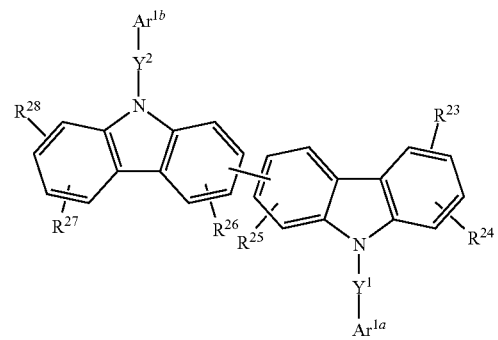

In Chemical Formula 3, $Y^1$ and $Y^2$ are each independently a single bond, a substituted or unsubstituted C6 to C30 arylene group, a substituted or unsubstituted C2 to C30 heteroarylene group, or a combination thereof, $Ar^{1a}$ and $Ar^{1b}$ is a substituted or unsubstituted C6 to C30 aryl group, a substituted or unsubstituted C2 to C30 heteroaryl group, or a combination thereof, and $R^{23}$ to $R^{28}$ are each independently hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof.

The compound represented by Chemical Formula 3 has relatively strong hole characteristics and thus, may adjust the injection amount of electrons of the first compound in an electron transport auxiliary layer, when included with the first compound in the electron transport auxiliary layer, and also, prevent accumulation of holes on the interface of the emission layer and the electron transport auxiliary layer, and thus, increase stability of an organic optoelectric device and remarkably improve luminous efficiency and life-span characteristics of an organic optoelectric device.

The third compound may be, for example represented by at least one of Chemical Formula 3-I to 3-VIII according to a bonding position of bicarbazole.

[Chemical Formula 3-I]

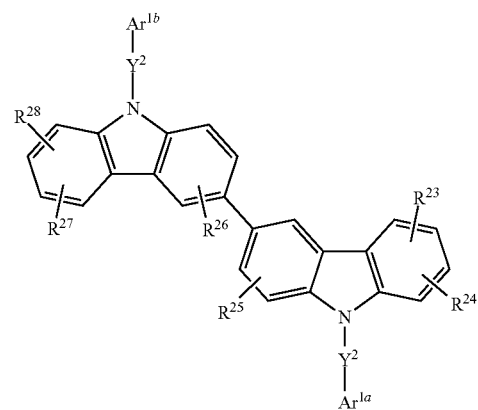

[Chemical Formula 3-II]

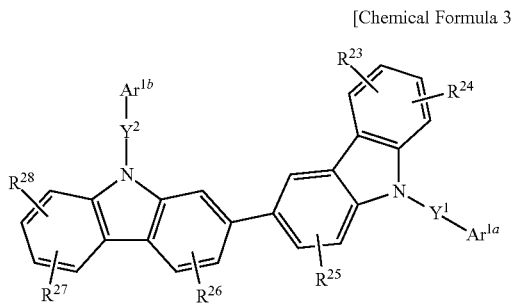

[Chemical Formula 3-III]

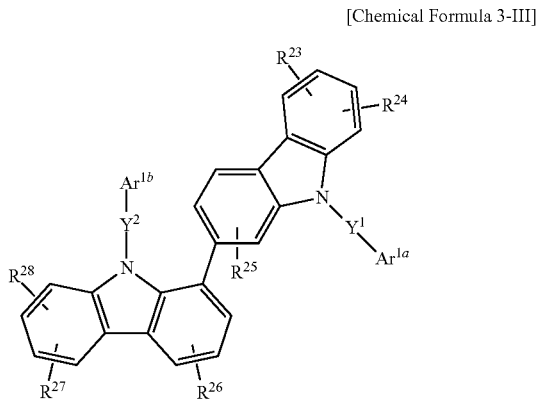

[Chemical Formula 3-IV]

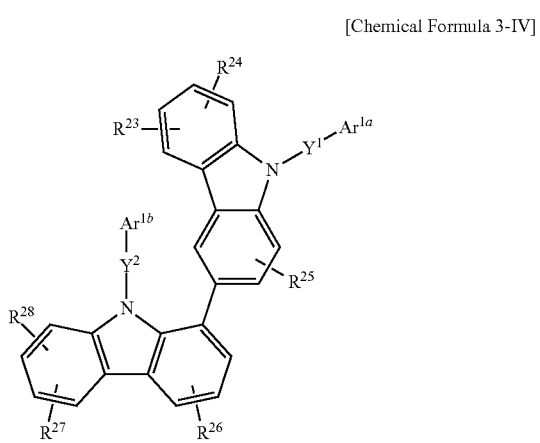

[Chemical Formula 3-V]

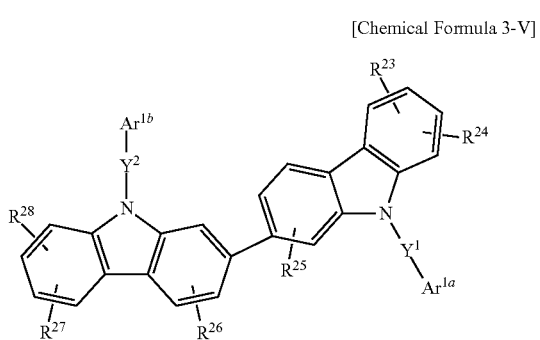

[Chemical Formula 3-VI]

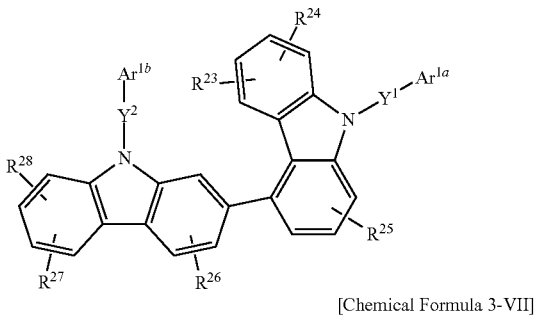

[Chemical Formula 3-VII]

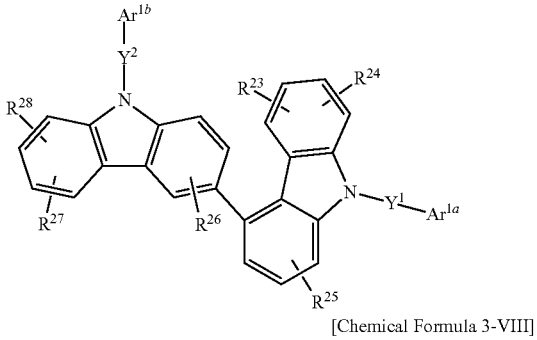

[Chemical Formula 3-VIII]

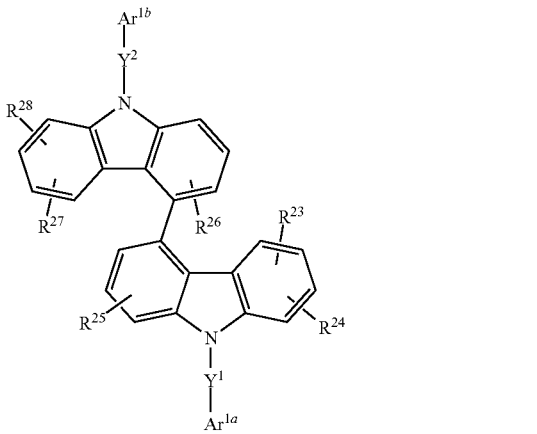

In Chemical Formulae 3-I to 3-VIII,
$Y^1$ and $Y^2$, $Ar^{1a}$ and $Ar^{1b}$, $R^{23}$ to $R^{28}$ are the same as described above.

The third compound has a structure where two carbazolyl groups having substituents are linked to each other.

$Ar^{1a}$ and $Ar^{1b}$ of the third compound have a hole or a substituent having electron characteristics, and are for example each independently a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted carbazolyl group, a substituted or unsubstituted benzofuranyl group, a substituted or unsubstituted benzothiophenyl group, a substituted or unsubstituted fluorenyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted triphenylene group, a substituted or unsubstituted dibenzofuranyl group, a substituted or unsubstituted dibenzothiophenyl group, or a combination thereof.

The third compound may be, for example represented by at least one of Chemical Formula 3-IX to Chemical Formula 3-XI according to characteristics of $Ar^{1a}$ and $Ar^{1b}$.

[Chemical Formula 3-IX]

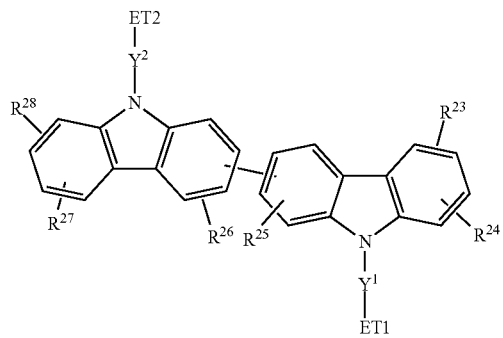

[Chemical Formula 3-X]

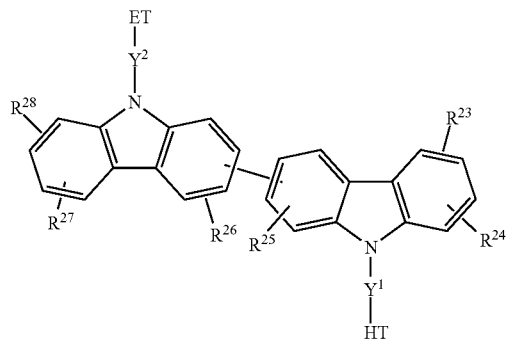

[Chemical Formula 3-XI]

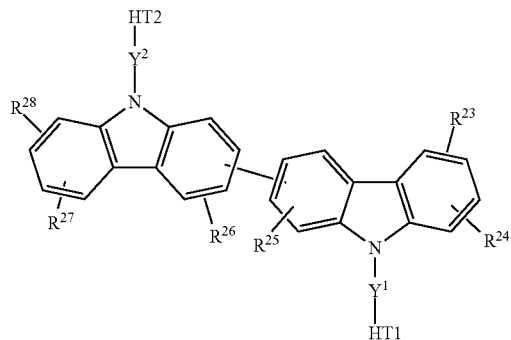

In Chemical Formulae 3-IX to 3-XI, $Y^1$ and $Y^2$ and $R^{23}$ to $R^{28}$ are the same as described above, ET, ET1 and ET2 are each independently a substituent having electron characteristics, and HT, HT1 and HT2 are each independently a substituent having hole characteristics. $Ar^{1a}$ and $Ar^{1b}$ of the third compound are substituents having electron characteristics and "ET", "ET1" and "ET2" are for example substituents represented by Chemical Formula A.

[Chemical Formula A]

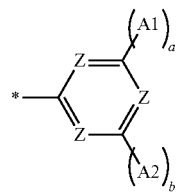

In Chemical Formula A,

Z is each independently N or $CR^d$,

A1 and A2 and $R^d$ are each independently a substituted or unsubstituted C6 to C30 aryl group, a substituted or unsubstituted C2 to C30 heteroaryl group, or a combination thereof, at least one of the Z, A1 and A2 includes N, a and b are each independently 0 or 1, and

* is a linking point.

The substituent represented by Chemical Formula A may be, for example functional groups listed in Group 3.

[Group 3]

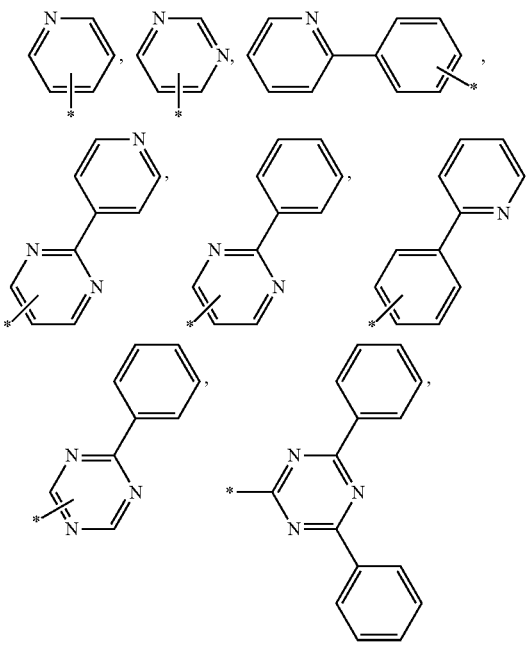

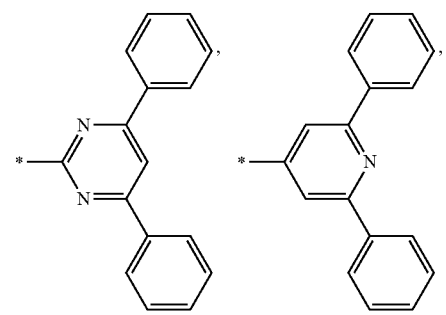

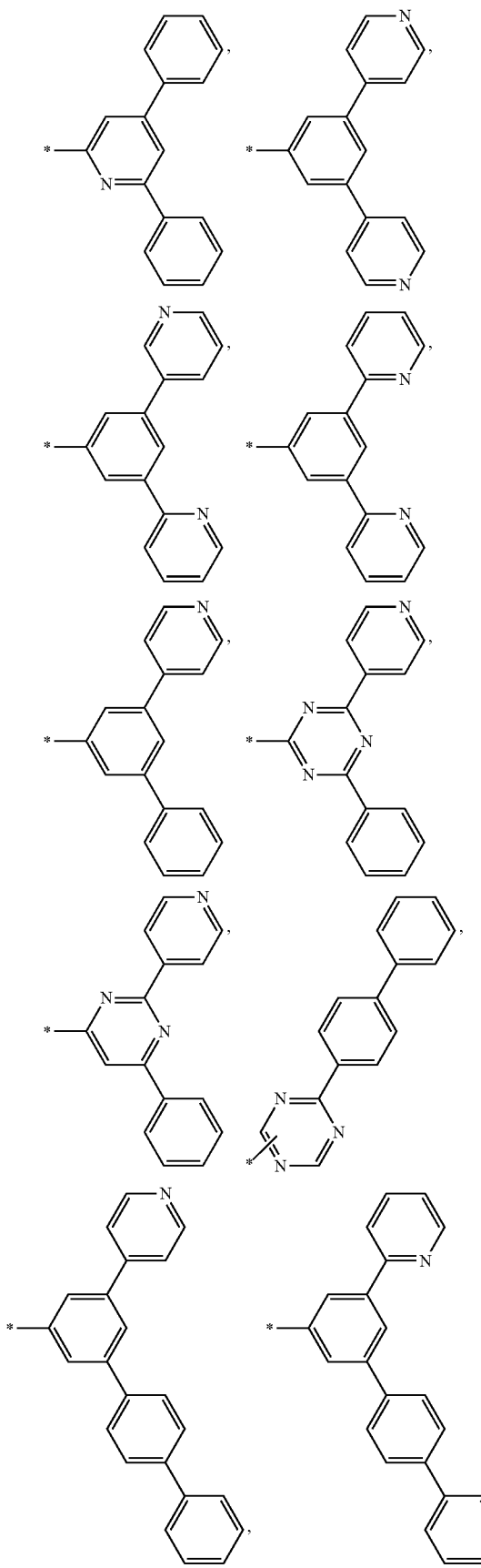
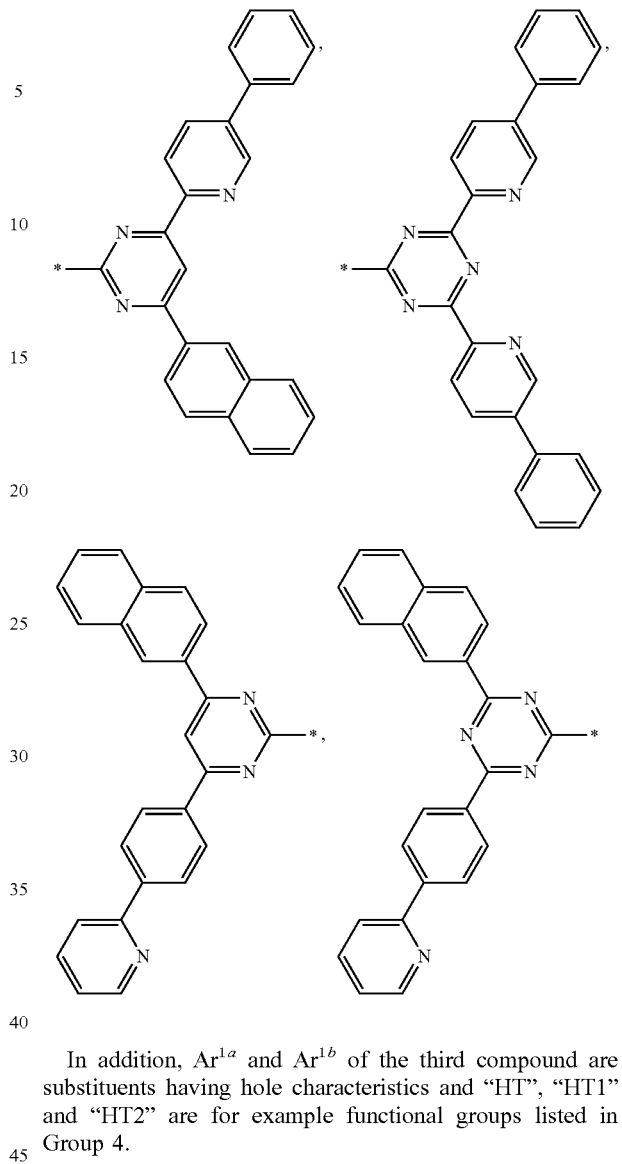
In addition, Ar$^{1a}$ and Ar$^{1b}$ of the third compound are substituents having hole characteristics and "HT", "HT1" and "HT2" are for example functional groups listed in Group 4.
[Group 4]
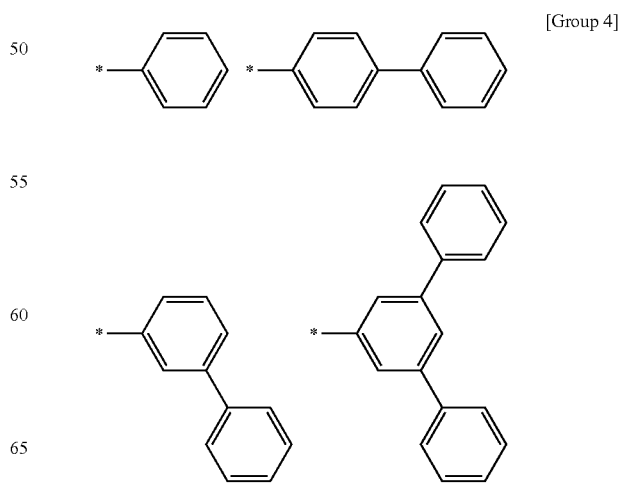

-continued
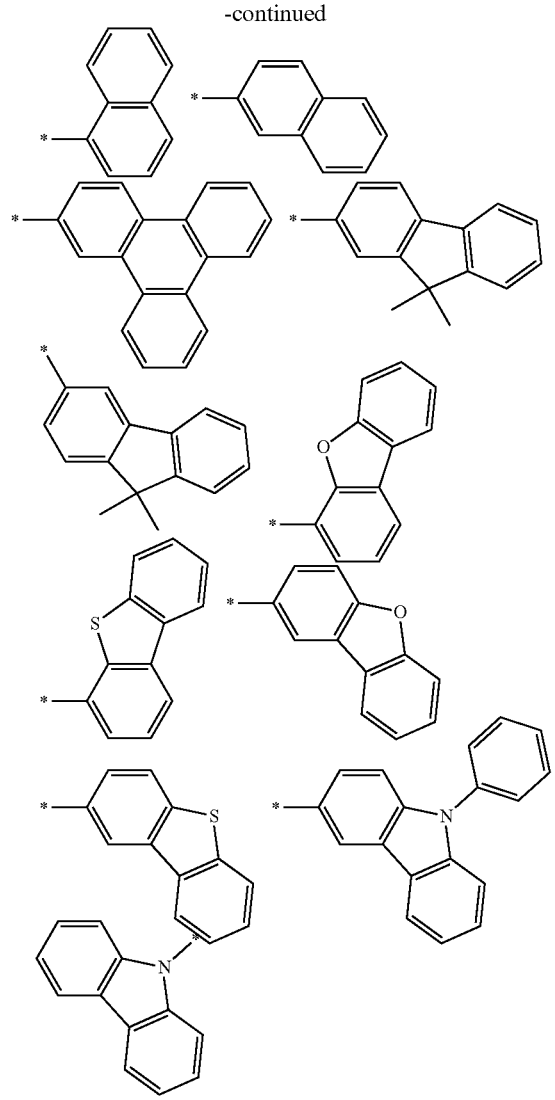
The third compound may be, for example selected from compounds listed in Group 5, but is not limited thereto.
[Group 5]
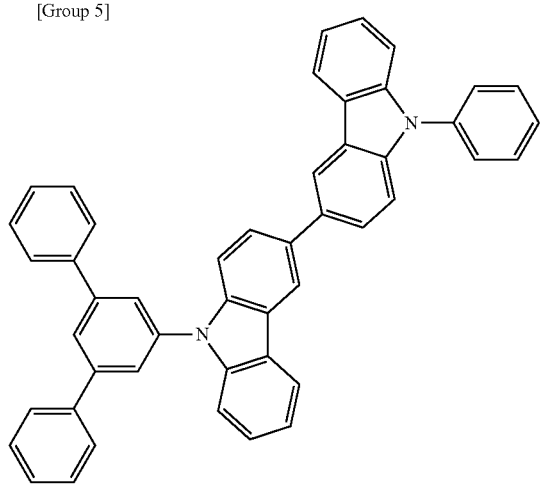
B-10
-continued
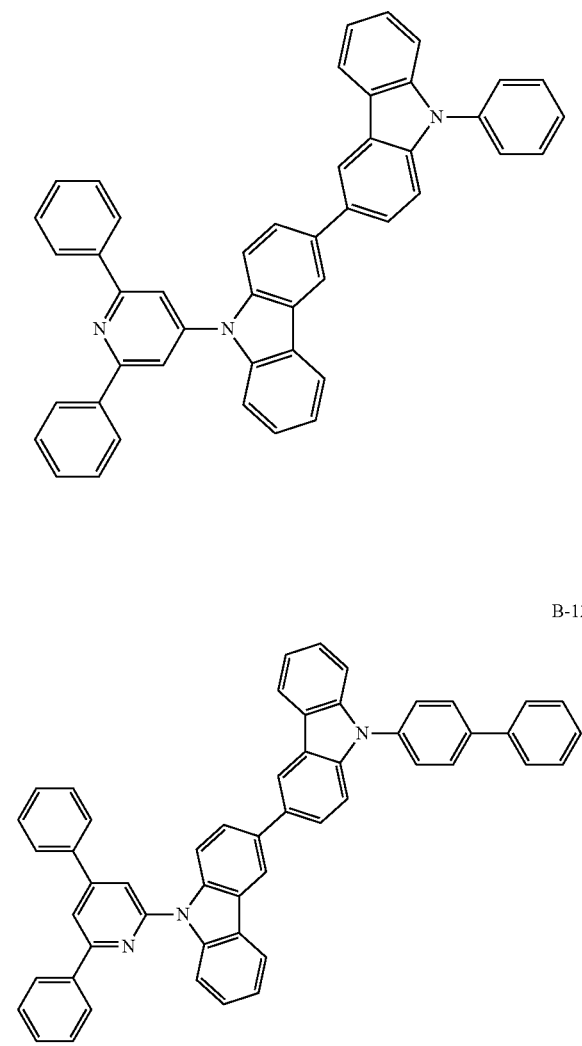
B-11
B-12
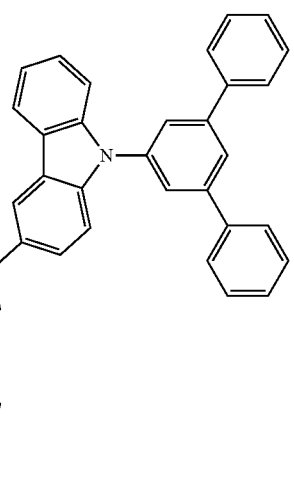
B-13

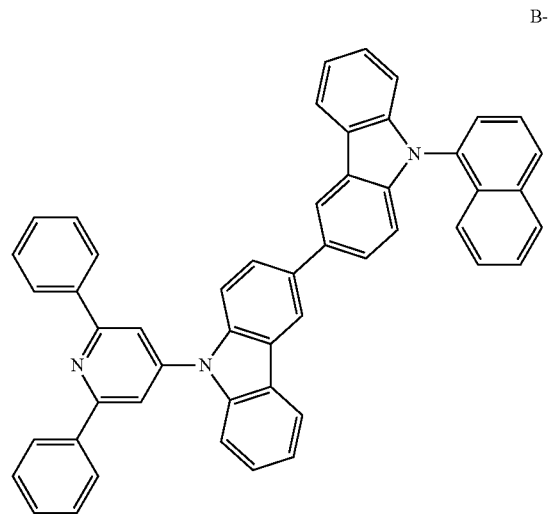
B-16
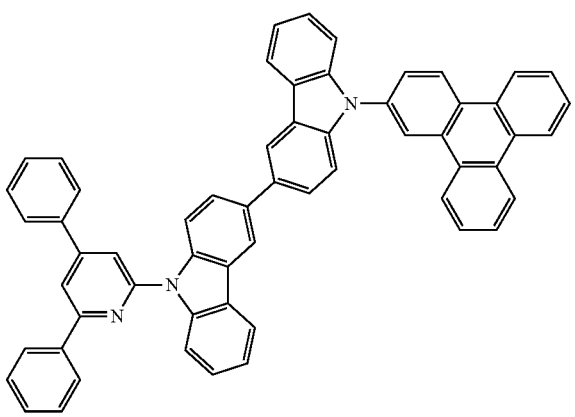
B-17
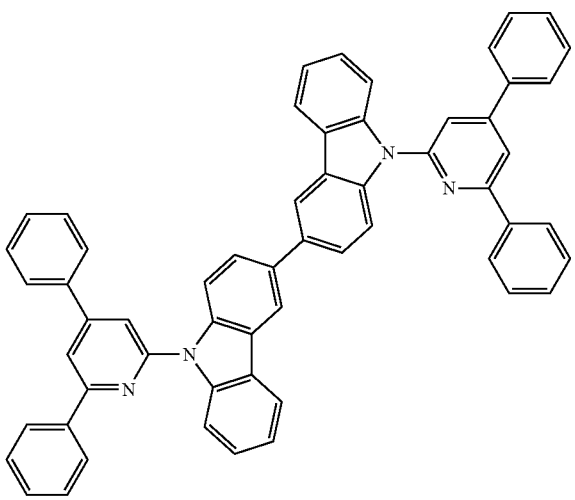
B-19
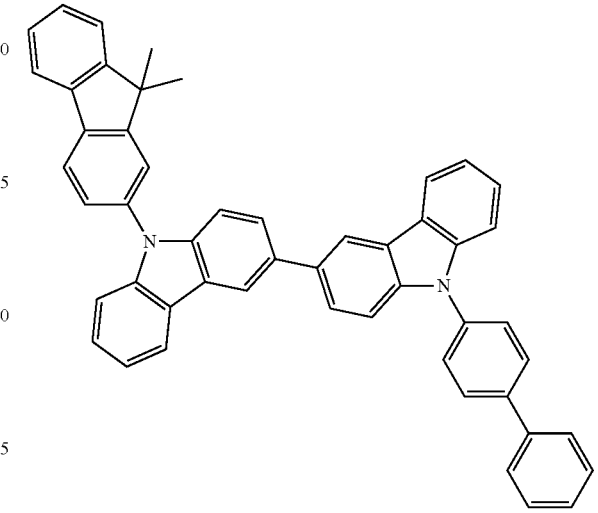
B-20
B-23
B-24

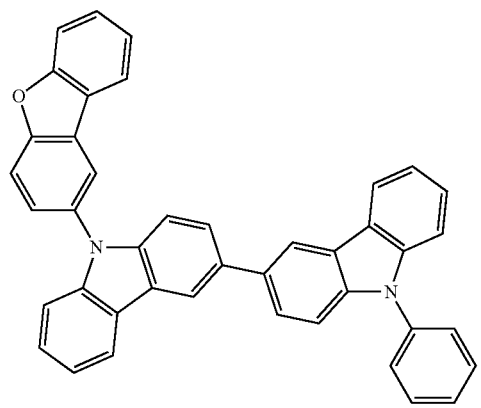
B-25
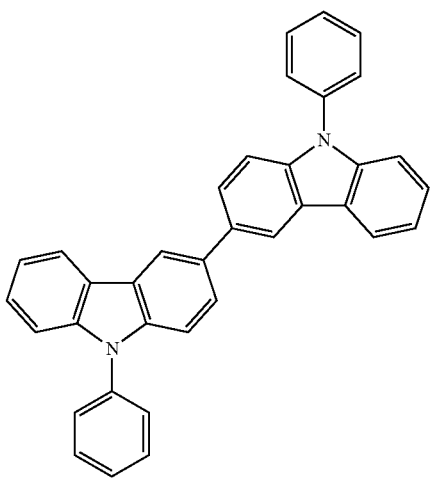
B-31
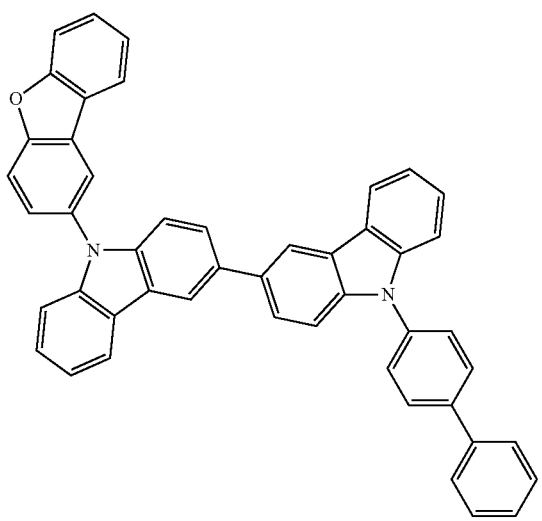
B-26
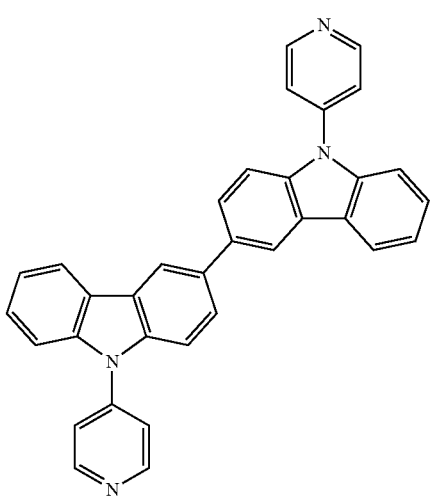
B-32
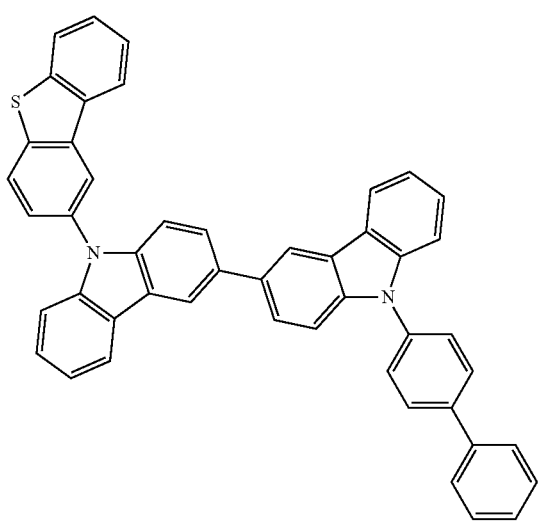
B-29
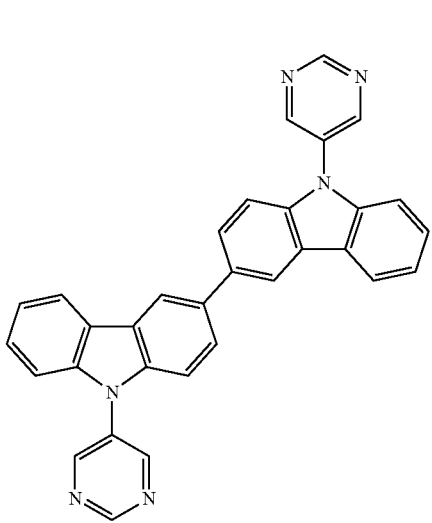
B-33

B-34
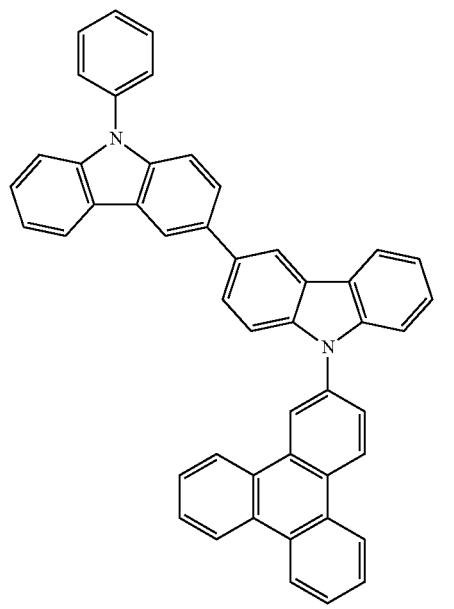
B-35
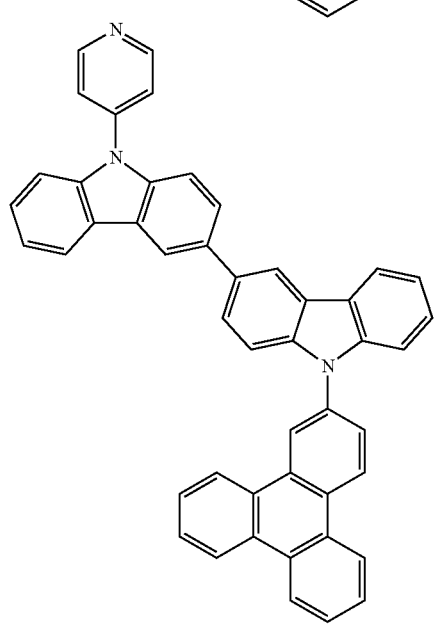
B-37
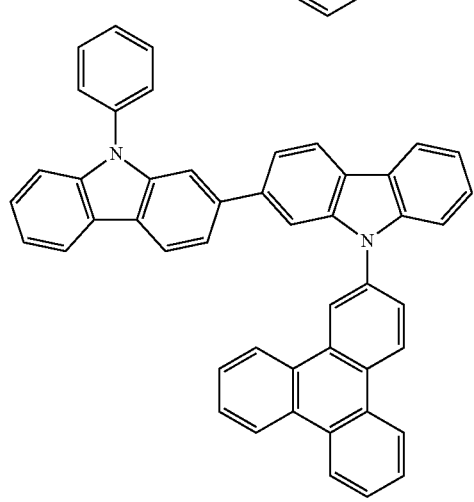
B-38
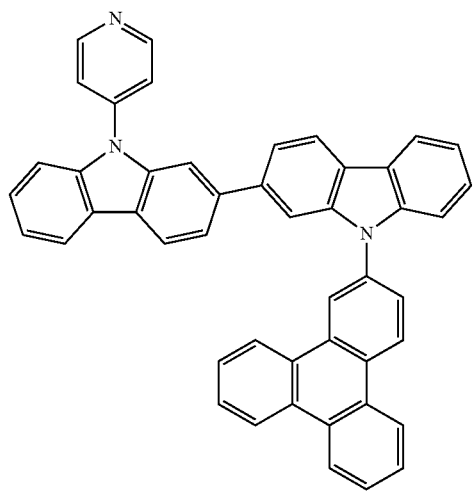
B-40
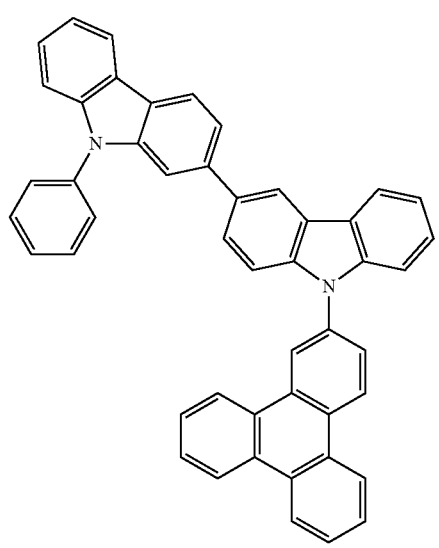
B-41
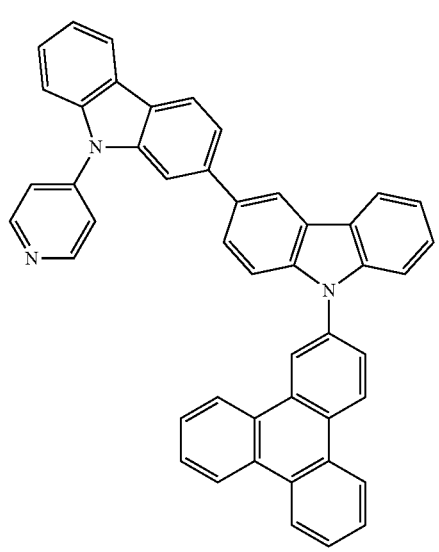

B-43
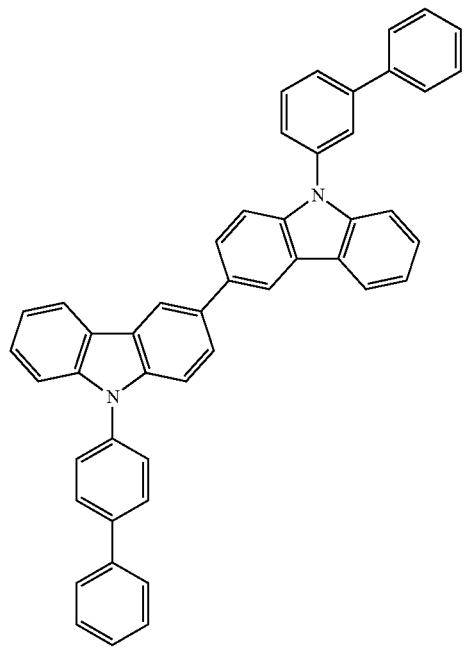
B-44
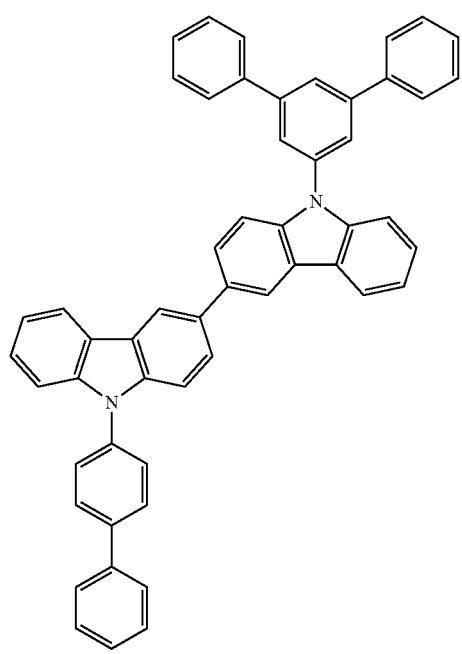
B-45
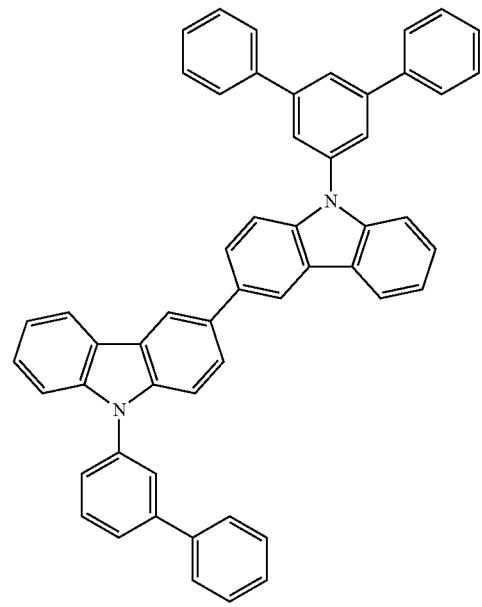
B-47
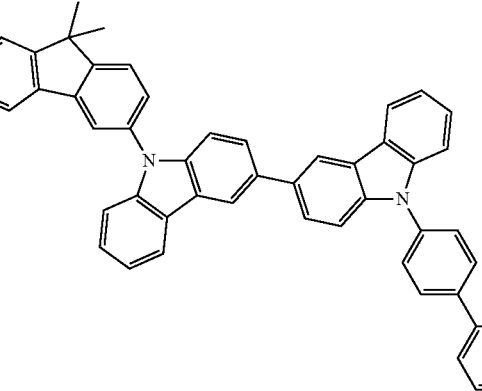
B-48
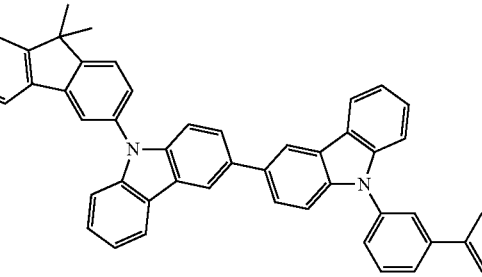
B-51
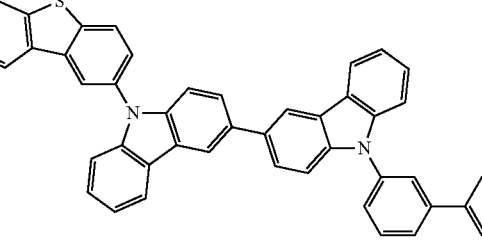

B-52
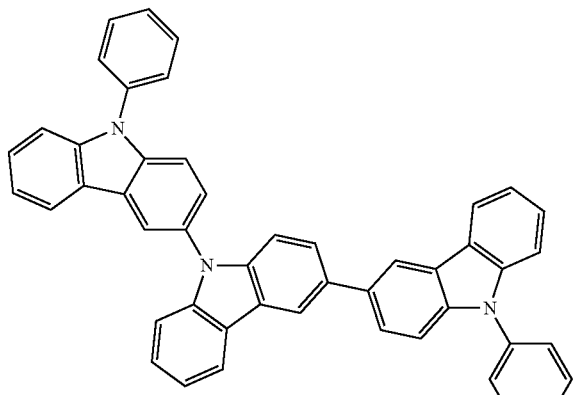
B-54
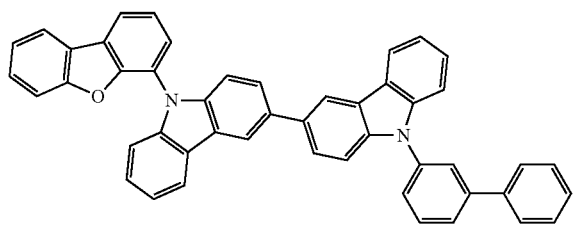
B-55
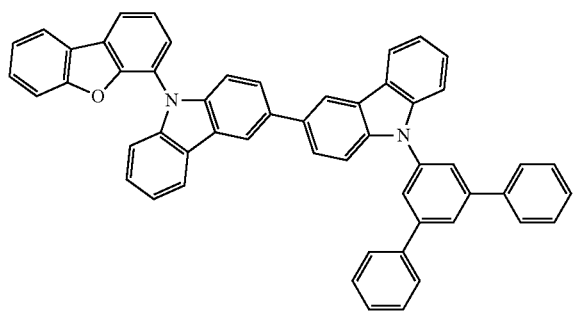
B-56
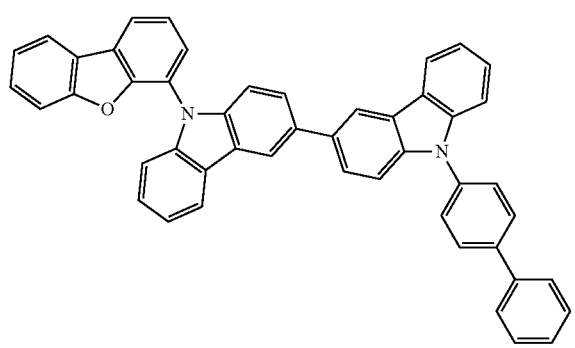
B-57
B-58
B-59
B-60
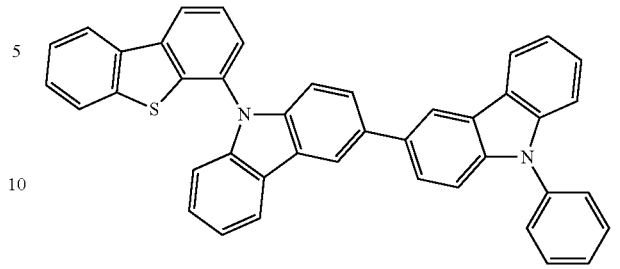
B-61
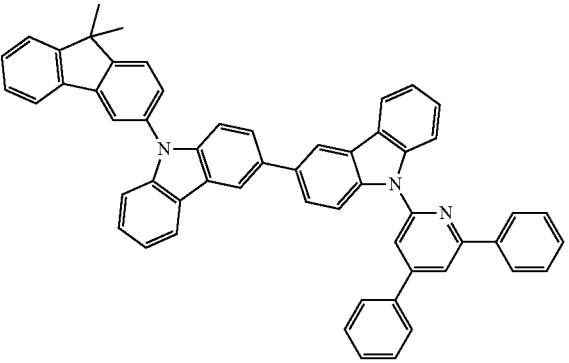

-continued
B-64
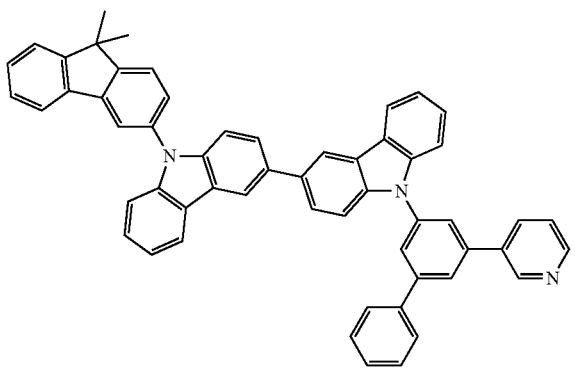
B-66
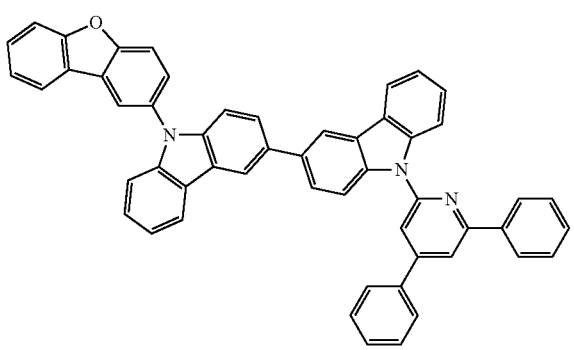
B-67
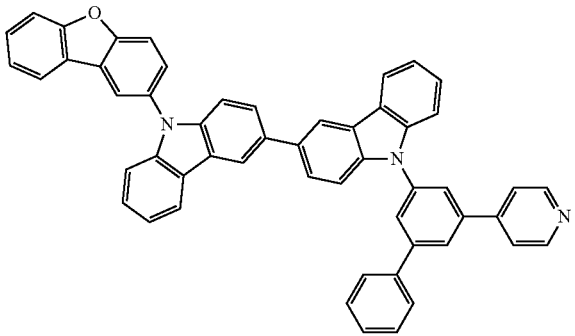
B-70
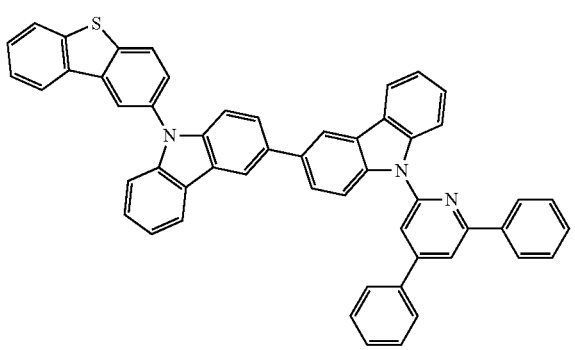
-continued
B-72
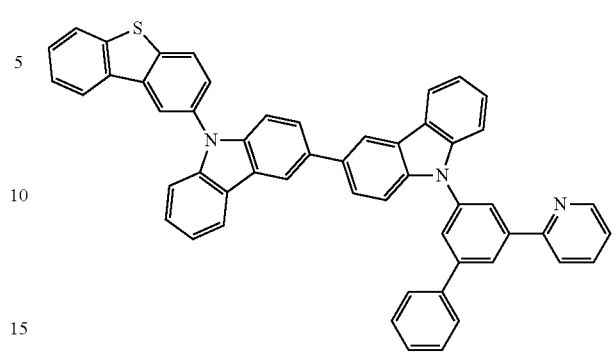
B-74
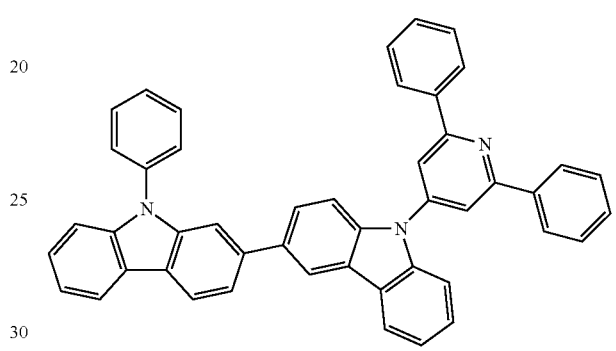
B-75
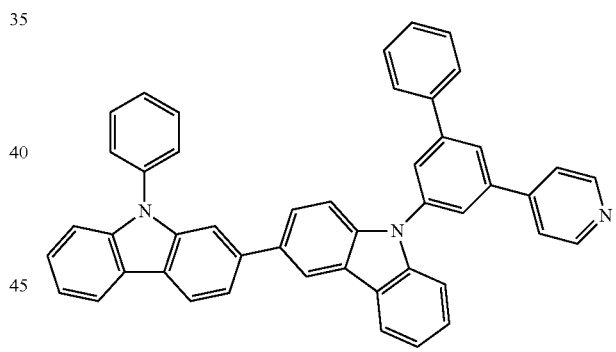
B-77
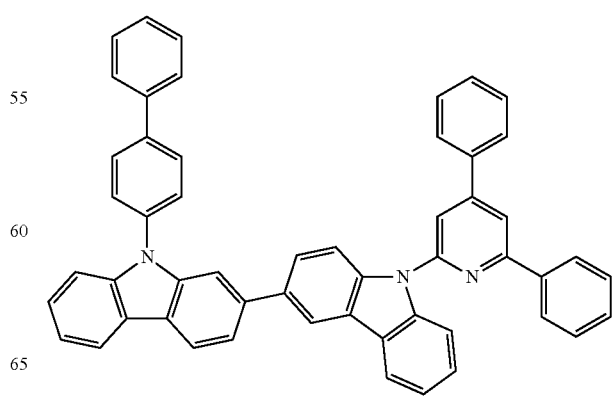

B-80
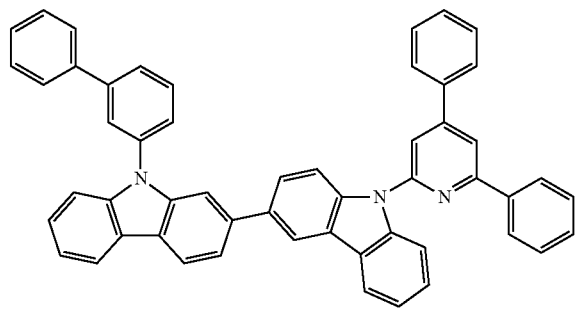
B-86
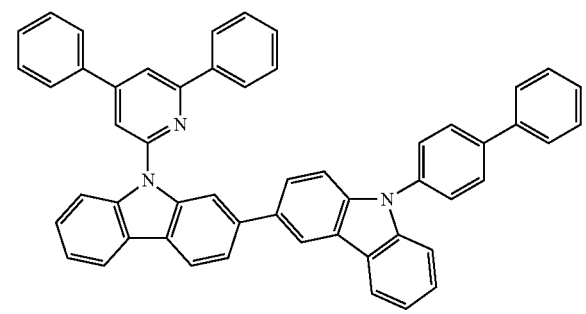
B-82
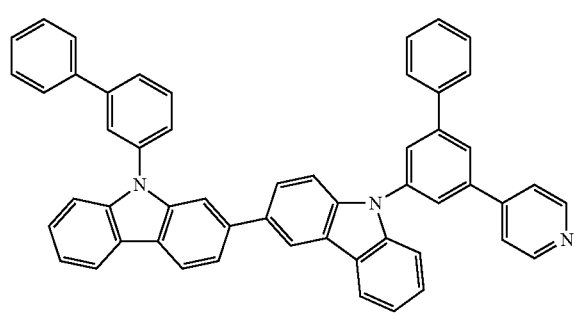
B-90
B-84
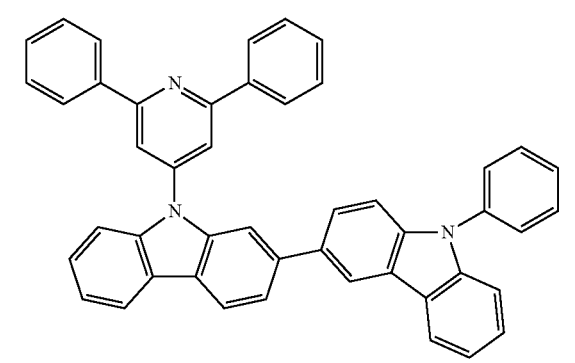
B-91
B-85
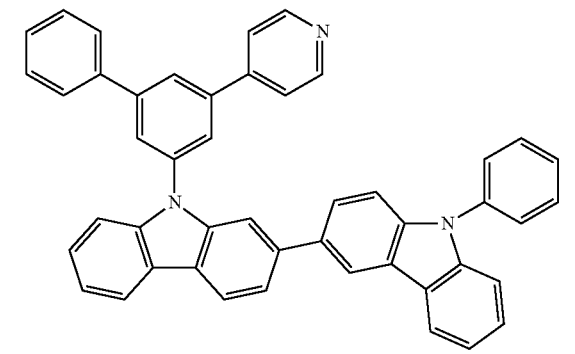
B-92
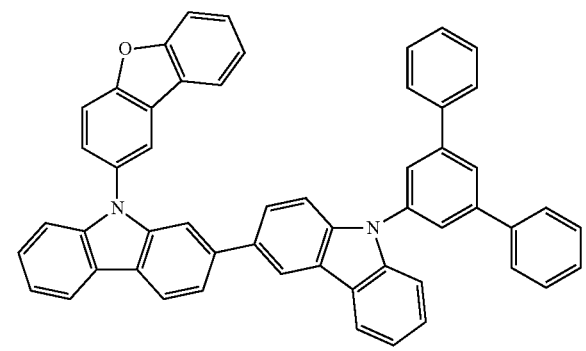

B-93
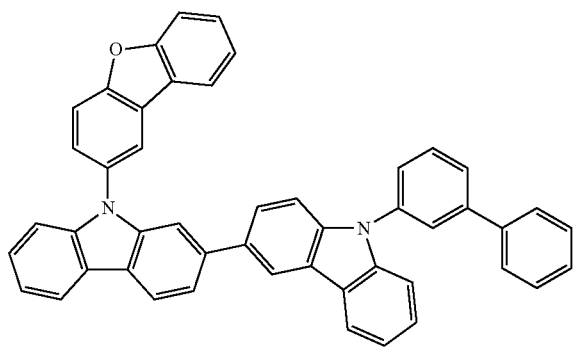
B-103
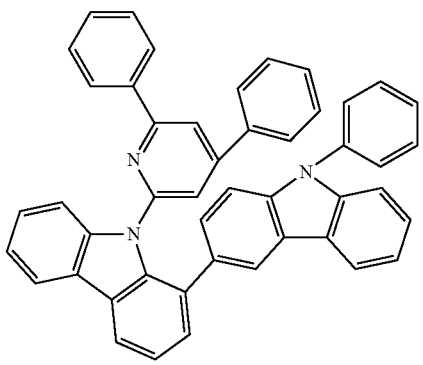
B-98
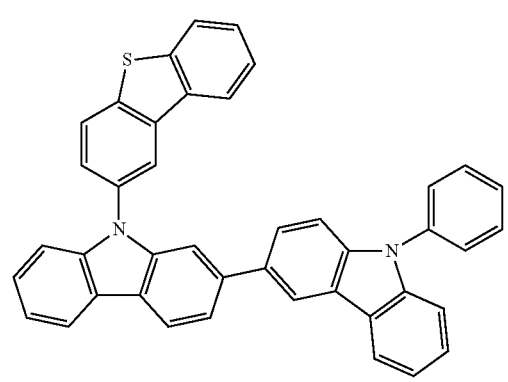
B-105
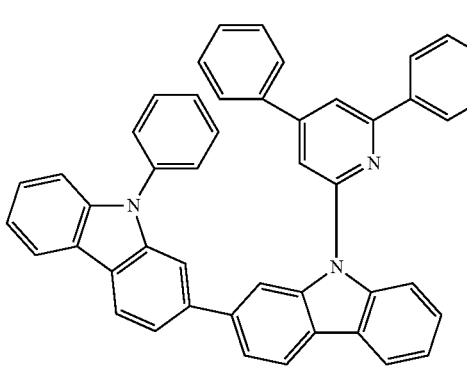
B-99
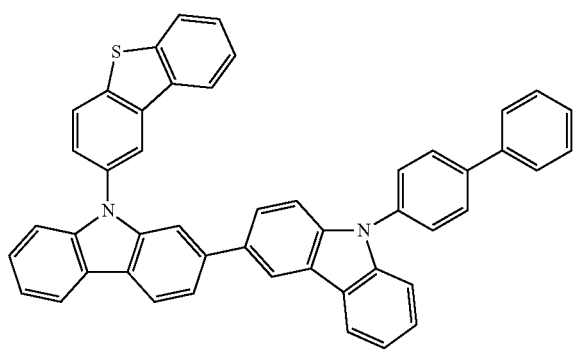
B-106
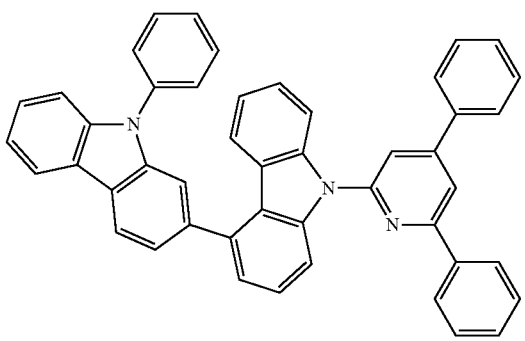
B-100
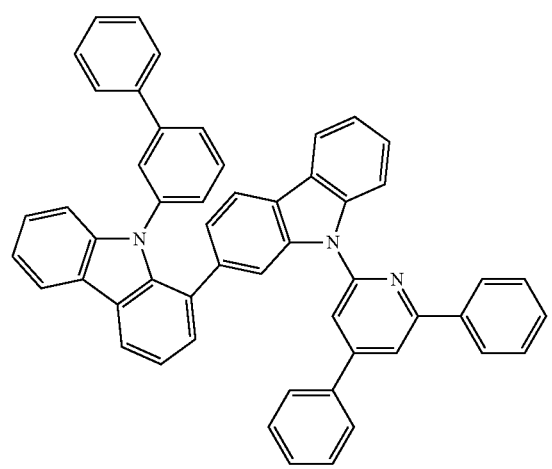
B-106
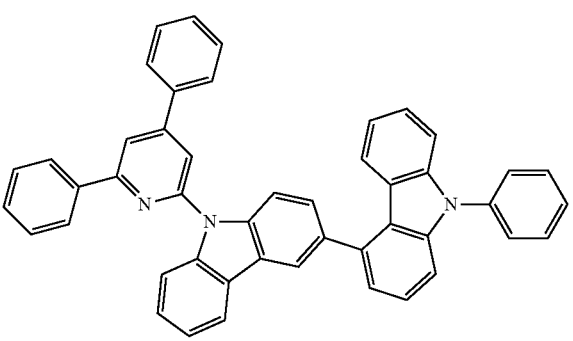

B-109
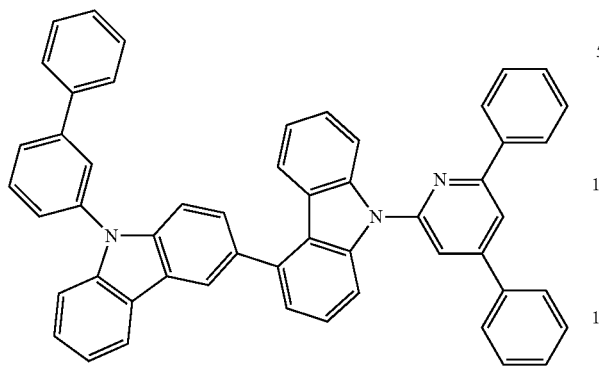
B-110
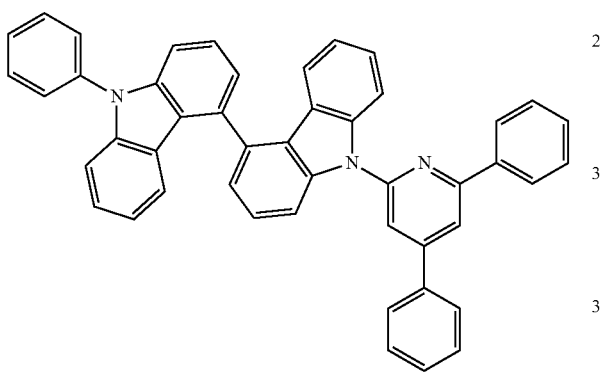
B-111
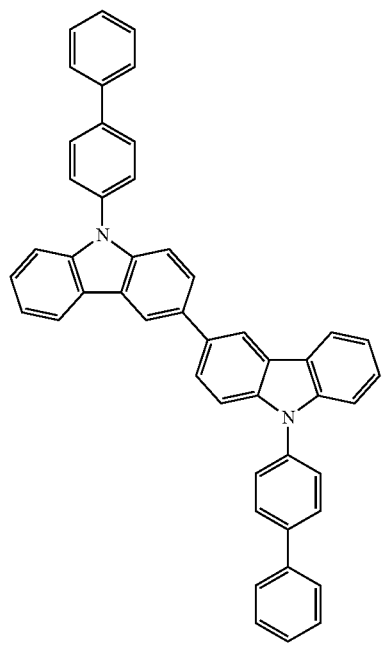
B-112
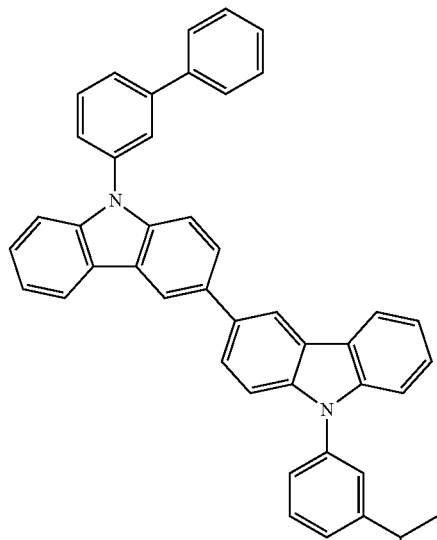
B-113
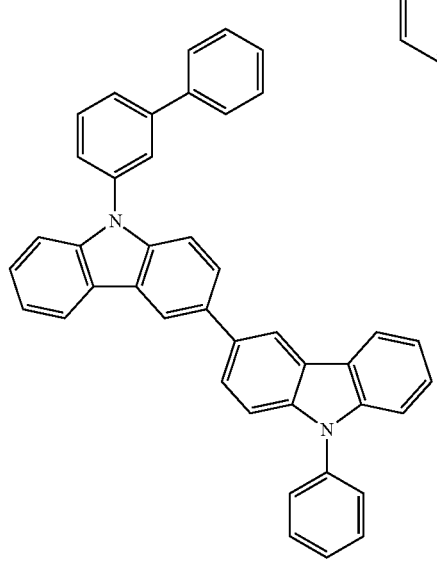
Specifically, it may be selected from compounds listed in Group 5-1, but is not limited thereto.
[Group 5-1]
B-23
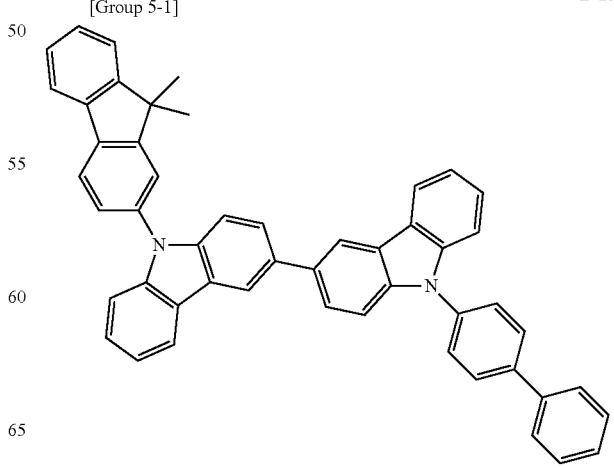

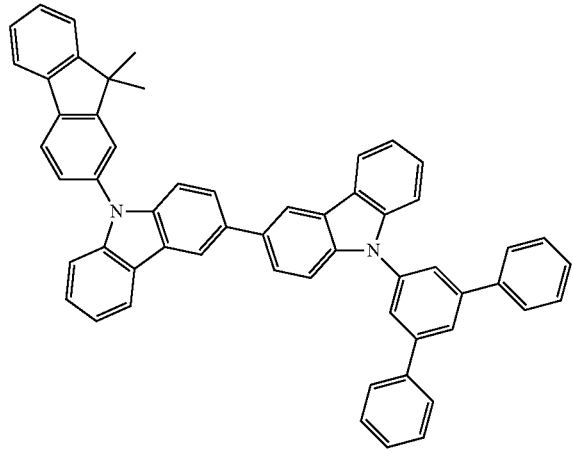
B-24
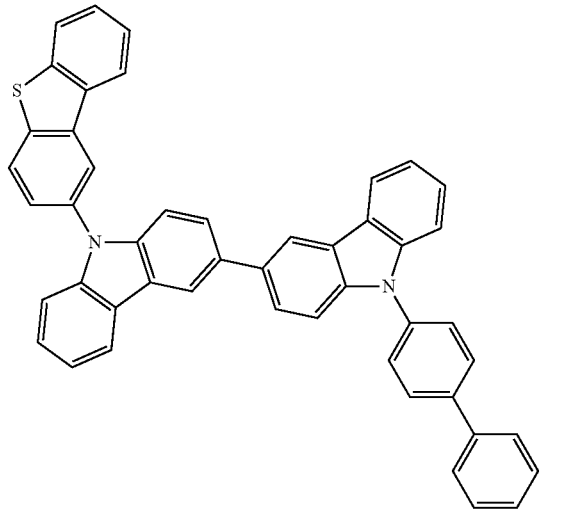
B-29
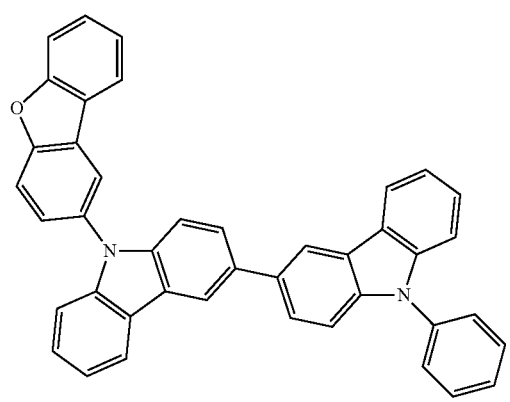
B-25
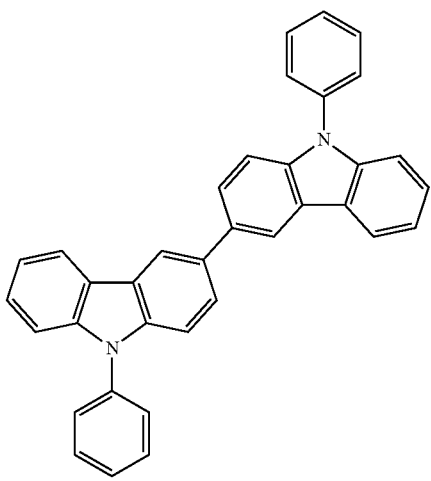
B-31
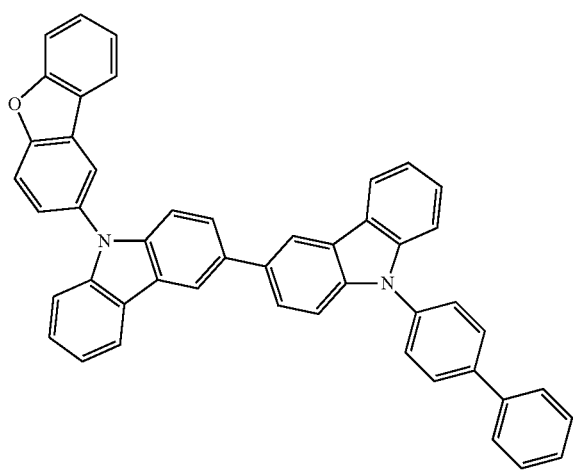
B-26
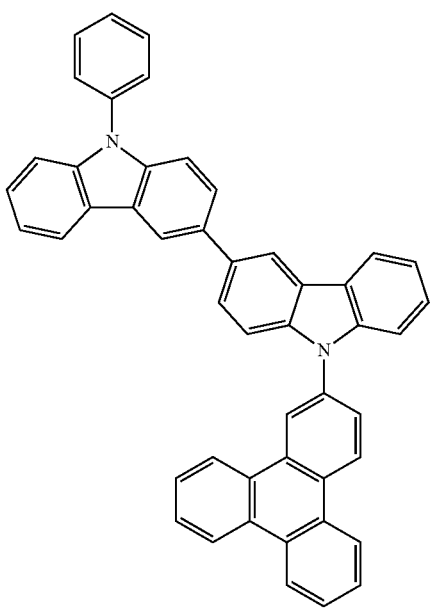
B-34

B-37
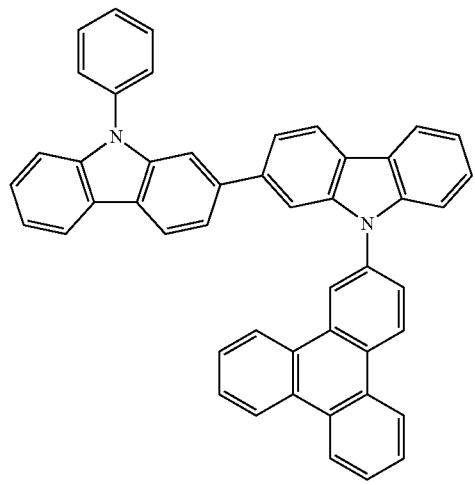
B-40
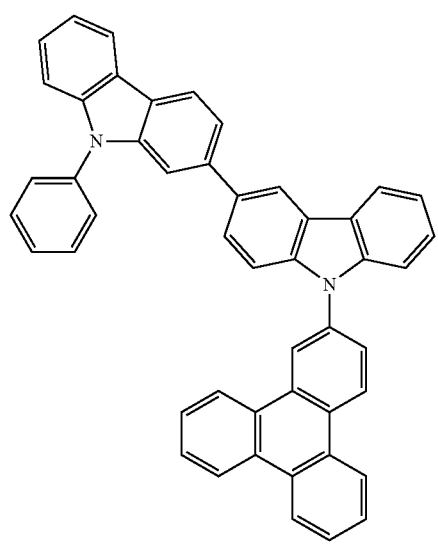
B-43
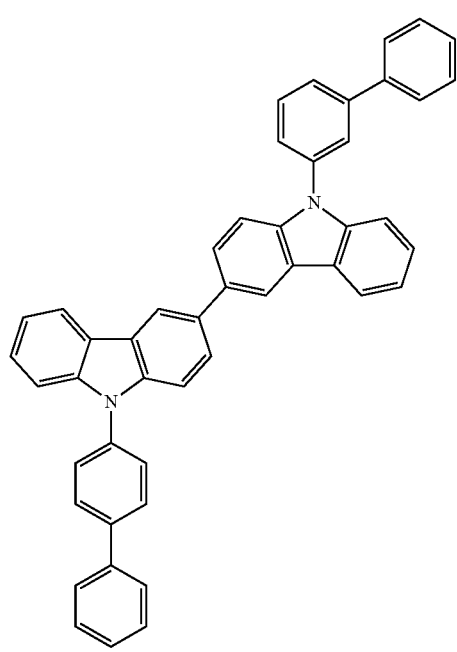
B-44
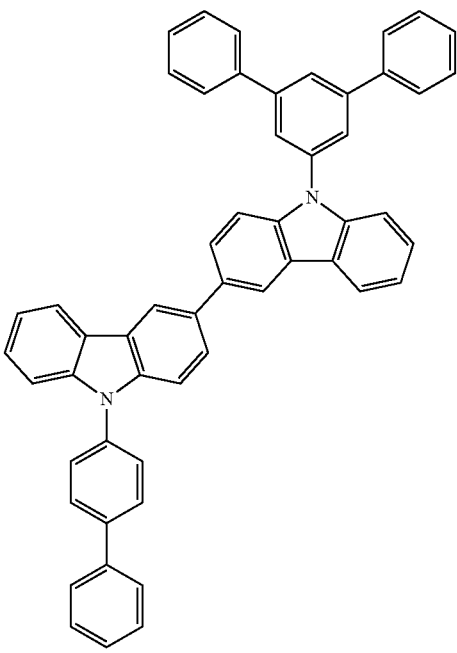
B-46
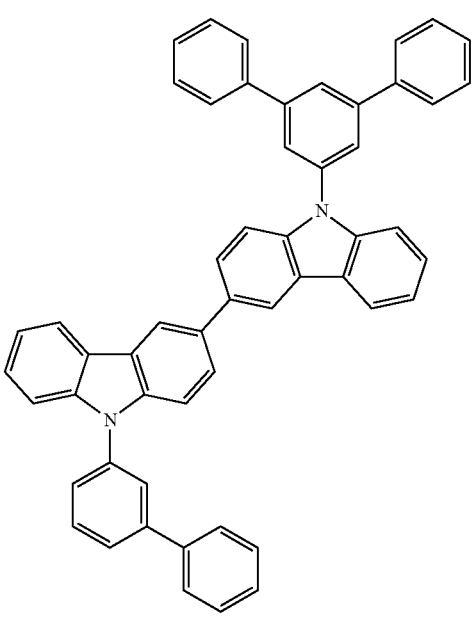

-continued
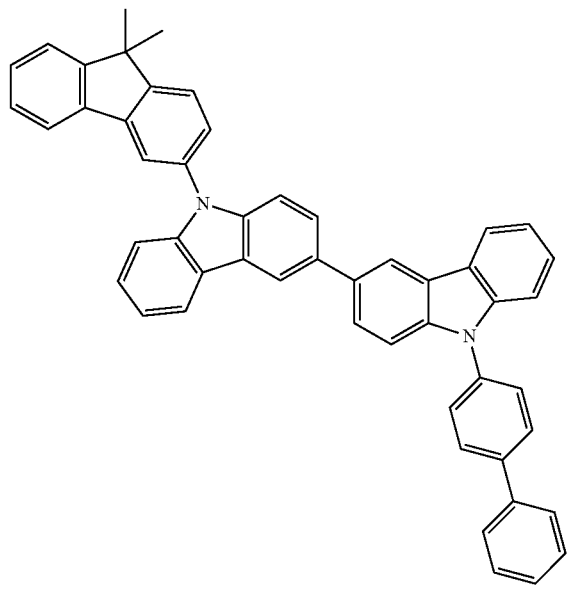
B-47
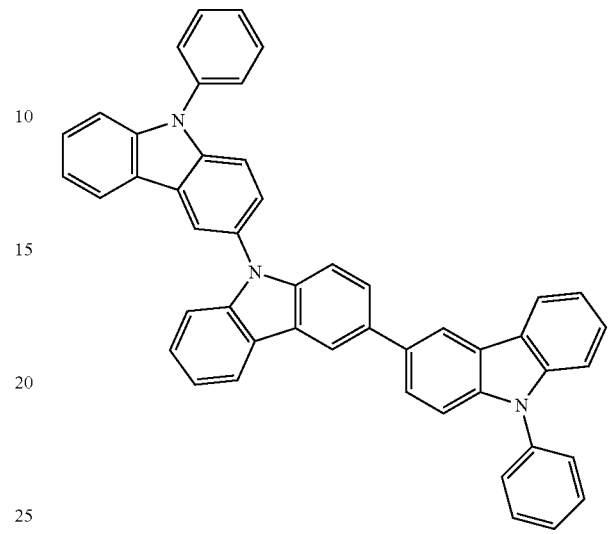
B-52
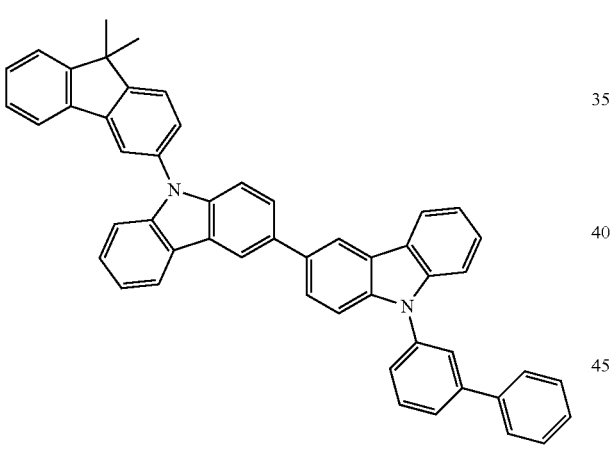
B-48
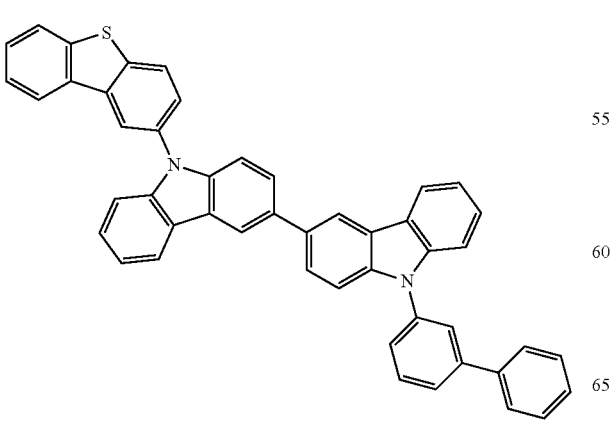
B-54
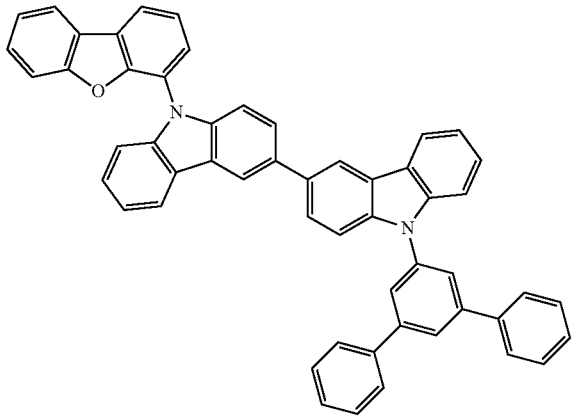
B-51
B-55

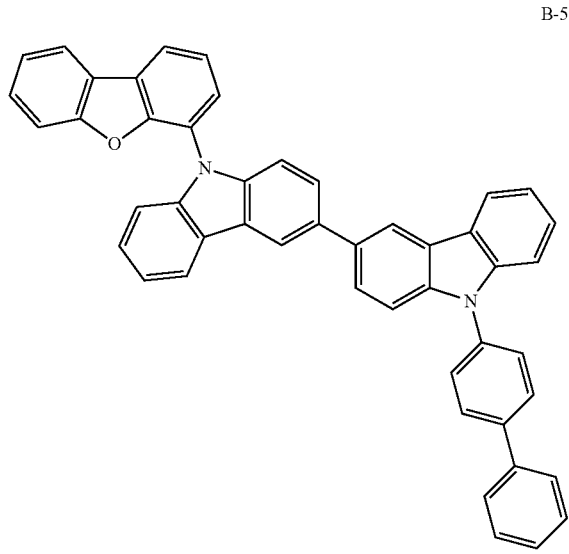
B-56
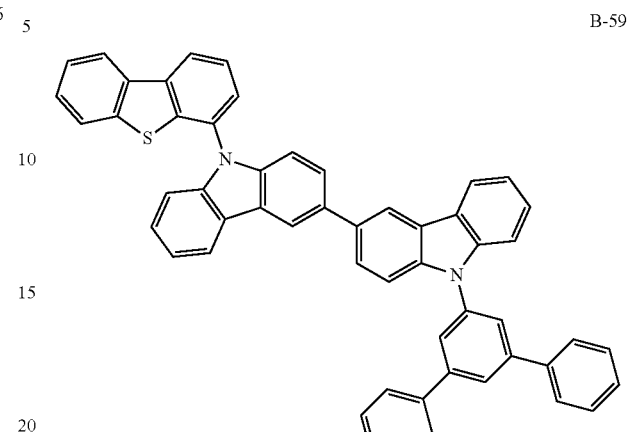
B-59
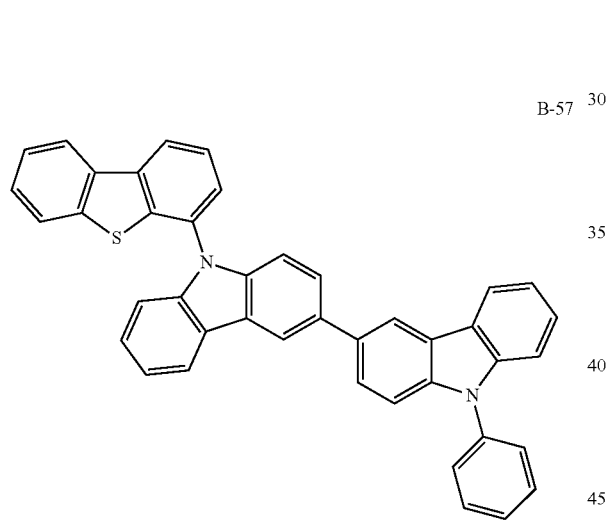
B-57
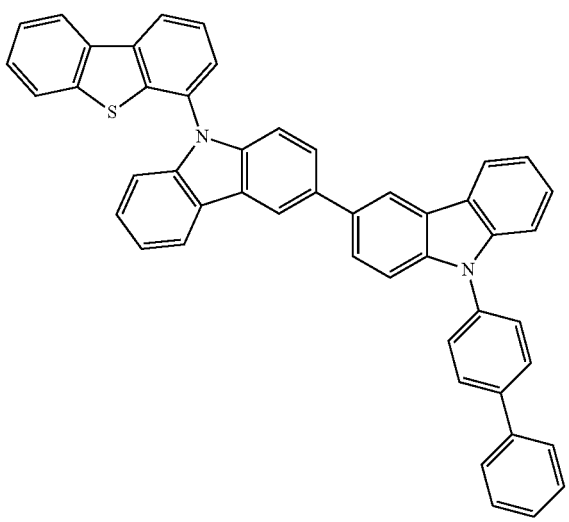
B-60
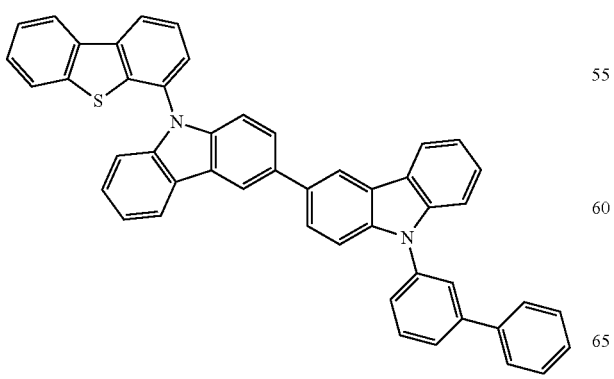
B-58
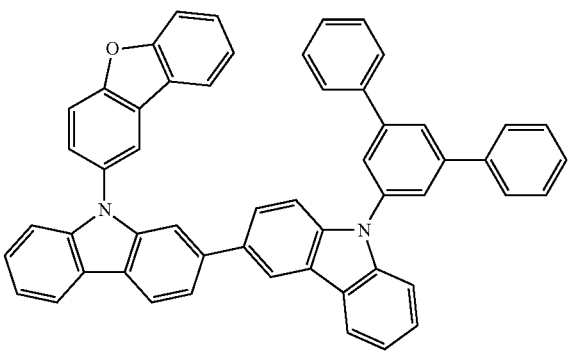
B-92

B-93
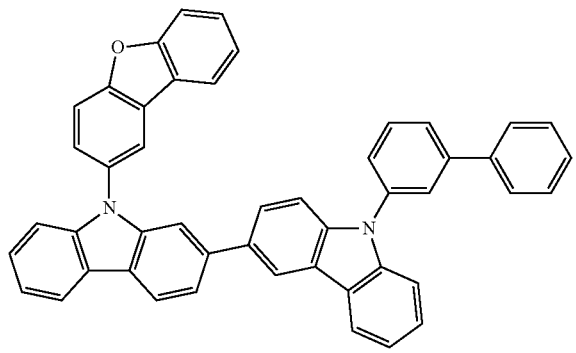
B-98
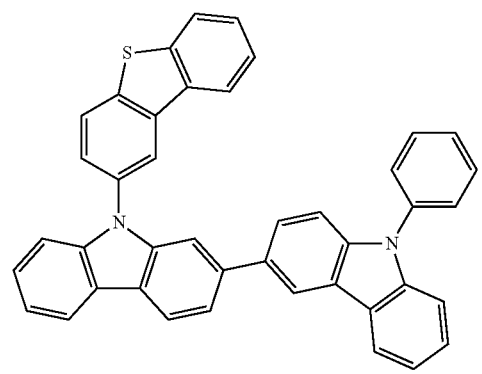
B-99
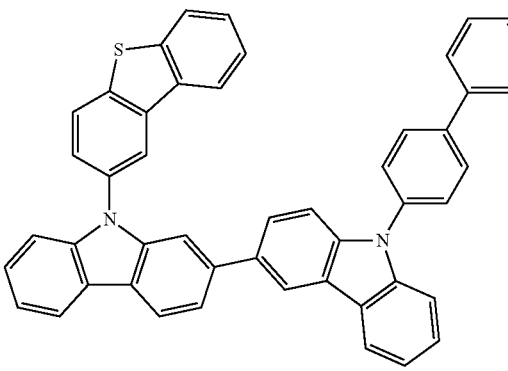
B-111
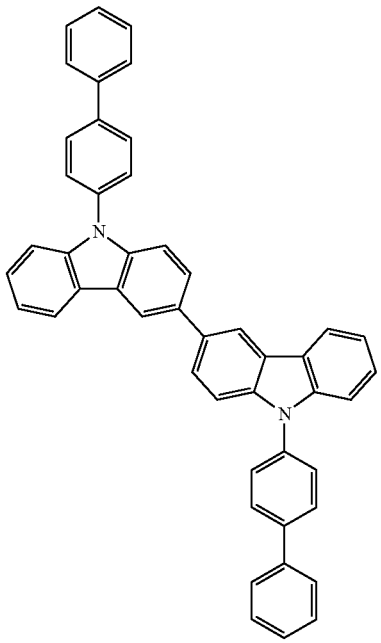
B-112
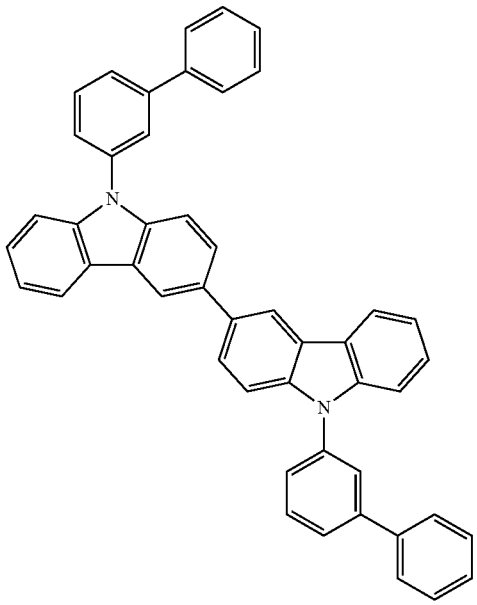

B-113

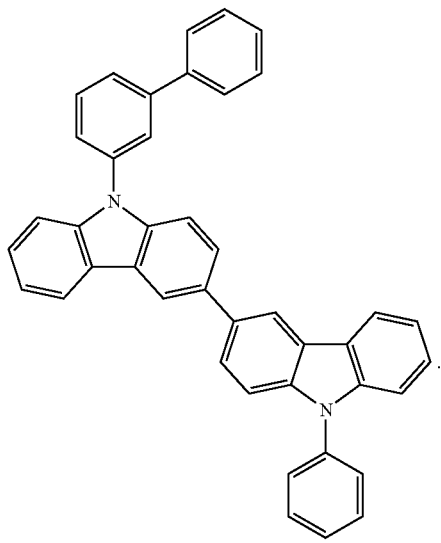

One or more kinds of the third compound may be used.

In electron transport auxiliary layer 35, the first compound and the third compound may be, for example included in a weight ratio of about 1:99 to 99:1. Specifically, it may be for example included in weight ratios of 10:90 to 90:10, 20:80 to 80:20, 30:70 to 70:30 and 40:60 to 60:40, and most specifically 50:50.

When the first and third compounds are included within the range, electron injection capability may be adjusted depending on a ratio of the two compounds and balanced with electron transport capability of an emission layer, and thus, accumulation of electrons may be prevented on the interface of the emission layer. In addition, holes and/or excitons transported from the emission layer are transformed into excitons having lower energy than that of the excitons of the emission layer due to the electron transport auxiliary layer, minimizing an influence of the holes and/or the excitons of the emission layer on the electron transport layer. Accordingly, the first compound having strong electron characteristics and the third compound having strong hole characteristics are used together in an electron transport auxiliary layer and may play the above role and thus, improve efficiency and life-span of a device.

The hole transport auxiliary layer 33 includes a second compound having excellent hole transport characteristics and thus, may reduce a HOMO energy level difference between the hole transport layer 31 and the emission layer 32 and adjust hole injection characteristics and resultantly, decrease accumulation of holes on the interface of the hole transport auxiliary layer 33 and the emission layer 32 and thus, a quenching phenomenon that excitons disappear on the interface due to polaron. Accordingly, the device may be less deteriorated and stabilized and thus, have improved efficiency and life-span.

The second compound may be represented by Chemical Formula 2.

[Chemical Formula 2]

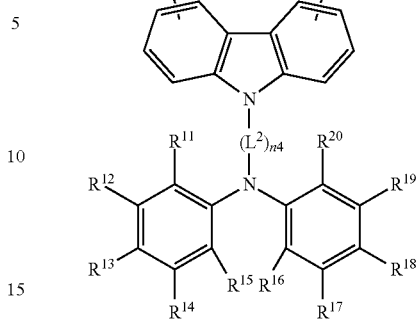

In Chemical Formula 2, $L^2$ is a substituted or unsubstituted C6 to C30 arylene group, or a substituted or unsubstituted C2 to C30 heteroarylene group, n4 is an integer of 1 to 5, preferably 1 to 3.

$R^{11}$ to $R^{22}$ are independently, hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof, $R^{11}$ to $R^{20}$ are independently present or are fused with each other to form a ring.

$R^{11}$ to $R^{20}$ of Chemical Formula 2 may be, specifically hydrogen, a substituted or unsubstituted phenyl group, a substituted or unsubstituted biphenyl group, a substituted or unsubstituted o-terphenyl group, a substituted or unsubstituted m-terphenyl group, a substituted or unsubstituted p-terphenyl group, a substituted or unsubstituted quaterphenyl group, a substituted or unsubstituted naphthyl group, a substituted or unsubstituted anthracenyl group, a substituted or unsubstituted phenanthrenyl group, a substituted or unsubstituted pyrenyl group, a substituted or unsubstituted triphenylene group, a substituted or unsubstituted fluorenyl group, a substituted or unsubstituted dibenzofuranyl group, a substituted or unsubstituted dibenzothiophenyl group, or a combination thereof, and more specifically, hydrogen, a substituted or unsubstituted phenyl group, a substituted or unsubstituted biphenyl group, a substituted or unsubstituted o-terphenyl group, a substituted or unsubstituted m-terphenyl group, a substituted or unsubstituted p-terphenyl group, a substituted or unsubstituted quaterphenyl group, a substituted or unsubstituted fluorenyl group, or a combination thereof, and the $R^{11}$ to $R^{20}$ are independently present, or adjacent two are fused with each other to form a fluorenyl group.

For example, the second compound may be represented by at least one of Chemical Formulae 2-I to 2-IV according to fusion of the $R^{11}$ to $R^{20}$ and kinds of substituents.

[Chemical Formula 2-I]

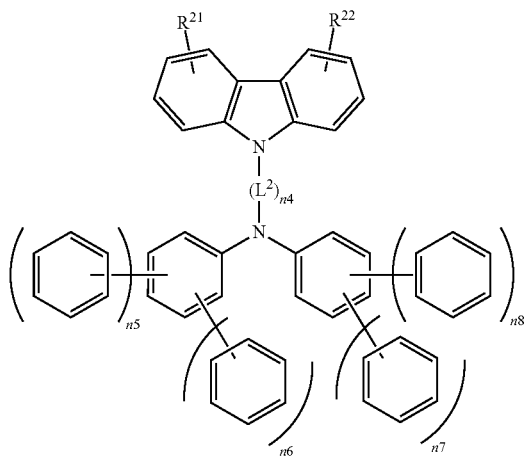

[Chemical Formula 2-II]

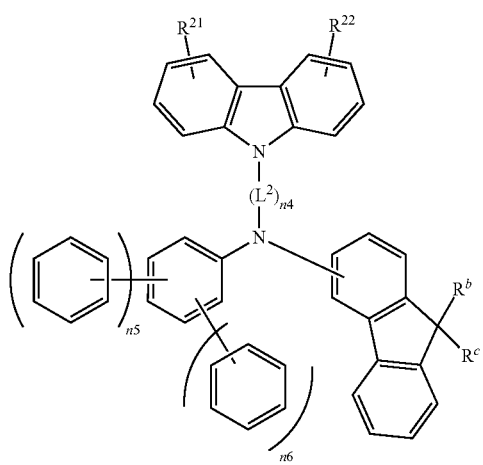

[Chemical Formula 2-III]

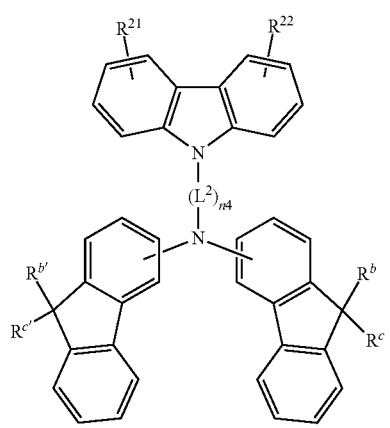

[Chemical Formula 2-IV]

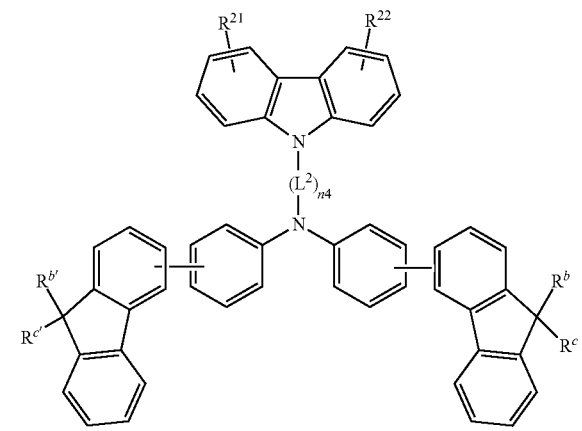

In Chemical Formulae 2-I to 2-IV, $L^2$, $n^4$, $R^{21}$ and $R^{22}$ are the same as described above, n5 to n8 are independently one of integers of 0 to 3, and $R^b$, $R^{b'}$, $R^c$ and $R^{c'}$ are independently, hydrogen, deuterium, a substituted or unsubstituted C1 to 20 alkyl group, a substituted or unsubstituted C6 to C50 aryl group, a substituted or unsubstituted C2 to C50 heteroaryl group, or a combination thereof.

$L^2$ of Chemical Formula 2 may be specifically a substituted or unsubstituted phenylene group, a substituted or unsubstituted biphenylene group, a substituted or unsubstituted terphenylene group, a substituted or unsubstituted quaterphenylene group, a substituted or unsubstituted fluorenylene group, or a combination thereof.

For example, the second compound may be represented by at least one of Chemical Formulae 2a to 2h according to kinds of the linking group (L2).

[Chemical Formula 2a]

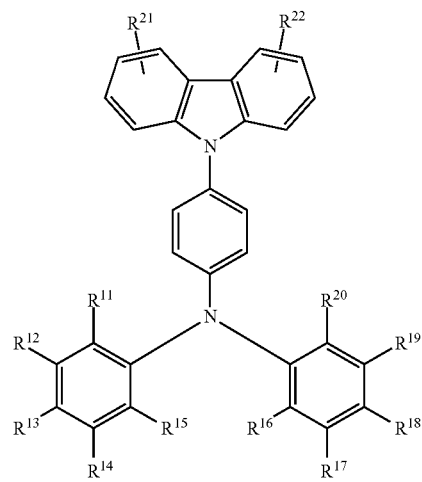

[Chemical Formula 2b]
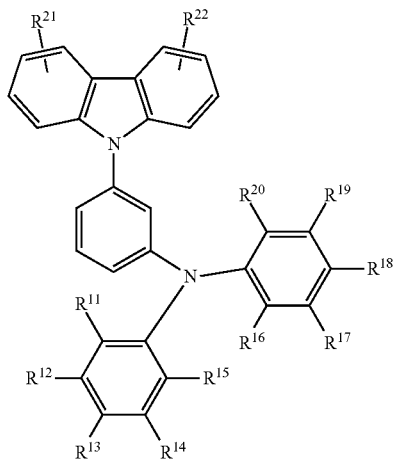
[Chemical Formula 2c]
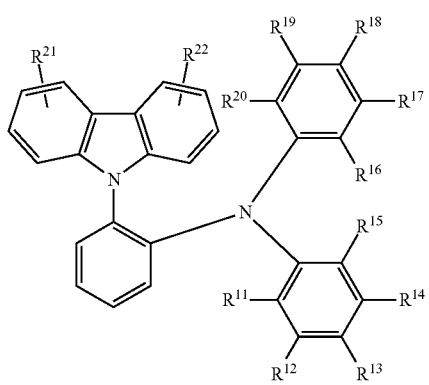
[Chemical Formula 2d]
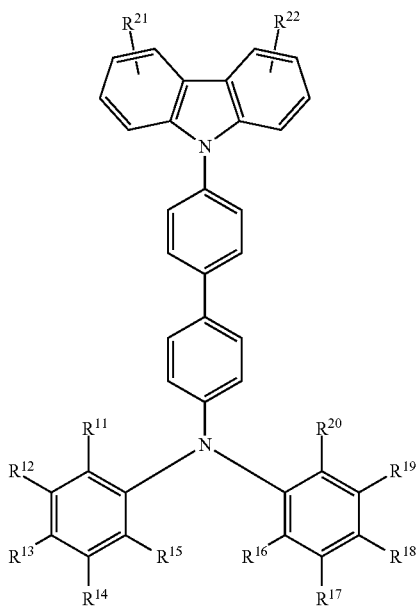
[Chemical Formula 2e]
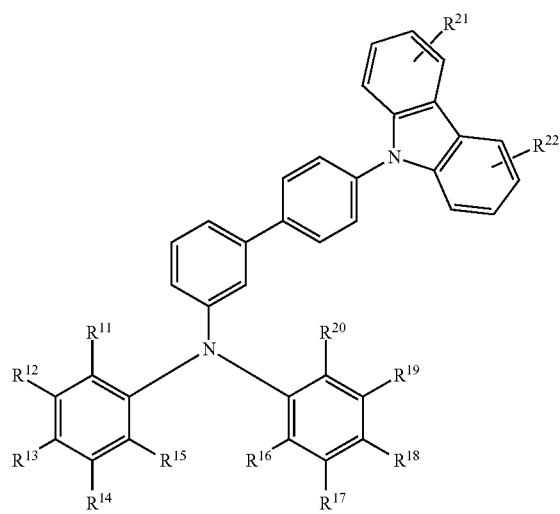
[Chemical Formula 2f]
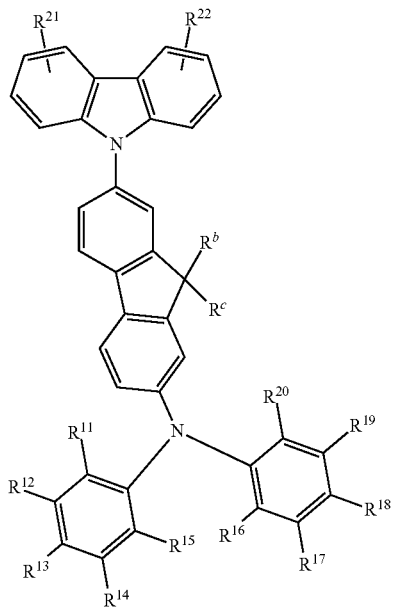

[Chemical Formula 2g]
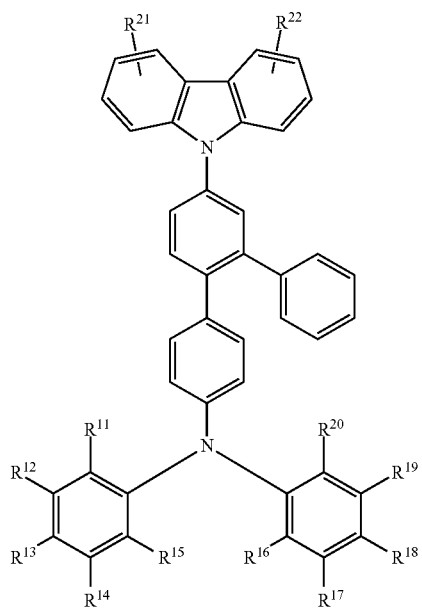
[Chemical Formula 2h]
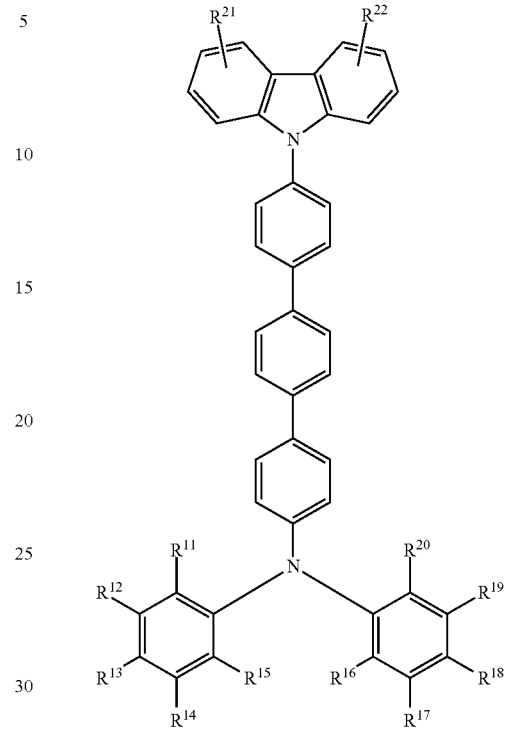
In Chemical Formulae 2a to 2h,
$R^{11}$ to $R^{22}$ are the same as described above.
The second compound may be, for example selected from compounds listed in Group 6, but is not limited thereto.
[Group 6]
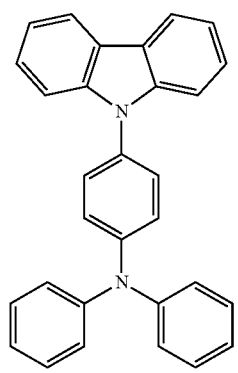
[P-1]
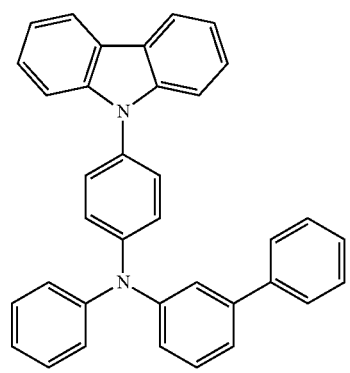
[P-2]

-continued
[P-3]
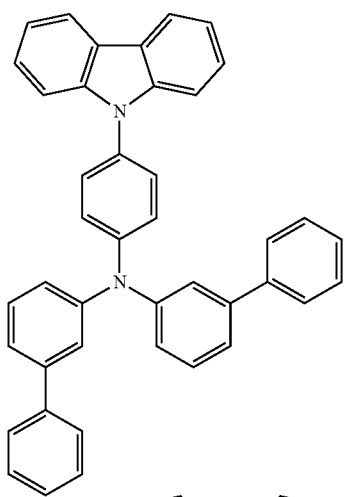
[P-4]
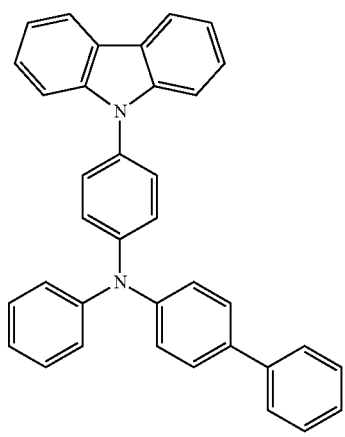
[P-5]
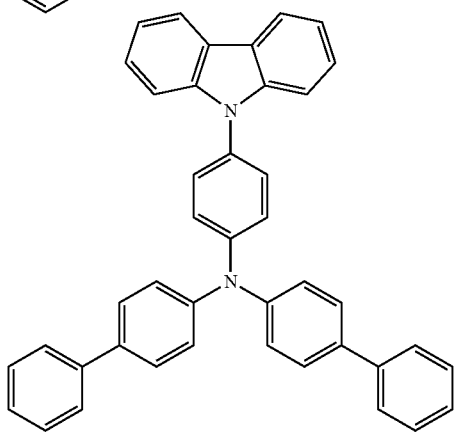
[P-6]
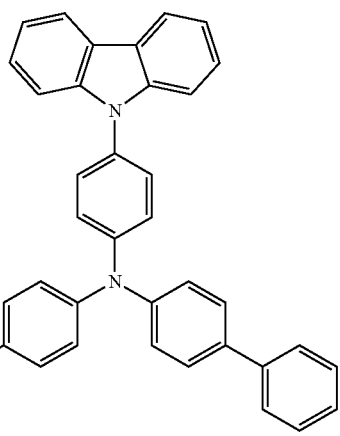
[P-7]
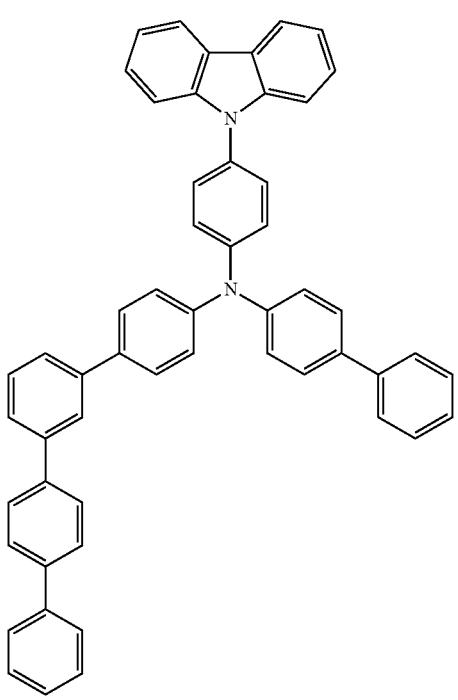
[P-8]
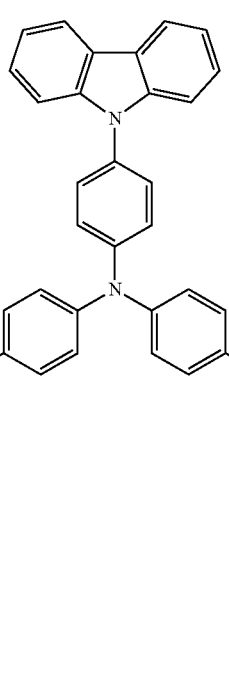

-continued
[P-9]
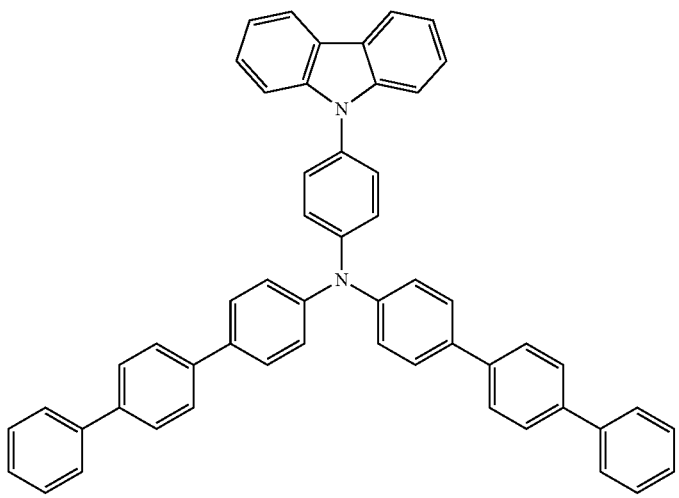
[P-10]
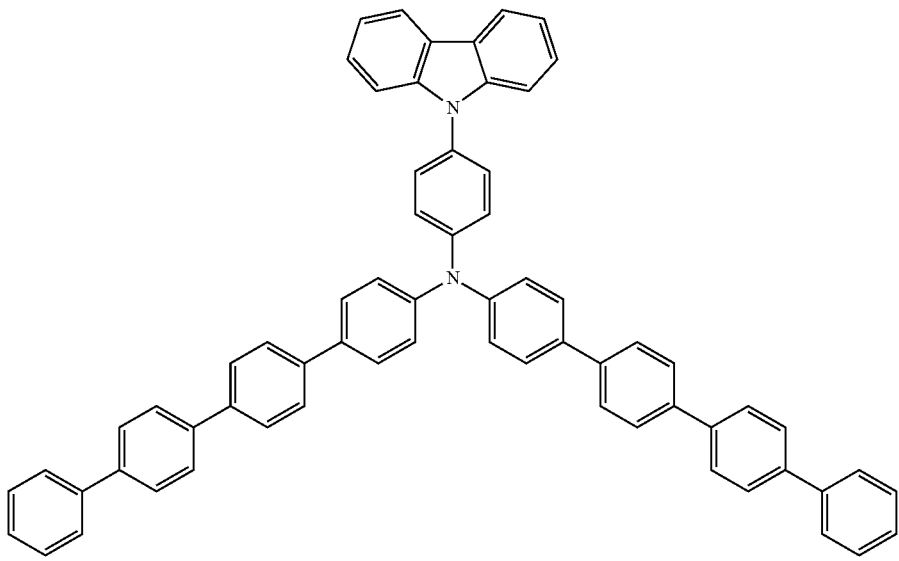
[P-11]
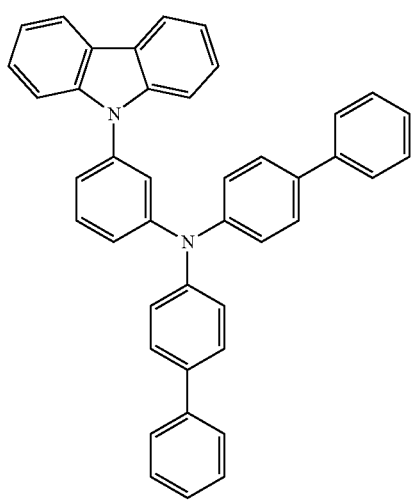
[P-12]
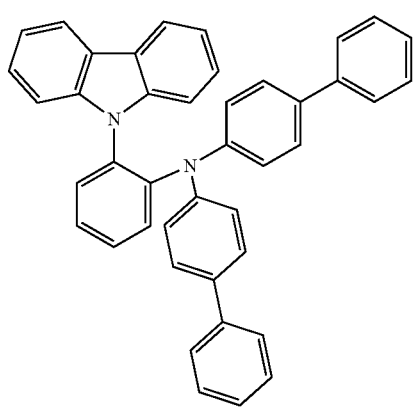

-continued
[P-13]
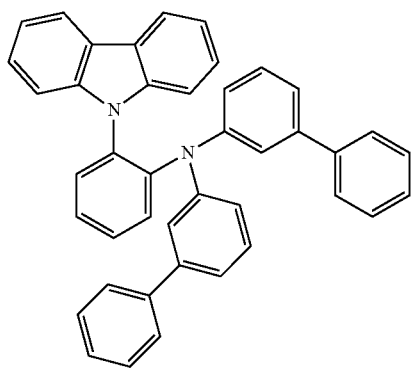
[P-14]
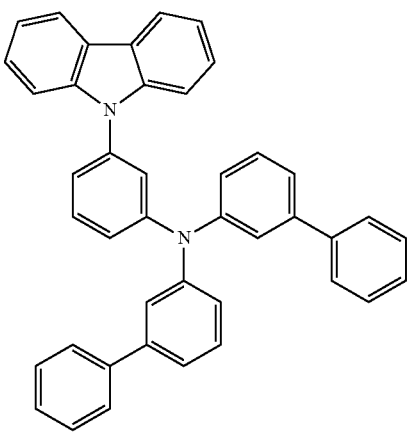
[P-15]
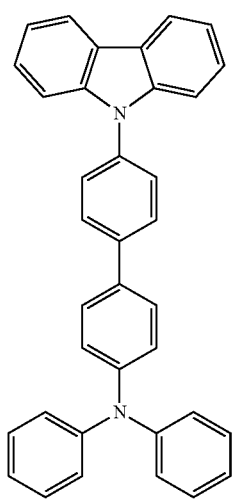
[P-16]
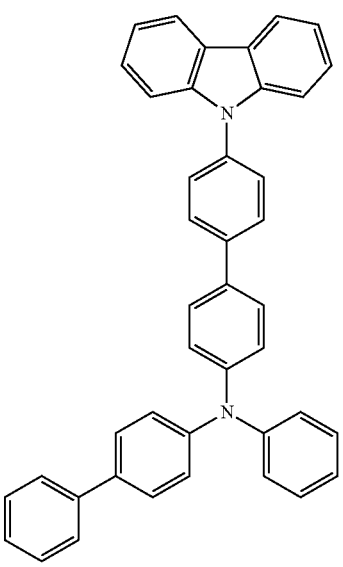
[P-17]
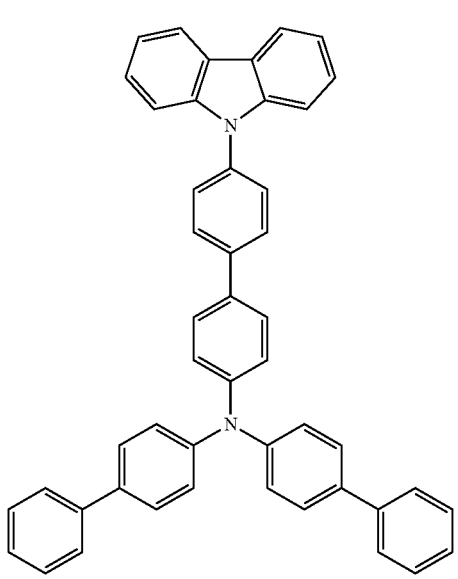
[P-18]
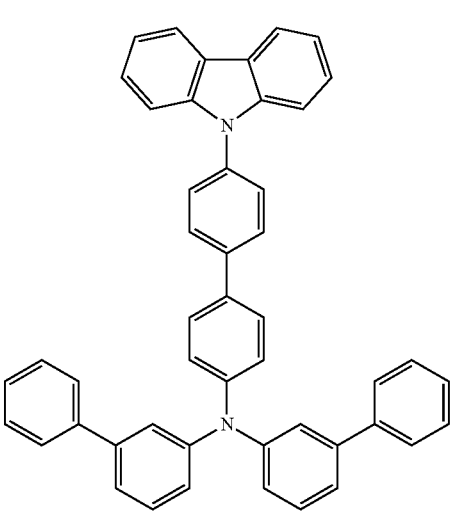

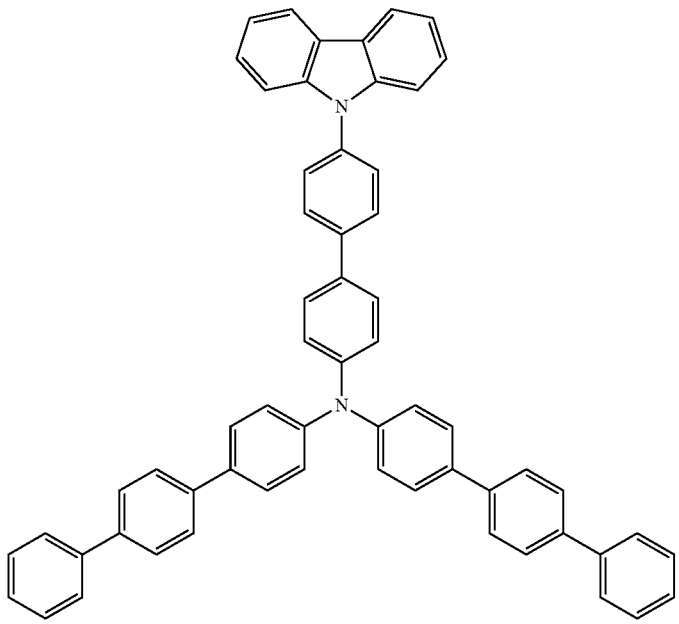
[P-19]
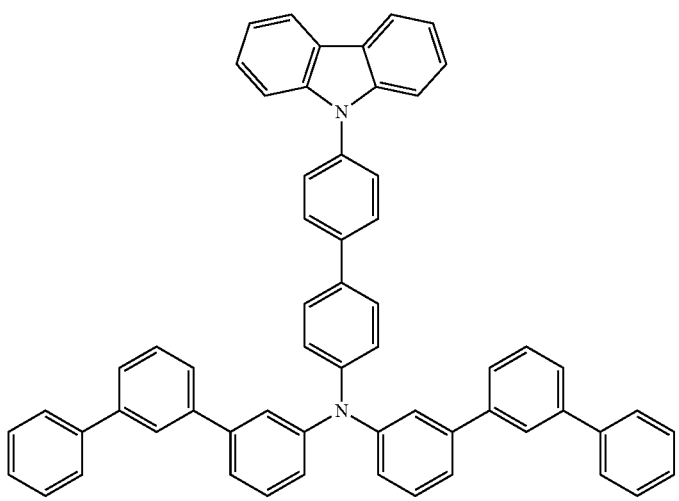
[P-20]
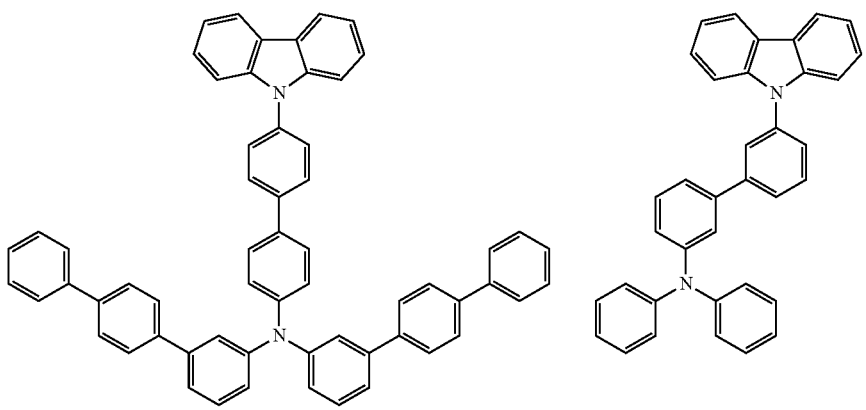
[P-21]         [P-22]

-continued
[P-23]
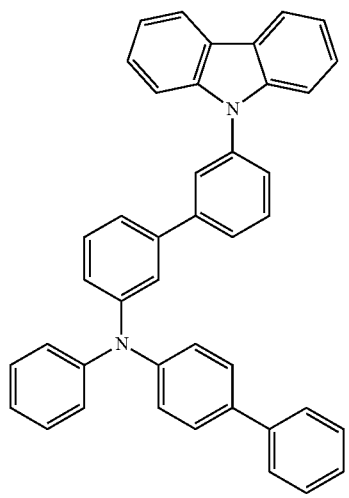
[P-24]
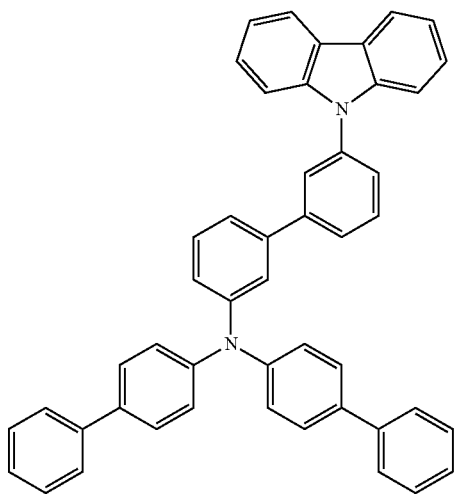
[P-25]
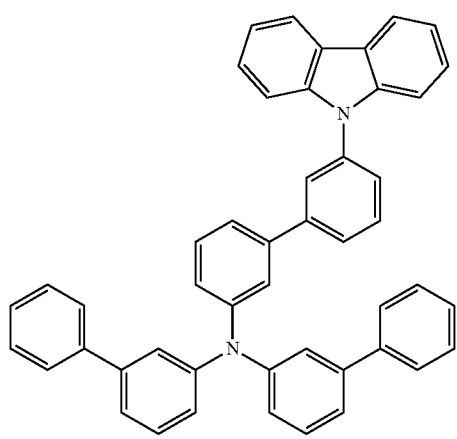
[P-26]
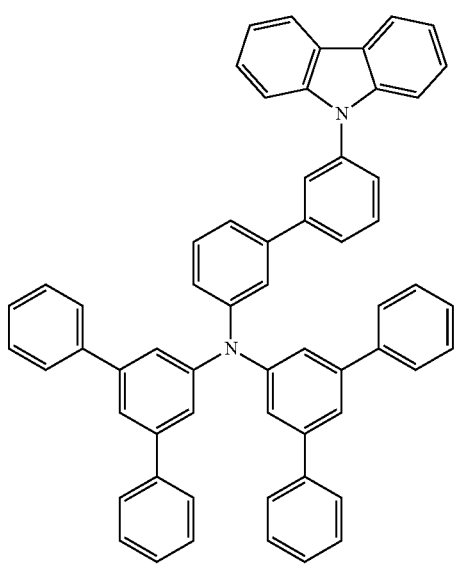
[P-27]
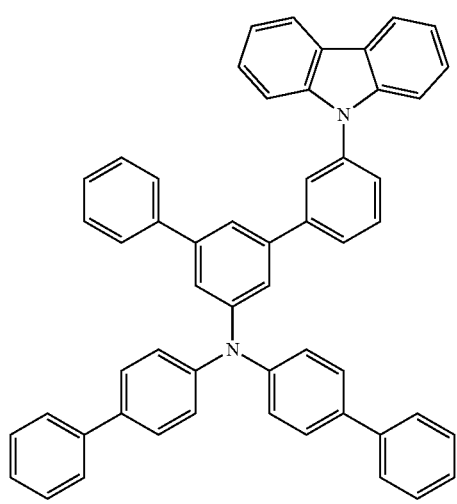
[P-28]
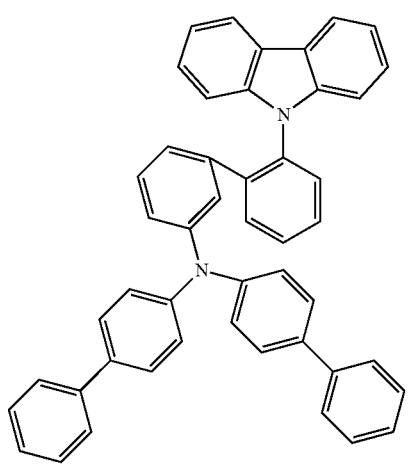

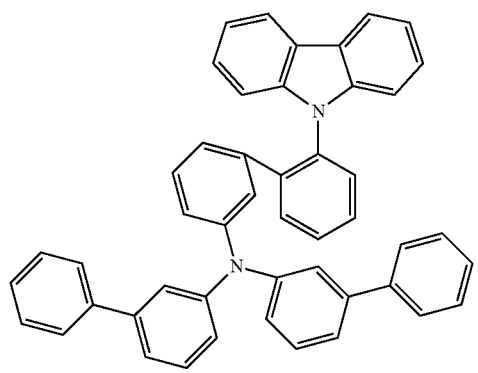
[P-29]
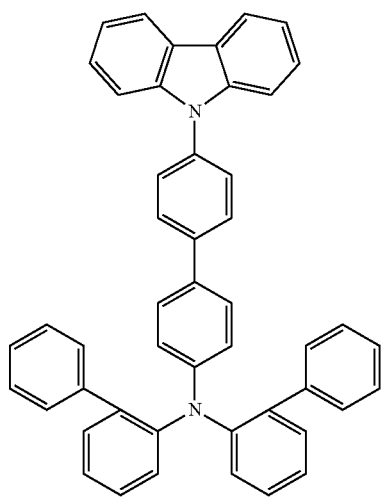
[P-30]
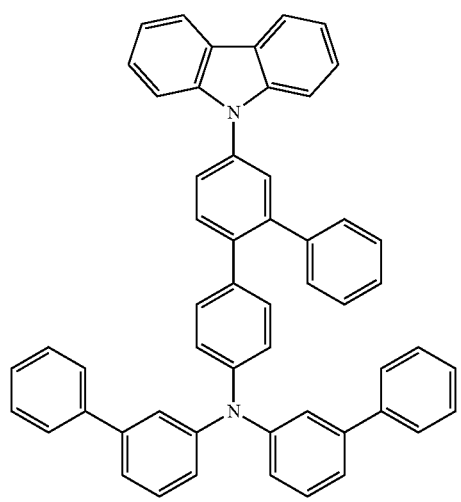
[P-31]
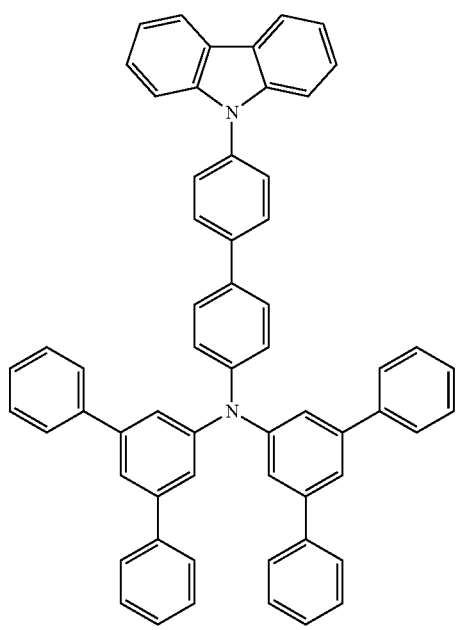
[P-32]

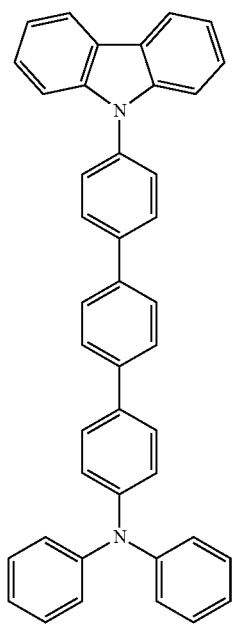 [P-33]
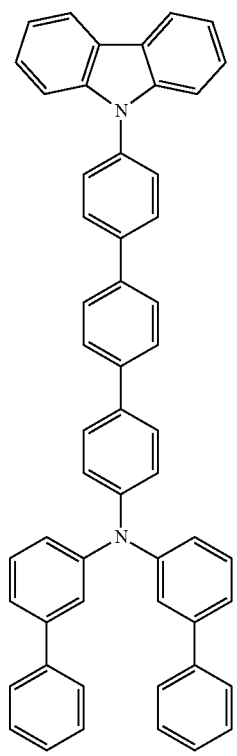 [P-34]
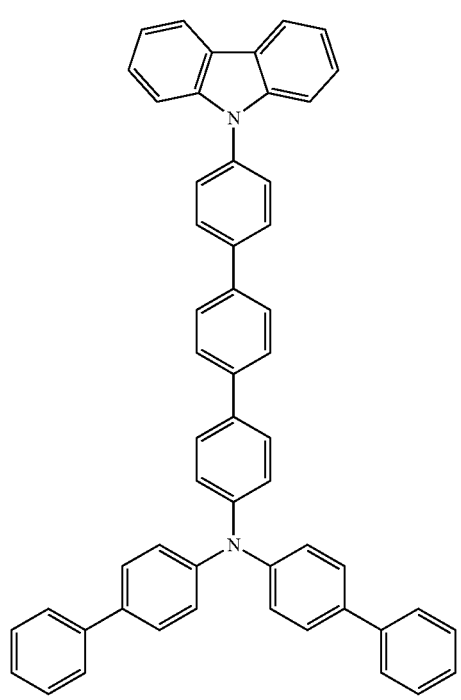 [P-35]
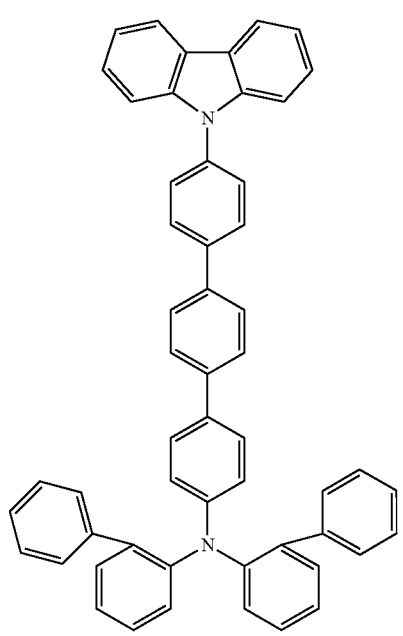 [P-36]

-continued
[P-37]
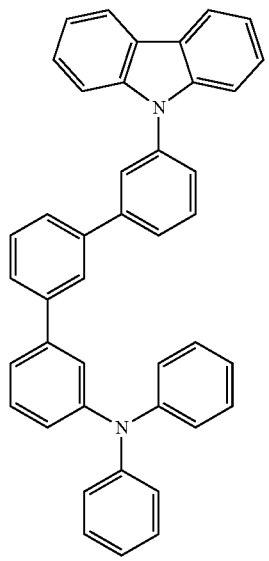
[P-38]
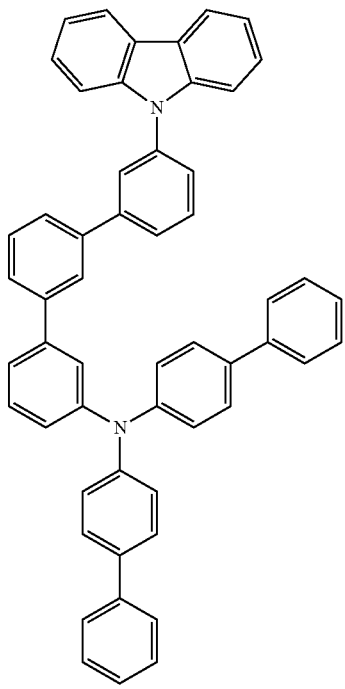
[P-39]
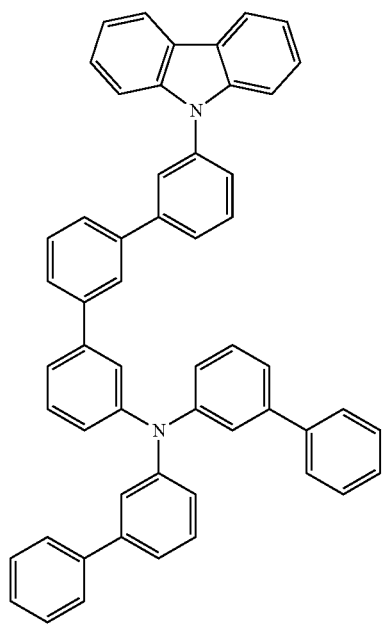
[P-40]
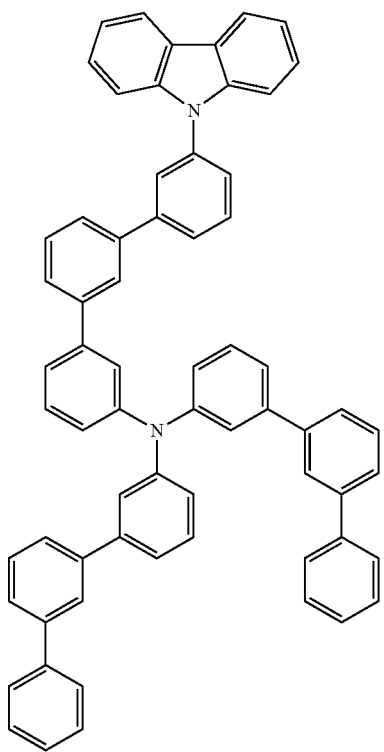

[P-41]
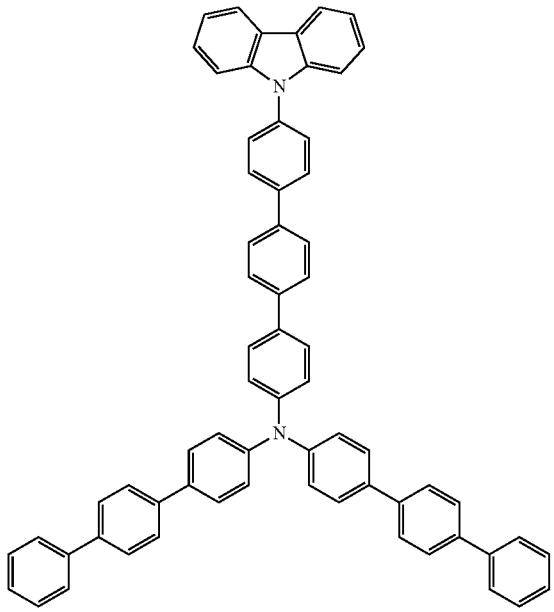
[P-42]
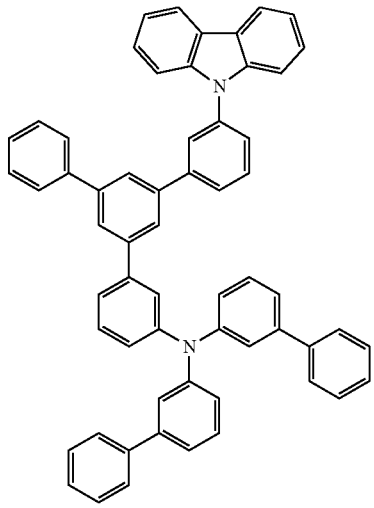
[P-43]
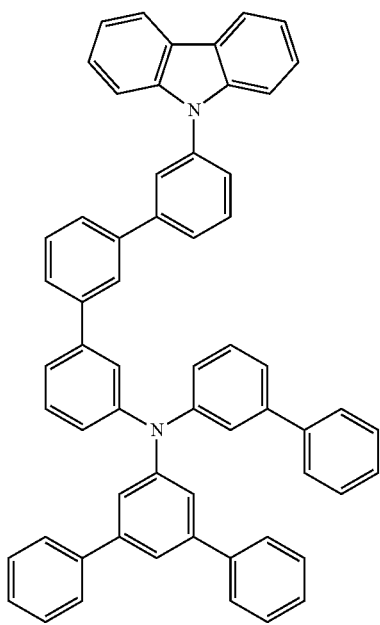
[P-44]
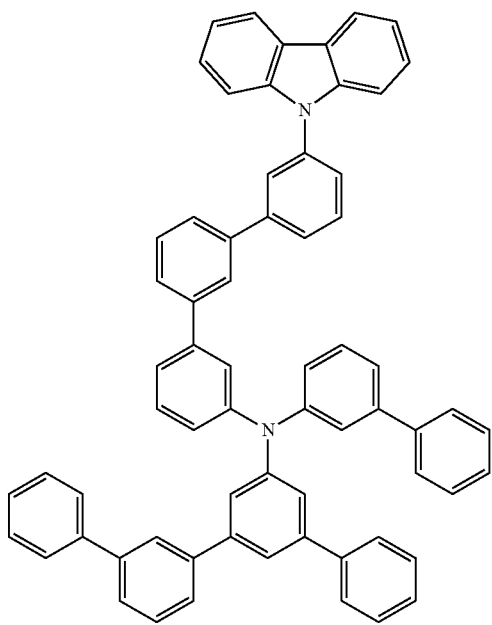

-continued
[P-45]
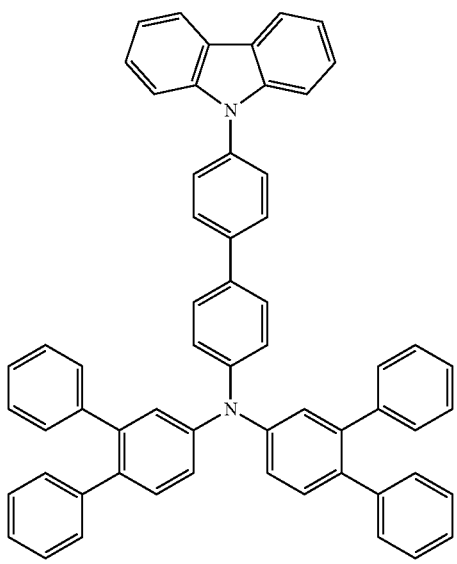
[P-46]
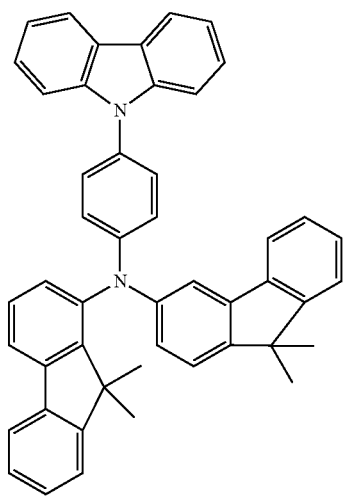
[P-47]
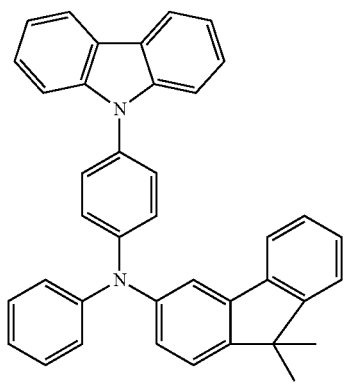
[P-48]
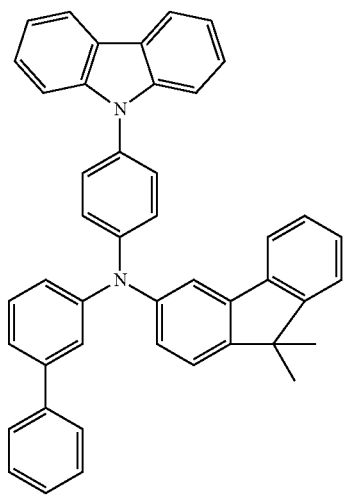
[P-49]
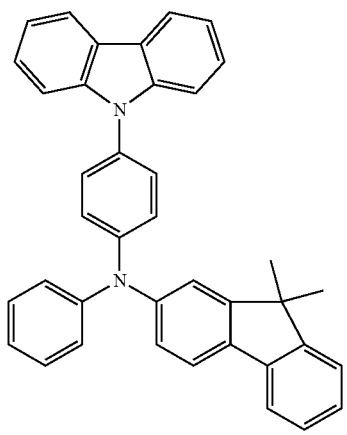
[P-50]
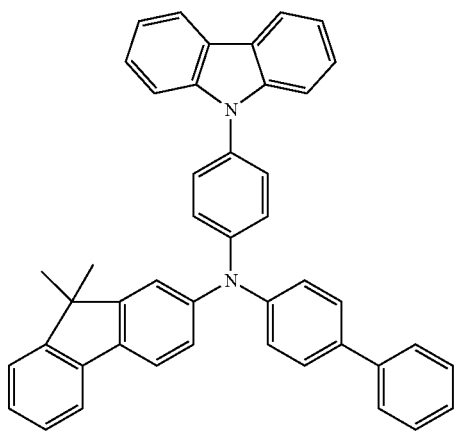

-continued
[P-51]
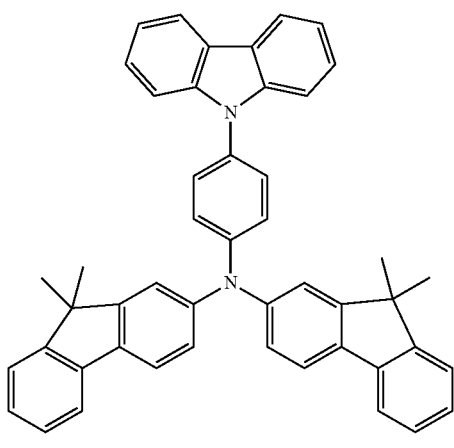
[P-52]
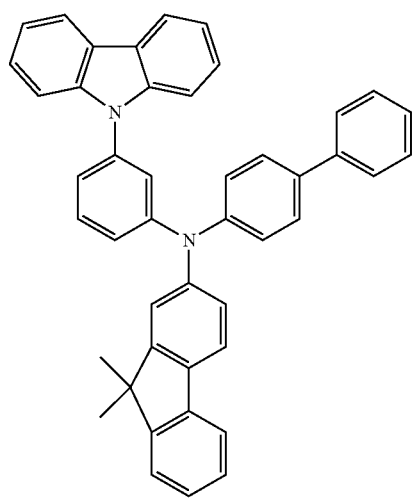
[P-53]
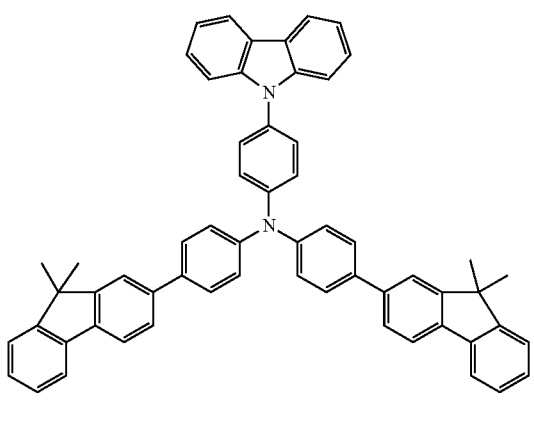
[P-54]
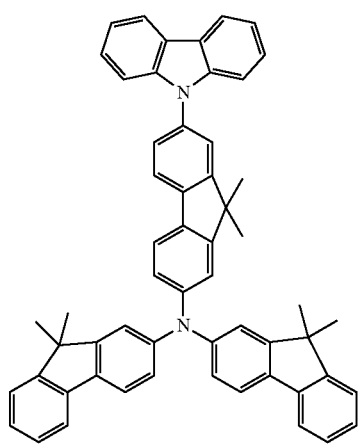
[P-55]
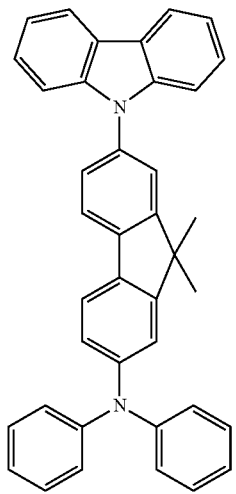
[P-56]
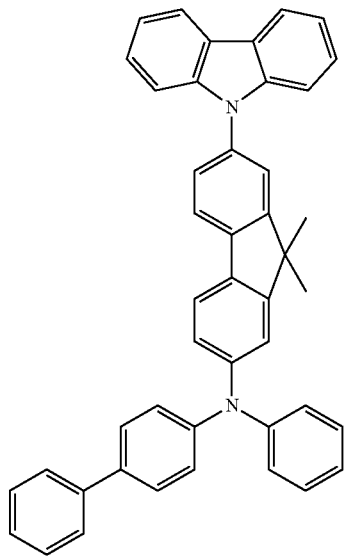

-continued
[P-57]
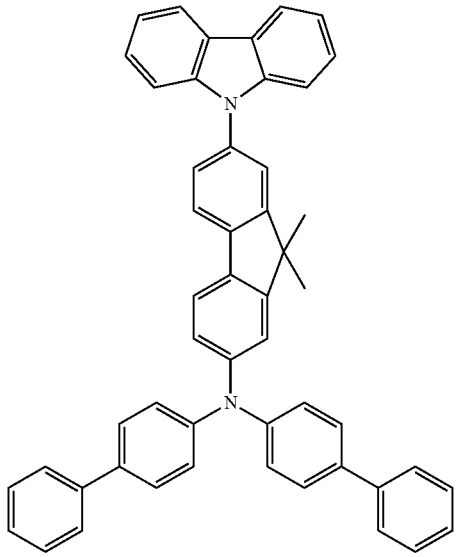
[P-58]
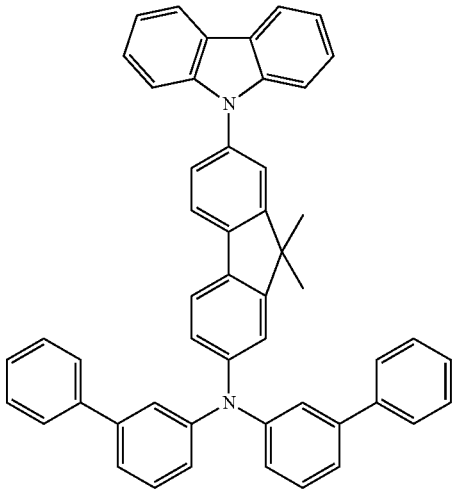
[P-59]
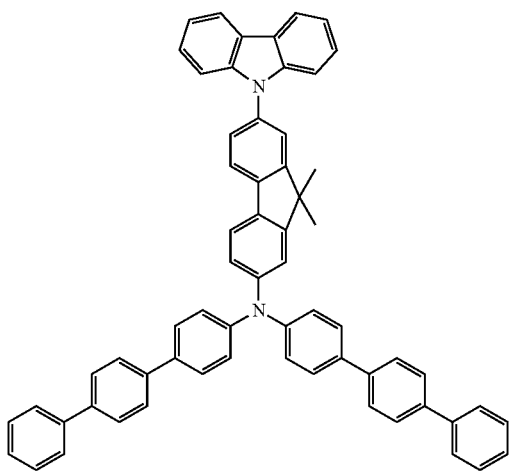
[P-60]
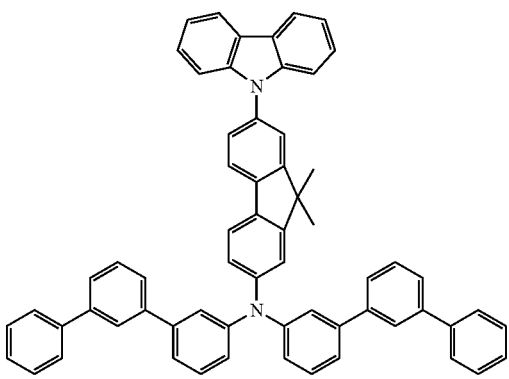
[P-61]
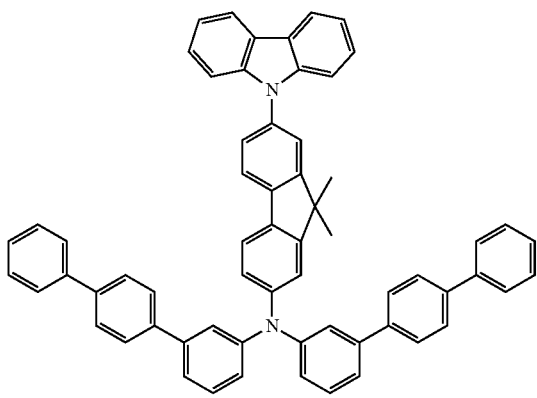
[P-62]
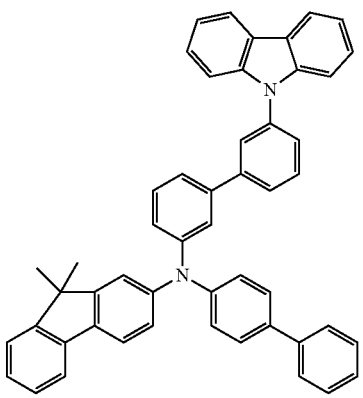

[P-63]
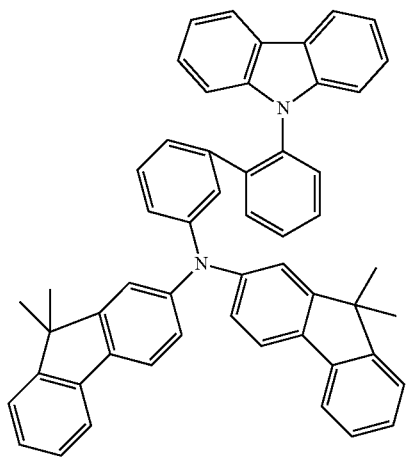
[P-64]
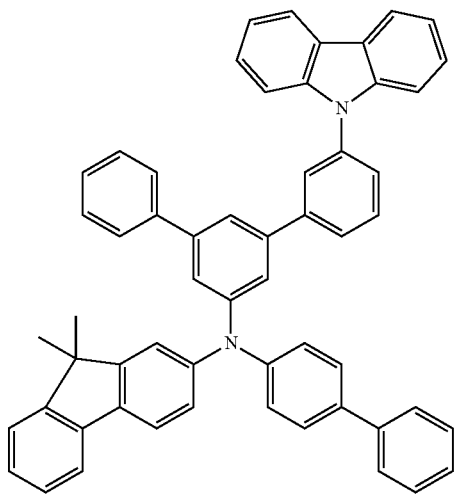
[P-65]
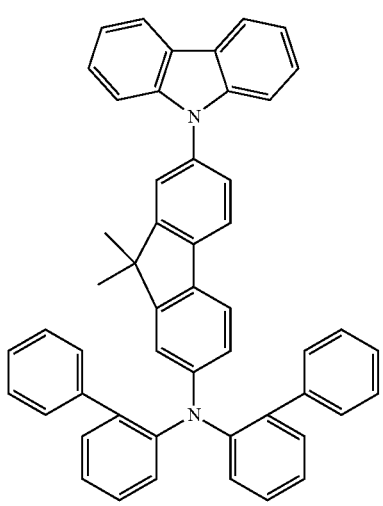
[P-66]
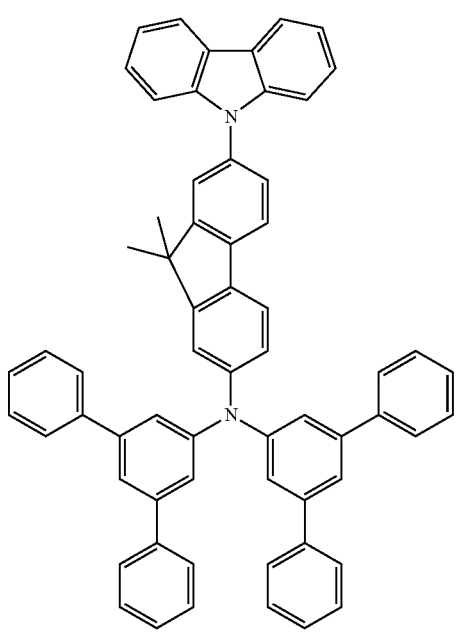

[P-67]
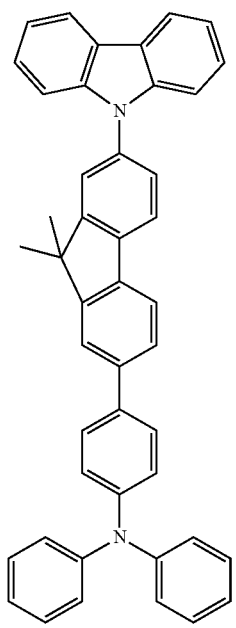
[P-68]
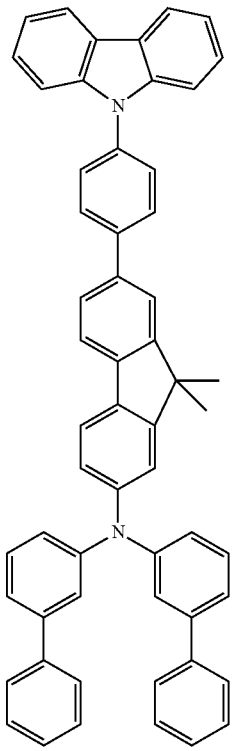
[P-69]
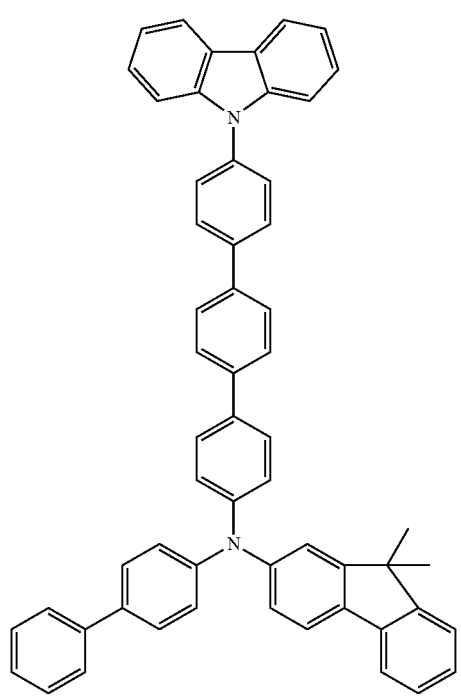
[P-70]
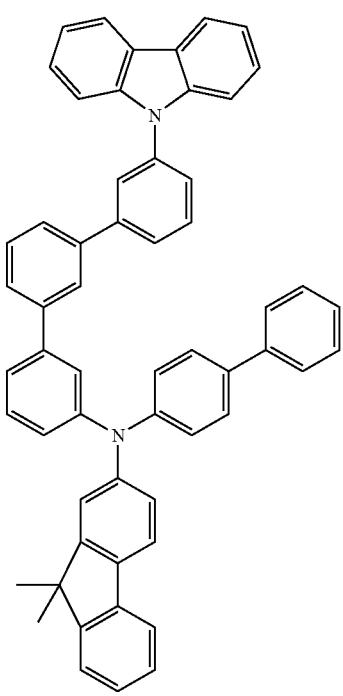

-continued
[P-71]
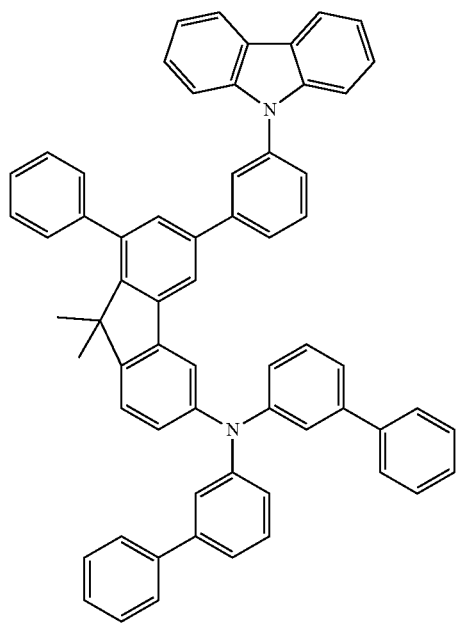
[P-72]
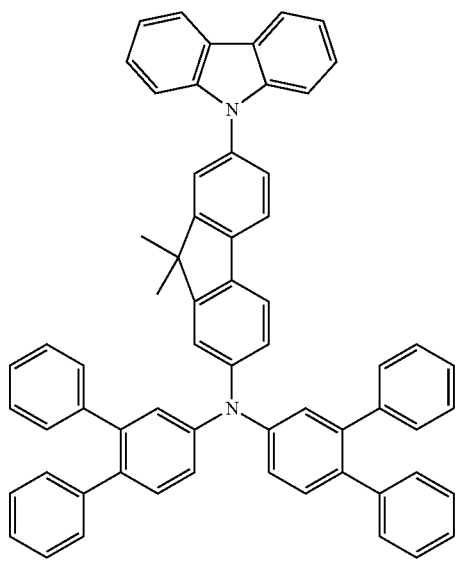
[P-73]
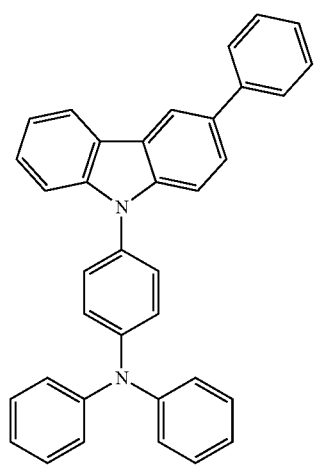
[P-74]
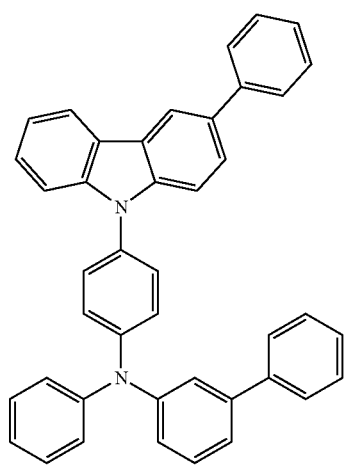
[P-75]
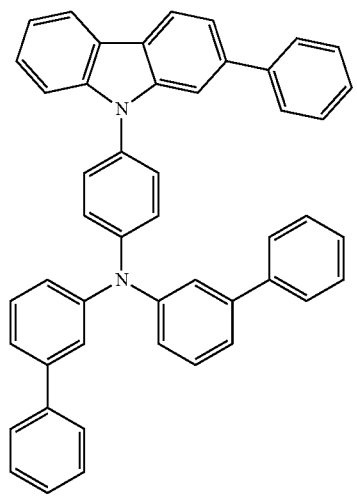
[P-76]
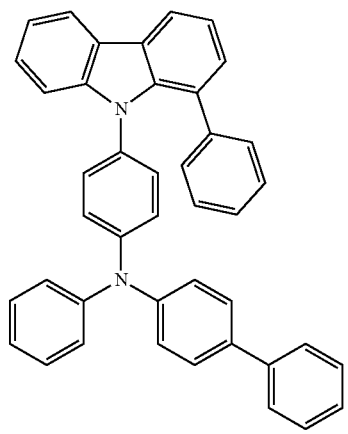

[P-77]
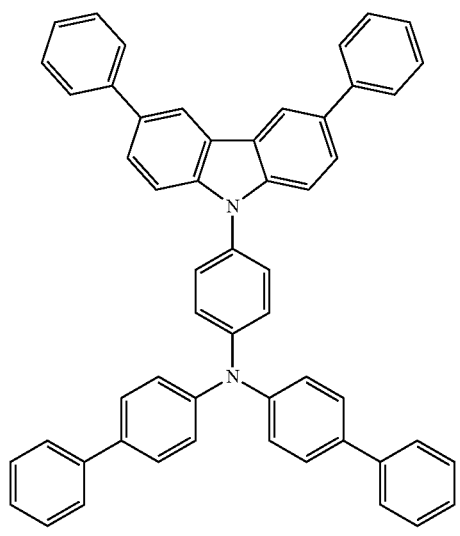
[P-78]
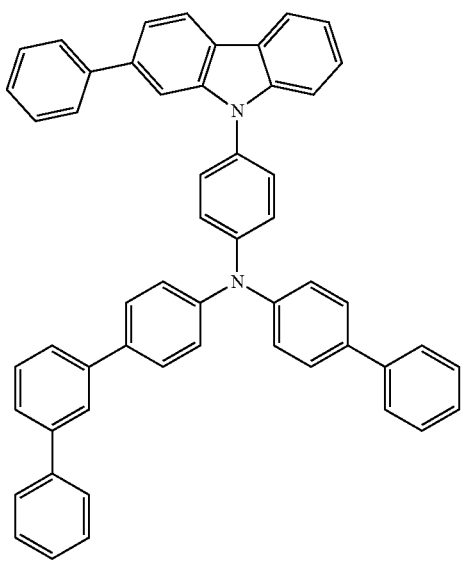
[P-79]
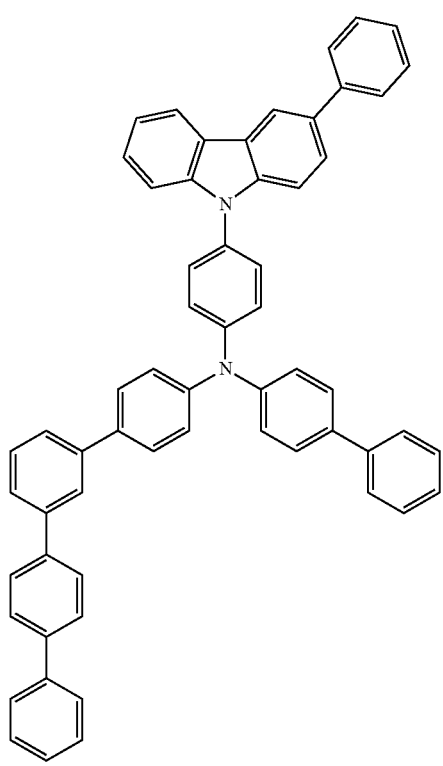
[P-80]
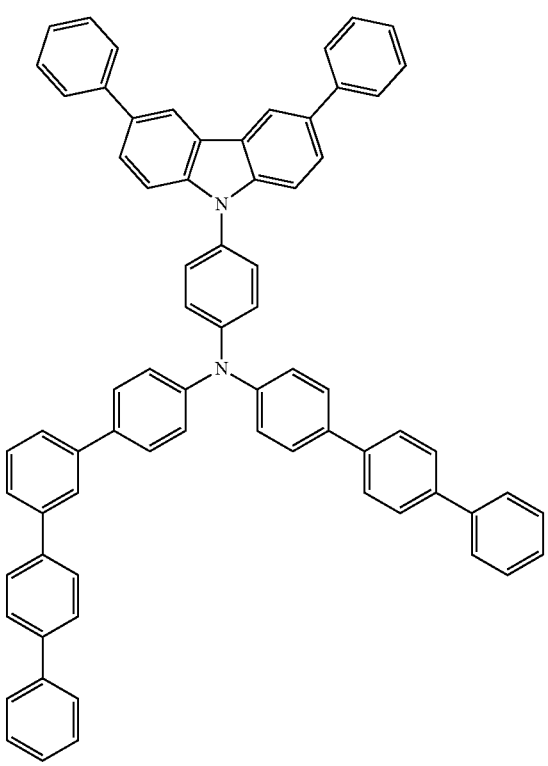

-continued
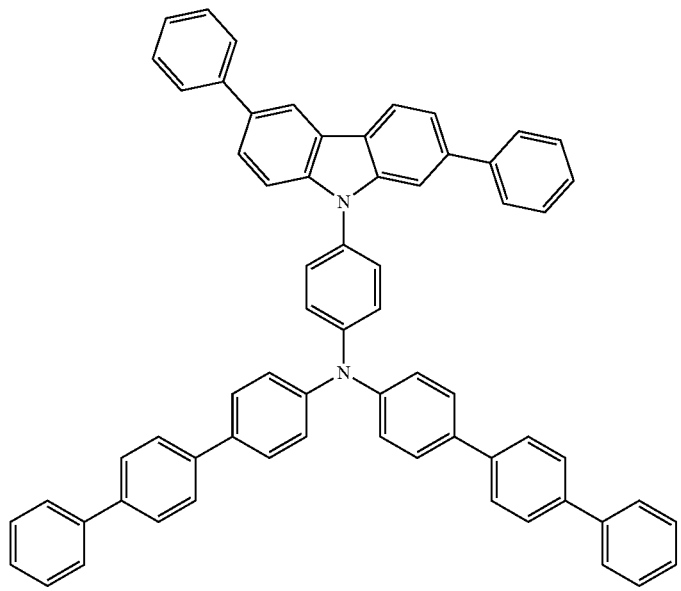
[P-81]
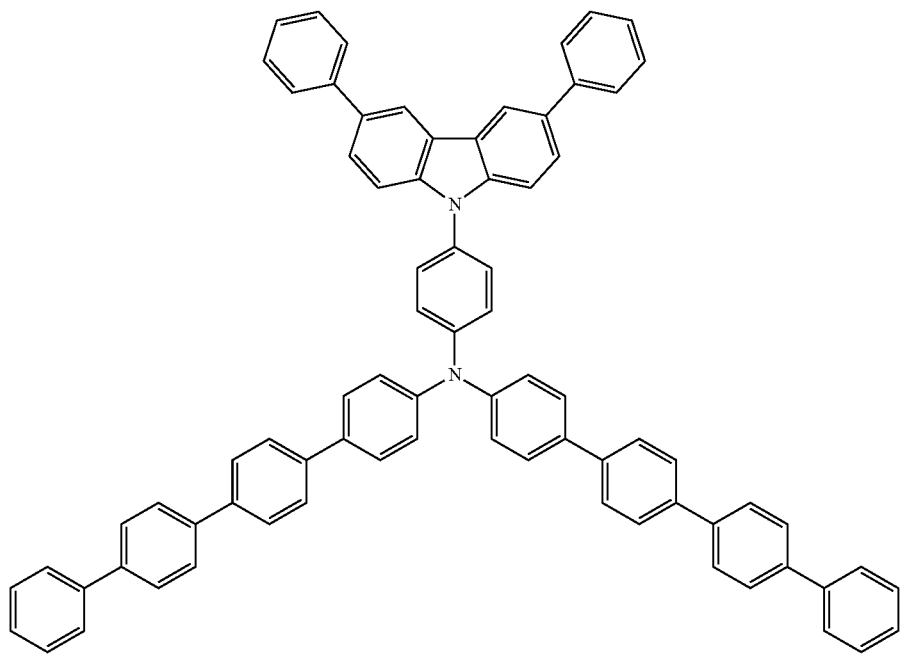
[P-82]

-continued
[P-83]
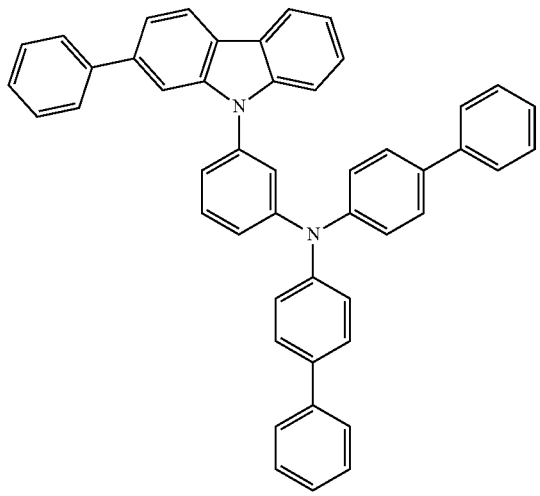
[P-84]
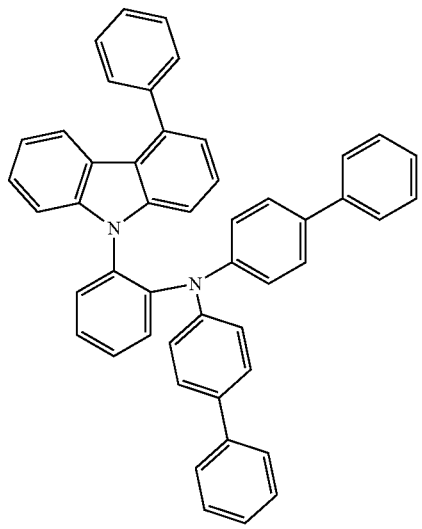
[P-85]
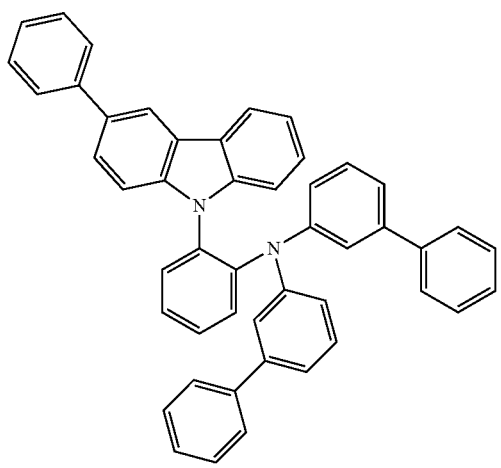
[P-86]
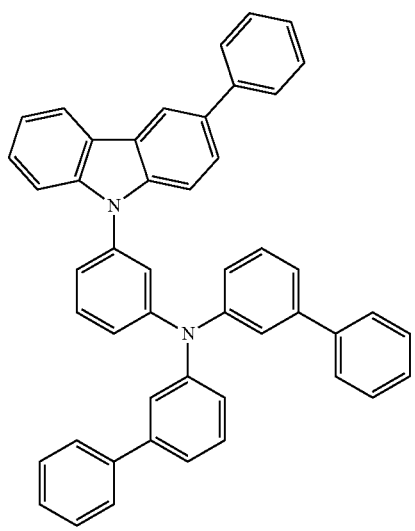
[P-87]
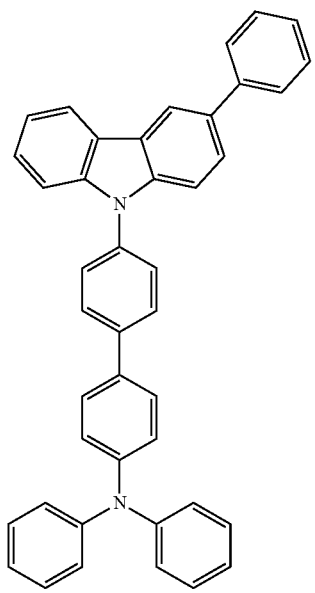
[P-88]
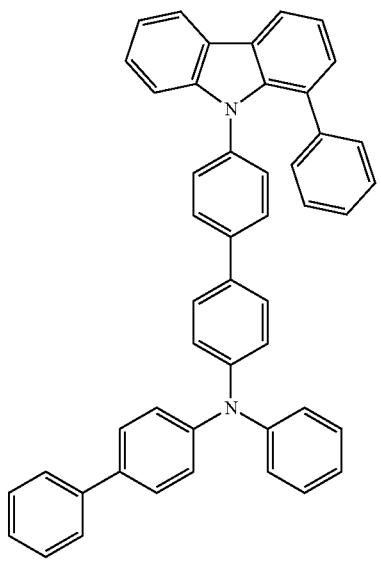

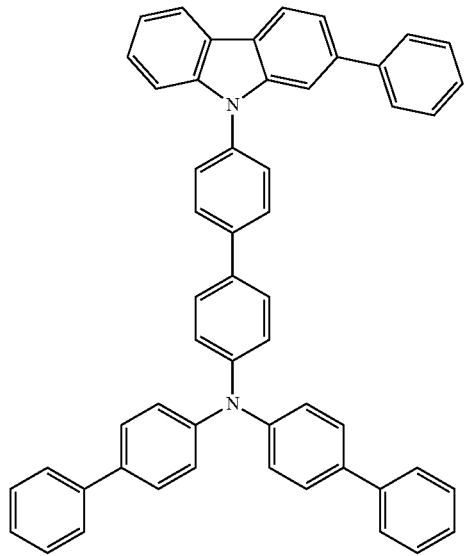 [P-89]
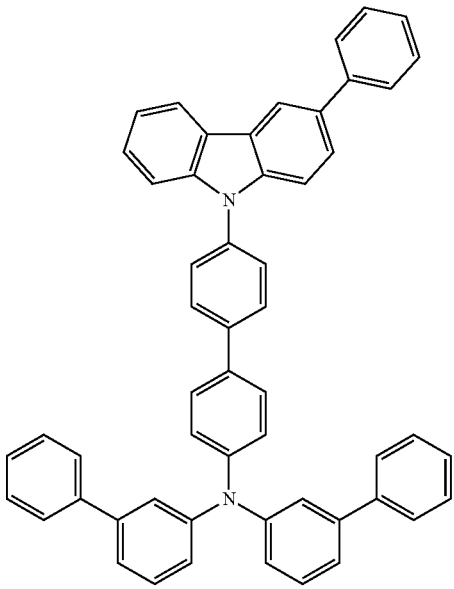 [P-90]
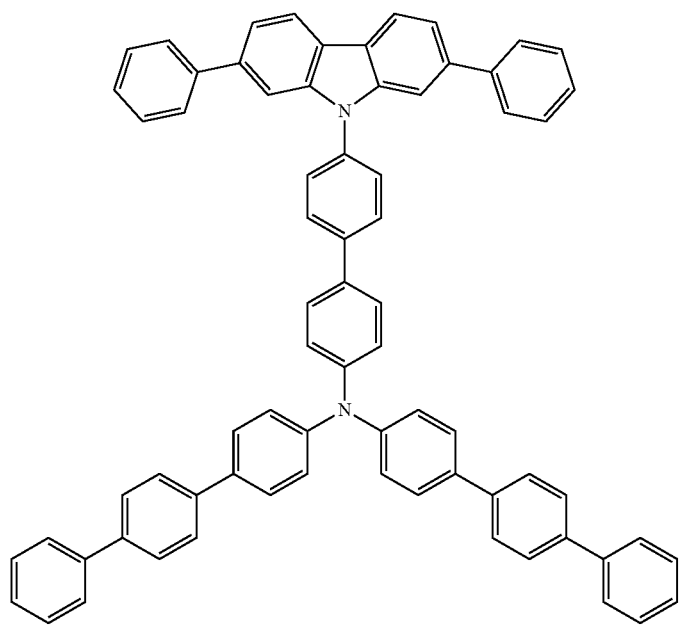 [P-91]

-continued
[P-92]
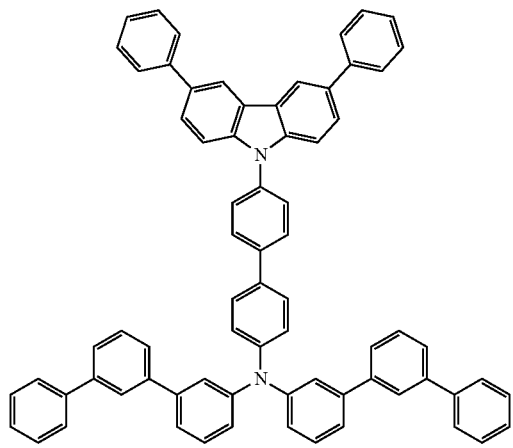
[P-93]
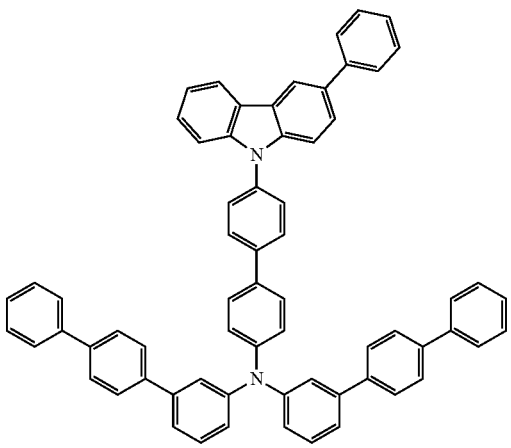
[P-94]
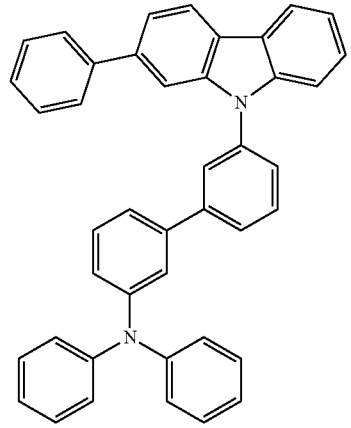
[P-95]
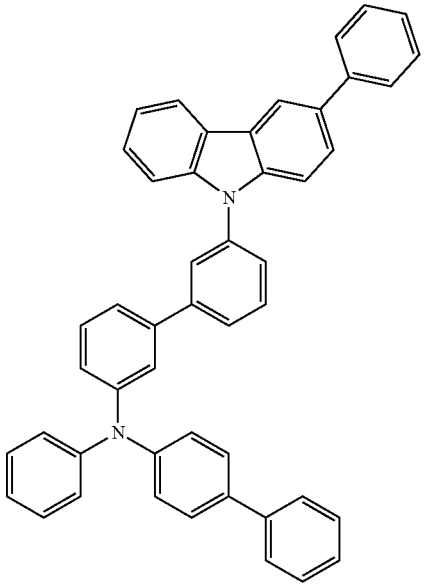
[P-96]
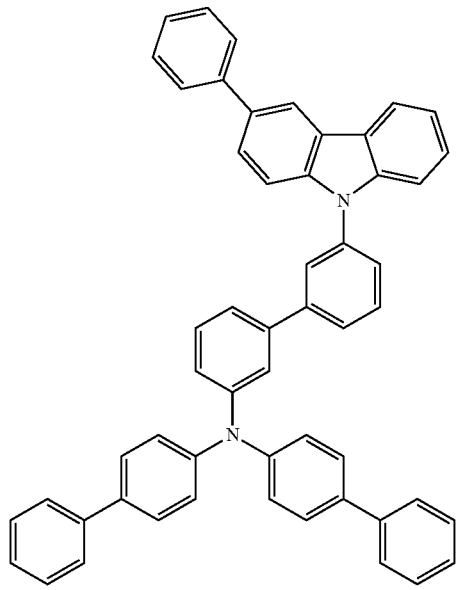
[P-97]
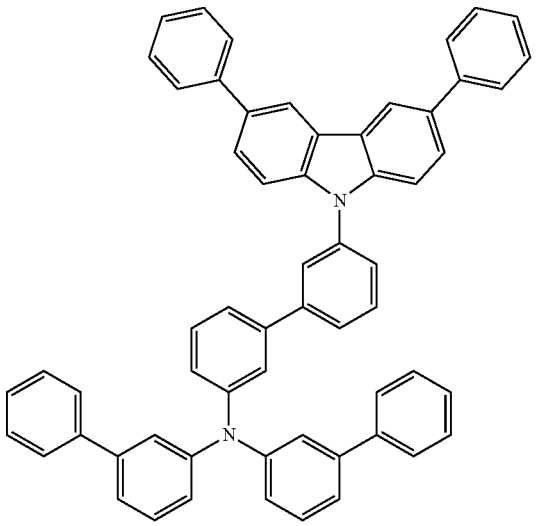

[P-98]
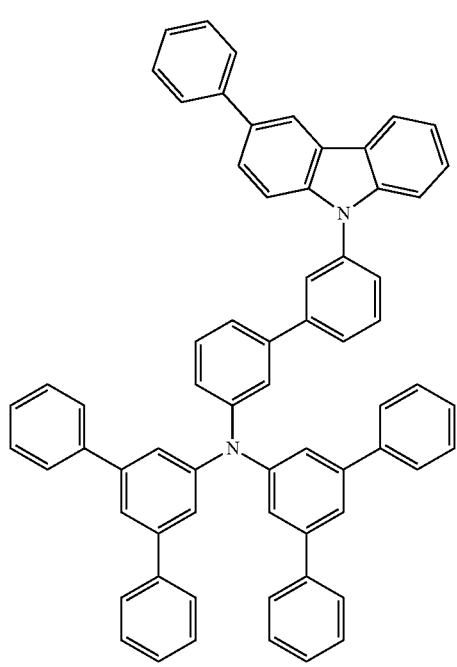
[P-99]
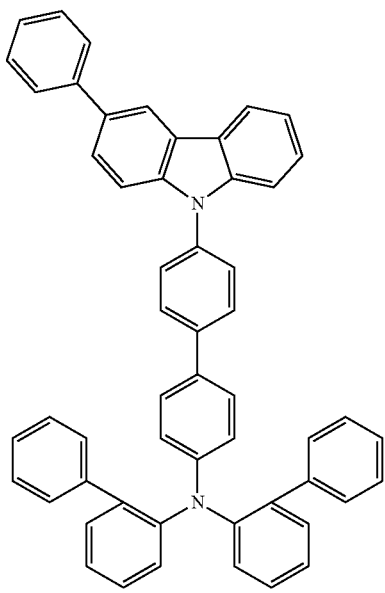
[P-100]
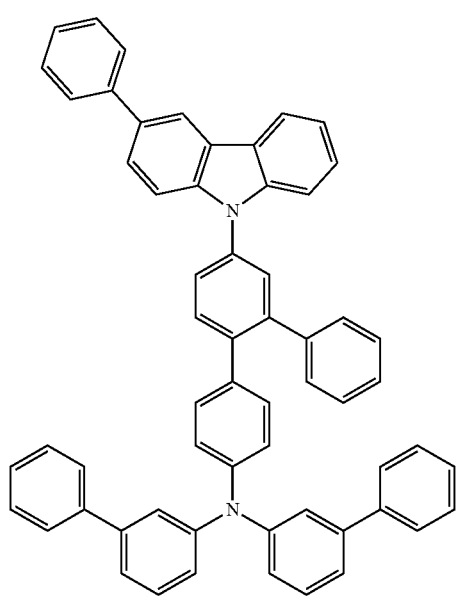
[P-101]
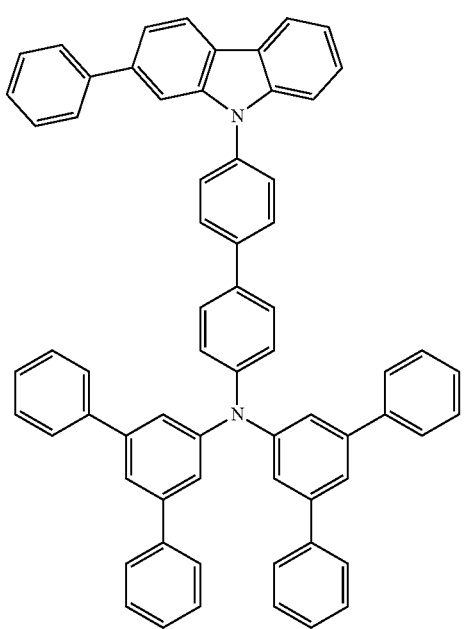

-continued
[P-102]
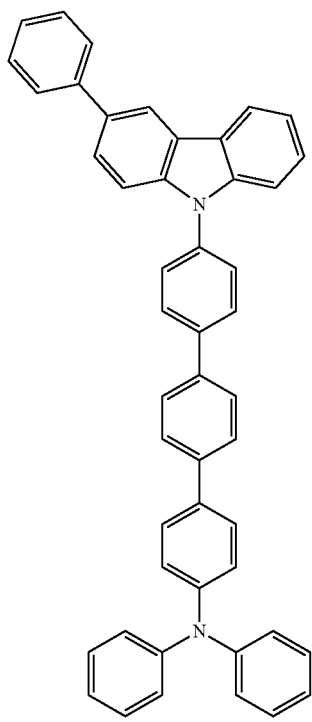
[P-103]
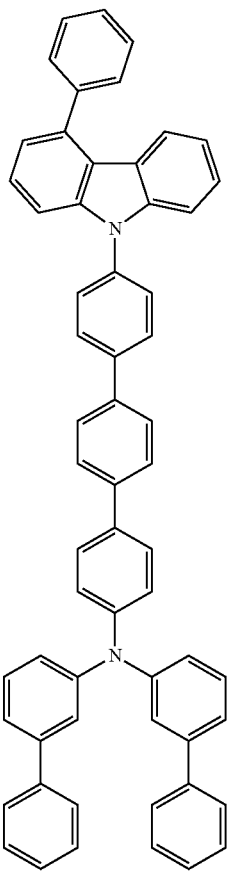
[P-104]
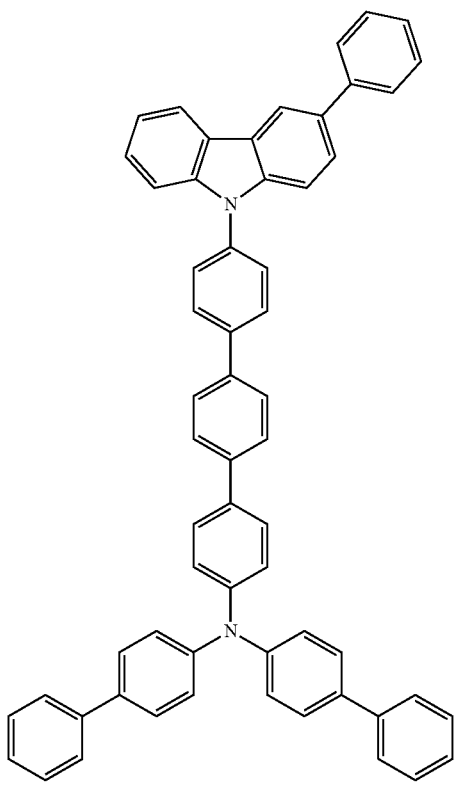
[P-105]
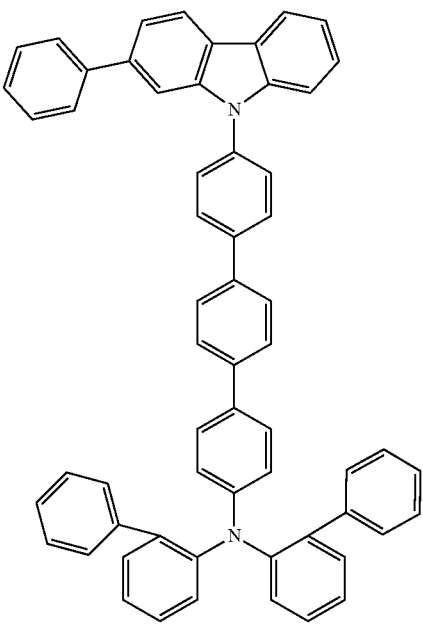

According to one embodiment of the present invention, an organic optoelectric device may simultaneously include an electron transport auxiliary layer including a first compound having strong electron characteristics and a hole transport auxiliary layer including a second compound having strong hole transport characteristics by reducing a HOMO energy level difference between the hole transport layer 31 and the emission layer 32 and thus, adjusting hole injection characteristics.

When the first and second compounds are used together, efficiency may be improved by adjusting a charge balance through hole injection-adjusting capability of the hole transport auxiliary layer and electron injection-adjusting capability of the electron transport auxiliary layer, and a life-span may be also improved by applying the hole and electron transport auxiliary layers and thus, preventing accumulation of charges on each interface of the organic layers and accordingly, reducing degradation of a device and stabilizing it.

Specifically, the electron transport auxiliary layer may include the first compound represented by Chemical Formula 1-I, and the hole transport auxiliary layer may include the second compound represented by Chemical Formula 2-I.

In addition, the electron transport auxiliary layer may include the first compound represented by Chemical Formula 1-I, and the hole transport auxiliary layer may include at least one of the second compounds represented by Chemical Formulae 2d, 2e, 2g and 2h. More specifically, the second compound may be represented by Chemical Formula 2d.

The electron transport auxiliary layer may further include a third compound having strong hole characteristics.

Specifically, it may further include at least one of compounds represented by Chemical Formulae 3-I to 3-XI, specifically, at least one of third compounds represented by Chemical Formulae 3-IX to 3-XI, and more specifically the third compound represented by Chemical Formula 3-XI.

The first compound and the third compound may be included in a weight ratio of about 1:10 to 10:1, and specifically 2:8 to 8:2, 3:7 to 7:3, 4:6 to 6:4 and 5:5. Within the ranges, bipolar characteristics may be more effectively realized and thus efficiency and life-span may be simultaneously improved.

For example, the organic optoelectric device according to one embodiment of the present invention may include an electron transport auxiliary layer including the first compound represented by Chemical Formula 1-I and the third compound represented by Chemical Formula 3-XI and a hole transport auxiliary layer including the second compound represented by Chemical Formula 2d.

The hole transport auxiliary layer 33 and the electron transport auxiliary layer 35 may be applied on a hole transport layer by a deposition or inkjet process with a thickness of 0.1 nm to 20.0 nm, for example 0.2 nm to 10.0 nm, 0.3 nm to 5 nm, 0.3 nm to 2 nm, or 0.4 nm to 1.0 nm.

The organic layer 30 may further include an electron transport layer 34. The electron transport layer 34 makes electron transfer from the cathode 20 to the emission layer 32 easy, and may be omitted as needed.

The organic layer 30 may optionally further include a hole injection layer 37 between the anode 10 and the hole transport layer 31 and/or an electron injection layer 36 between the cathode 20 and the electron transport layer 34.

The organic light emitting diode may be applied to an organic light emitting diode (OLED) display.

In the present invention, the organic optoelectric device refers to an organic photoelectric device, an organic light emitting diode, an organic solar cell, an organic transistor, an organic photo conductor drum, an organic memory device, and the like. Particularly, the compound for an organic optoelectric device according to one embodiment may be included in an electrode or an electrode buffer layer in the organic solar cell to improve the quantum efficiency, and it may be used as an electrode material for a gate, a source-drain electrode, or the like in the organic transistor.

Hereinafter, the embodiments are illustrated in more detail with reference to examples. These examples, however, are not in any sense to be interpreted as limiting the scope of the invention.

Synthesis of First Compound

Synthesis Example 1: Synthesis of Intermediate I-1

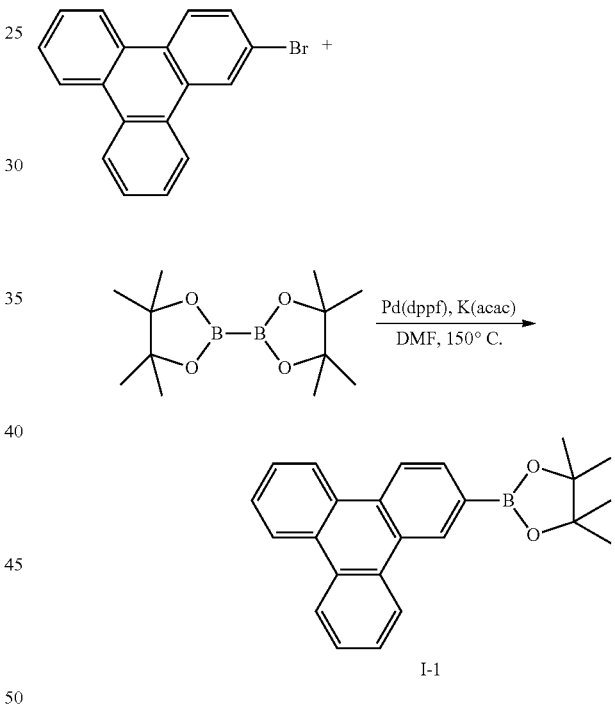

100 g (326 mmol) of 2-bromotriphenylene (TCI) was dissolved in 1 L of dimethyl formamide (DMF) under a nitrogen environment, 99.2 g (391 mmol) of bis(pinacolato) diboron (Sigma-Aldrich Co., Ltd.), 2.66 g (3.26 mmol) of (1,1'-bis(diphenylphosphine)dichloropalladium (II) and 80 g (815 mmol) of potassium acetate were added thereto, and the mixture was heated and refluxed at 150° C. for 5 hours. When the reaction was complete, water was added to the reaction solution, and the mixture was filtered and dried in a vacuum oven. The obtained residue was purified through column chromatography, obtaining 113 g (98%) of a compound I-1.

HRMS (70 eV, EI+): m/z calcd for $C_{24}H_{23}BO_2$: 354.1791, found: 354.

Elemental Analysis: C, 81%; H, 7%

Synthesis Example 2: Synthesis of Intermediate I-2

[Reaction Scheme 2]

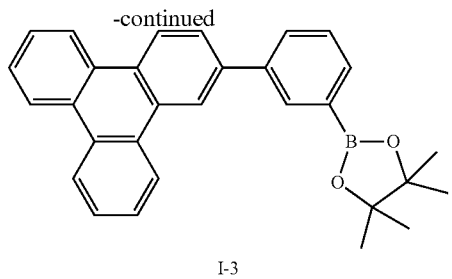

32.7 g (107 mmol) of 2-bromotriphenylene (TCI) was dissolved in 0.3 L of tetrahydrofuran (THF) in a nitrogen environment, 20 g (128 mmol) of 3-chlorophenylboronic acid (TCI) and 1.23 g (1.07 mmol) of tetrakis(triphenylphosphine)palladium were added thereto, and the mixture was agitated. Then, 36.8 g (267 mmol) of potassium carbonate saturated in water was added thereto, and the resulting mixture was heated and refluxed at 80° C. for 24 hours. When the reaction was complete, water was added to the reaction solution, and the mixture was extracted with dichloromethane (DCM) and then, filtered after removing moisture with anhydrous $MgSO_4$ and concentrated under a reduced pressure. The obtained residue was separated and purified through column chromatography, obtaining 22.6 g (63%) of a compound I-2.

HRMS (70 eV, EI+): m/z calcd for $C_{24}H_{15}Cl$: 338.0862, found: 338.

Elemental Analysis: C, 85%; H, 5%

Synthesis Example 3: Synthesis of Intermediate I-3

[Reaction Scheme 3]

18.6 g (65%) of a compound I-3 was obtained according to the same synthesis method as the synthesis method of the intermediate I-1.

HRMS (70 eV, EI+): m/z calcd for $C_{30}H_{27}BO_2$: 430.2104, found: 430.

Elemental Analysis: C, 84%; H, 6%

Synthesis Example 4: Synthesis of Intermediate I-4

[Reaction Scheme 4]

100 g (282 mmol) of the compound I-1 was dissolved in 1 L of tetrahydrofuran (THF) under a nitrogen environment, 95.9 g (339 mmol) of 1-bromo-2-iodobenzene (Sigma-Aldrich Co., Ltd.) and 3.26 g (2.82 mmol) of tetrakis(triphenylphosphine)palladium were added thereto, and the mixture was agitated. 97.4 g (705 mmol) of potassium carbonate saturated in water was added thereto, and the resulting mixture was heated and refluxed at 80° C. for 53 hours. When the reaction was complete, water was added to the reaction solution, and the mixture was extracted with dichloromethane (DCM) and then, filtered after removing moisture with anhydrous $MgSO_4$ and concentrated under a reduced pressure. The obtained residue was separated and purified through column chromatography, obtaining 95.1 g (88%) of a compound I-4.

HRMS (70 eV, EI+): m/z calcd for $C_{24}H_{15}Br$: 382.0357, found: 382.

Elemental Analysis: C, 75%; H, 4%

Synthesis Example 5: Synthesis of Intermediate I-5

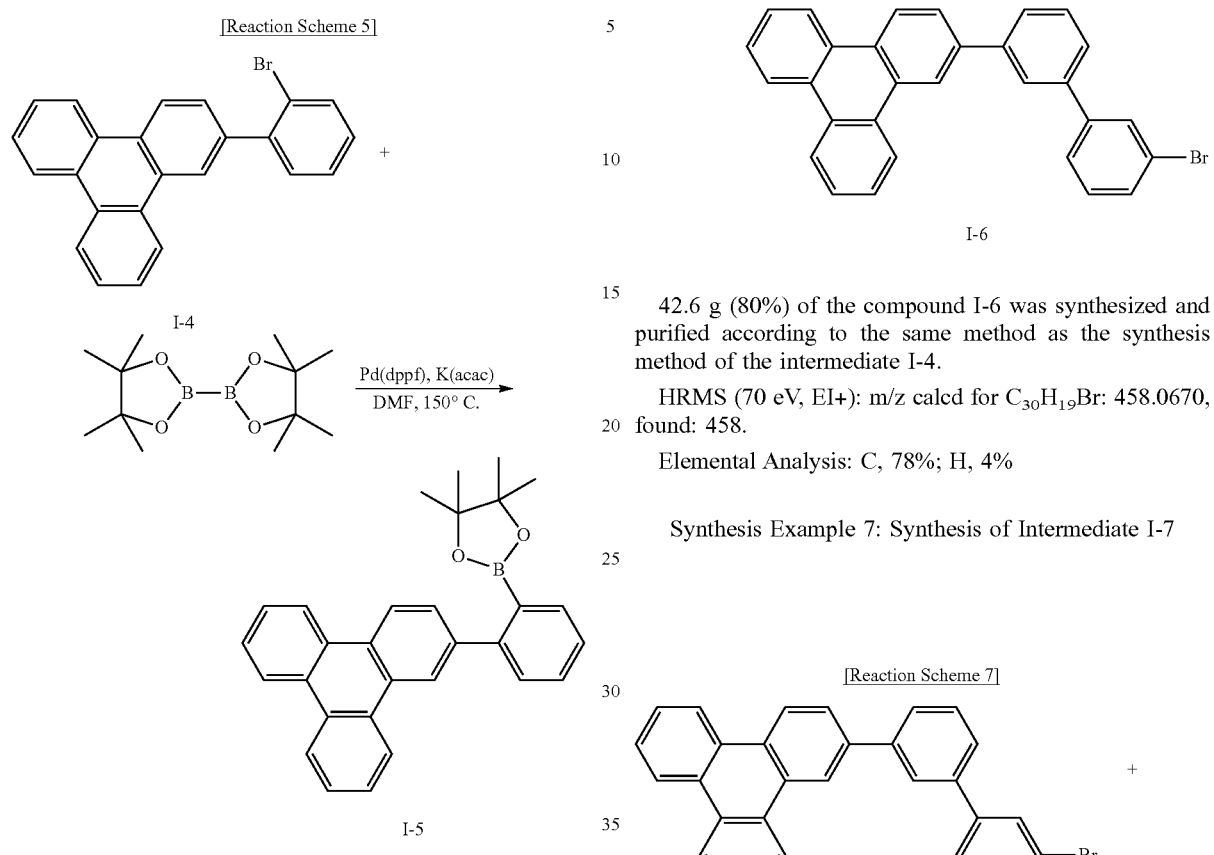

74.8 g (74%) of a compound I-5 was synthesized and purified according to the same method as the synthesis method of the intermediate I-1.

HRMS (70 eV, EI+): m/z calcd for $C_{30}H_{27}BO_2$: 430.2104, found: 430.

Elemental Analysis: C, 84%; H, 6%

SYNTHESIS Example 6: Synthesis of Intermediate I-6

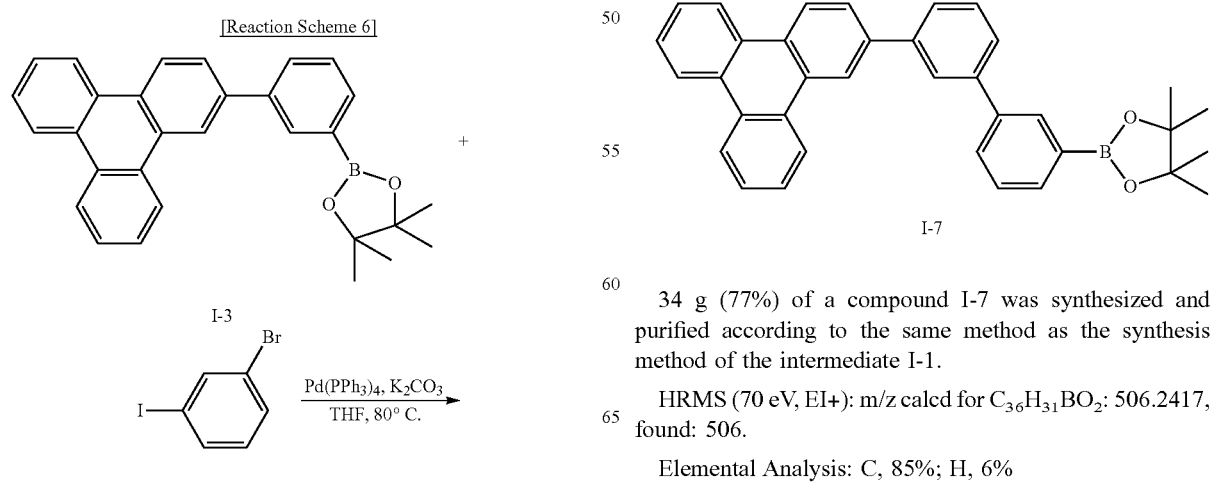

42.6 g (80%) of the compound I-6 was synthesized and purified according to the same method as the synthesis method of the intermediate I-4.

HRMS (70 eV, EI+): m/z calcd for $C_{30}H_{19}Br$: 458.0670, found: 458.

Elemental Analysis: C, 78%; H, 4%

Synthesis Example 7: Synthesis of Intermediate I-7

34 g (77%) of a compound I-7 was synthesized and purified according to the same method as the synthesis method of the intermediate I-1.

HRMS (70 eV, EI+): m/z calcd for $C_{36}H_{31}BO_2$: 506.2417, found: 506.

Elemental Analysis: C, 85%; H, 6%

159

Synthesis Example 8: Synthesis of Intermediate I-8

[Reaction Scheme 8]

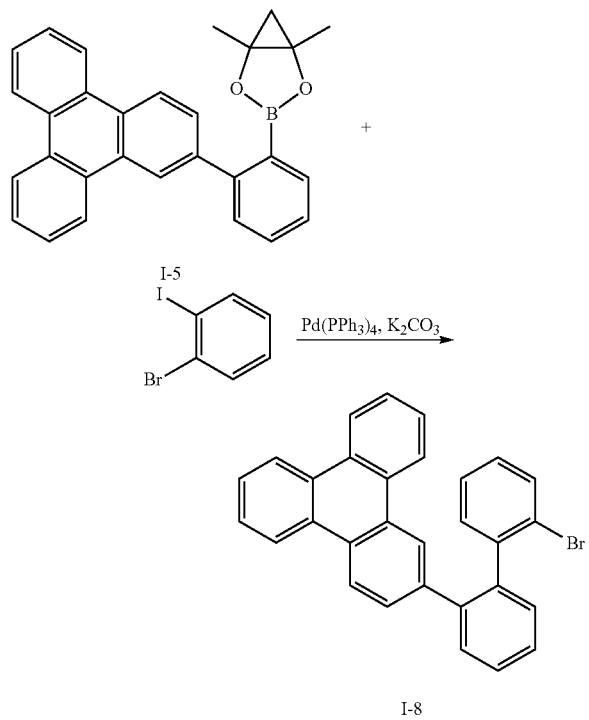

70 g (163 mmol) of the compound I-5 was dissolved in 0.6 L of tetrahydrofuran (THF) under a nitrogen environment, 55.2 g (195 mmol) of 1-bromo-2-iodobenzene and 1.88 g (1.63 mmol) of tetrakis(triphenylphosphine)palladium were added thereto, and the mixture was agitated. Then, 56.3 g (408 mmol) of potassium carbonate saturated in water was added thereto, and the resulting mixture was heated and refluxed at 80° C. for 12 hours. When the reaction was complete, water was added to the reaction solution, and the mixture was extracted with dichloromethane (DCM) and then, filtered after removing moisture with anhydrous $MgSO_4$ and concentrated under a reduced pressure. The obtained residue was separated and purified through flash column chromatography, obtaining 68.1 g (91%) of the compound I-8

HRMS (70 eV, EI+): m/z calcd for $C_{30}H_{19}Br$: 458.0670, found: 458.

Elemental Analysis: C, 78%; H, 4%

Synthesis Example 9: Synthesis of Intermediate I-9

[Reaction Scheme 9]

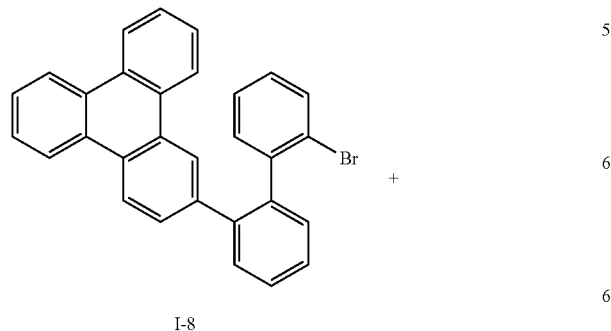

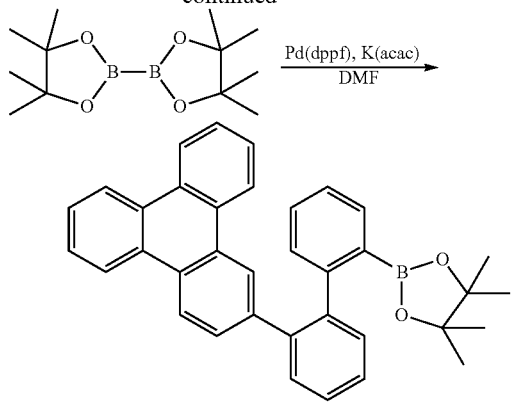

40 g (87.1 mmol) of the compound I-8 was dissolved in 0.3 L of dimethylforamide (DMF) under a nitrogen environment, 26.5 g (104 mmol) of bis(pinacolato)diboron, 0.71 g (0.87 mmol) of (1,1'-bis(diphenylphosphine)ferrocene) dichloropalladium (II) and 21.4 g (218 mmol) of potassium acetate were added thereto, and the mixture was heated and refluxed at 150° C. for 23 hours. When the reaction was complete, water was added to the reaction solution, and the mixture was filtered and dried in a vacuum oven. The obtained residue was separated and purified through flash column chromatography, obtaining 30.4 g (69%) of the compound I-9.

HRMS (70 eV, EI+): m/z calcd for $C_{36}H_{31}BO_2$: 506.2417, found: 506.

Elemental Analysis: C, 85%; H, 6%

Synthesis Example 10: Synthesis of Compound A-69

[Reaction Scheme 10]

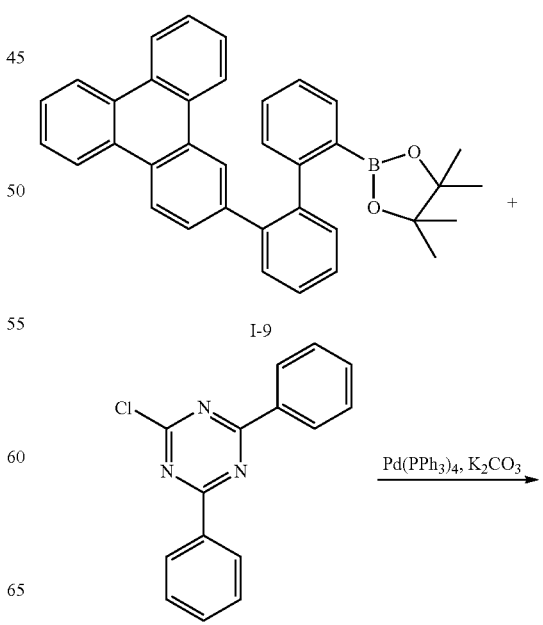

-continued

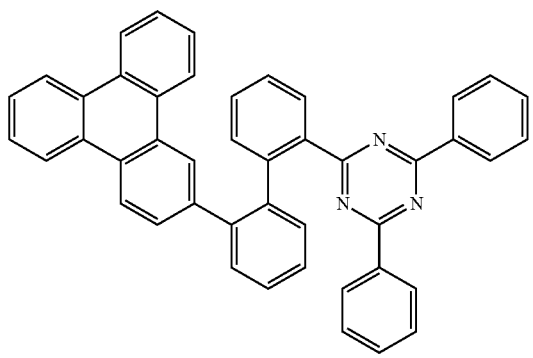

A-69

20 g (39.5 mmol) of the compound I-9 was dissolved in 0.2 L of tetrahydrofuran (THF) in a nitrogen environment, 10.6 g (39.5 mmol) of 2-chloro-4,6-diphenyl-1,3,5-triazine and 0.46 g (0.4 mmol) of tetrakis(triphenylphosphine)palladium were added thereto, and the mixture was agitated. Then, 13.6 g (98.8 mmol) of potassium carbonate saturated in water was added thereto, and the resulting mixture was heated and refluxed at 80° C. for 32 hours. When the reaction was complete, water was added to the reaction solution, and the mixture was extracted with dichloromethane (DCM) and filtered after removing moisture with anhydrous $MgSO_4$ and concentrated under a reduced pressure. The obtained residue was separated and purified through column chromatography, obtaining 15.2 g (63%) of the compound A-69.

HRMS (70 eV, EI+): m/z calcd for $C_{45}H_{29}N_3$: 611.2361, found: 611.

Elemental Analysis: C, 88%; H, 5%

Synthesis Example 11: Synthesis of Compound A-33

[Reaction Scheme 11]

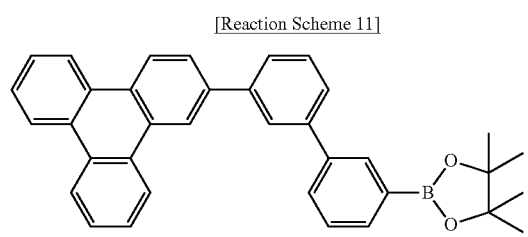

I-7

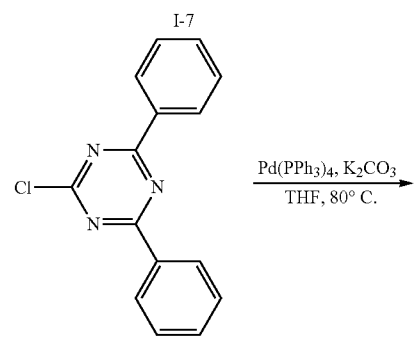

Pd(PPh3)4, K2CO3
THF, 80° C.

-continued

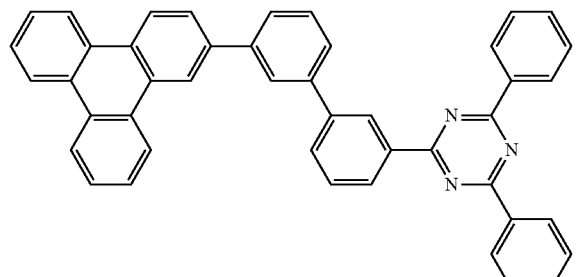

A-33

20 g (39.5 mmol) of the compound I-7 was dissolved in 0.2 L of tetrahydrofuran (THF) under a nitrogen environment, 10.6 g (39.5 mmol) of 2-chloro-4,6-diphenyl-1,3,5-triazine and 0.46 g (0.4 mmol) of tetrakis(triphenylphosphine)palladium were added thereto, and the mixture was agitated. Then, 13.6 g (98.8 mmol) of potassium carbonate was added thereto, and the resulting mixture was heated and refluxed at 80° C. for 23 hours. When the reaction was complete, water was added to the reaction solution, and the mixture was extracted with dichloromethane (DCM) and then, filtered after removing moisture with anhydrous $MgSO_4$ and concentrated under a reduced pressure. The obtained residue was separated and purified through column chromatography, obtaining 17.9 g (74%) of the compound A-33.

HRMS (70 eV, EI+): m/z calcd for $C_{45}H_{29}N_3$: 611.2361, found: 611.

Elemental Analysis: C, 88%; H, 5%

Synthesis Example 12: Synthesis of Compound A-32

[Reaction Scheme 12]

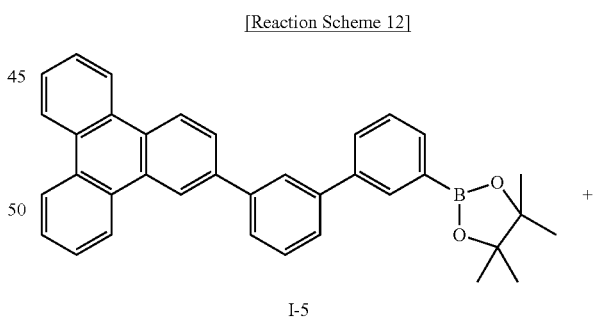

I-5

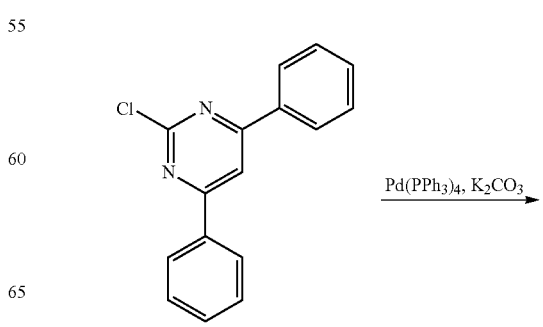

Pd(PPh3)4, K2CO3

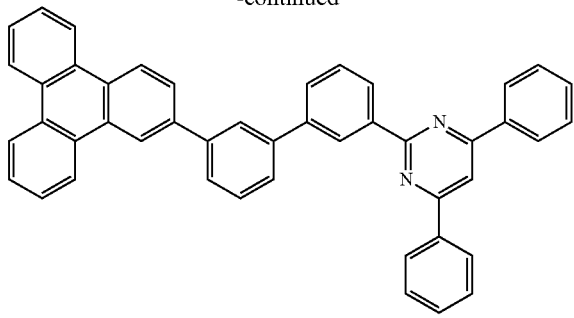

A-32

20 g (31.6 mmol) of the compound I-5 was dissolved in 0.2 L of tetrahydrofuran (THF) in a nitrogen environment, 8.4 g (31.6 mmol) of 2-chloro-4,6-diphenylpyrimidine and 0.46 g (0.4 mmol) of tetrakis(triphenylphosphine)palladium were added thereto, and the mixture was agitated. Then, 13.6 g (98.8 mmol) of potassium carbonate saturated in water was added thereto, and the resulting mixture was heated and refluxed at 80° C. for 15 hours. When the reaction was complete, water was added to the reaction solution, and the mixture was extracted with dichloromethane (DCM) and then, filtered after removing moisture with anhydrous MgSO$_4$ and concentrated under a reduced pressure. The obtained residue was separated and purified through column chromatography, obtaining 15.8 g (82%) of the compound A-32.

HRMS (70 eV, EI+): m/z calcd for C$_{46}$H$_{30}$N$_2$: 610.2461, found: 610.

Elemental Analysis: C, 90%; H, 5%

Synthesis of Second Compound

Synthesis Example 13: Synthesis of Intermediate PI-1

[Reaction Scheme 13]

PI-1

60.00 g (358.83 mmol) of 9H-carbazole (Sigma-Aldrich Co., Ltd.) as a starting material was dissolved with nitrobenzene in a round-bottomed flask, 154.58 g (430.60 mmol) of 4-bromo-4'-iodo-1,1'-biphenyl (TCI), 50.95 g (358.83 mmol) of Na$_2$SO$_4$, 49.52 g (358.83 mmol) of K$_2$CO$_3$, and 6.84 g (107.65 mmol) of Cu were added thereto, and the mixture was agitated at 200° C. After confirming that the reaction was complete by using TLC, the resultant was distilled under a reduced pressure to remove nitrobenzene and then, extracted with CH$_2$Cl$_2$ and water. Then, an organic layer obtained therefrom was dried with MgSO$_4$ and concentrated, and then, a compound obtained therefrom was silica gel-columned and recrystallized, obtaining 104.33 g (261.95 mmol) of an intermediate PI-1 (a yield of 73%).

HRMS (70 eV, EI+): m/z calcd for C$_{24}$H$_{16}$BrN: 397.05, found: 397.

Elemental Analysis: C, 72%; H, 4%

Synthesis Example 14: Synthesis of Intermediate PI-2

[Reaction Scheme 14]

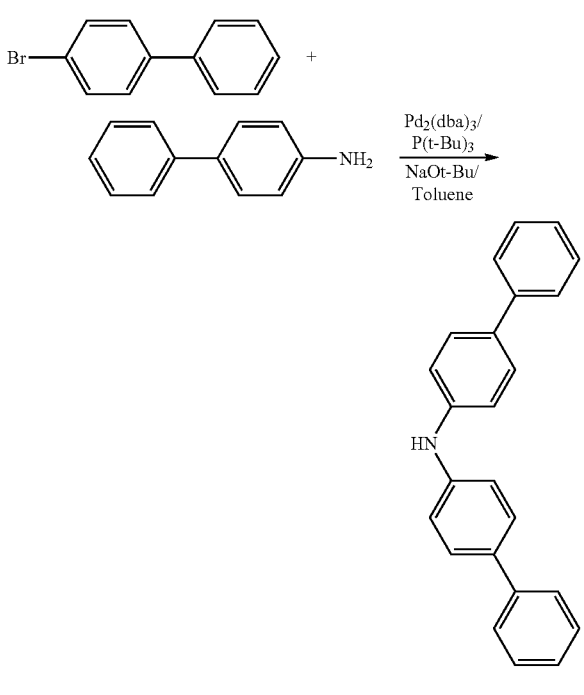

PI-2

50.00 g (214.49 mmol) of 4-bromo-1-1'-biphenyl (Sigma-Aldrich Co., Ltd.) as a starting material was dissolved with toluene in a round flask, 72.60 g (428.98 mmol) of [1,1'-biphenyl]-4-amine Sigma-Aldrich Co., Ltd.), 4.59 g (5.0 mmol) of Pd$_2$(dba)$_3$, 4.92 ml (10.0 mmol) of 50% P(t-Bu)$_3$, and 61.84 g (643.47 mmol) of NaOt-Bu were added thereto, and the mixture was agitated at 40° C. After confirming that the reaction was complete by using TLC, the resultant was extracted with CH$_2$Cl$_2$ and water, an organic layer obtained therefrom was dried with MgSO$_4$ and concentrated, and a compound obtained therefrom was silica-gel columned and recrystallized, obtaining 51.71 g (160.87 mmol) of an intermediate PI-2 (a yield of 75%).

HRMS (70 eV, EI+): m/z calcd for C$_{24}$H$_{19}$N: 321.15, found: 321.

Elemental Analysis: C, 90%; H, 6%

Synthesis Example 15: Synthesis of Compound P-17

[Reaction Scheme 15]

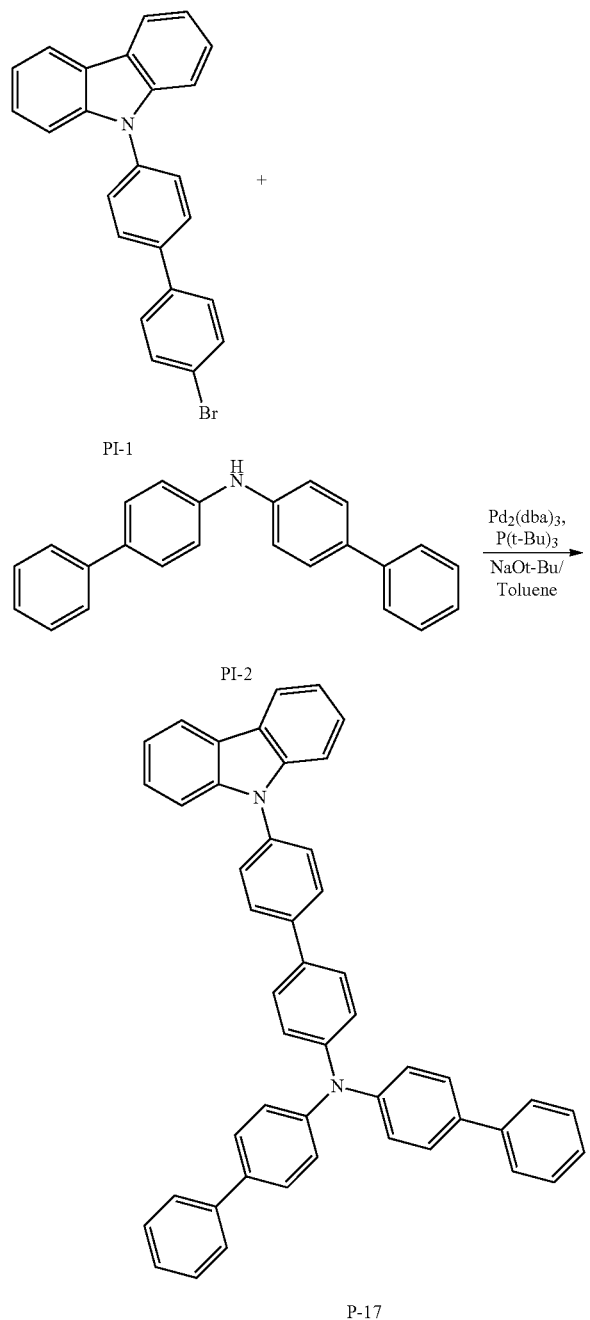

P-17

53.59 g (134.06 mmol) of the intermediate PI-1 obtained from the synthesis was dissolved with toluene in a round-bottomed flask, 51.71 g (160.87 mmol) of the intermediate PI-2, 4.59 g (5.0 mmol) of $Pd_2(dba)_3$, 4.92 ml (10.0 mmol) of 50% P(t-Bu)$_3$, and 61.84 g (643.47 mmol) of NaOt-Bu were added thereto, and the mixture agitated at 100° C. After conforming that the reaction was complete by using TLC, the resultant was extracted with $CH_2Cl_2$ and water, an organic layer obtained therefrom was dried with $MgSO_4$ and concentrated, and a compound obtained therefrom was silica-gel columned and recrystallized, obtaining 71.08 g (111.27 mmol) of an intermediate P-17 (a yield: 83%).

HRMS (70 eV, EI+): m/z calcd for $C_{48}H_{34}N_2$: 638.27, found: 638.

Elemental Analysis: C, 90%; H, 5%

Synthesis of Third Compound

Synthesis Example 16: Synthesis of Compound B-10

[Reaction Scheme 16]

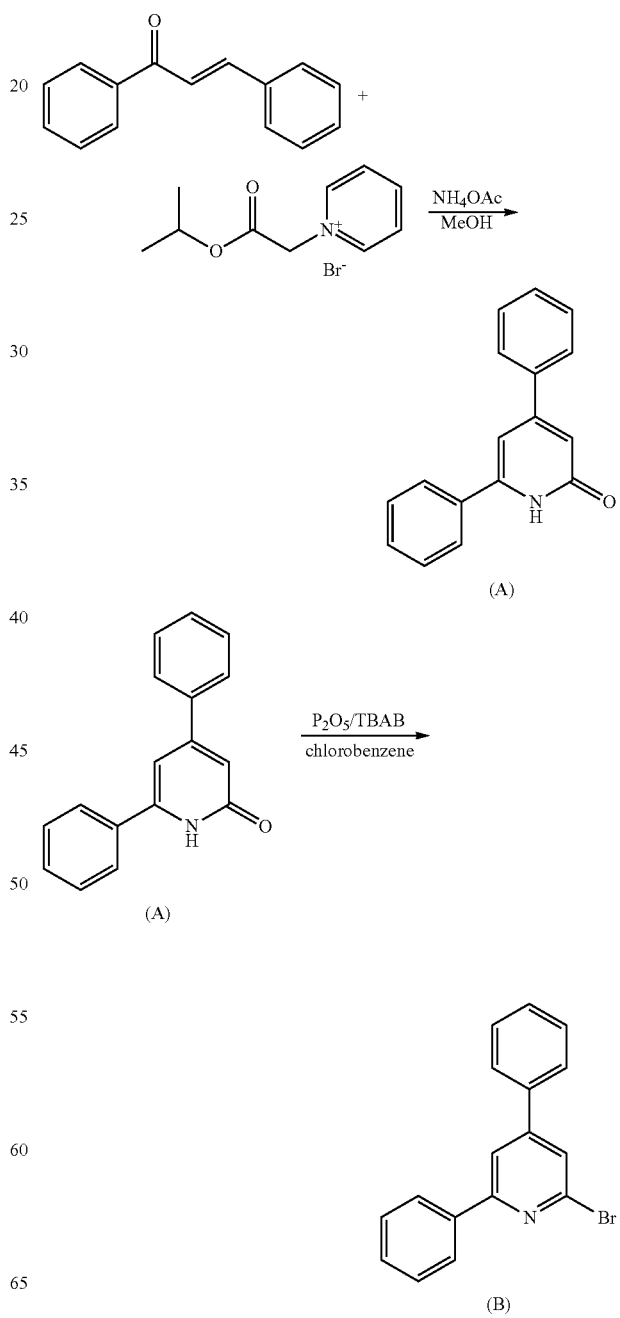

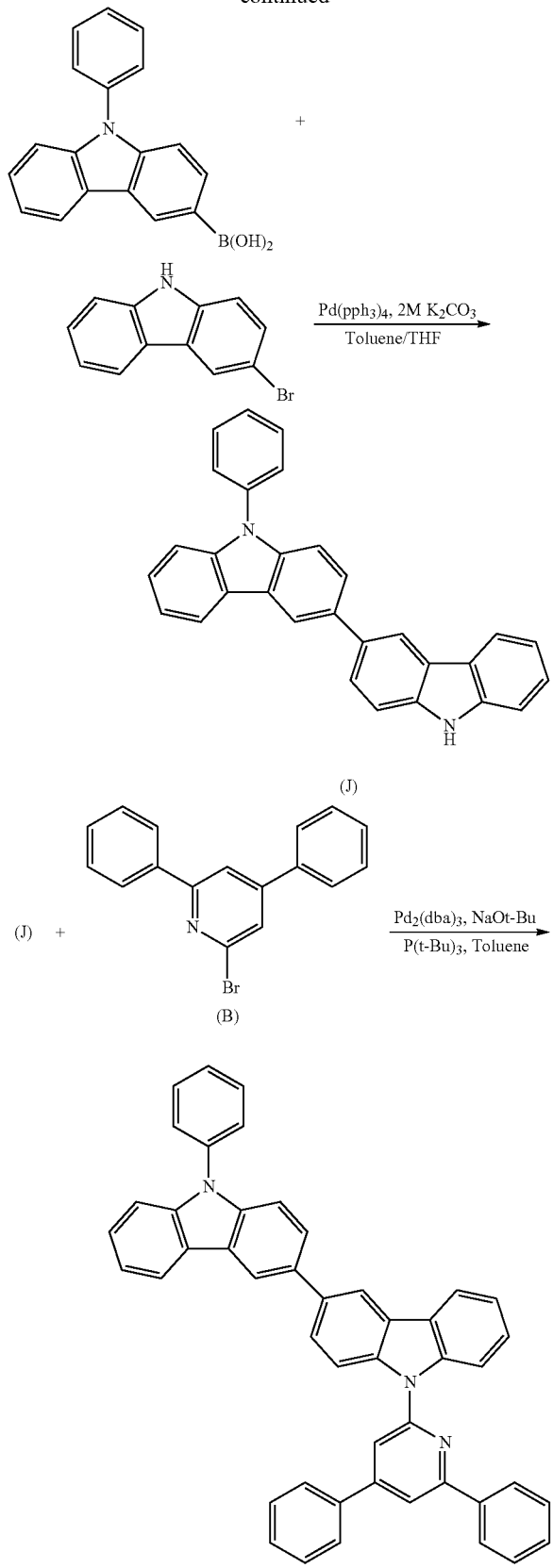

First Step: Synthesis of Compound A 140.4 g (674 mmol) of 2-Benzalacetophenone, 199.04 g (808.77 mmol) of pyridinechloride, and 415.6 g (5391 mmol) of ammonium acetate were suspended in 1720 ml of methanol and then, refluxed and agitated at 110° C. for 2 hours. After the reaction, the reaction product was precipitated in distilled water to produce a solid, and the solid was filtered, obtaining 106 g (64%) of a compound A.

Second Step: Synthesis of Compound B 100 g (405.67 mmol) of the compound A, 172.74 g (1217 mmol) of $P_2O_5$, and 196.17 g (608.5 mmol) of Tetra-n-butylammonium bromide (TBAB) were all suspended in chlorobenzene and then, refluxed and agitated at 140° C. for 14 hours. After the reaction, the resultant was extracted with dichloromethane and distilled water after removing a solvent therefrom, an organic layer obtained therefrom was filtered with silica gel and then, removed down to 150 ml, and a solid was precipitated by pouring methanol thereinto and filtered, obtaining 89 g (71%) of a compound B.

Third Step: Synthesis of Compound J 10 g (34.83 mmol) of 9-phenyl-9H-carbazol-3-yl boronic acid (TCI), 11.77 g (38.31 mmol) of 3-bromocarbazole (Sigma-Aldrich Co., Ltd.), and 14.44 g (104.49 mmol) of potassium carbonate, and 0.80 g (0.7 mmol) of tetrakis-(triphenylphosphine)palladium (0) were suspended in 140 ml of toluene and 50 ml of distilled water and then, refluxed and agitated for 12 hours. Subsequently, the resultant was extracted with dichloromethane and distilled water, and an organic layer obtained therefrom was filtered with silica gel. Subsequently, when the reaction was complete, a solid obtained by pouring methanol to the reactant was filtered and redissolved in chlorobenzene, activated carbon and anhydrous magnesium sulfate were added thereto, and the mixture was agitated. The solution was filtered and then, recrystallized by using chlorobenzene and methanol, obtaining 22.6 g (68%) of a compound J.

HRMS (70 eV, EI+): m/z calcd for $C_{30}H_{20}N_2$: 408.16, found: 408.

Elemental Analysis: C, 88%; H, 5%

Fourth Step: Synthesis of Compound B-10

22.42 g (54.88 mmol) of the compound J, 2-bromo-4,6-diphenylpyridine, 20.43 g (65.85 mmol) of the compound B and 7.92 g (82.32 mmol) of tertiarybutoxysodium were dissolved in 400 ml of toluene, 1.65 g (1.65 mmol) of palladium dibenzylideneamine and 1.78 g (4.39 mmol) of Tri-t-butyl phosphine were added thereto in a dropwise fashion. The reaction solution was heated and agitated at 110° C. under a nitrogen stream for 12 hours. When the reaction was complete, a solid produced by pouring methanol to the reactant was filtered and redissolved in chlorobenzene, activated carbon and anhydrous magnesium sulfate were added thereto, and the mixture was agitated. The solution was filtered and recrystallized by using chlorobenzene and methanol, obtaining 28.10 g (80%) of a compound B-10.

HRMS (70 eV, EI+): m/z calcd for $C_{47}H_{31}N_3$: 637.25, found: 637.

Elemental Analysis: C, 89%; H, 5%

Synthesis Example 17: Synthesis of Compound B-31

[Reaction Scheme 17]

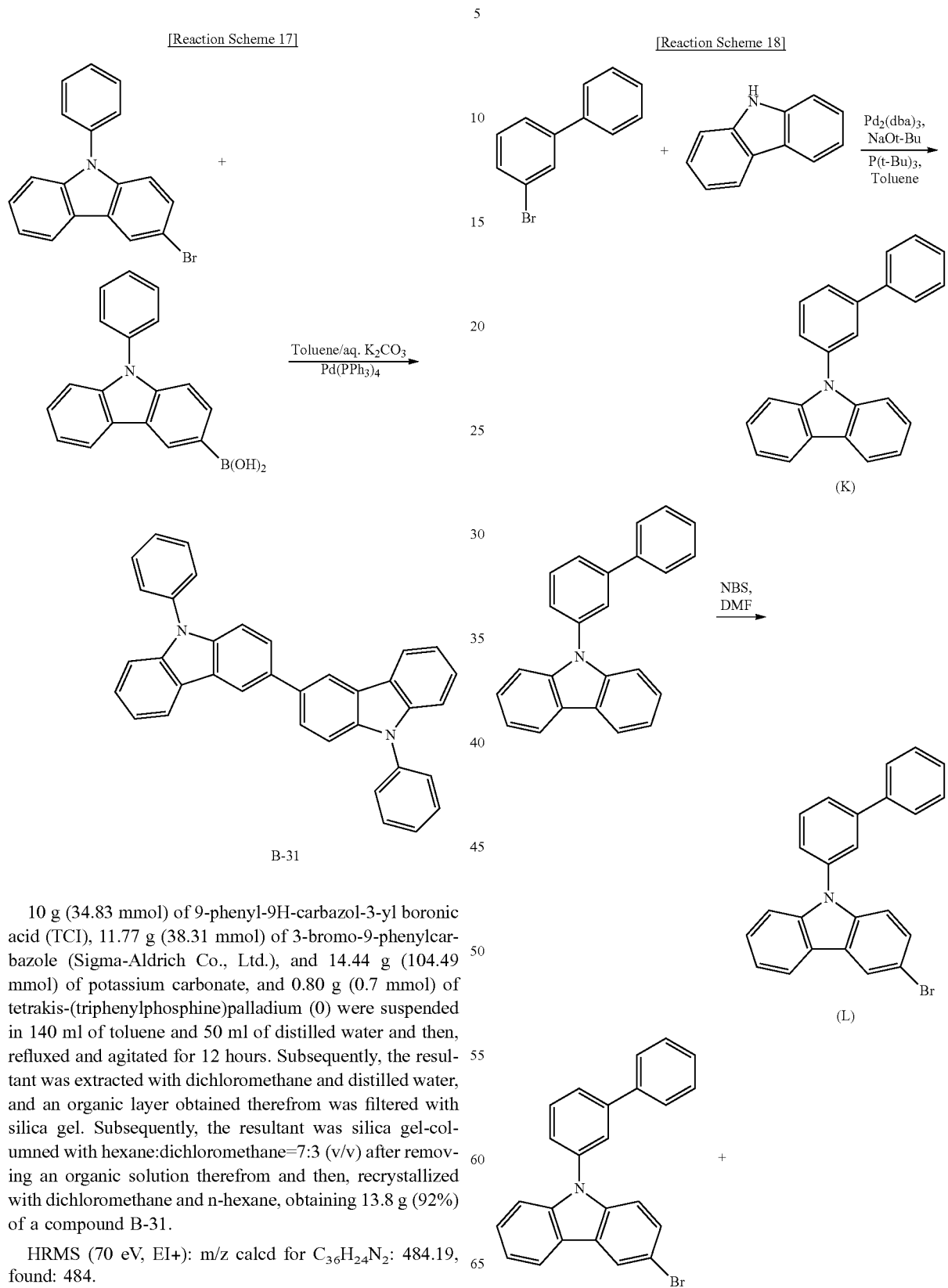

10 g (34.83 mmol) of 9-phenyl-9H-carbazol-3-yl boronic acid (TCI), 11.77 g (38.31 mmol) of 3-bromo-9-phenylcarbazole (Sigma-Aldrich Co., Ltd.), and 14.44 g (104.49 mmol) of potassium carbonate, and 0.80 g (0.7 mmol) of tetrakis-(triphenylphosphine)palladium (0) were suspended in 140 ml of toluene and 50 ml of distilled water and then, refluxed and agitated for 12 hours. Subsequently, the resultant was extracted with dichloromethane and distilled water, and an organic layer obtained therefrom was filtered with silica gel. Subsequently, the resultant was silica gel-columned with hexane:dichloromethane=7:3 (v/v) after removing an organic solution therefrom and then, recrystallized with dichloromethane and n-hexane, obtaining 13.8 g (92%) of a compound B-31.

HRMS (70 eV, EI+): m/z calcd for $C_{36}H_{24}N_2$: 484.19, found: 484.

Elemental Analysis: C, 89%; H, 5%

Synthesis Example 18: Synthesis of Compound B-43

[Reaction Scheme 18]

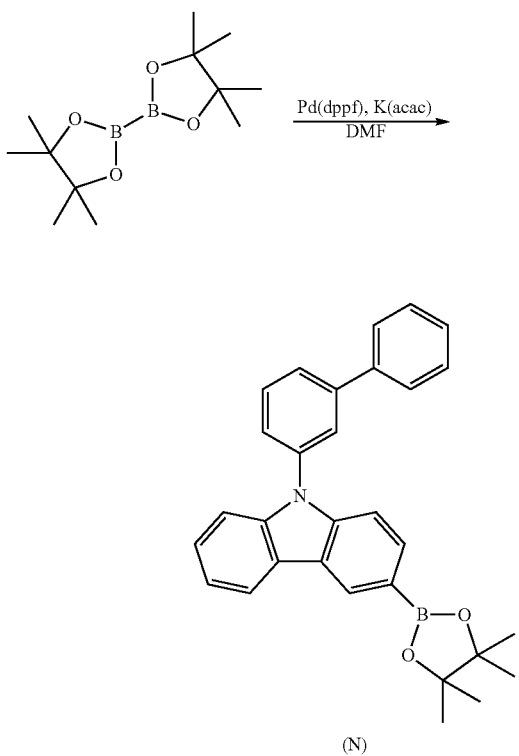

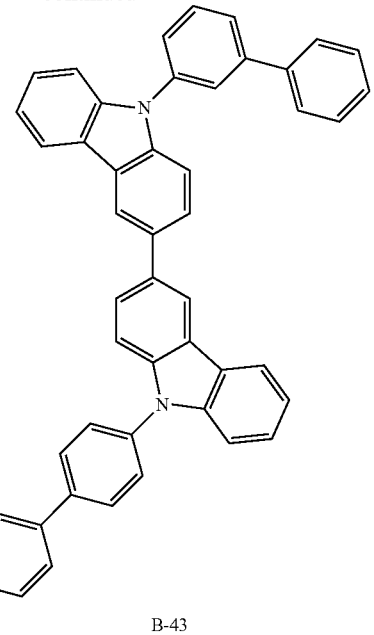

B-43

First Step: Synthesis of Compound K 20 g (90%) of a compound K was obtained through purification according to the same method as the synthesis method of the compound B-10.

Second Step: Synthesis of Compound L 20 g (62.6 mmol) of the compound K was suspended in 200 ml of DMF, 12.93 g (72.67 mmol) of NBS was added thereto little by little, and the mixture was refluxed and agitated for 12 hours. Then, distilled water was added thereto to complete the reaction, the mixture was extracted with dichloromethane, and an organic layer obtained therefrom was filtered with silica gel. Subsequently, a solid product silica gel columned with hexane:dichloromethane=7:3 (v/v) after removing an organic solution was recrystallized with dichloromethane and n-hexane, obtaining 22.4 g (90%) of a compound L.

Third Step: Synthesis of Compound N 22.5 g (90%) of a compound N was obtained through purification according to the same method as the synthesis method of the intermediate I-1.

Fourth Step: Synthesis of Compound B-43

10 g (34.83 mmol) of the compound N, 11.77 g (38.31 mmol) of 9-[1,1'-biphenyl-4-yl]-3-bromo-9H-carbazole (TCI), 14.44 g (104.49 mmol) of potassium carbonate, and 0.80 g (0.7 mmol) of tetrakis-(triphenylphosphine)palladium (0) were suspended in 140 ml of toluene and 50 ml of distilled water and then, refluxed and agitated for 12 hours. Subsequently, the resultant was recrystallized with dichloromethane and n-hexane, obtaining 18.7 g (92%) of a compound B-43.

HRMS (70 eV, EI+): m/z calcd for $C_{48}H_{32}N_2$: 636.26, found: 636.

Elemental Analysis: C, 91%; H, 5%

Manufacture of Organic Light Emitting Diode

Example 1

A glass substrate coated with ITO (indium tin oxide) to be 1500 Å thick was ultrasonic wave-washed with a distilled water. Subsequently, the glass substrate was ultrasonic wave-washed with a solvent such as isopropyl alcohol, acetone, methanol, and the like, moved to a plasma cleaner, cleaned by using oxygen plasma for 10 minutes, and then, moved to a vacuum depositor. This ITO transparent electrode was used as a positive electrode, a 700 Å-thick hole injection layer (HIL) was formed thereon by vacuum-depositing N4,N4'-diphenyl-N4,N4'-bis(9-phenyl-9H-carbazol-3-yl)biphenyl-4,4'-diamine) (the compound A), and a hole transport layer was formed on the hole injection layer (HIL) by depositing 1,4,5,8,9,11-hexaazatriphenylene-hexacarbonitrile (HAT-CN) (the compound B) to be 50 Å thick and then, N-(biphenyl-4-yl)-9,9-dimethyl-N-(4-(9-phenyl-9H-carbazol-3-yl)phenyl)-9H-fluoren-2-amine) (the compound C) to be 700 Å thick. On the hole transport layer, a 50 Å-thick hole transport auxiliary layer was formed by vacuum-depositing the compound P-17 according to Synthesis Example 15. Subsequently, on the hole transport auxiliary layer, a 200 Å-thick emission layer was formed by depositing a blue fluorescent light emitting host doped with 5 wt % of BH113 and BD370 available from SFC as a dopant, and then, a 50 Å-thick electron transport auxiliary layer was formed by vacuum-depositing the compound A-33 according to Synthesis Example 11 on the emission layer.

Subsequently, on the electron transport auxiliary layer, a 310 Å-thick electron transport layer was formed by simultaneously vacuum-depositing (8-(4-(4-(naphthalen-2-yl)-6-(naphthalen-3-yl)-1,3,5-triazin-2-yl)phenyl)quinoline) (the compound E) and Liq in a ratio of 1:1, and a cathode was formed by sequentially vacuum-depositing Liq to be 15 Å thick and Al to be 1200 Å thick on the electron transport layer, manufacturing an organic light emitting diode.

The organic light emitting diode had a six-layered organic thin film structure and specifically, ITO/A 700 Å/B 50 Å/C 700 Å/hole transport auxiliary layer [P-17 50 Å]/EML [BH113:BD370=95:5 (wt %)] 200 Å/electron transport auxiliary layer [A-33 50 Å/E:Liq=1:1 310 Å/Liq 15 Å/Al 1200 Å.

Example 2

An organic light emitting diode was manufactured according to the same method as Example 1 except for using the compound A-69 according to Synthesis Example 10 instead of the compound A-33 for the electron transport auxiliary layer.

Example 3

An organic light emitting diode was manufactured according to the same method as Example 1 except for sequentially depositing the compound A-33 according to Synthesis Example 11 and the compound B-43 according to Synthesis Example 18 in a ratio of 1:1 to be respectively 25 Å thick instead of the compound A-33 for the electron transport auxiliary layer.

Reference Example 1

An organic light emitting diode was manufactured according to the same method as Example 1 except for depositing the compound C to be 750 Å thick to form a hole transport layer without forming a hole transport auxiliary layer.

Reference Example 2

An organic light emitting diode was manufactured according to the same method as Example 3 except for depositing the compound C to be 750 Å thick to form a hole transport layer without forming a hole transport auxiliary layer.

Reference Example 3

An organic light emitting diode was manufactured according to the same method as Example 2 except for depositing the compound C to be 750 Å thick to form a hole transport layer without forming a hole transport auxiliary layer.

Comparative Example 1

An organic light emitting diode was manufactured according to the same method as Example 1 except for depositing the compound C to form a 750 Å-thick hole transport layer without a hole transport auxiliary layer and depositing the compound E:Liq=1:1 to form not a 360 Å but 310 Å thick for an electron transport layer without an electron transport auxiliary layer.

Comparative Example 2

An organic light emitting diode was manufactured according to the same method as Example 1 except for depositing the compound E:Liq=1:1 to form not a 310 Å but 360 Å thick electron transport layer without an electron transport auxiliary layer.

Evaluation

Luminous efficiency and roll-off characteristics of each organic light emitting diode according to Examples 1 to 3, Reference Example 1 to 3, Comparative Example 1 and Comparative Example 2 were measured.

Specific measurement methods were as follows, and the results were provided in Table 1.

(1) Measurement of Current Density Change Depending on Voltage Change

The obtained organic light emitting diodes were measured for current value flowing in the unit device while increasing the voltage from 0 V to 10 V using a current-voltage meter (Keithley 2400), the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

Current efficiency (cd/A) at the same current density (10 mA/cm$^2$) were calculated by using the luminance, current density, and voltages (V) from the items (1) and (2).

(4) Roll-Off

Efficiency roll-off was calculated as a percentage through (Max measurement−Measurement at 6000 cd/m$^2$/Max measurement) among the measurements of (3).

TABLE 1

|  | Hole transport auxiliary layer | Electron transport auxiliary layer | Driving voltage (V) | Luminous efficiency (cd/A) |
| --- | --- | --- | --- | --- |
| Example 1 | P-17 | A-33 | 4.15 | 7.5 |
| Example 2 | P-17 | A-69 | 4.05 | 7.9 |
| Example 3 | P-17 | A-33:B-43 1:1 | 4.20 | 7.6 |
| Reference Example 1 | — | A-33 | 3.84 | 6.5 |

TABLE 1-continued

| | Hole transport auxiliary layer | Electron transport auxiliary layer | Driving voltage (V) | Luminous efficiency (cd/A) |
|---|---|---|---|---|
| Reference Example 2 | — | A-33:B-43 1:1 | 4.24 | 5.9 |
| Reference Example 3 | — | A-69 | 3.83 | 7.3 |
| Comparative Example 1 | — | — | 4.32 | 5.6 |
| Comparative Example 2 | P-17 | — | 4.24 | 6.9 |

Referring to Table 1, the organic light emitting diode according to Examples 1 to 3 showed remarkably improved luminous efficiency respectively compared with the organic light emitting diodes according to Reference Examples 1 to 3 and simultaneously, remarkably improved driving voltage and luminous efficiency compared with the organic light emitting diodes according to Comparative Examples 1 and 2.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of Symbols>

| | |
|---|---|
| 10: anode | 20: cathode |
| 30: organic layer | 31: hole transport layer |
| 32: emission layer | 33: hole transport auxiliary layer |
| 34: electron transport layer | 35: electron transport auxiliary layer |
| 36: electron injection layer (EIL) | 37: hole injection layer (HIL) |

What is claimed is:

1. An organic optoelectric device, comprising:
an anode and a cathode facing each other,
an emission layer between the anode and the cathode,
a hole transport layer between the anode and the emission layer,
a hole transport auxiliary layer between the hole transport layer and the emission layer,
an electron transport layer between the cathode and the emission layer, and
an electron transport auxiliary layer between the electron transport layer and the emission layer,
wherein the electron transport auxiliary layer includes a first compound represented by the following Chemical Formula 1, and
the hole transport auxiliary layer includes a second compound represented by the following Chemical Formula 2:

[Chemical Formula 1]

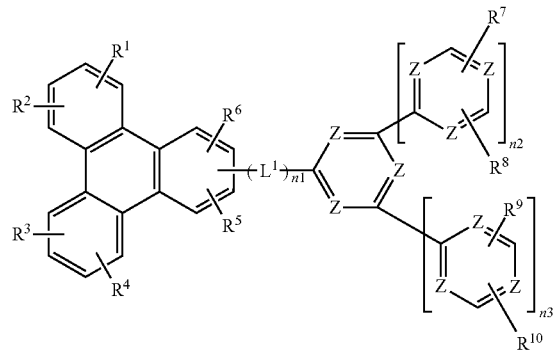

wherein, in Chemical Formula 1,
each Z is independently N or $CR^a$, at least one Z being N,
$R^1$ to $R^{10}$ and $R^a$ are each independently hydrogen, deuterium, a substituted or unsubstituted C1 to C10 alkyl group, a substituted or unsubstituted C6 to C12 aryl group, or a combination thereof,
$L^1$ is a substituted or unsubstituted phenylene group, a substituted or unsubstituted biphenylene group, or a substituted or unsubstituted terphenylene group,
n1 to n3 are each independently 0 or 1, $n1+n2+n3 \geq 1$,

[Chemical Formula 2]

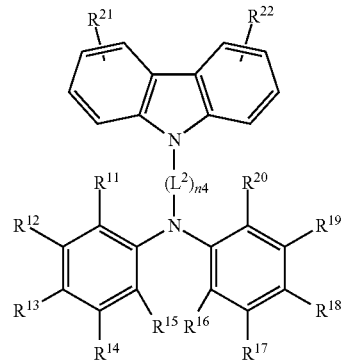

wherein, in Chemical Formula 2,
$L^2$ is a substituted or unsubstituted C6 to C30 arylene group or a substituted or unsubstituted C6 to C30 heteroarylene group,
n4 is an integer of 1 to 5,
$R^{11}$ to $R^{22}$ are each independently hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof,
$R^{11}$ to $R^{20}$ are separate or are fused with an adjacent group to form a ring,
wherein "substituted" of Chemical Formulae 1 and 2 refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

2. The organic optoelectric device as claimed in claim 1, wherein the first compound is represented by the following Chemical Formula 1-I or Chemical Formula 1-II:

[Chemical Formula 1-I]

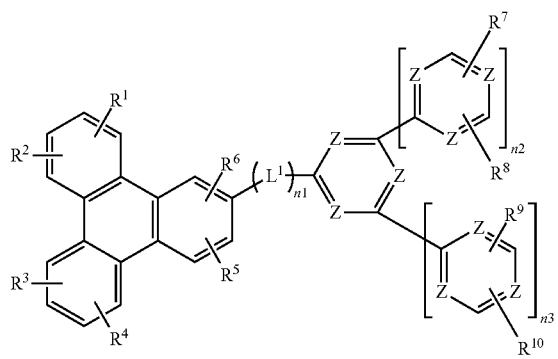

[Chemical Formula 1-II]

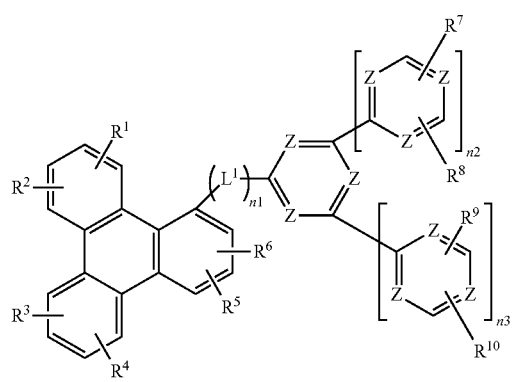

wherein, in Chemical Formulae 1-I and 1-II, each Z is independently N or CR$^a$, at least one Z being N, R$^1$ to R$^{10}$ and R$^a$ are each independently hydrogen, deuterium, a substituted or unsubstituted C1 to C10 alkyl group, a substituted or unsubstituted C6 to C12 aryl group, or a combination thereof, L$^1$ is a substituted or unsubstituted phenylene group, a substituted or unsubstituted biphenylene group, or a substituted or unsubstituted terphenylene group, n1 to n3 are each independently 0 or 1, and $n1+n2+n3 \geq 1$, wherein "substituted" refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

3. The organic optoelectric device as claimed in claim 1, wherein the first compound is one of the following Compounds A-1 to A-125:

A-1

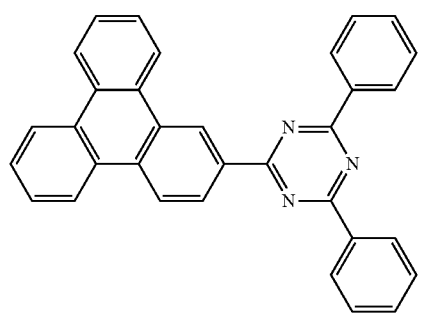

A-2

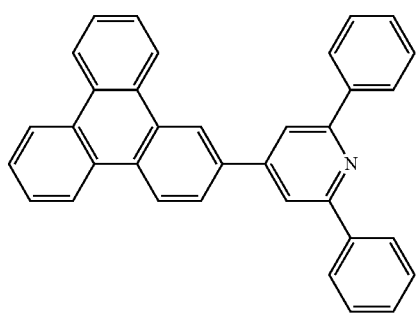

A-3

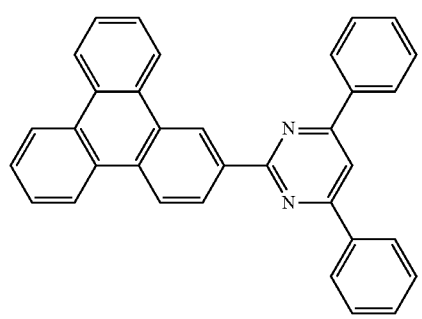

A-4

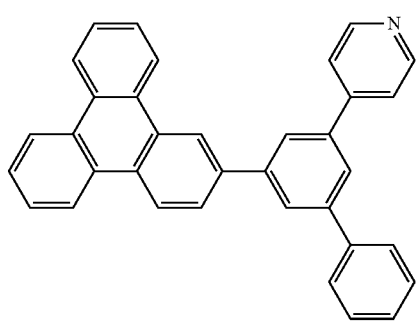

-continued
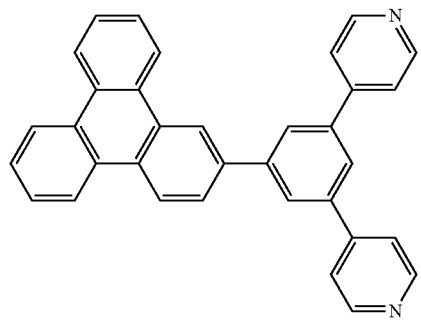
A-5
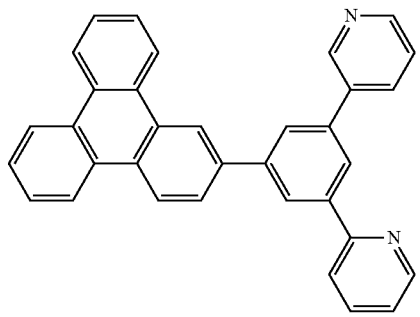
A-6
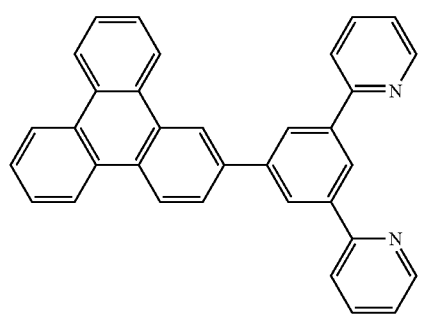
A-7
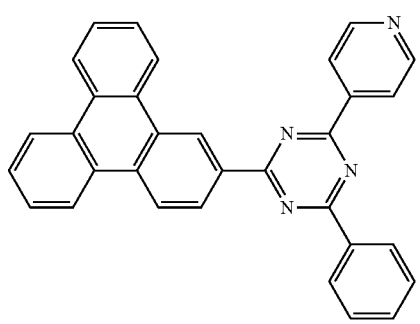
A-8
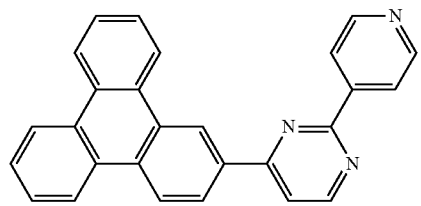
A-9
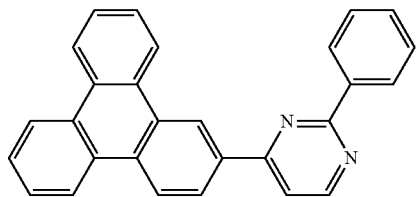
A-10
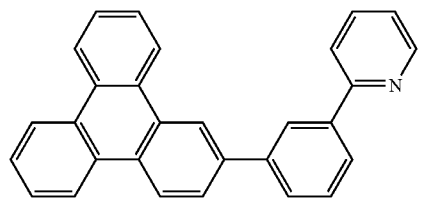
A-11
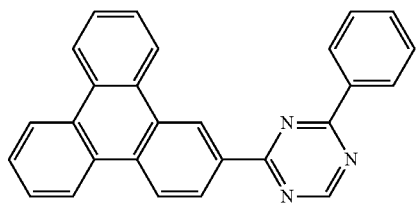
A-12
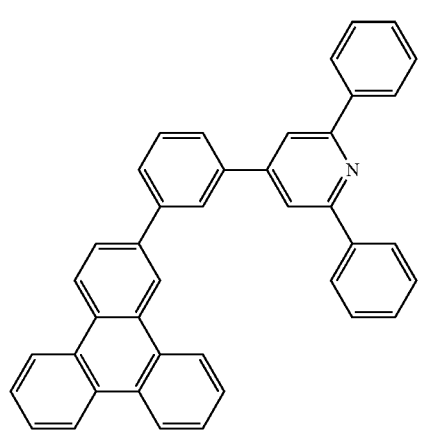
A-13
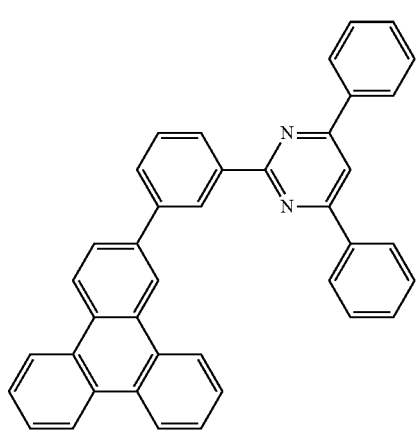
A-14

-continued
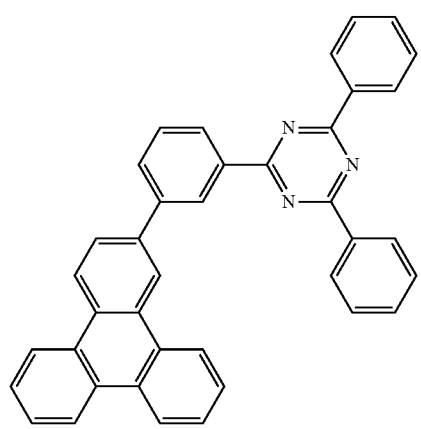
A-15
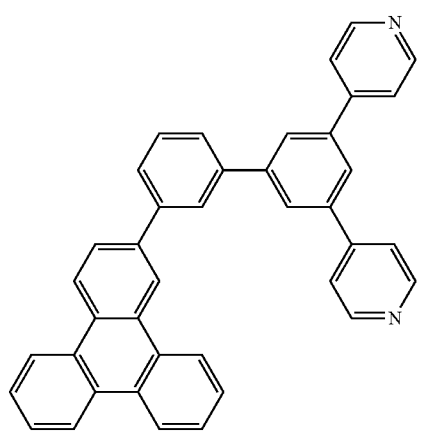
A-16
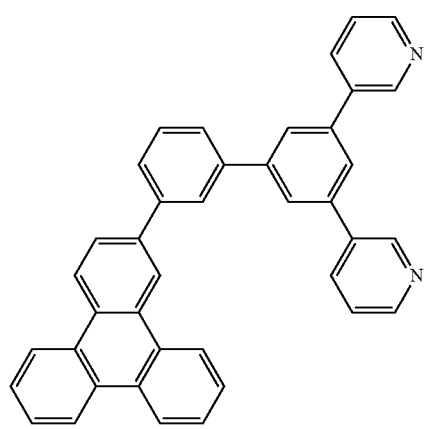
A-17
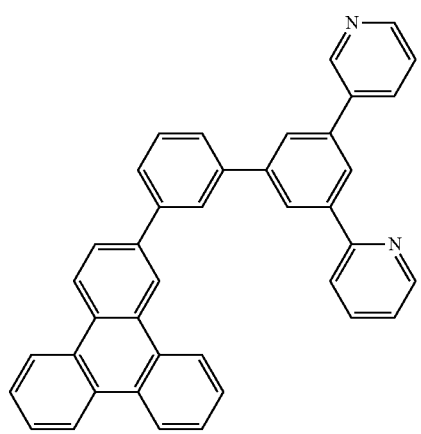
A-18
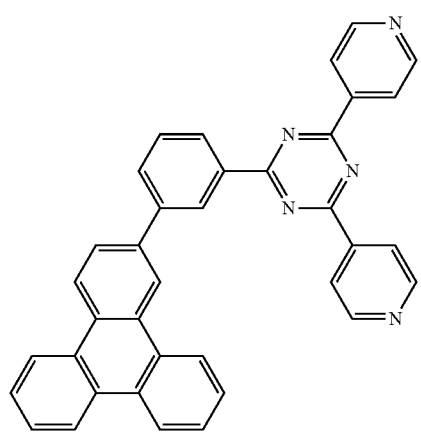
A-19
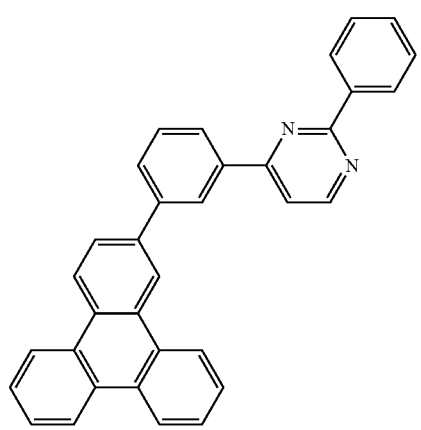
A-20

-continued
A-21
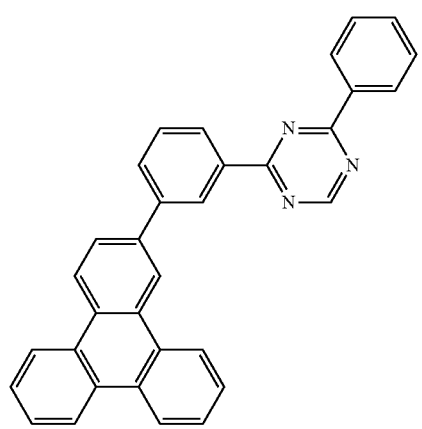
A-22
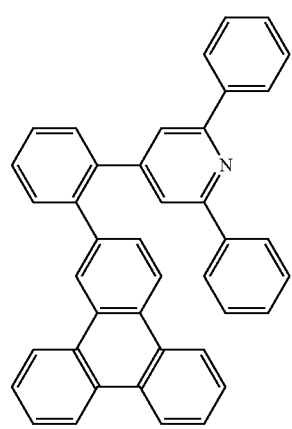
A-23
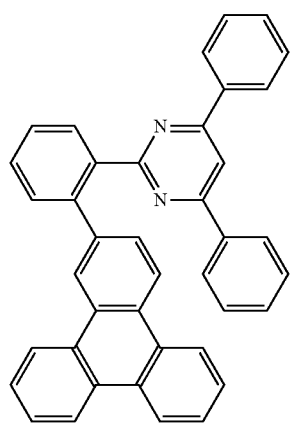
A-24
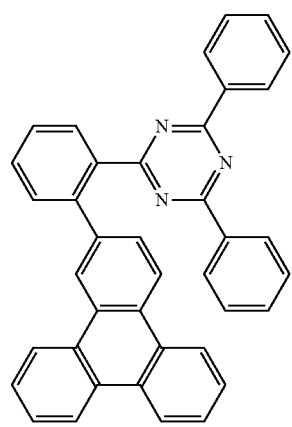
A-25
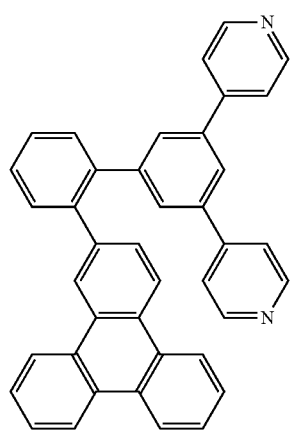
A-26
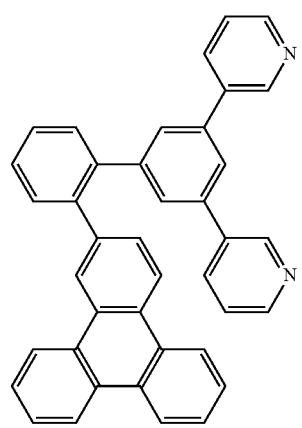

-continued
A-27
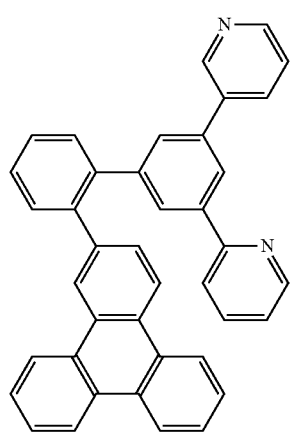
A-28
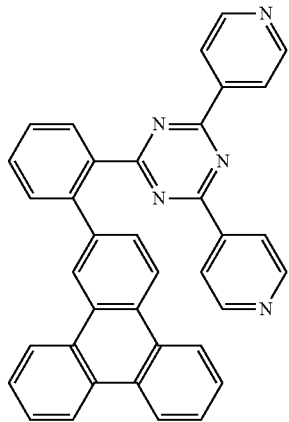
A-29
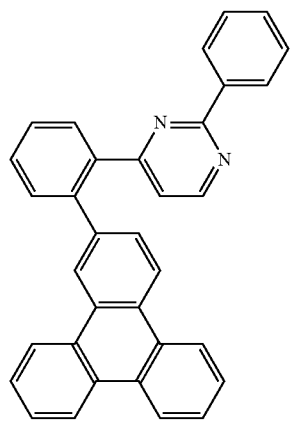
A-30
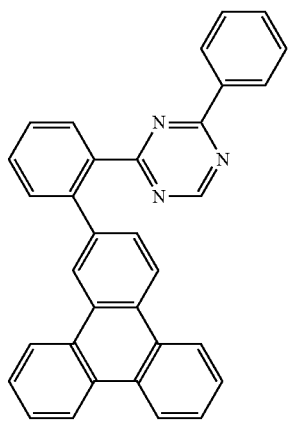
A-31
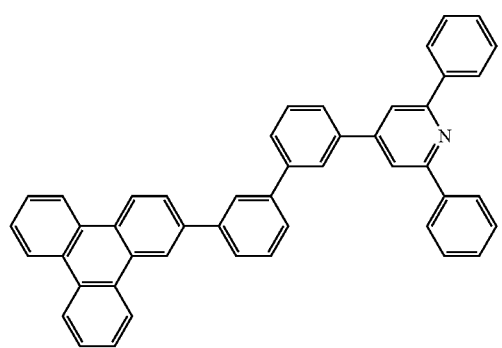
A-32
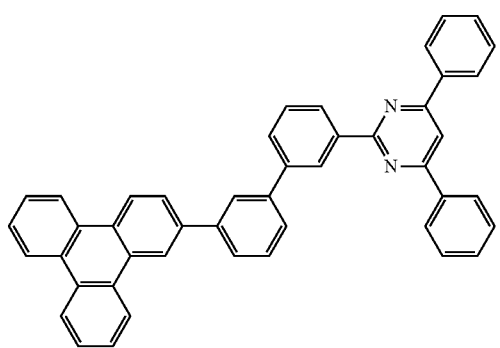
A-33
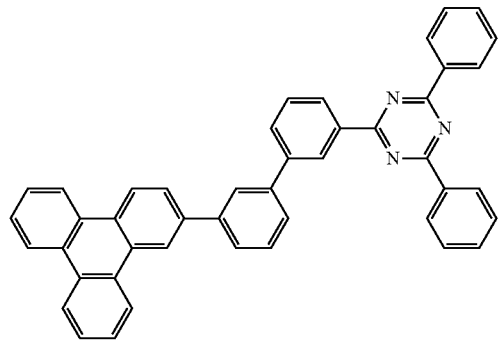
A-34
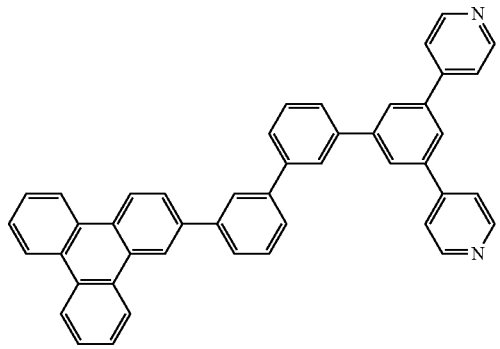

-continued
A-35
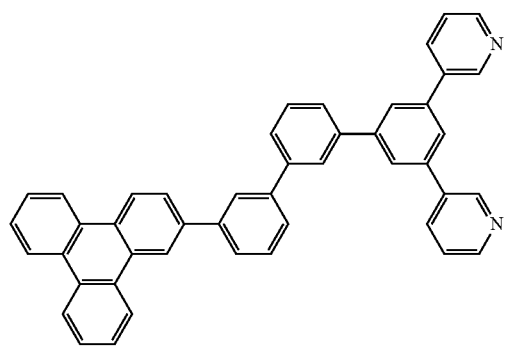
A-36
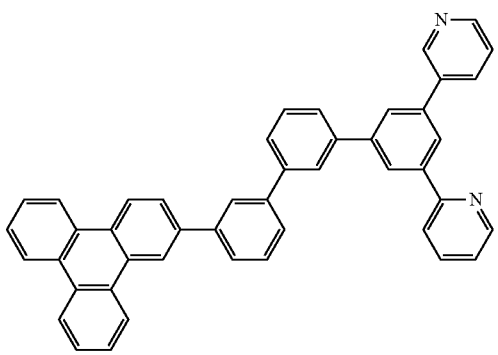
A-37
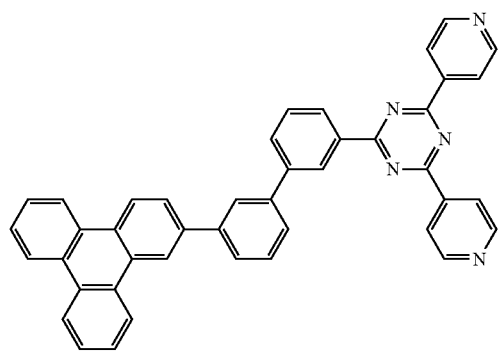
A-38
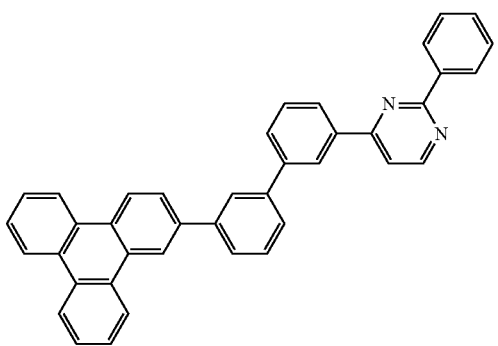
A-39
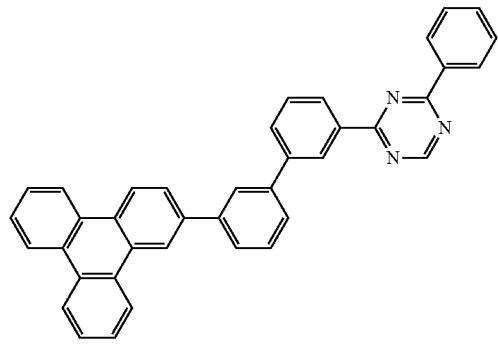
A-40
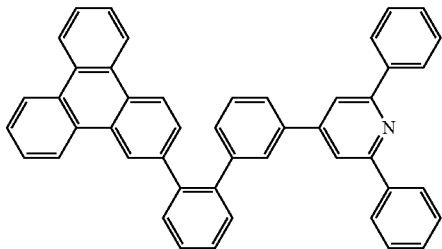
A-41
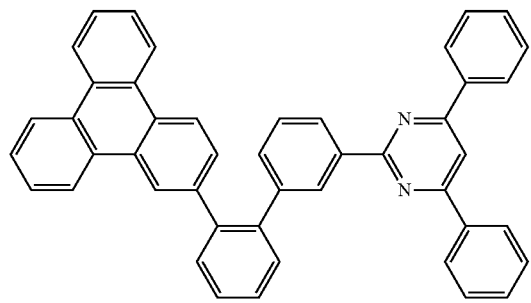
A-42
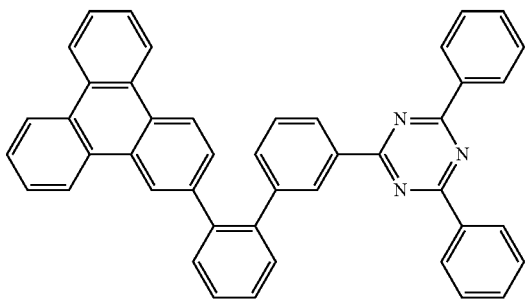

-continued
A-43
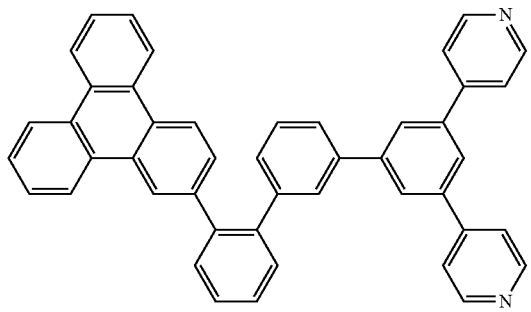
A-44
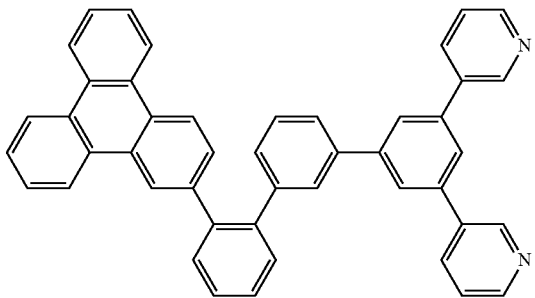
A-45
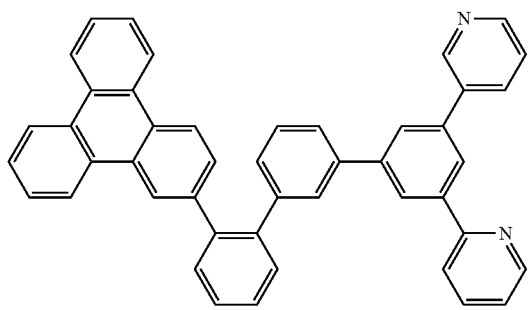
A-46
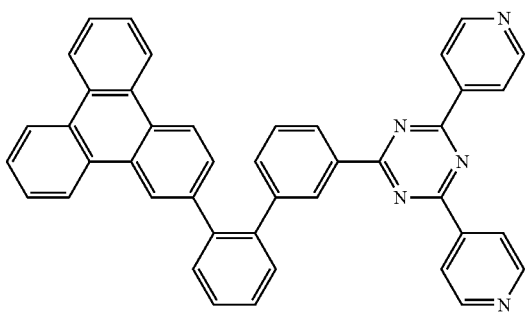
A-47
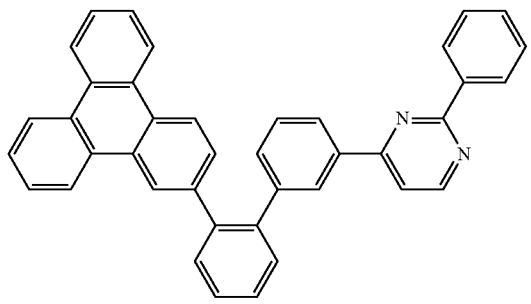
A-48
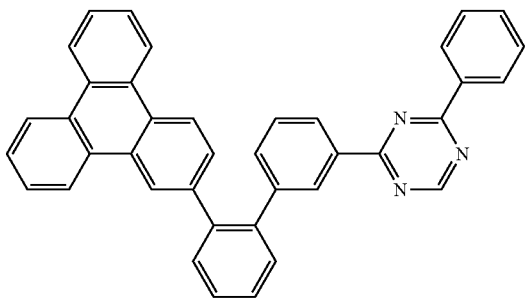
A-49
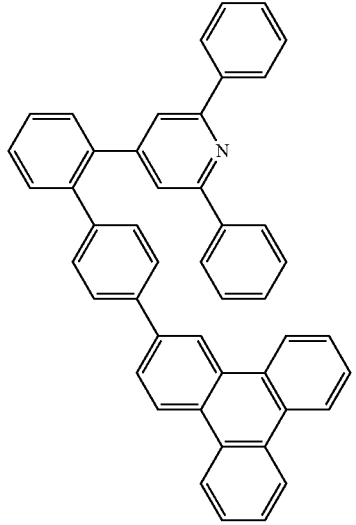
A-50
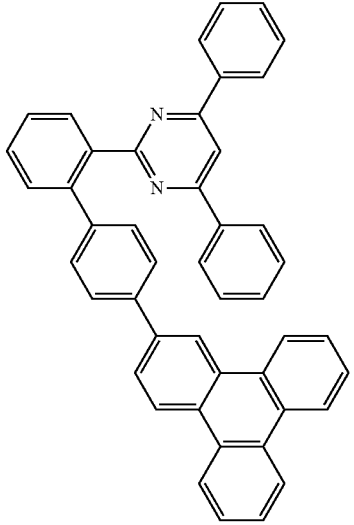

-continued
A-51
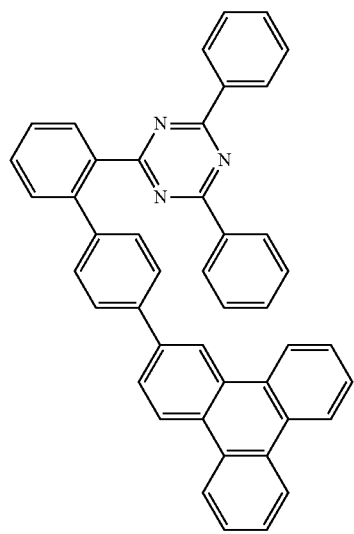
A-52
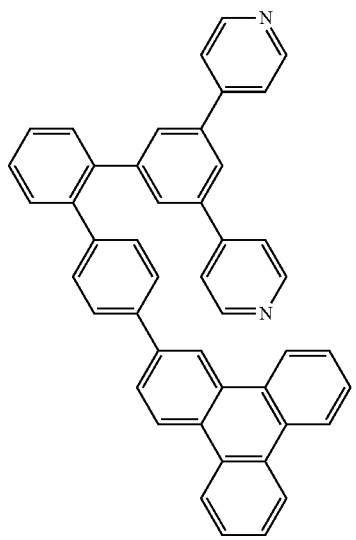
A-53
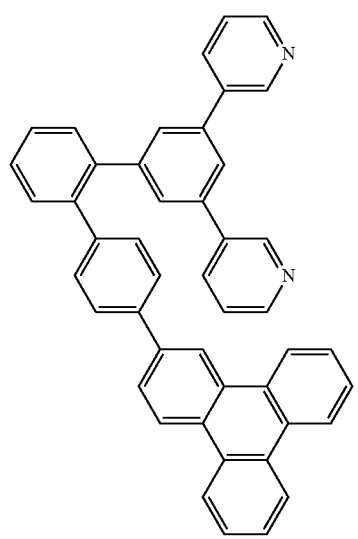
A-54
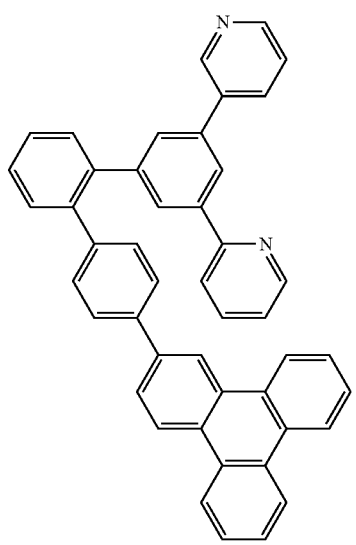
A-55
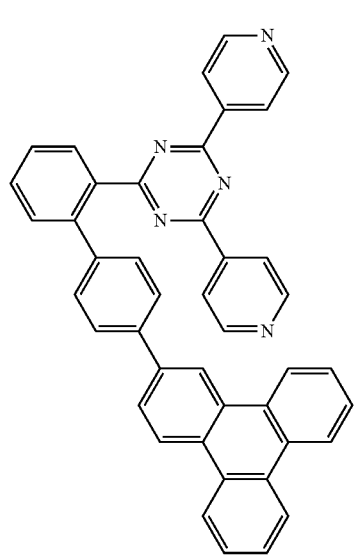
A-56
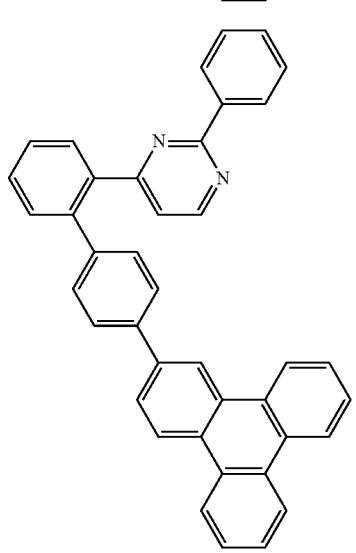

-continued
A-57
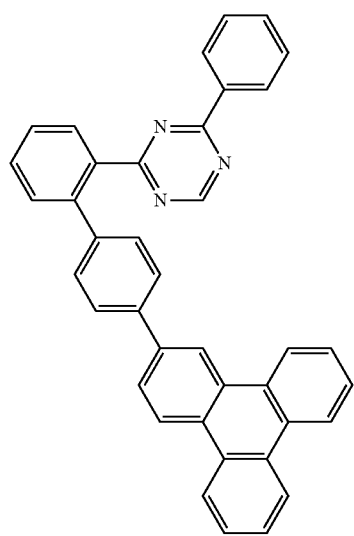
A-58
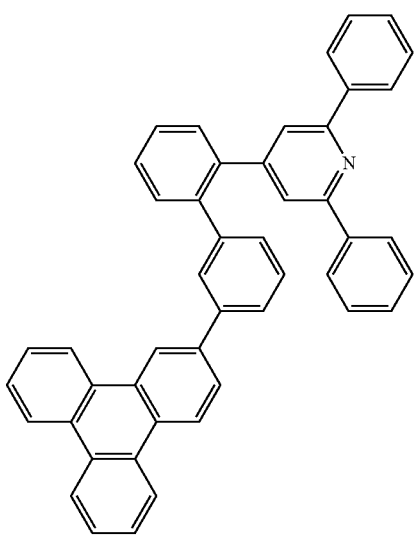
A-59
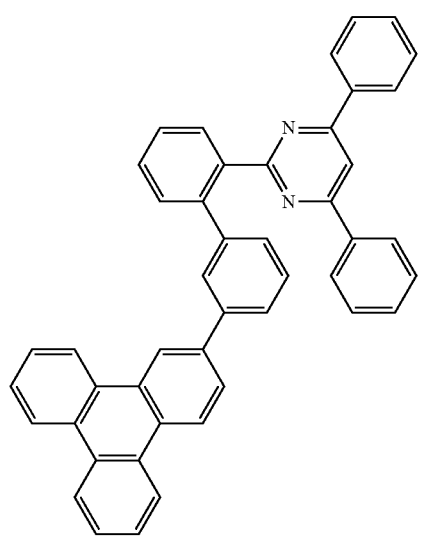
A-60
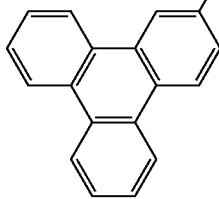
A-61
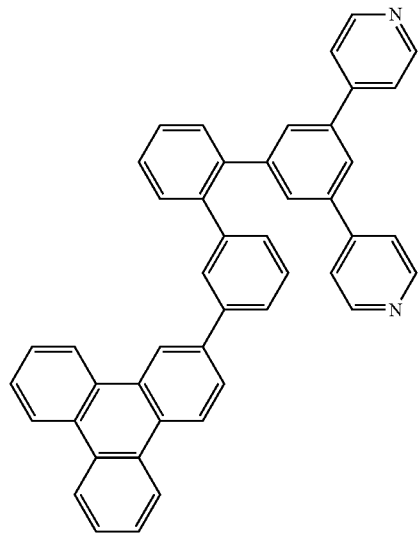
A-62
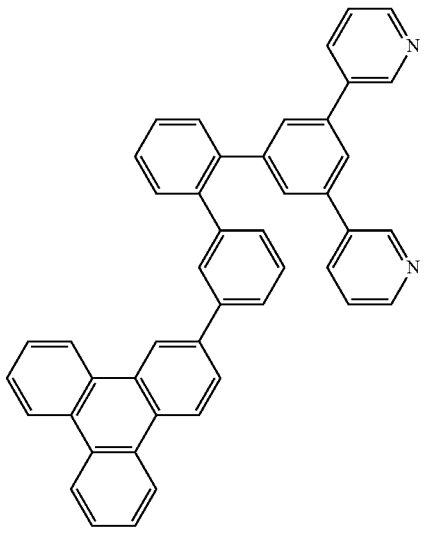

-continued
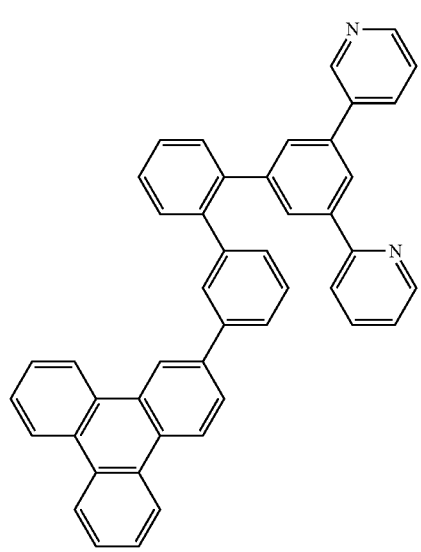
A-63
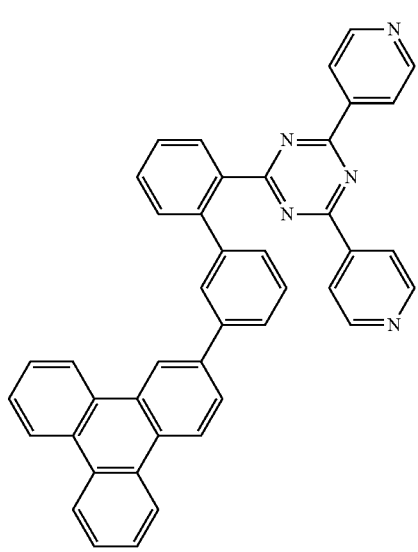
A-64
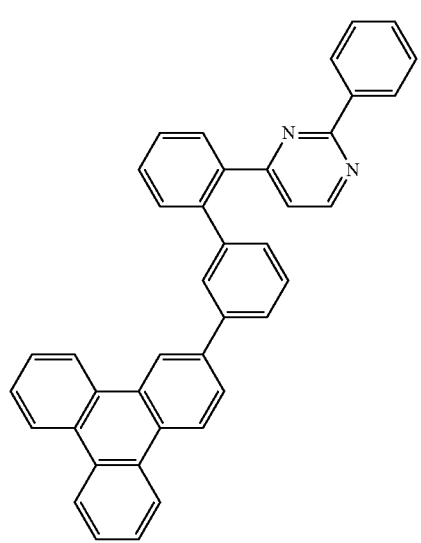
A-65
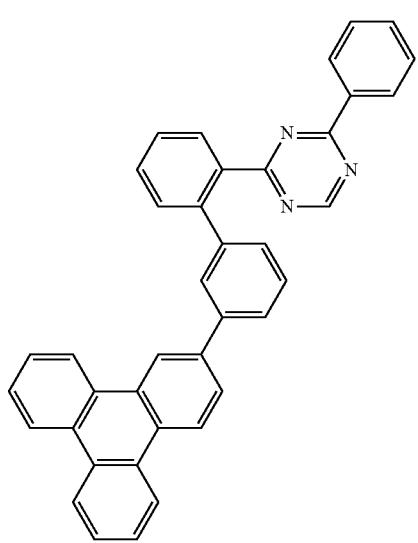
A-66
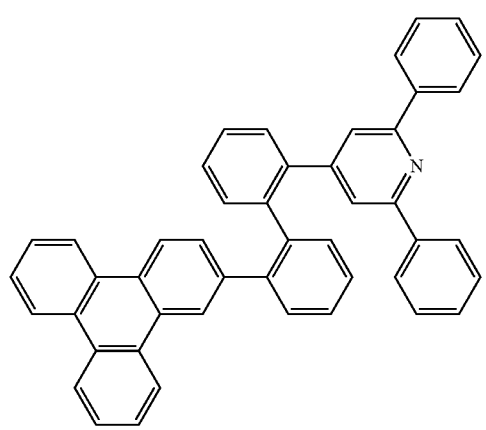
A-67
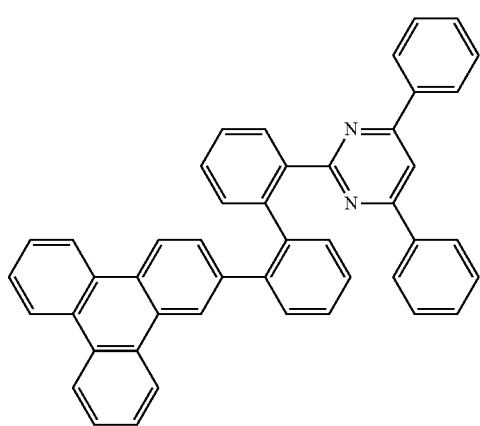
A-68

-continued
A-69
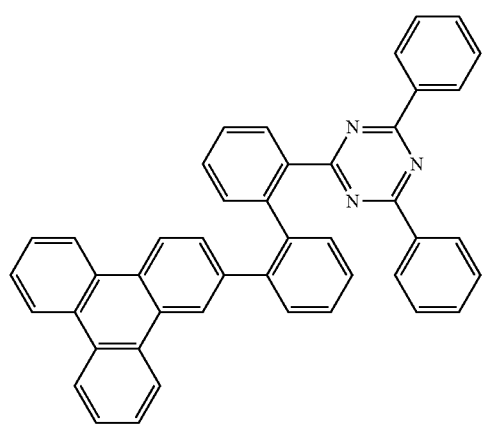
A-70
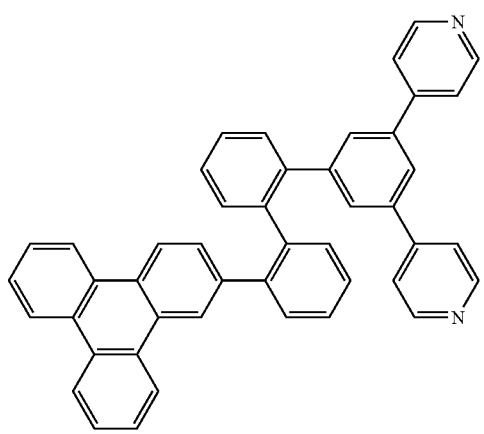
A-71
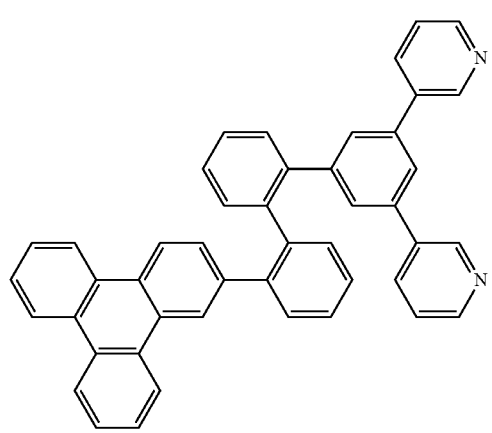
A-72
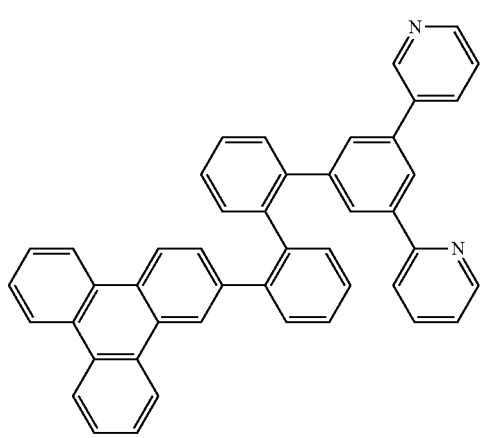
A-73
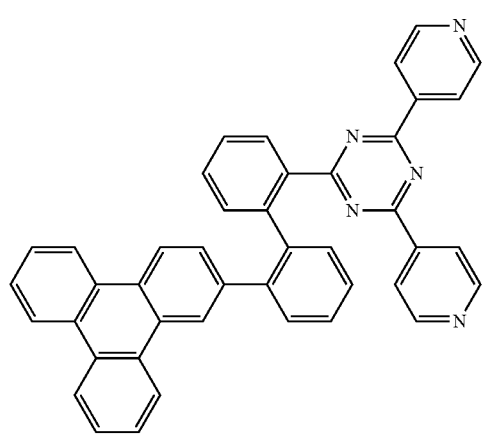
A-74
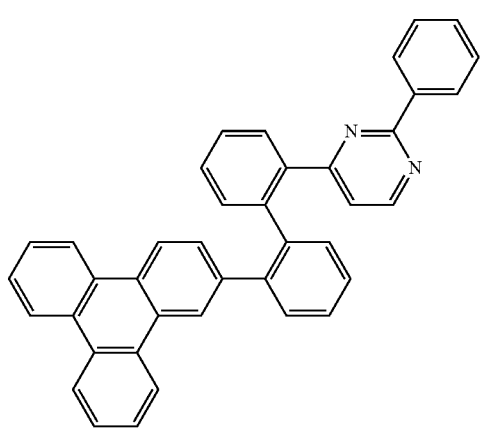
A-75
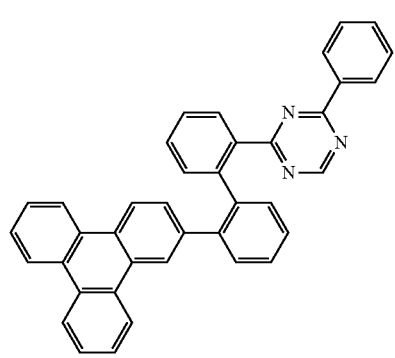
A-76
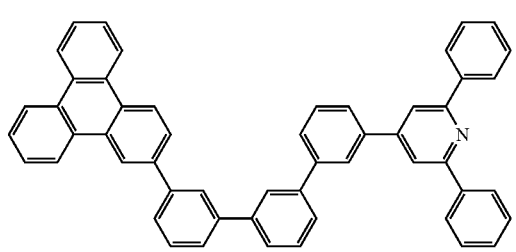

-continued
A-77
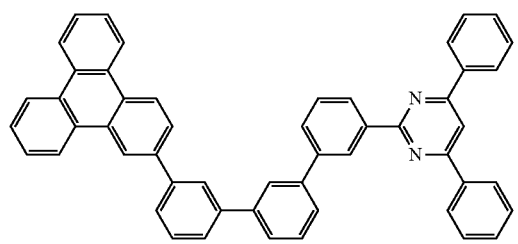
A-78
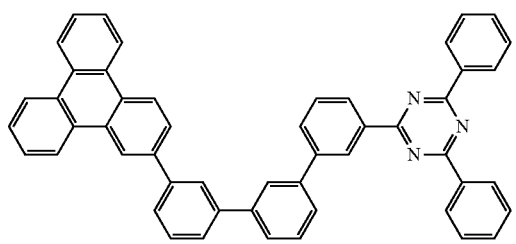
A-79
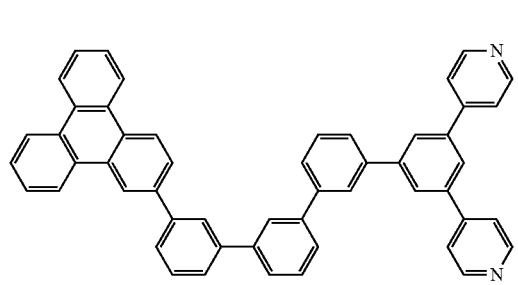
A-80
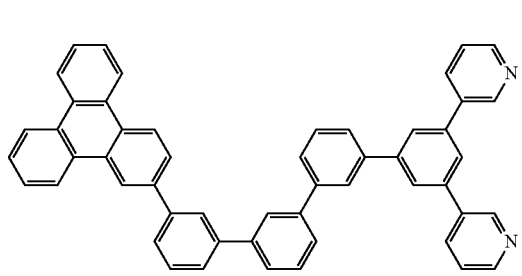
A-81
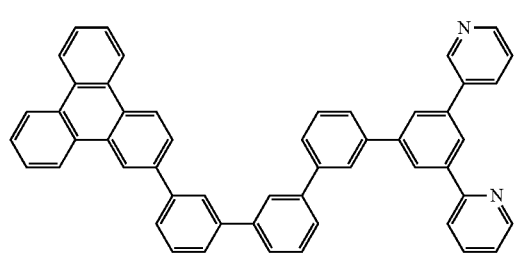
A-82
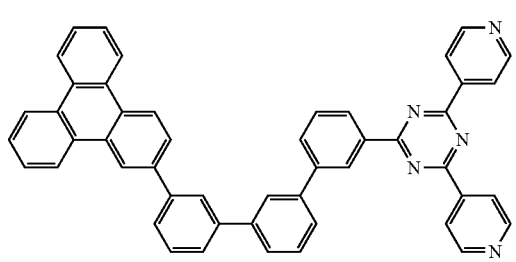
A-83
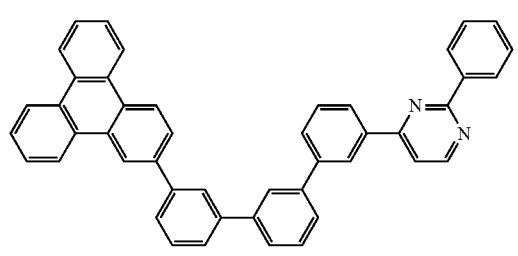
A-84
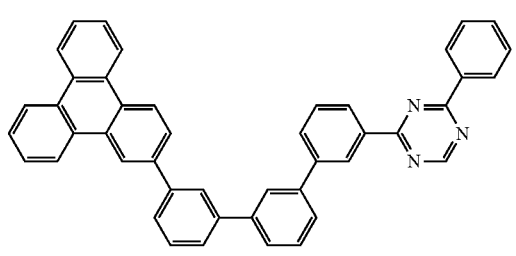
A-85
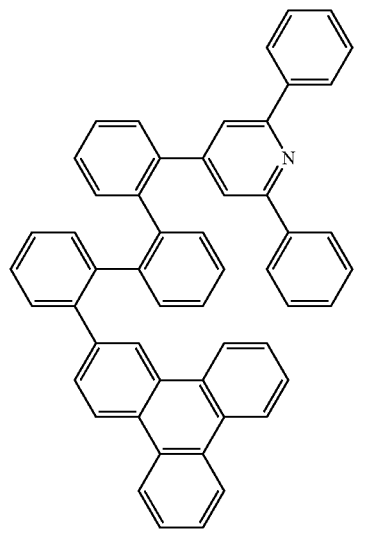
A-86
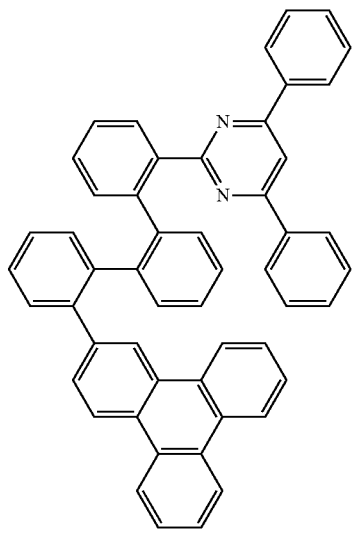

-continued
A-87
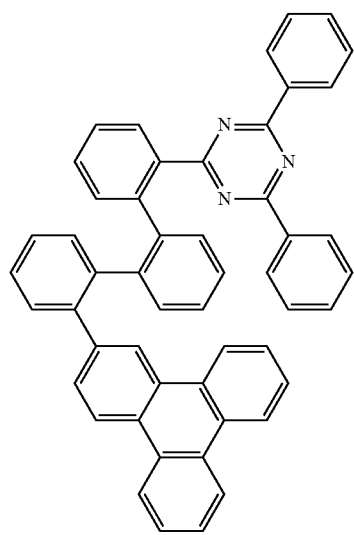
A-88
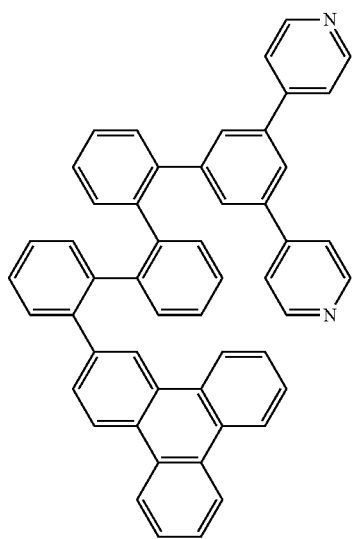
A-89
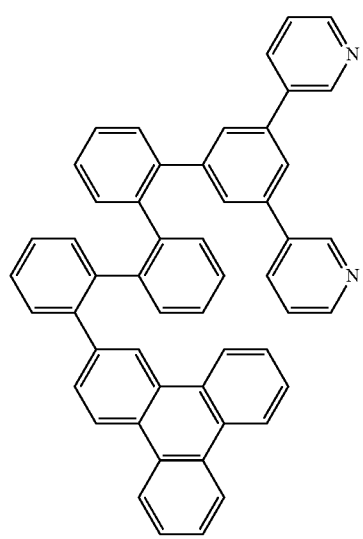
A-90
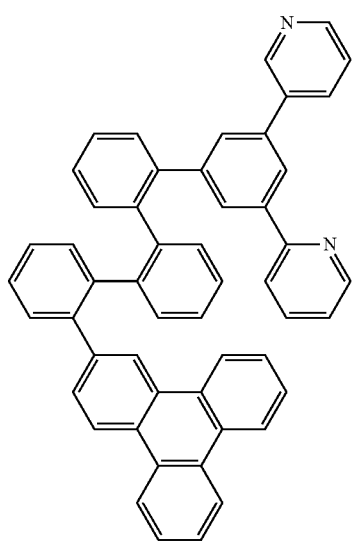
A-91
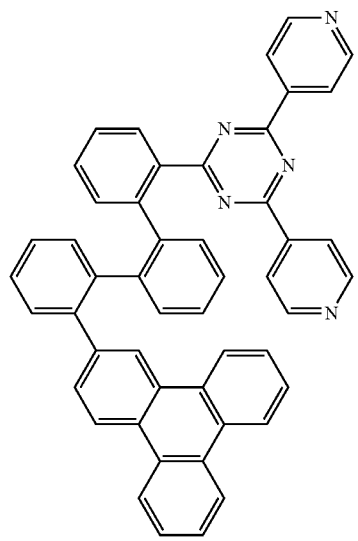
A-92
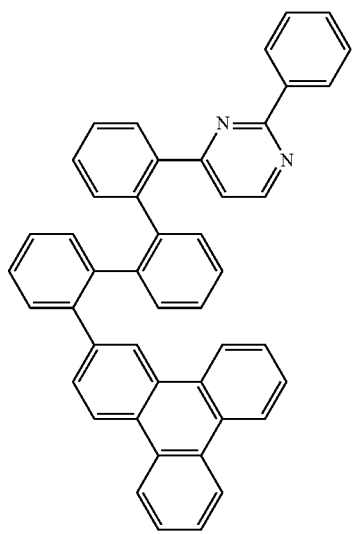

-continued
A-93
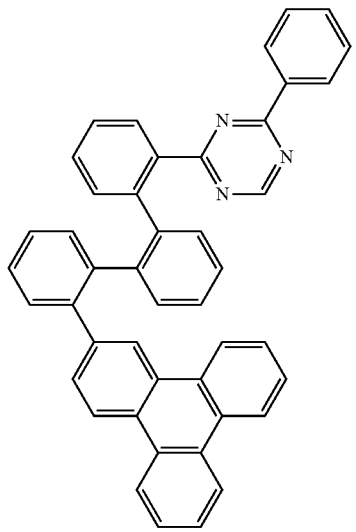
A-94
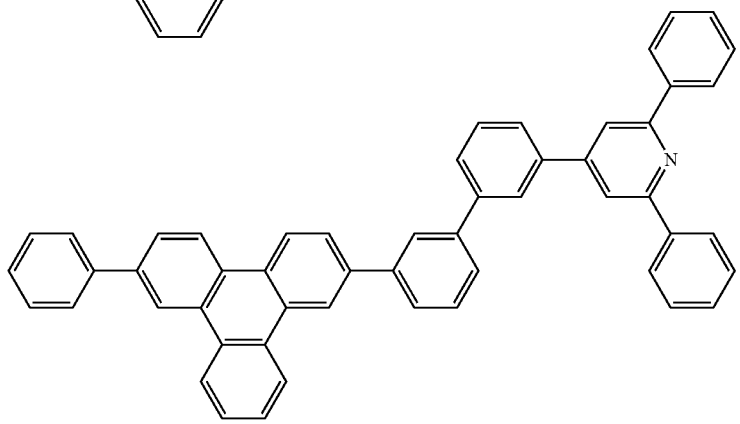
A-95
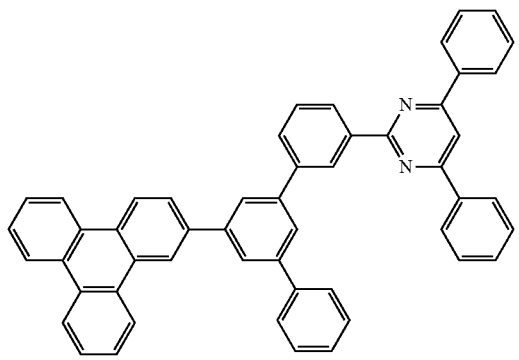
A-96
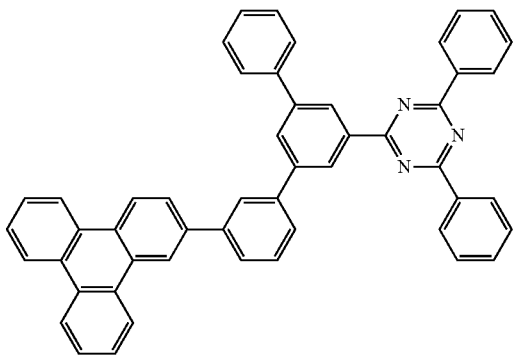
A-97
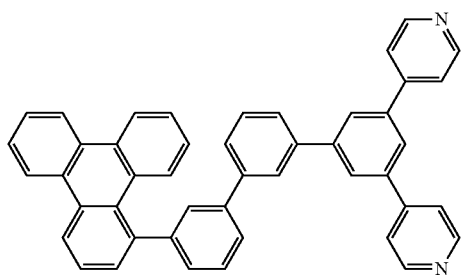
A-98
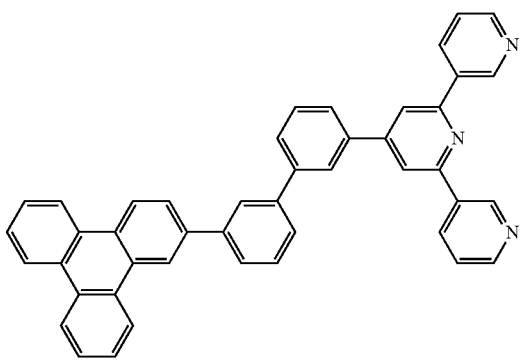

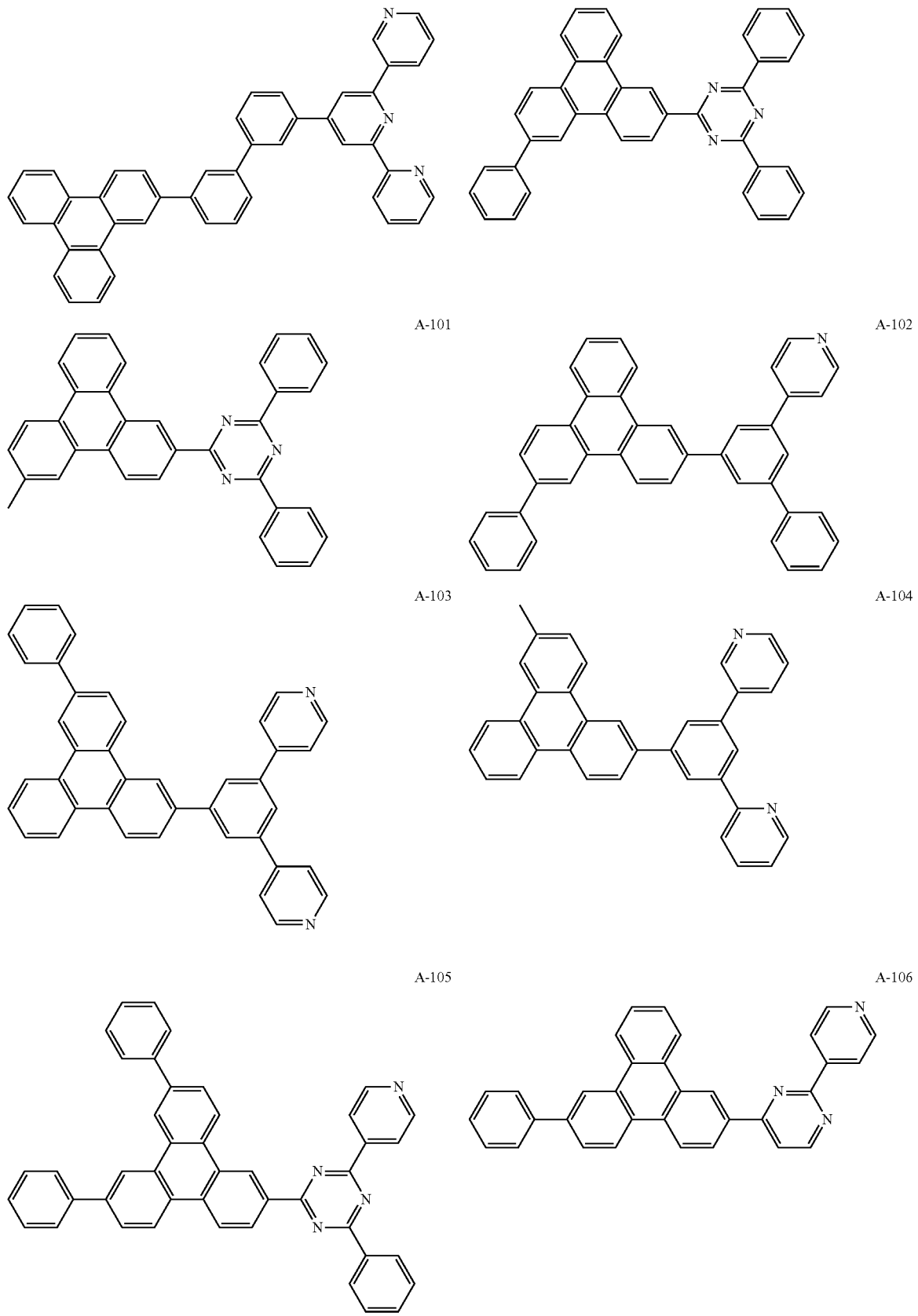

-continued
A-107
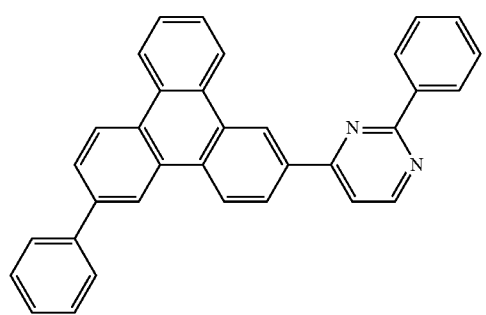
A-108
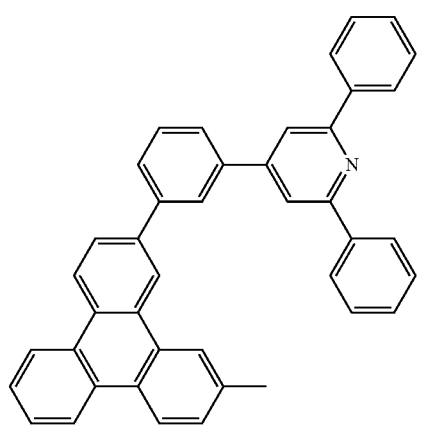
A-109
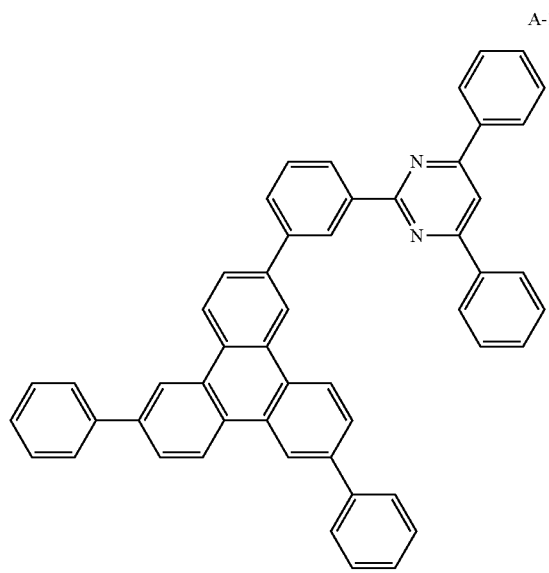
A-110
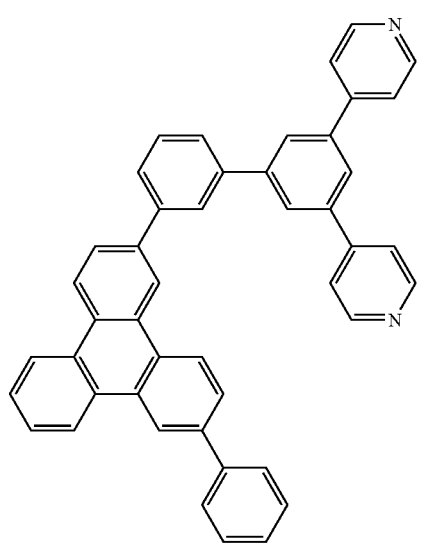
A-111
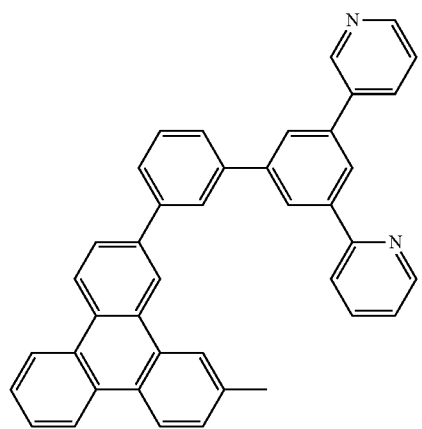
A-112
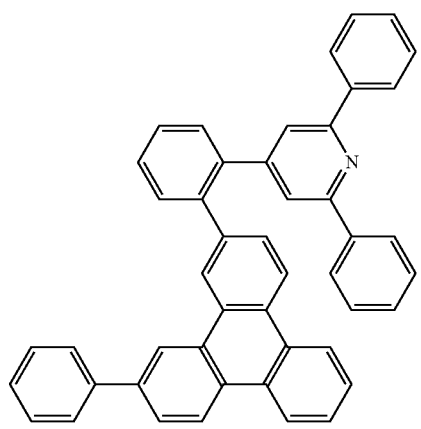

-continued
A-113
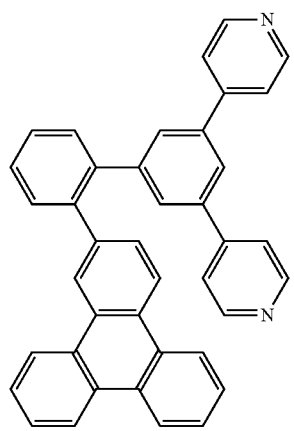
A-114
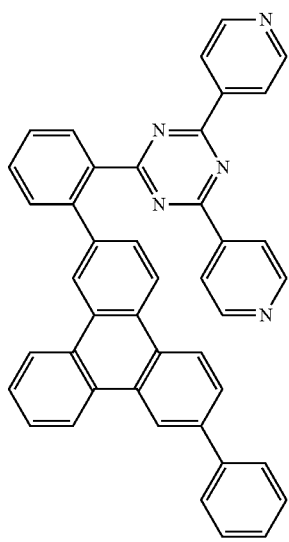
A-115
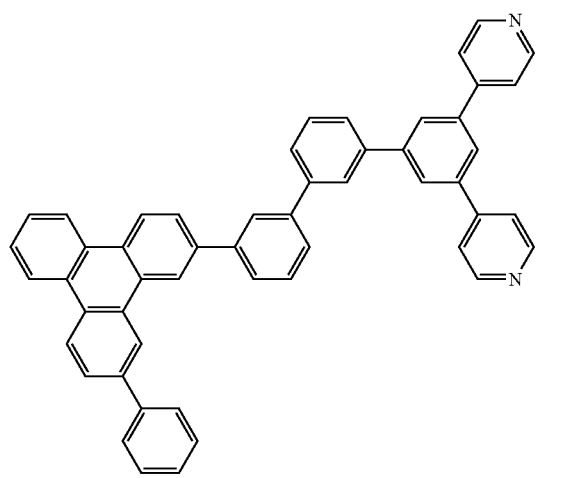
A-116
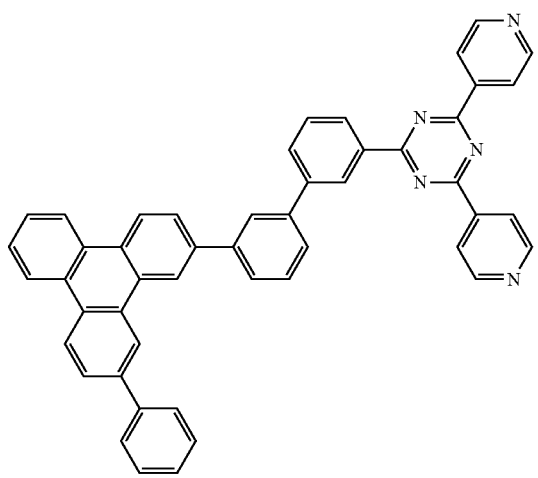
A-117
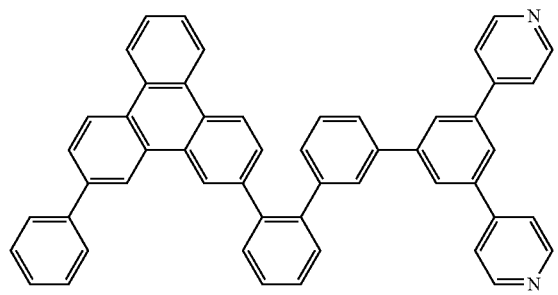
A-118
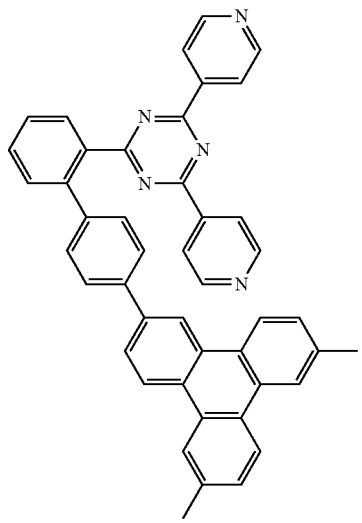

-continued
A-119
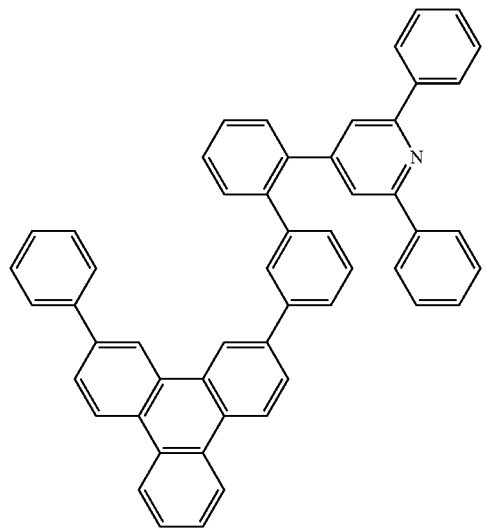
A-120
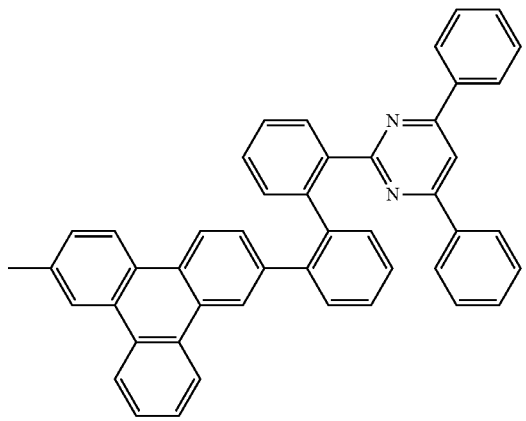
A-121
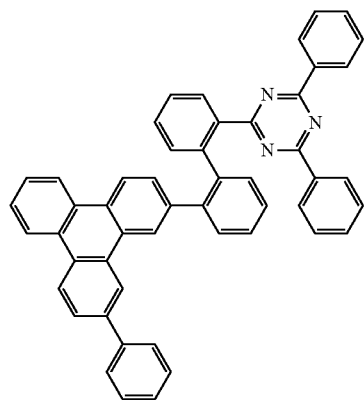
A-122
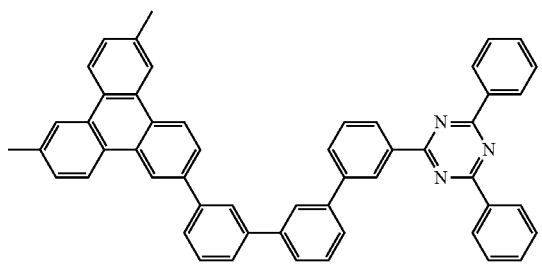
A-123
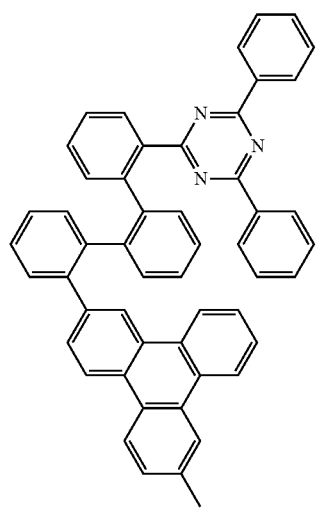
A-124
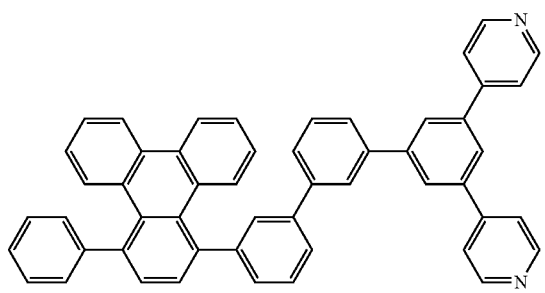

A-125

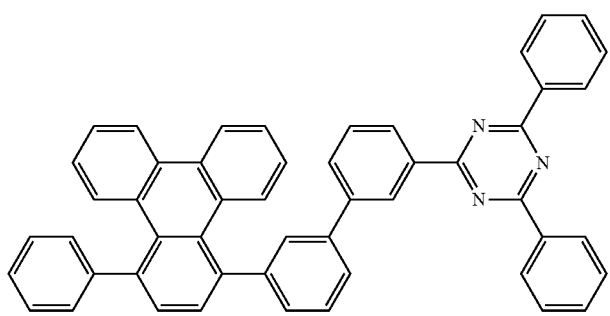

4. The organic optoelectric device as claimed in claim 1, wherein the electron transport auxiliary layer further includes a third compound represented by the following Chemical Formula 3:

[Chemical Formula 3]

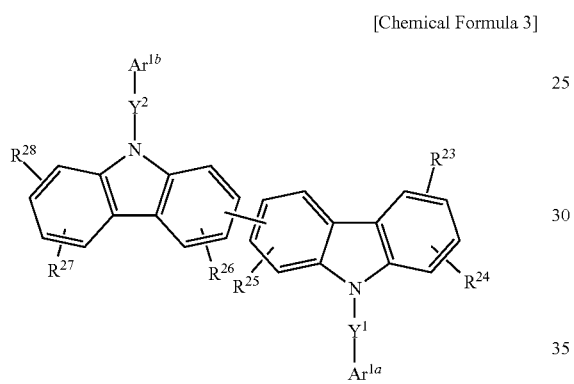

wherein, in Chemical Formula 3, $Y^1$ and $Y^2$ are each independently a single bond, a substituted or unsubstituted C6 to C30 arylene group, a substituted or unsubstituted C2 to C30 heteroarylene group, or a combination thereof, $Ar^{1a}$ and $Ar^{1b}$ are each independently a substituted or unsubstituted C6 to C30 aryl group, a substituted or unsubstituted C2 to C30 heteroaryl group, or a combination thereof, and $R^{23}$ to $R^{28}$ are each independently hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof, wherein "substituted" refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

5. The organic optoelectric device as claimed in claim 4, wherein the third compound is represented by one of the following Chemical Formulae 3-IX to 3-XI:

[Chemical Formula 3-IX]

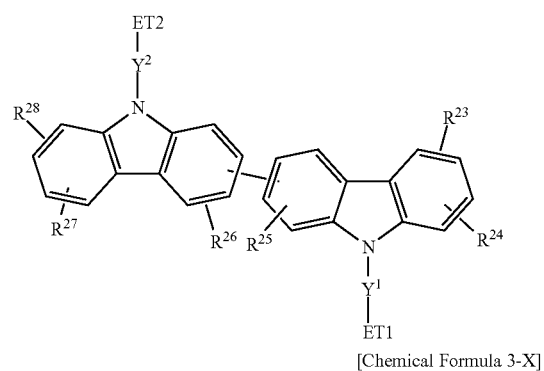

[Chemical Formula 3-X]

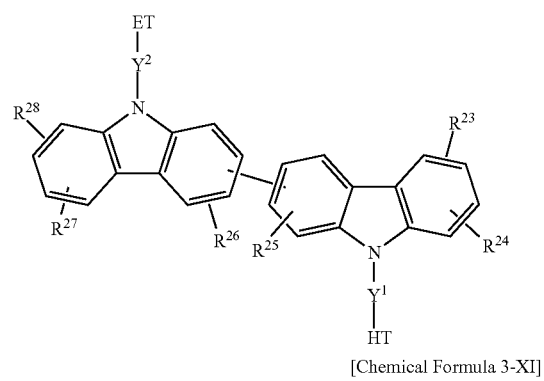

[Chemical Formula 3-XI]

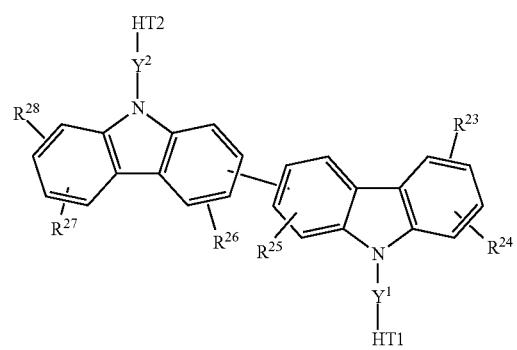

wherein, in Chemical Formulae 3-IX to 3-XI, $Y^1$ and $Y^2$ are each independently a single bond, a substituted or unsubstituted C6 to C30 arylene group, a substituted or unsubstituted C2 to C30 heteroarylene group, or a combination thereof, $R^{23}$ to $R^{28}$ are each independently hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof, ET, ET1, and ET2 are each independently selected from substituted or unsubstituted groups of the following Group 3, and HT, HT1, and HT2 are each independently selected from substituted or unsubstituted groups of the following Group 4,

[Group 3]

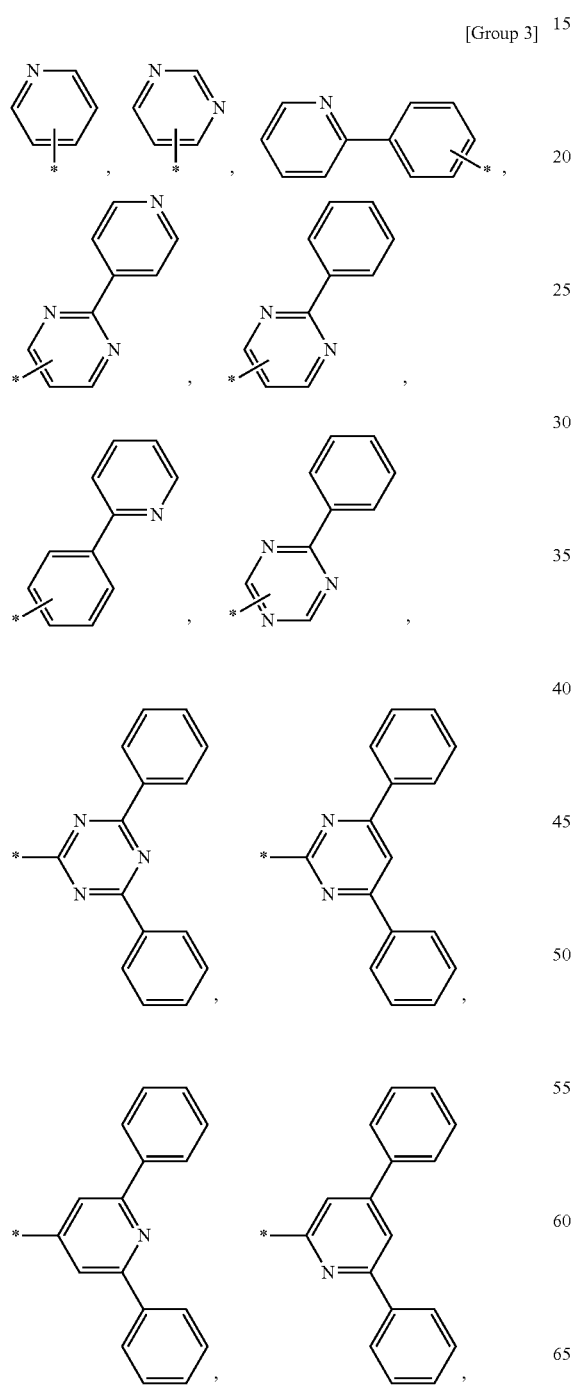

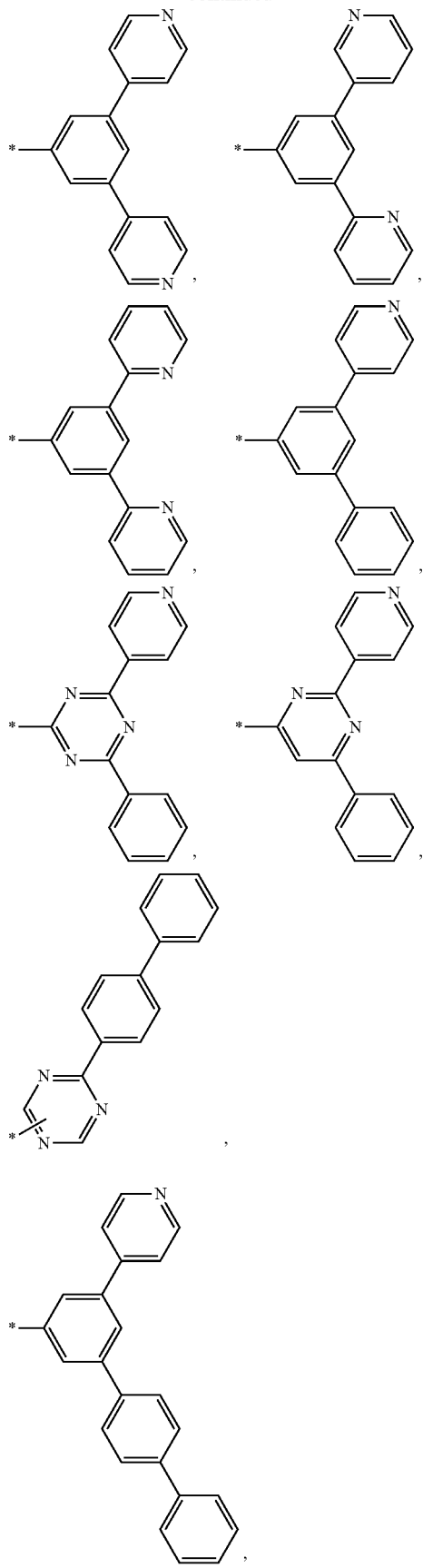

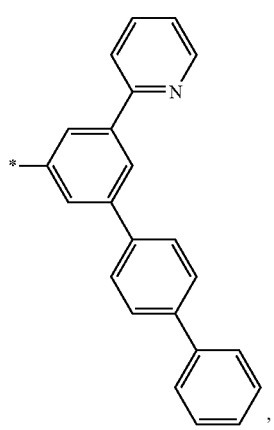
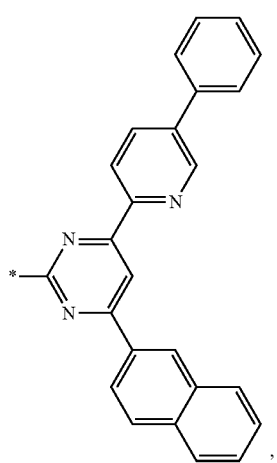
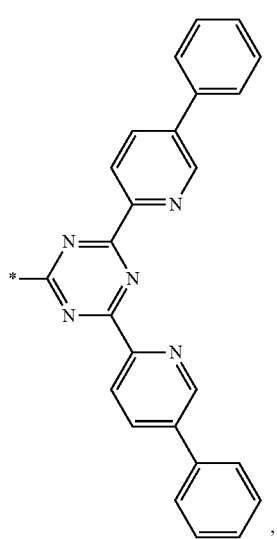
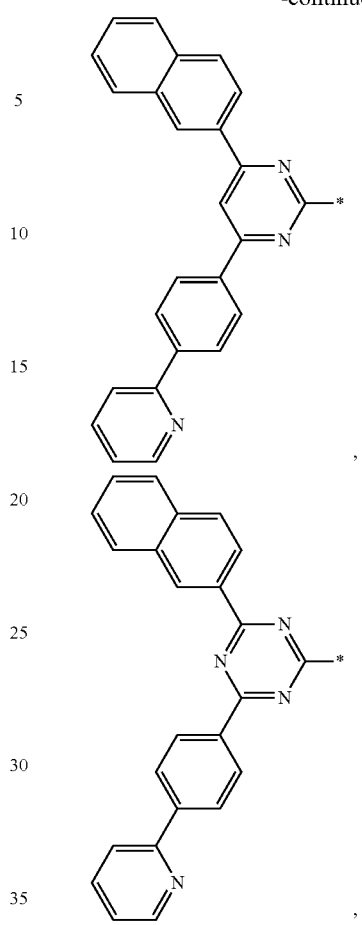
[Group 4]
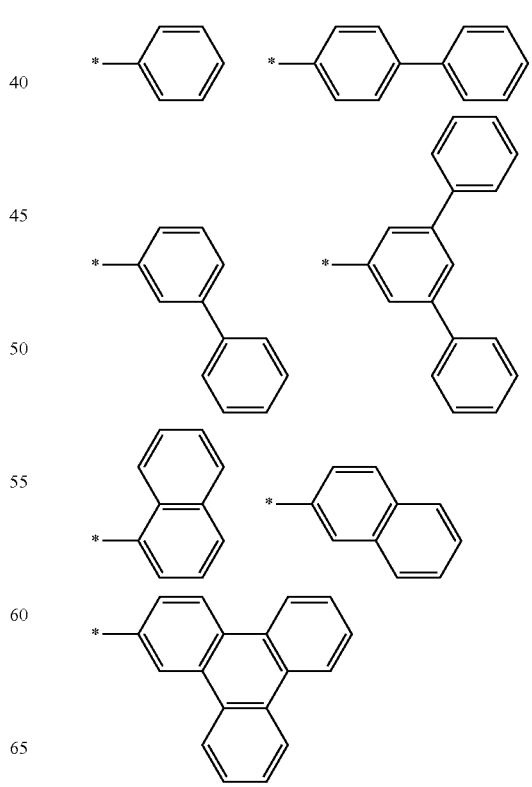

wherein, in Groups 3 and 4, * indicates a linking point, wherein "substituted" refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

6. The organic optoelectric device as claimed in claim 4, wherein the third compound is one of the following Compounds B-23 to B-26, B-29, B-31, B-34, B-37, B-40, B-43 to B-45, B47, B-48, B-51, B-52, B-54 to B-60, B-92, B-93, B-98, B-99, and B-111 to B-113:

-continued
B-29
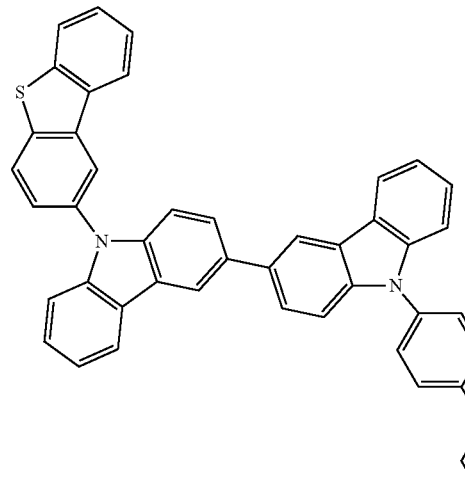
B-31
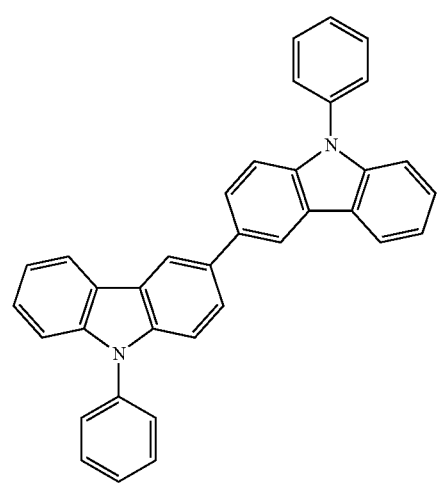
B-34
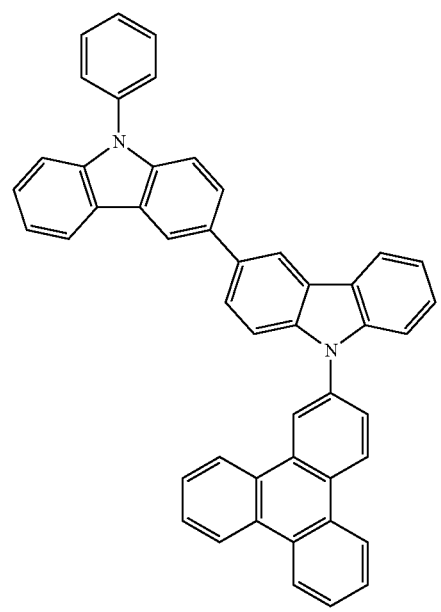
B-37
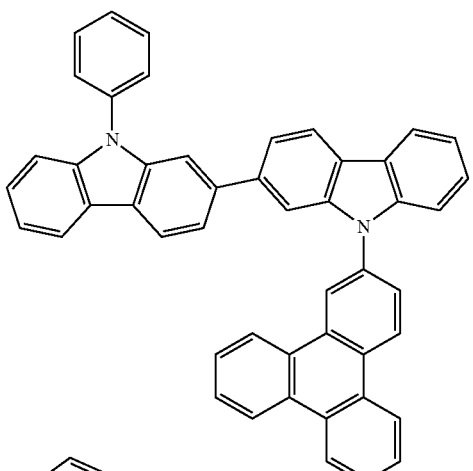
B-40
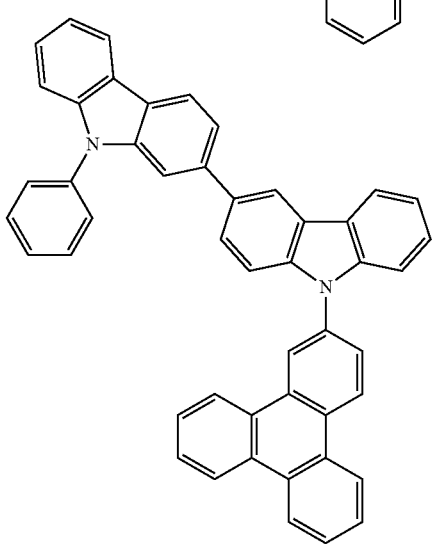
B-43
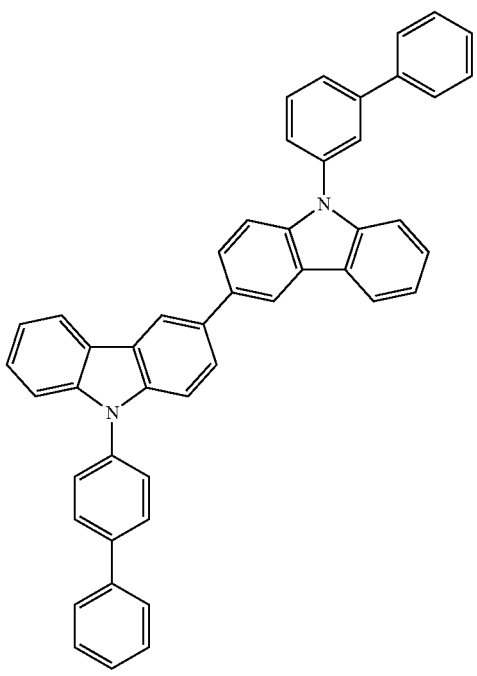

B-44
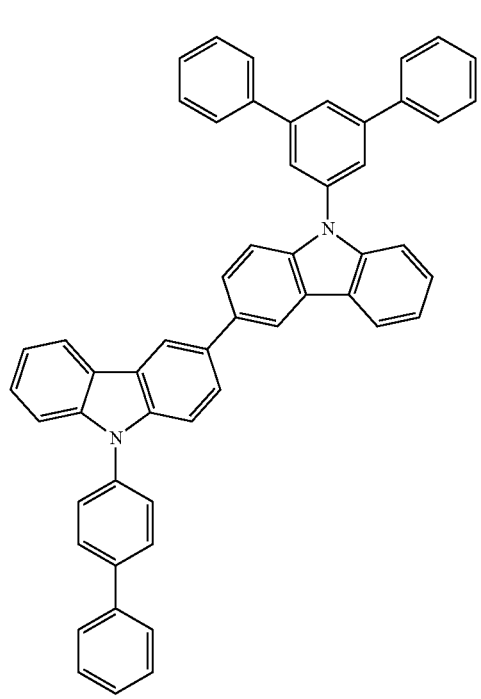
B-47
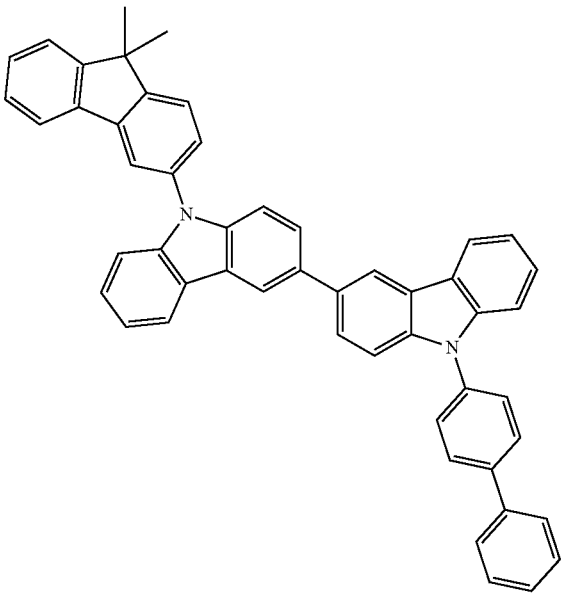
B-45
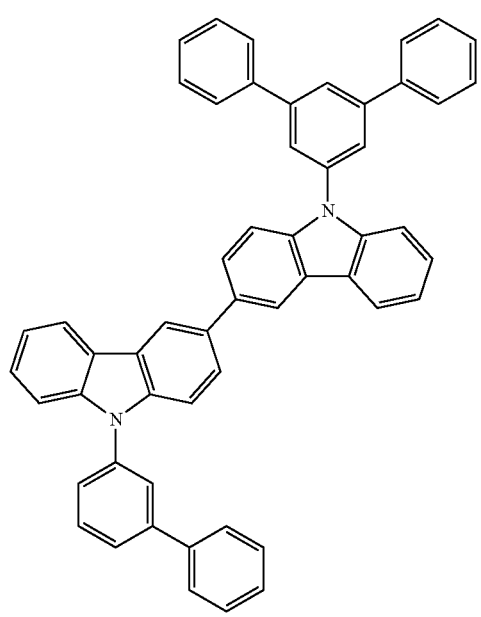
B-48
B-51
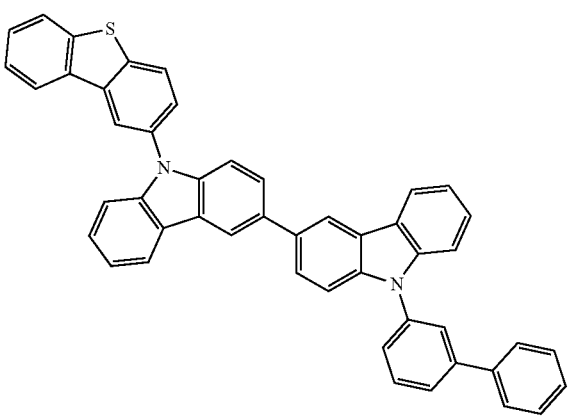

B-52
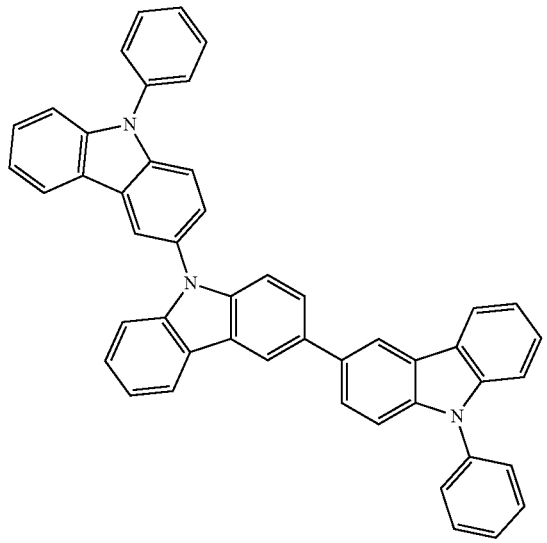
B-54
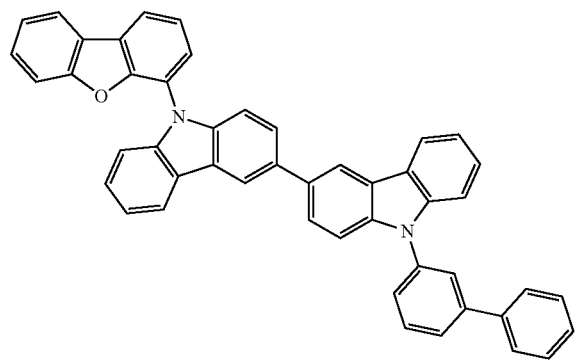
B-55
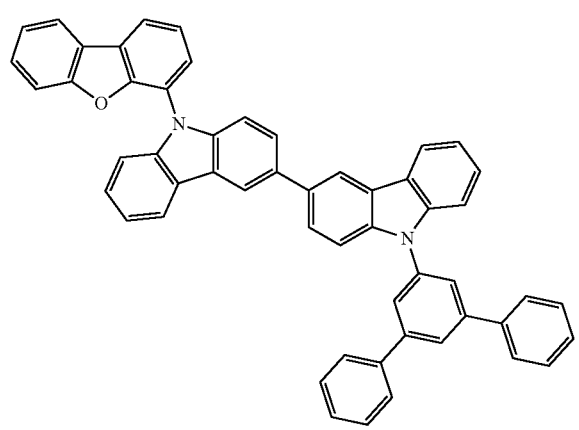
B-56
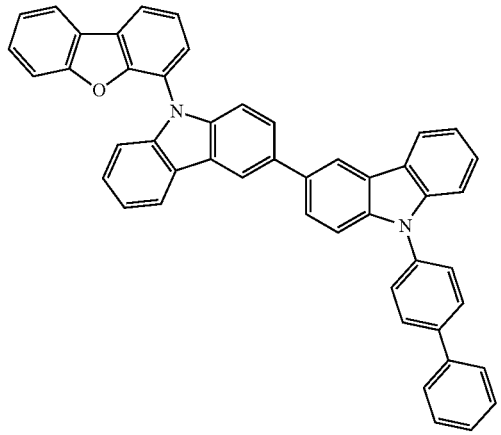
B-57
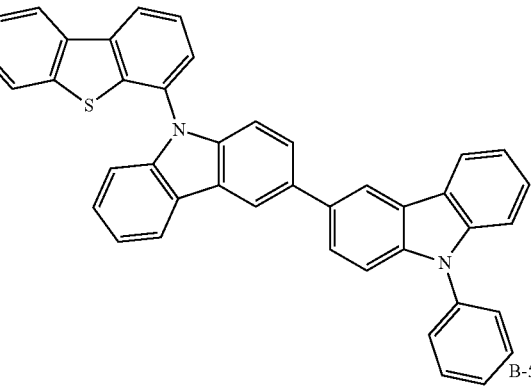
B-58
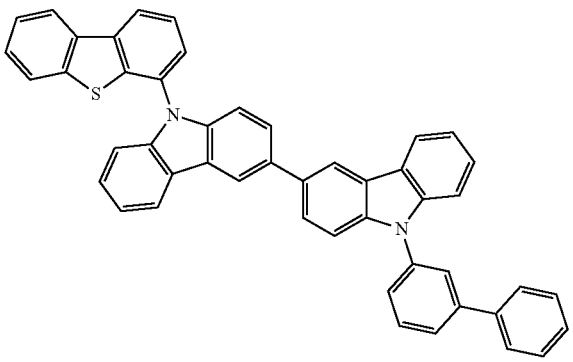
B-59
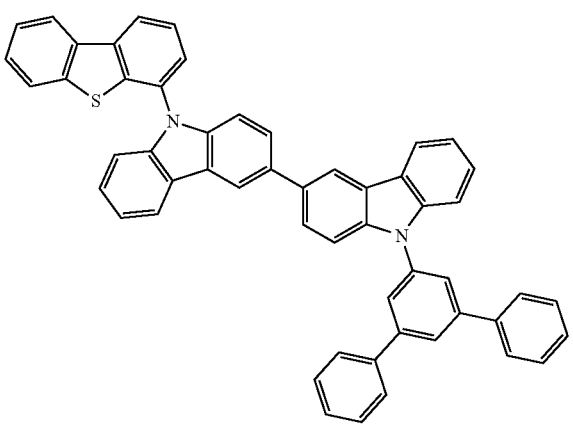

B-60
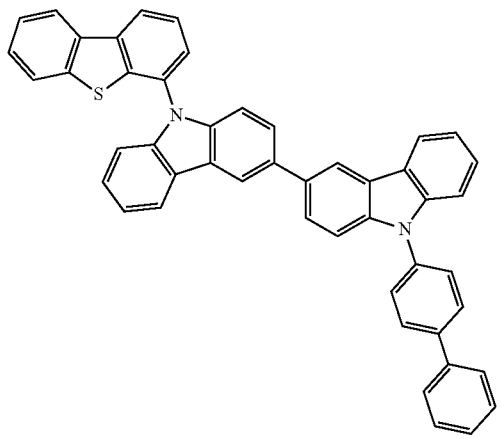
B-92
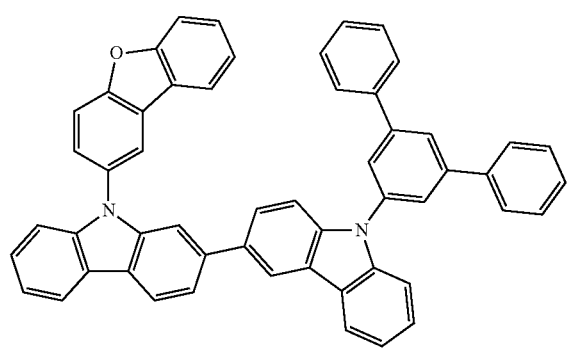
B-93
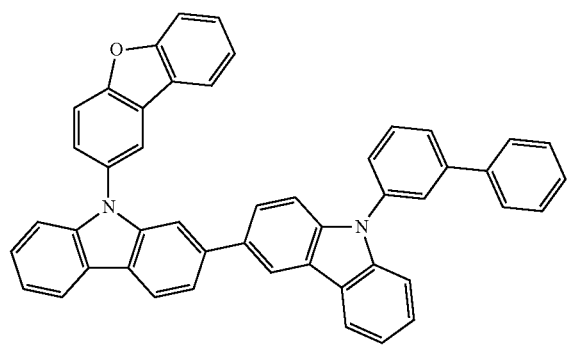
B-98
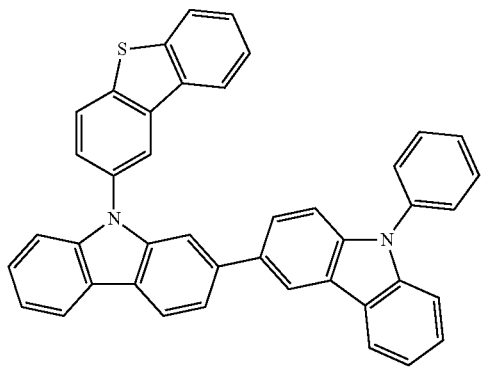
B-99
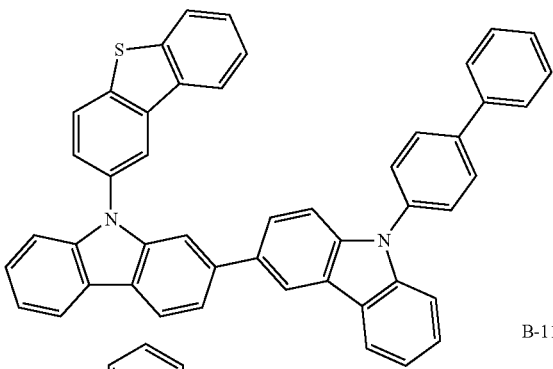
B-111
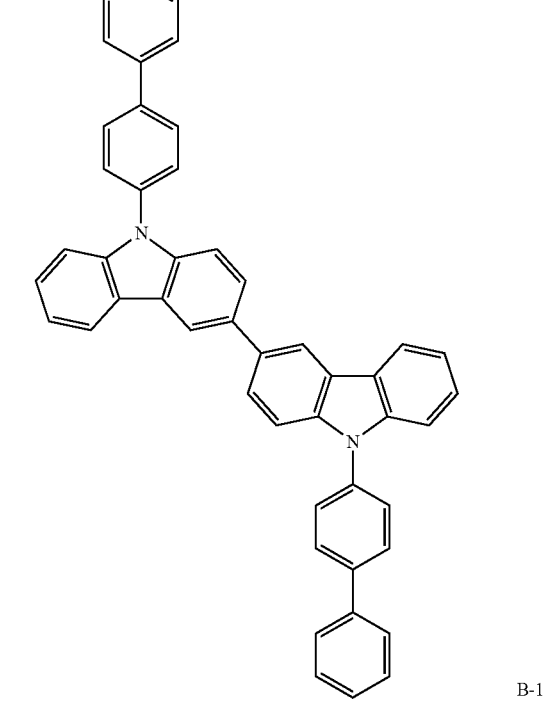
B-112
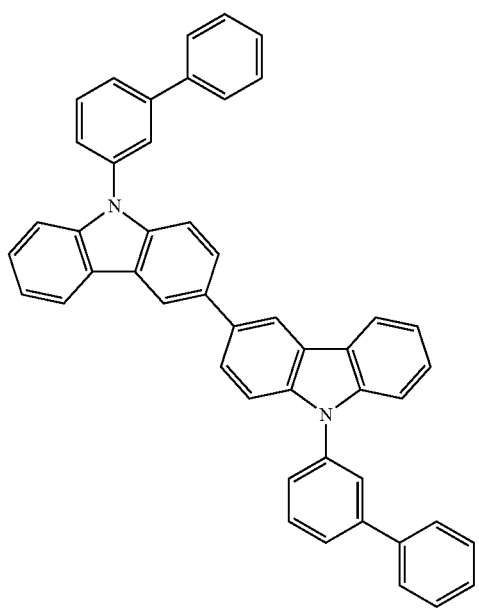

-continued

B-113

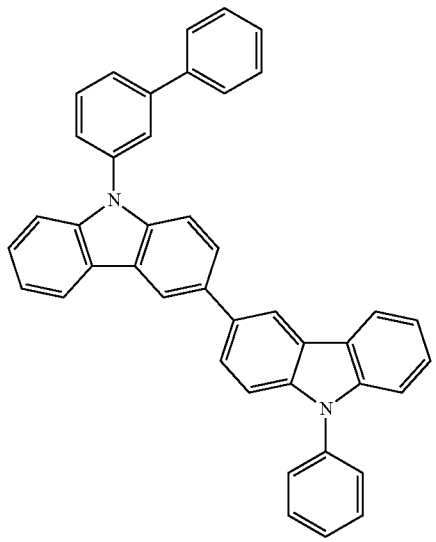

7. The organic optoelectric device as claimed in claim 1, wherein:

R$^{11}$ to R$^{20}$ of Chemical Formula 2 are each independently hydrogen, deuterium, a substituted or unsubstituted phenyl group, a substituted or unsubstituted biphenyl group, a substituted or unsubstituted o-terphenyl group, a substituted or unsubstituted m-terphenyl group, a substituted or unsubstituted p-terphenyl group, a substituted or unsubstituted quaterphenyl group, a substituted or unsubstituted fluorenyl group, or a combination thereof, and R$^{11}$ to R$^{20}$ are separate or are fused with an adjacent group to form a ring.

8. The organic optoelectric device as claimed in claim 1, wherein the second compound is represented by one of the following Chemical Formulae 2-I to 2-IV:

-continued

[Chemical Formula 2-II]

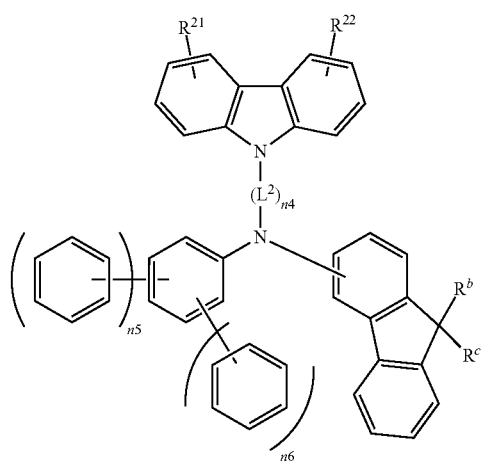

[Chemical Formula 2-III]

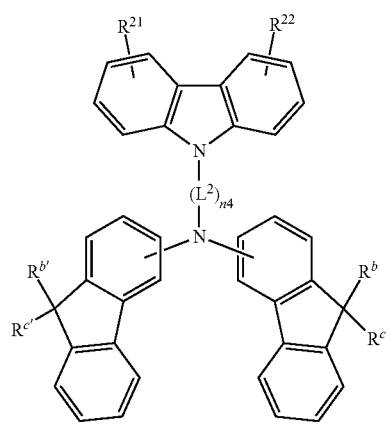

[Chemical Formula 2-I]

[Chemical Formula 2-IV]

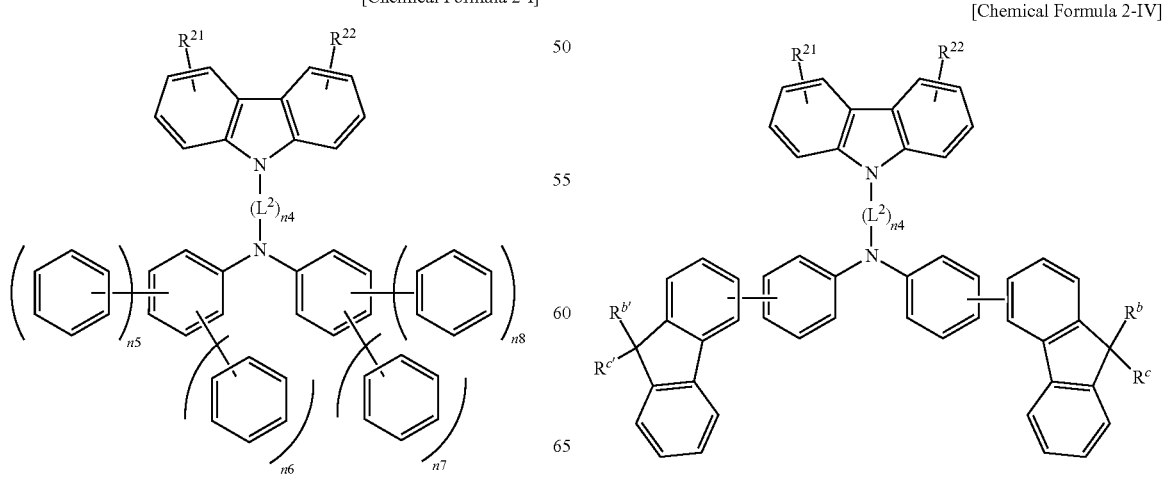

wherein, in Chemical Formulae 2-I to 2-IV,

L² is a substituted or unsubstituted C6 to C30 arylene group, n4 is an integer of 1 to 5, n5 to n8 are each independently an integer of 0 to 3, and $R^b$, $R^{b'}$, $R^c$, $R^{c'}$, $R^{21}$, and $R^{22}$ are each independently hydrogen, deuterium, a substituted or unsubstituted C1 to 20 alkyl group, a substituted or unsubstituted C6 to C50 aryl group, a substituted or unsubstituted C2 to C50 heteroaryl group, or a combination thereof, wherein "substituted" of Chemical Formulae 2-I to 2-IV refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, C6 to C30 aryl group, C2 to C30 heteroaryl group, a C1 to C20 alkoxy group, a fluoro group, a C1 to C10 trifluoroalkyl group, or a cyano group.

9. The organic optoelectric device as claimed in claim 1, wherein:

the first compound is represented by the following Chemical Formula 1-I, and the second compound is represented by the following Chemical Formula 2-I:

[Chemical Formula 1-I]

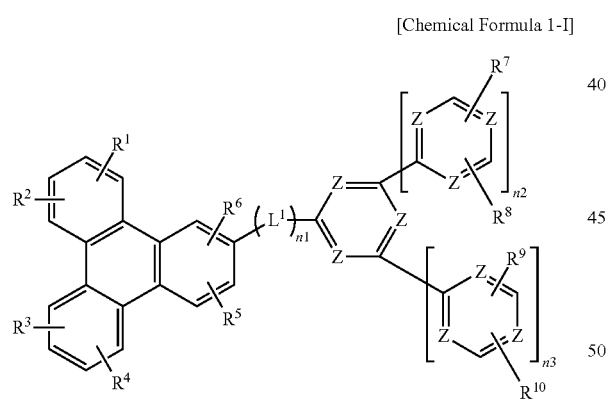

wherein, in Chemical Formula 1-I, each Z is independently N or CR$^a$, at least one Z being N, $R^1$ to $R^{10}$ and $R^a$ are each independently hydrogen, deuterium, a substituted or unsubstituted C1 to C10 alkyl group, a substituted or unsubstituted C6 to C12 aryl group, or a combination thereof, L¹ is a substituted or unsubstituted phenylene group, a substituted or unsubstituted biphenylene group or a substituted or unsubstituted terphenylene group, n1 to n3 are each independently 0 or 1, and $n1+n2+n3 \geq 1$,

[Chemical Formula 2-I]

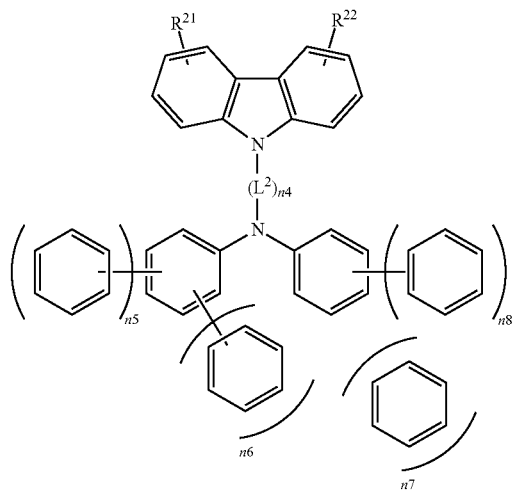

wherein, in Chemical Formula 2-I,

L² is a substituted or unsubstituted C6 to C30 arylene group, n4 is an integer of 1 to 5, n5 to n8 are each independently an integer of 0 to 3, and $R^{21}$ and $R^{22}$ are each independently hydrogen, deuterium, a substituted or unsubstituted C1 to 20 alkyl group, a substituted or unsubstituted C6 to C50 aryl group, a substituted or unsubstituted C2 to C50 heteroaryl group, or a combination thereof, wherein "substituted" of Chemical Formulae 1-I and 2-I refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

10. The organic optoelectric device as claimed in claim 9, wherein:

L² of Chemical Formula 2-I is a substituted or unsubstituted biphenylene group, and n4 is 1.

11. The organic optoelectric device as claimed in claim 9, wherein the electron transport auxiliary layer further includes a third compound represented by the following Chemical Formula 3-XI:

[Chemical Formula 3-XI]

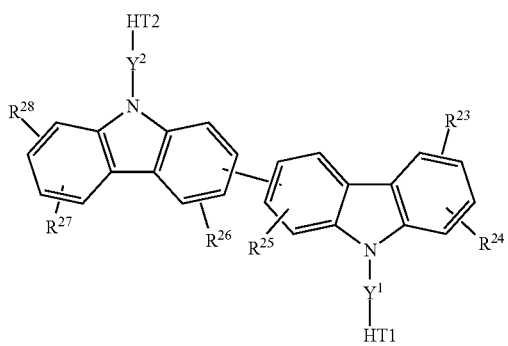

wherein, in Chemical Formula 3-XI,
$Y^1$ and $Y^2$ are each independently a single bond, a substituted or unsubstituted C6 to C30 arylene group, a substituted or unsubstituted C2 to C30 heteroarylene group, or a combination thereof,
$R^{23}$ to $R^{28}$ are each independently hydrogen, deuterium, a substituted or unsubstituted C1 to C20 alkyl group, a substituted or unsubstituted C6 to C50 aryl group, a substituted or unsubstituted C2 to C50 heteroaryl group, or a combination thereof,
HT1 and HT2 are each independently selected from substituted or unsubstituted groups of the following Group 4,

[Group 4]

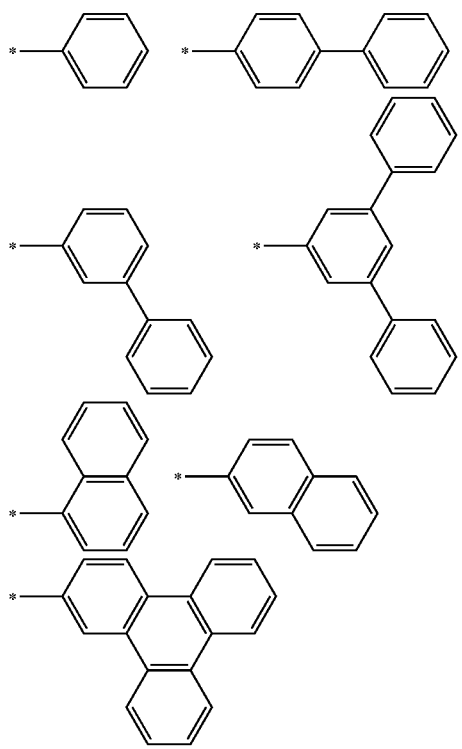

-continued

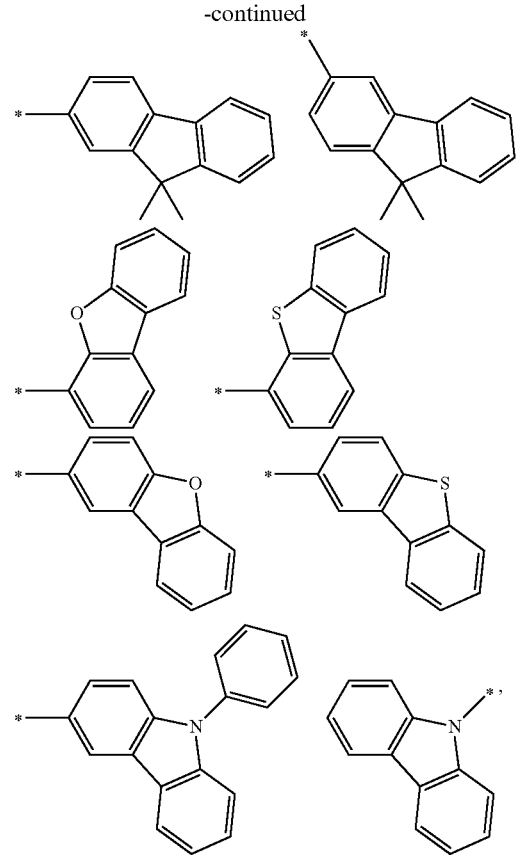

wherein, in Group 4, * indicates a linking point,
wherein "substituted" refers to that at least one hydrogen is replaced by deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C3 to C30 cycloalkyl group, a C2 to C30 heterocycloalkyl group, a C6 to C30 aryl group, a C2 to C30 heteroaryl group, a C1 to C20 alkoxy group, a fluoro group, a C1 to C10 trifluoroalkyl group, or a cyano group.

12. The organic optoelectric device as claimed in claim 1, wherein:
the hole transport auxiliary layer contacts the hole transport layer and the emission layer, and
the electron transport auxiliary layer contacts the electron transport layer and the emission layer.

13. The organic optoelectric device as claimed in claim 1, wherein the emission layer further includes a fluorescent dopant.

14. The organic optoelectric device as claimed in claim 1, wherein the organic optoelectric device is an organic light emitting diode, an organic photoelectric device, an organic solar cell, an organic transistor, an organic photo conductor drum, or an organic memory device.

15. A display device comprising the organic optoelectric device as claimed in claim 1.

* * * * *